(12) United States Patent
Takada

(10) Patent No.: US 9,048,440 B2
(45) Date of Patent: Jun. 2, 2015

(54) MATERIAL FOR ORGANIC ELECTROLUMINESCENCE DEVICE AND ELECTROLUMINESCENCE DEVICE

(75) Inventor: Saki Takada, Kanagawa (JP)

(73) Assignee: UDC Ireland, Dublin (IE)

( * ) Notice: Subject to any disclaimer, the term of this patent is extended or adjusted under 35 U.S.C. 154(b) by 719 days.

(21) Appl. No.: 12/872,340

(22) Filed: Aug. 31, 2010

(65) Prior Publication Data

US 2011/0050092 A1   Mar. 3, 2011

(30) Foreign Application Priority Data

Aug. 31, 2009 (JP) .................................. 2009-201147
Feb. 12, 2010 (JP) .................................. 2010-029537

(51) Int. Cl.
| | |
|---|---|
| H01L 51/54 | (2006.01) |
| C09K 11/06 | (2006.01) |
| H01L 51/00 | (2006.01) |
| H05B 33/14 | (2006.01) |
| H01L 51/50 | (2006.01) |

(52) U.S. Cl.
CPC ............ *H01L 51/0085* (2013.01); *C09K 11/06* (2013.01); *C09K 2211/1007* (2013.01); *C09K 2211/1044* (2013.01); *C09K 2211/1051* (2013.01); *C09K 2211/1059* (2013.01); *C09K 2211/185* (2013.01); *H01L 51/0072* (2013.01); *H01L 51/5016* (2013.01); *H05B 33/14* (2013.01)

(58) Field of Classification Search
None
See application file for complete search history.

(56) References Cited

U.S. PATENT DOCUMENTS

| | | | |
|---|---|---|---|
| 2008/0030125 | A1 | 2/2008 | Boerner et al. |
| 2008/0160345 | A1 | 7/2008 | Inoue et al. |
| 2008/0203028 | A1 | 8/2008 | Boerner et al. |
| 2008/0297033 | A1 | 12/2008 | Knowles et al. |
| 2009/0134785 | A1 | 5/2009 | Kamatani et al. |

FOREIGN PATENT DOCUMENTS

| | | |
|---|---|---|
| JP | 04 085388 A | 3/1992 |
| JP | 2006 237306 A | 9/2006 |
| JP | 2006 278781 A | 10/2006 |
| JP | 2006 278782 A | 10/2006 |
| JP | 2006 332116 A | 12/2006 |
| JP | 2007 091718 A | 4/2007 |
| JP | 2007 515058 A | 6/2007 |
| JP | 2008 179607 A | 8/2008 |
| JP | 2008 531495 A | 8/2008 |
| JP | 2008-311607 A | 12/2008 |
| JP | 2009 132627 A | 6/2009 |
| JP | 2009-526071 A | 7/2009 |
| WO | 2007/095118 A2 | 8/2007 |

OTHER PUBLICATIONS

Machine translation of JP 2006-237306 (Sep. 2006).*
Machine translation of JP 2006-278781 (Oct. 2006).*
Office Action dated Nov. 25, 2009 on counterpart Japanese Application No. 2009-201147.

* cited by examiner

*Primary Examiner* — Marie R. Yamnitzky
(74) *Attorney, Agent, or Firm* — Riverside Law LLP

(57) ABSTRACT

Provided is a material for organic electroluminescence device containing (a) a phosphorescent metal complex containing a monoanionic bidentate ligand and a metal having an atomic weight of 40 or greater, wherein the monoanionic bidentate ligand is represented by the following formula (A):

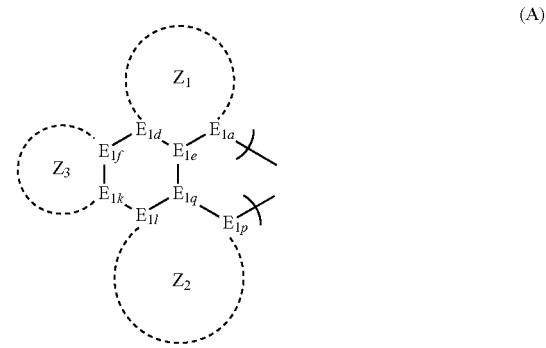

wherein, each of $E_{1a}$, $E_{1d}$, $E_{1e}$, $E_{1f}$, $E_{1k}$, $E_{1l}$, $E_{1p}$, and $E_{1q}$ independently represents a carbon atom or a hetero atom, each of $Z_1$, $Z_2$, and $Z_3$ independently represents an aromatic ring or aromatic heterocycle, the aromatic ring or aromatic heterocycle may have a substituent, and a skeleton represented by the formula (A) has, in total, a 18π electron structure, and the bidentate ligand represented by the formula (A) may be coupled to another ligand to form a tridentate or higher-dentate ligand; and (b) a structural isomer represented by the same chemical formula as that of the phosphorescent metal complex (a) but different sterically in a coordination method of the ligand, wherein the structural isomer (b) is contained in an amount of 0.05 mass % or greater but not greater than 5 mass % relative to the phosphorescent metal complex (a).

9 Claims, 1 Drawing Sheet

MATERIAL FOR ORGANIC ELECTROLUMINESCENCE DEVICE AND ELECTROLUMINESCENCE DEVICE

BACKGROUND OF THE INVENTION

1. Field of the Invention

The present invention relates to a material for organic electroluminescence device and the organic electroluminescence device.

2. Description of the Related Art

Research and development are being vigorously made on organic electroluminescence devices (which may hereinafter be referred to as "devices" or "organic EL devices") because they can emit light with high brightness even by low voltage driving. In general, organic electroluminescence devices each has one or more organic layers including a light emitting layer and a pair of electrodes sandwiching them therebetween. For light emission, they utilize energy of an exciton generated as a result of recombination, in the light emitting layer, of electrons injected from a cathode and holes injected from an anode.

In recent years, phosphorescent materials have been used for the purpose of increasing the efficiency of devices. For example, use of an iridium or platinum complex as a phosphorescent material has been studied in order to provide an organic electroluminescence device having improved emission efficiency and heat resistance.

In addition, doped devices using a light emitting layer obtained by doping a light emitting material in a host material have been employed widely.

Patent Document 1 describes an iridium complex that contains a condensed azole ligand, has high durability, and is blue-light emissive.

Patent Document 2 describes a device using a phosphorescent complex, particularly, an iridium complex containing a structural isomer thereof.

Patent Document 3 describes a method of producing an iridium complex while increasing the purity of a facial isomer thereof.

[Patent Document 1] U.S. Patent Application Publication No. 2008/0297033

[Patent Document 2] JP-A-2006-237306 (The term "JP-A" as used herein refers to an "unexamined published Japanese patent application".)

[Patent Document 3] JP-A-2007-91718

SUMMARY OF THE INVENTION

Patent Document 1 describes a light emitting material with high blue color purity and high durability. As described on page 55 of Patent document 1, however, the metal complex described in Patent Document 1 is not resistant to a visible light and is easily oxidized so that it should be treated under light shielding conditions during from synthesis to isolation of the complex. This complicates the production steps or reduces productivity so that there is a demand for improvement.

Patent Document 2 describes that a tris Ir complex containing two structural isomers mixed at a predetermined ratio has improved solubility, light emission properties, and durability, but it does not include any description on the stability of the material against light or heat. In addition, as described in the paragraph 11 of Patent Document 3, it is conventionally thought that a meridional isomer, which is one of the structural isomers of the iridium complex, is inferior to a facial isomer as a phosphorescent material because of having a lower emission quantum yield than the facial isomer. It has been recognized that use of a mixture of two isomers different in structure may cause deterioration of device characteristics.

An object of the invention is to provide a material for organic electroluminescence device which material can be used for an organic electroluminescence device, is excellent in stability against heat or light, and is excellent in productivity. Another object of the invention is to provide an organic electroluminescence device using the material for organic electroluminescence device.

As a result of extensive investigation, the present inventors have found that by incorporating, in a material containing a phosphorescent metal complex having a specific condensed ligand, a structural isomer of the complex at a predetermined content, the resulting material has excellent stability when stored under a visible light and high temperature conditions.

The above-described objects of the invention can be achieved by the following means.

(1) A material for organic electroluminescence device, which comprises:

(a) a phosphorescent metal complex containing a monoanionic bidentate ligand and a metal having an atomic weight of 40 or greater, wherein the monoanionic bidentate ligand is represented by the following formula (A):

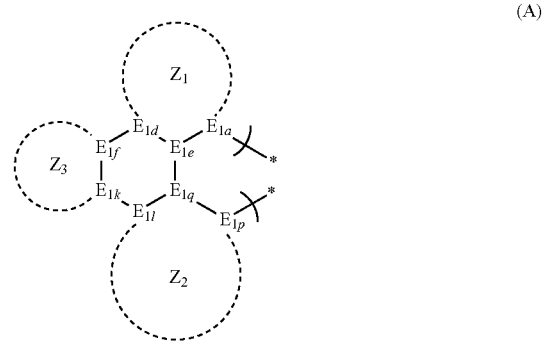

(A)

wherein, each of $E_{1a}$, $E_{1d}$, $E_{1e}$, $E_{1f}$, $E_{1k}$, $E_{1l}$, $E_{1p}$, and $E_{1q}$ independently represents a carbon atom or a hetero atom, each of $Z_1$, $Z_2$, and $Z_3$ independently represents an aromatic ring or aromatic heterocycle, the aromatic ring or aromatic heterocycle may have a substituent, and a skeleton represented by the formula (A) has, in total, a $18\pi$ electron structure, and the bidentate ligand represented by the formula (A) may be coupled to another ligand to form a tridentate or higher-dentate ligand; and (b) a structural isomer represented by the same chemical formula as that of the phosphorescent metal complex (a) but different sterically in a coordination method of the ligand, wherein the structural isomer (b) is contained in an amount of 0.05 mass % or greater but not greater than 5 mass % relative to the phosphorescent metal complex (a).

(2) The material for organic electroluminescence device according to (1), wherein the formula (A) is the following formula (A1) or (A3):

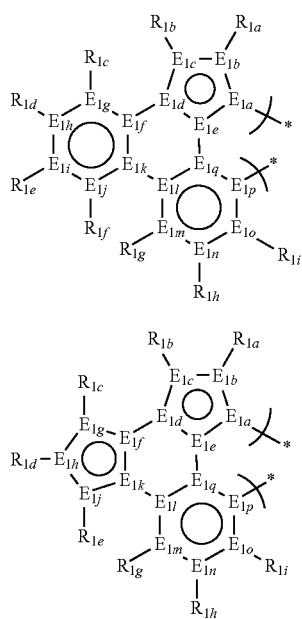

(A1)

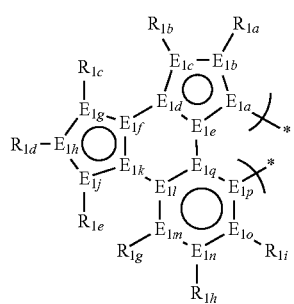

(A3)

wherein, each of $E_{1a}$ to $E_{1q}$ independently represents a carbon atom or a hetero atom, each of $R_{1a}$ to $R_{1i}$ independently represents a hydrogen atom or a substituent, and the skeletons represented by the formula (A1) or (A3) has, in total, a 18π electron structure.

(3) The material for organic electroluminescence device according to (1) or (2), wherein the formula (A) is either the following formula (A1-3) or (A3-3):

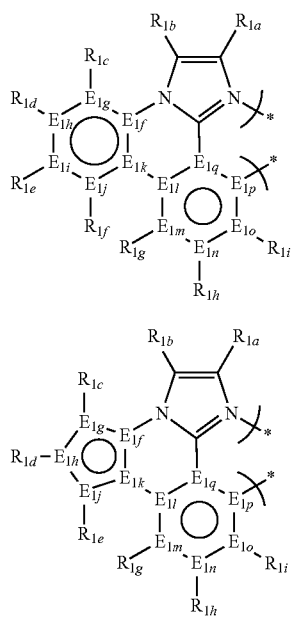

(A1-3)

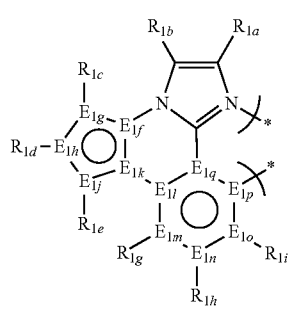

(A3-3)

wherein, each of $E_{1f}$ to $E_{1q}$ independently represents a carbon atom or a hetero atom; each of $R_{1a}$ to $R_{1i}$ independently represents a hydrogen atom or a substituent; and the skeleton represented by the formula (A1-3) or (A3-3) has, in total, a 18π electron structure.

(4) The material for organic electroluminescence device according to any one of (1) to (3), wherein the metal is iridium.

(5) The material for organic electroluminescence device according to any one of claims 1 to 4, wherein the phosphorescent metal complex is represented by the following formula (A10):

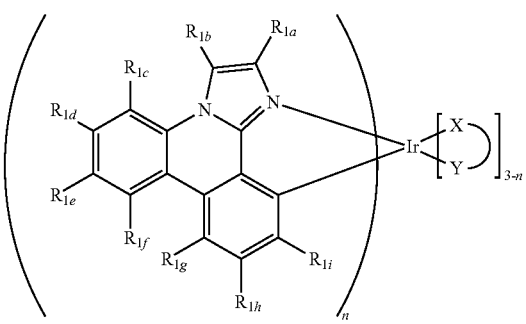

(A10)

wherein, each of $R_{1a}$ to $R_{1i}$ independently represents a hydrogen atom or a substituent, X—Y represents at least one monoanionic bidentate ligand selected from the following (1-1) to (1-14):

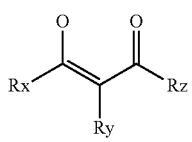

(I-1)

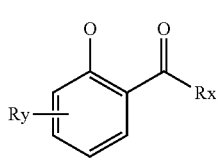

(I-2)

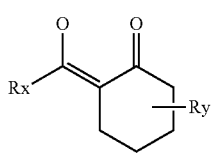

(I-3)

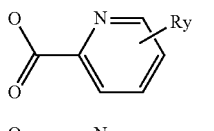

(I-4)

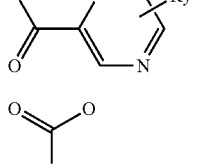

(I-5)

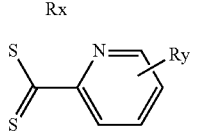

(I-6)

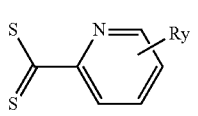

(I-7)

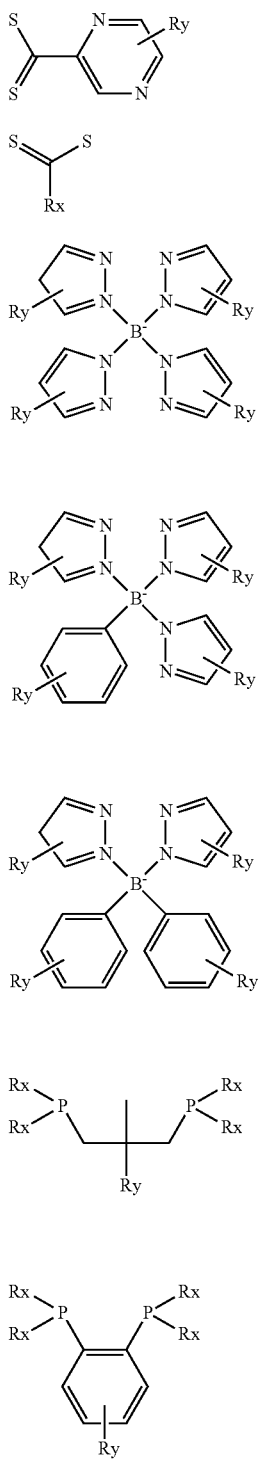

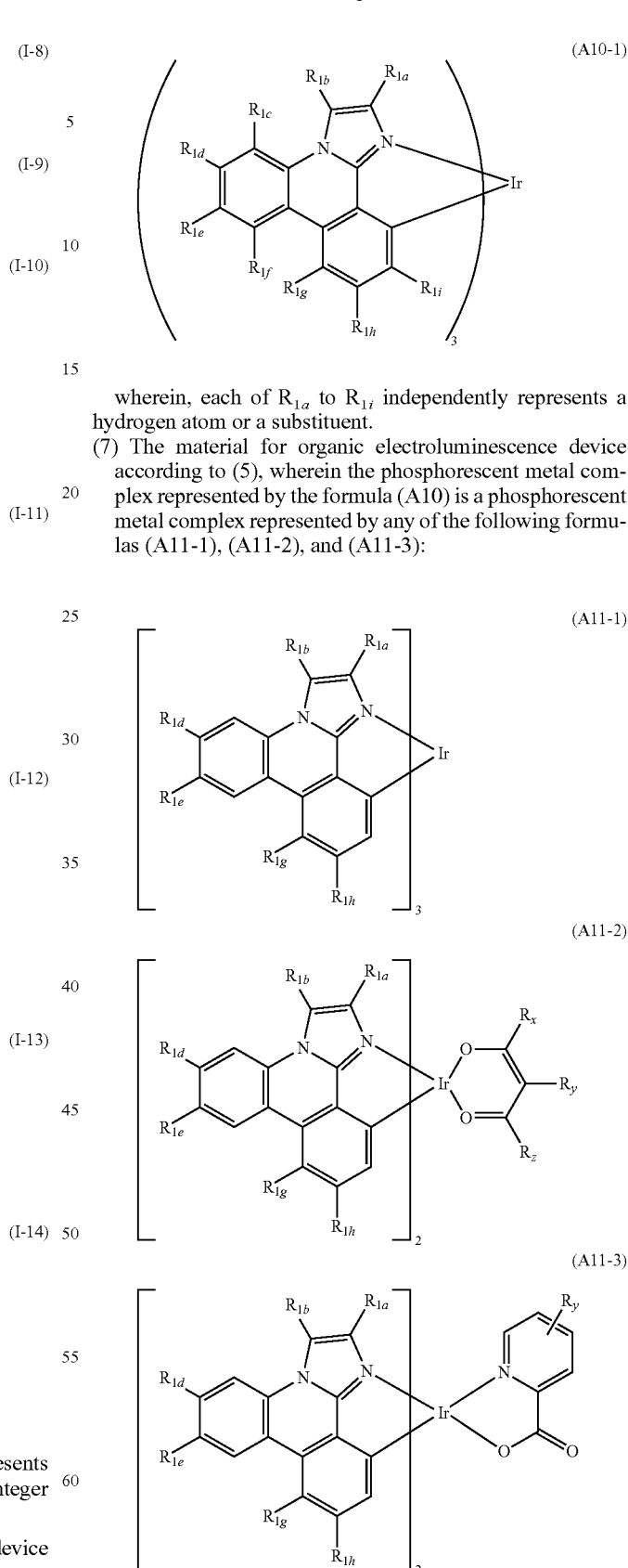

wherein, each of Rx, Ry, and Rz independently represents a hydrogen atom or a substituent, and n stands for an integer from 1 to 3.

(6) The material for organic electroluminescence device according to (5), wherein the phosphorescent metal complex represented by the formula (A10) is a phosphorescent metal complex represented by the following formula (A10-1):

wherein, each of $R_{1a}$ to $R_{1i}$ independently represents a hydrogen atom or a substituent.

(7) The material for organic electroluminescence device according to (5), wherein the phosphorescent metal complex represented by the formula (A10) is a phosphorescent metal complex represented by any of the following formulas (A11-1), (A11-2), and (A11-3):

wherein, each of $R_{1a}$, $R_{1b}$, $R_{1d}$, $R_{1c}$, $R_{1g}$, $R_{1h}$ independently represents a hydrogen atom, an alkyl group, a cycloalkyl group, an aryl group, a cyano group, a fluoro group, $-OR_{2a}$, $-SR_{2a}$, $-NR_{2a}R_{2b}$, $-BR_{2a}R_{2b}$, or $-SiR_{2a}R_{2b}R_{2c}$, each of $R_{2a}$ to $R_{2c}$ independently represents a hydrocarbon substituent or a hetero-substituted hydrocarbon substituent, each of Rx and Rz independently represents any of alkyl groups, perfluoroalkyl groups, halogen atoms, and aryl groups, and Ry represents any of a hydrogen atom, alkyl groups, perfluoroalkyl groups, halogen atoms, and aryl groups.

(8) The material for organic electroluminescence device according to any one of (1) to (7), wherein the structural isomer (a) is a facial isomer, while the structural isomer (b) is a meridional isomer.

(9) An organic electroluminescence device which comprises:
a substrate,
a pair of electrodes on the substrate, and
one or more organic layers including a light emitting layer between the electrodes,
wherein the material for organic electroluminescence device according to any one of the above (1) to (8) is contained in at least one of the organic layers.

(10) The organic electroluminescence device according to (9), which comprises the material for organic electroluminescence device according to any one of the above (1) to (8) in the light emitting layer.

(11) A light emission apparatus which uses the organic electroluminescence device according to the above (9) or (10).

(12) A display apparatus which uses the organic electroluminescence device according to the above (9) or (10).

(13) An illumination apparatus which uses the organic electroluminescence device according to the above (9) or (10).

(14) The material for organic electroluminescence device according to (2), wherein each of $R_{1a}$ to $R_{1i}$ independently represents a hydrogen atom, an alkyl group, a cycloalkyl group, an aryl group, a cyano group, a fluoro group, $-OR_{2a}$, $-SR_{2a}$, $-NR_{2a}R_{2b}$, $-BR_{2a}R_{2b}$, or $-SiR_{2a}R_{2b}R_{2c}$,
wherein each of $R_{2a}$ to $R_{2c}$ independently represents an alkyl group, a cycloalkyl group, or an aryl group.

(15) The material for organic electroluminescence device according to (5), wherein each of $R_{1a}$ to $R_{1i}$ independently represents a hydrogen atom, an alkyl group, a cycloalkyl group, an aryl group, a cyano group, a fluoro group, $-OR_{2a}$, $-SR_{2a}$, $-NR_{2a}R_{2b}$, $-BR_{2a}R_{2b}$, or $-SiR_{2a}R_{2b}R_{2c}$,
each of $R_{2a}$ to $R_{2c}$ independently represents an alkyl group, a cycloalkyl group, or an aryl group, and
wherein each of Rx and Rz independently represents any of alkyl groups, perfluoroalkyl groups, halogen atoms, and aryl groups and Ry represents any of a hydrogen atom, alkyl groups, perfluoroalkyl groups, halogen atoms, and aryl groups.

The invention makes it possible to provide a material for organic electroluminescence device that can be used for organic electroluminescence devices and is excellent from the standpoint of stability against heat and light, and productivity. In addition, the invention can provide an organic electroluminescence device using the material for organic electroluminescence device.

DESCRIPTION OF REFERENCE NUMERALS AND SIGNS

Figure 1:
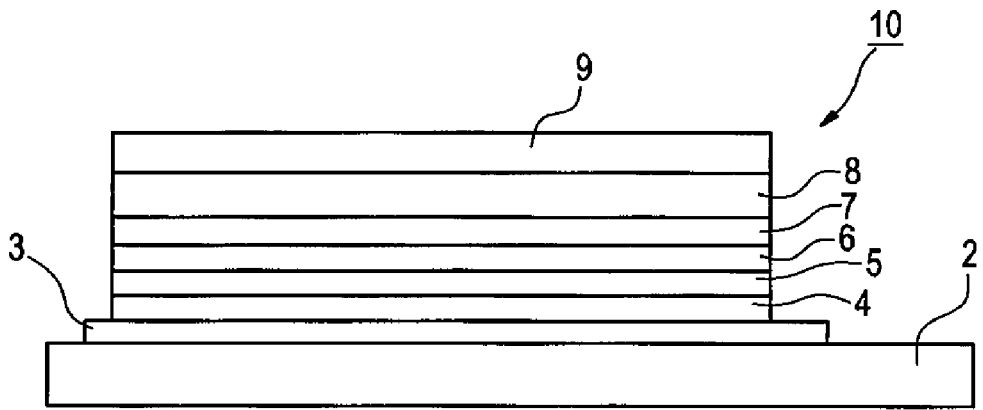
FIG. 1 is a schematic view illustrating an example (first embodiment) of the layer constitution of an organic EL device according to the invention.

2 Substrate
3 Anode
4 Hole injection layer
5 Hole transport layer
6 Light emitting layer
7 Hole blocking layer
8 Electron transport layer
9 Cathode
10 Organic electroluminescence device (Organic EL device)
11 Organic layer
12 Protective layer
14 Adhesion layer
16 Sealing container
20 Light emission apparatus
30 Light scattering member
30A Light incident surface
30B Light output surface
31 Transparent substrate
32 Fine particles
40 Illumination apparatus

DETAILED DESCRIPTION OF THE INVENTION

The hydrogen atom in the description of each of the formulas in the invention embraces isotopes thereof (such as deuterium) and atoms constituting the substituent also embrace isotopes thereof.

In the invention, the number of carbon atoms of the substituent such as alkyl group includes the number of carbon atoms, in the case where the substituent such as alkyl group has been substituted with another substituent, of the another substituent.

The material for organic electroluminescence device according to the invention contains (a) a phosphorescent metal complex containing a monoanionic bidentate ligand represented by the above formula (A) and a metal having an atomic weight of 40 or greater and (b) a structural isomer represented by the same chemical formula as that of the phosphorescent metal complex (a) but different sterically in the coordination of the ligand, the structural isomer (b) being contained in an amount of 0.05 mass % or greater but not greater than 5 mass % relative to the phosphorescent metal complex (a).

The term "structural isomer" as used herein means an isomer having the same chemical formula but sterically different in the coordination of the ligand. The material for organic electroluminescence device according to the invention contains at least the structural isomer (a) and the structural isomer (b) of a phosphorescent metal complex which are represented by the same structural formula and the structural isomer (b) is contained in an amount of 0.05 mass % or greater but not greater than 5 mass % relative to the structural isomer (a).

Conventional complexes having a condensed ligand as described above in Patent Document 1 have some oxidation active sites. Since the condensed ligands have inevitably a wide surface area, many active sites are presumed to be present outside the molecule without being blocked. When the material powder is excited by a visible light under such a state, a complex molecule excited at a high energy attacks the active site of another complex molecule in the vicinity thereof and this is presumed to trigger decomposition. In the case of a dilute solution or host-dispersed film device, no marked photodegradation is observed. Such decomposition is presumed to occur upon synthesis or isolation only when the distance between complex molecules is small as in the above-described case. When a small amount of a structural isomer is incorporated, a structural isomer (for example, a meridional isomer) having a lower emission efficiency (this is presumed to mean "having more thermal deactivation paths") is presumed to play a role of releasing a photoexcitation energy. In the tris(2-phenylpyridin)iridium or tris(2-phenylquinolin)iridium described in Patent Document 2, the main path of photodegradation in a solid state is presumed to be different from that of the compound of the invention and in fact, such an effect is not be observed.

The effect as described above is great particularly when an organic EL is manufactured at a low cost. The material of the invention can be stored for a long period of time in a wide temperature range and special light shielding conditions are not necessary upon purification or storage so that it is possible to realize simplification of manufacturing steps, improvement in productivity, and cost reduction.

A device manufactured by heating the material of the invention in a crucible and then exposing it for long hours to vapor deposition conditions necessary for the production of a device is evaluated for its properties. As a result, it has been found that decrease in the performance of the device due to deterioration in the material is small. This means that the device has improved durability against vapor deposition for long hours because it uses the material of the invention, which leads to reduction in time or cost upon production of an organic EL device.

These structural isomers differ greatly from each other in physical properties. When the content of the structural isomer (b) is excessively large, the physical properties of the structural isomer (b) are presumed to have a strong influence on the fundamental performance of the resulting organic EL device. The content of the structural isomer (b) relative to that of the structural formula (a) is preferably as small as possible within the range where the advantage of the invention is available. The content is preferably 0.05 mass % or greater but not greater than 1 mass %, more preferably 0.05 mass % or greater but not greater than 0.7 mass %.

As described above, the structural isomer (a) has preferably an equal or lower emission efficiency than the structural isomer (b) from the standpoint of releasing a photoexcitation energy and suppressing decomposition.

With regards to a complex composed of a center metal M and monodentate ligands X and Y (a plurality of ligands may be coupled to each other to form a bidentate or polydentate ligand), examples of the structural isomer include a facial or meridional isomer present in a metal complex having a six-coordinate octahedral $MX_3Y_3$ geometry and a trans or cis isomer present in a metal complex having a six-coordinate octahedral $MX_2Y_4$ geometry or a metal complex having a four-coordinate square planar $MX_2Y_2$ geometry.

The facial isomers are all on the corners of a common triangular face of octahedron, while the meridional isomers are all opposite to each other with a metal therebetween. The facial isomer has a C3 symmetrical structure and shows higher symmetry than the meridional isomer.

The facial isomer and the meridional isomer will next be described specifically with examples. The isomer (a1) is a facial isomer, while the isomer (b1) is a meridional isomer.

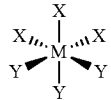

a1

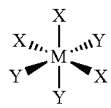

b1

A metal complex composed of a polydentate ligand also has an isomer. In a metal complex composed of a monoanionic bidentate ligand having a six-coordinate octahedral geometry, a structure where anionic ligand atoms are all on the corners of a common triangular face of octahedron is defined as a facial isomer, while a structure where anionic ligand atoms are all opposite to each other with a metal therebetween is defined as a meridional isomer.

A trans isomer is an isomer having a structure in which ligands X are arranged linearly with a metal therebetween, while a cis isomer is an isomer having a structure in which ligands X are arranged adjacent to each other.

The cis isomer and the trans isomer will next be described specifically with examples. The isomers (a2) and (a3) are cis isomers, while the isomers (b2) and (b3) are trans isomers.

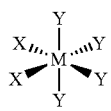

a2

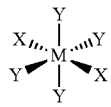

b2

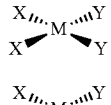

a3

b3

In the invention, it is preferred that the structural isomer (a) is a facial isomer and the structural isomer (b) is a meridional isomer.

The facial isomer and the meridional isomer can be synthesized selectively by using the process as described, for example, in *J. Am. Chem. Soc,* 125(24), 7377-7387 (2003). Even if a mixture of them is prepared, it can be isolated into respective isomers by using column chromatography and their structures can be identified by using $^1$H-NMR or $^{13}$C-NMR.

The bidentate ligand represented by the formula (A) will next be described.

Incidentally, in the formula of the ligand in the invention, the symbol * means a coordination site to a metal and each of the bond between $E_{1a}$ and a metal and the bond between $E_{1q}$ and the metal may independently be a covalent bond or coordination bond.

[Bidentate Ligand Represented by the Formula (A)]

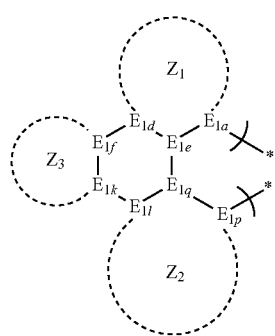
(A)

In the formula (A), each of $E_{1a}$, $E_{1d}$, $E_{1e}$, $E_{1f}$, $E_{1k}$, $E_{1l}$, $E_{1p}$, and $E_{1q}$ independently represents a carbon atom or a hetero atom, each of $Z_1$, $Z_2$, and $Z_3$ independently represents an aromatic ring or aromatic heterocycle, the aromatic ring or aromatic heterocycle may have a substituent, and a skeleton represented by the formula has, in total, a 18π electron structure).

The hetero atom means an atom other than a carbon atom and a hydrogen atom. Examples of the hetero atom include oxygen, nitrogen, phosphorus, sulfur, selenium, and arsenic, of which oxygen, sulfur, and nitrogen atoms are preferred and a nitrogen atom is more preferred.

The bidentate ligand represented by the formula (A) may be coupled to another ligand to form a tridentate or higher-dentate ligand.

$Z_1$ represents a five-membered or six-membered aromatic hydrocarbon ring or heterocycle, more preferably a five-membered heterocycle. Specific examples of the five-membered heterocycle include oxazole, thiazole, isoxazole, isothiazole, pyrrole, imidazole, pyrazole, triazole, and tetrazole. Of these, imidazole and pyrazole are preferred, with imidazole being more preferred. These rings may be condensed with another ring.

$Z_2$ represents a five-membered or six-membered aromatic hydrocarbon ring or heterocycle, more preferably a six-membered ring, still more preferably a six-membered aromatic hydrocarbon ring. Specific examples of $Z_2$ include benzene, oxazole, thiazole, isoxazole, isothiazole, oxadiazole, thiadiazole, furan, thiophene, pyrrole, imidazole, pyrazole, triazole, pyridine, pyrazine, pyrimidine, pyridazine, and triazine. Of these, pyridine and benzene are preferred, and benzene is more preferred. These rings may be condensed with another ring.

$Z_3$ represents a five-membered or six-membered aromatic hydrocarbon ring or heterocycle, more preferably a six-membered ring, still more preferably a six-membered aromatic hydrocarbon ring. Specific examples of $Z_3$ include benzene, oxazole, thiazole, isoxazole, isothiazole, oxadiazole, thiadiazole, furan, thiophene, pyrrole, imidazole, pyrazole, triazole, pyridine, pyrazine, pyrimidine, pyridazine, and triazine. Of these, pyridine and benzene are preferred, and benzene is more preferred. These rings may be condensed with another ring.

The aromatic ring or aromatic heterocycle represented by $Z_1$, $Z_2$, or $Z_3$ may have a substituent. The substituent is selected from a substituent group Z which will be described later and is preferably a hydrocarbon substituent (preferably, a $C_{1-10}$ alkyl group, a cycloalkyl group, or a $C_{6-18}$ aryl group), a cyano group, a fluoro group, $OR_{2a}$, $SR_{2a}$, $NR_{2a}R_{2b}$, $BR_{2a}R_{2b}$, or $SiR_{2a}R_{2b}R_{2c}$, more preferably a hydrogen atom, a hydrocarbon substituent (preferably, a $C_{1-10}$ alkyl group, a cycloalkyl group, or a $C_{6-18}$ aryl group), a cyano group, a fluoro group, $OR_{2a}$, $SR_{2a}$, $NR_{2a}R_{2b}$, or $SiR_{2a}R_{2b}R_{2c}$. Each of $R_{2a}$ to $R_{2c}$ independently represents a hydrocarbon substituent, or a hydrocarbon substituent having at least one carbon atom substituted with a hetero atom. The preferred ranges of $R_{2a}$ to $R_{2c}$ are the same as those of the substituents which may be possessed by the aromatic ring or aromatic heterocycle represented by $Z_1$, $Z_2$, or $Z_3$. At least two of the substituents may be coupled to each other to form a saturated or unsaturated, aromatic or non-aromatic ring. Examples of the ring thus formed include a benzene ring, a pyridine ring, a pyrazine ring, a pyridazine ring, a pyrimidine ring, an imidazole ring, an oxazole ring, a thiazole ring, a pyrazole ring, a pyrrole ring, a thiophene ring, and a furan ring.

These substituents may have a further substituent if possible and examples of the further substituent include substituents selected from the substituent group Z. The preferred ranges of them are the same as those of the substituents which may be possessed by the aromatic ring or aromatic heterocycle represented by $Z_1$, $Z_2$, or $Z_3$.

The term "hydrocarbon substituent" as used herein means a monovalent or divalent and linear, branched or cyclic substituent composed only of a carbon atom and a hydrogen atom.

Examples of the monovalent hydrocarbon substituent include $C_{1-20}$ alkyl groups; $C_{1-20}$ alkyl groups substituted with at least one group selected from $C_{1-20}$ alkyl groups, $C_{3-8}$ cycloalkyl groups, and aryl groups; $C_{3-8}$ cycloalkyl groups; $C_{3-8}$ cycloalkyl groups substituted with at least one group selected from $C_{1-20}$ alkyl groups, $C_{3-8}$ cycloalkyl groups, and aryl groups; $C_{6-18}$ aryl groups; and aryl groups substituted with at least one group selected from $C_{1-20}$ alkyl groups, $C_{3-8}$ cycloalkyl groups, and aryl groups.

Examples of the divalent hydrocarbon group include —$CH_2$—, $CH_2CH_2$—, —$CH_2CH_2CH_2$—, and a 1,2-phenylene group.

The bidentate ligand represented by the formula (A) is preferably represented by the following formula (A1), (A2), (A3), or (A4):

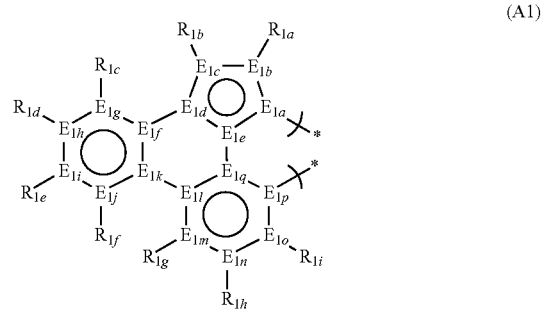
(A1)

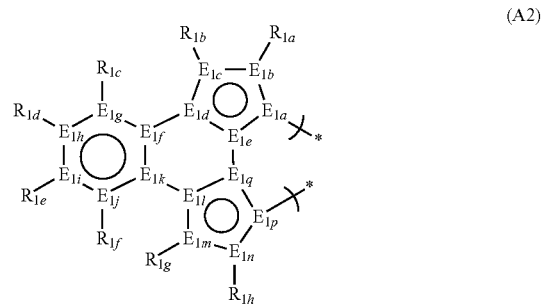
(A2)

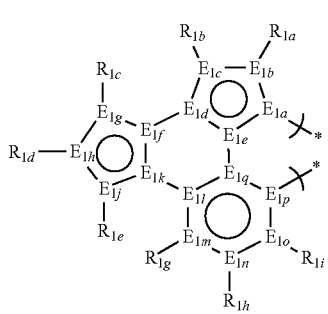

(A3)

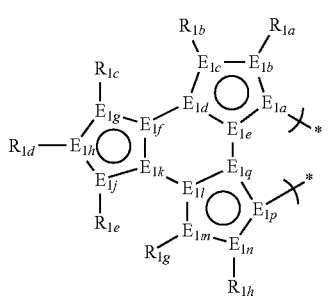

(A4)

wherein, each of $E_{1a}$ to $E_{1q}$ independently represents a carbon atom or a hetero atom, each of $R_{1a}$ to $R_{1i}$ independently represents a hydrogen atom or a substituent, and the skeletons represented by the formulas (A1) to (A4) each has, in total, a 18π electron structure.

Each of $E_{1a}$ to $E_{1q}$ is selected from a carbon atom or a hetero atom. Examples of the hetero atom include oxygen, nitrogen, phosphorus, sulfur, selenium, and arsenic. Of these, oxygen, sulfur, and nitrogen atoms are preferred, with a nitrogen atom being more preferred. Each of $E_{1a}$ to $E_{1q}$ is selected preferably from a carbon atom or a nitrogen atom. $E_{1a}$ and $E_{1p}$ are preferably different from each other. The skeleton has a 18π electron structure.

The five-membered ring formed of $E_{1a}$ to $E_{1e}$ is a five-membered heterocycle. Specific examples of the five-membered heterocycle include oxazole, thiazole, isoxazole, isothiazole, pyrrole, imidazole, pyrazole, triazole, and tetrazole. Of these, oxazole, imidazole, and pyrazole are preferred, imidazole and pyrazole are more preferred, and imidazole is most preferred. These five-membered rings may be condensed with another ring.

It is preferred that at least one of $E_{1a}$ to $E_{1e}$ represents a nitrogen atom; more preferred that two or three of $E_{1a}$ to $E_{1e}$ each represents a nitrogen atom; and especially preferred that two of $E_{1a}$ to $E_{1e}$ each represents a nitrogen atom. When two of $E_{1a}$ to $E_{1e}$ each represents a nitrogen atom, it is preferred that two of $E_{1a}$, $E_{1d}$ and $E_{1e}$ each represents a nitrogen atom; more preferred that $E_{1a}$ and $E_{1d}$ or $E_{1a}$ and $E_{1e}$ represent a nitrogen atom; still more preferably that $E_{1a}$ and $E_{1d}$ represent a nitrogen atom.

The ring formed of $E_{1f}$ to $E_{1k}$ is a five-membered or six-membered aromatic hydrocarbon ring or heterocycle, more preferably a six-membered ring, still more preferably a six-membered aromatic hydrocarbon ring. Specific examples of the ring formed of $E_{1f}$ to $E_{1k}$ include benzene, oxazole, thiazole, isoxazole, isothiazole, oxadiazole, thiadiazole, furan, thiophene, pyrrole, imidazole, pyrazole, triazole, pyridine, pyrazine, pyrimidine, pyridazine, and triazine. Of these, thiophene, pyridine, and benzene are preferred, pyridine and benzene are more preferred, and benzene is most preferred.

The ring formed of $E_{1l}$ to $E_{1q}$ is a five-membered or six-membered aromatic hydrocarbon ring or heterocycle, preferably a six-membered ring, more preferably a six-membered aromatic hydrocarbon ring. Specific examples of the ring formed of $E_{1l}$ to $E_{1q}$ include benzene, oxazole, thiazole, isoxazole, isothiazole, oxadiazole, thiadiazole, furan, thiophene, pyrrole, imidazole, pyrazole, triazole, pyridine, pyrazine, pyrimidine, pyridazine, and triazine. Of these, pyridine and benzene are preferred, with benzene being more preferred.

Each of $R_{1a}$ to $R_{1i}$ independently represents a hydrogen atom or a substituent. The substituent is preferably a group selected from the substituent group Z described below.

Specific examples of substituents belonging to the substituent group Z include alkyl groups, alkenyl groups, alkynyl groups, aryl groups, heteroaryl groups, amino groups, alkoxy groups, aryloxy groups, heterocyclic oxy groups, acyl groups, alkoxycarbonyl groups, aryloxycarbonyl groups, acyloxy groups, acylamino groups, alkoxycarbonylamino groups, aryloxycarbonylamino groups, sulfonylamino groups, sulfamoyl groups, carbamoyl groups, alkylthio groups, arylthio groups, heteroarylthio groups, sulfonyl groups, sulfinyl groups, ureido groups, phosphoric acid amide groups, a hydroxy group, a mercapto group, halogen groups, a cyano group, a sulfo group, a carboxyl group, a nitro group, a hydroxamic acid group, a sulfino group, a hydrazino group, an imino group, and heterocyclic groups other than the heteroaryl groups, silyl groups, silyloxy groups, and deuterium. These substituents may be substituted further with another substituent.

The alkyl groups are preferably $C_{1-30}$, more preferably $C_{1-20}$, especially preferably $C_{1-10}$ alkyl groups. Examples include methyl, ethyl, n-propyl, isopropyl, n-butyl, tert-butyl, n-octyl, n-nonyl, n-decyl, n-dodecyl, n-octadecyl, n-hexadecyl, cyclopropyl, cyclobutyl, cyclopentyl, cyclohexyl, cyclooctyl, 1-adamantyl, and trifluoromethyl.

The alkenyl groups are preferably $C_{2-30}$, more preferably $C_{2-20}$, especially preferably $C_{2-10}$ alkenyl groups. Examples include vinyl, allyl, 1-propenyl, 1-isopropenyl, 1-butenyl, 2-butenyl, and 3-pentenyl.

The alkynyl groups are preferably $C_{2-30}$, more preferably $C_{2-20}$, especially preferably $C_{2-10}$ alkynyl groups. Examples include ethynyl, propargyl, 1-propinyl, and 3-pentynyl.

The term "aryl group" means an aromatic hydrocarbon monoradical. When the aryl group is substituted, preferred examples of the substituent include a fluoro group, a hydrocarbon substituent, a hetero-substituted hydrocarbon substituent, and a cyano group. The aryl groups are preferably $C_{6-30}$, more preferably $C_{6-20}$, especially preferably $C_{6-12}$ aryl groups. Examples include phenyl, o-methylphenyl, m-methylphenyl, p-methylphenyl, 2,6-xylyl, p-cumenyl, mesityl, naphthyl, anthranyl, and biphenyl.

The term "heteroaryl group" means an aromatic heterocyclic monoradical. When it is substituted, preferred examples of the substituent include a fluoro group, a hydrocarbon substituent, a hetero-substituted hydrocarbon substituent, and a cyano group. Examples of the heterocyclic group include imidazolyl, pyrazolyl, pyridyl, pyrazyl, pyrimidyl, triazinyl, quinolyl, isoquinolinyl, pyrrolyl, indolyl, furyl, thienyl, benzoxazolyl, benzimidazolyl, benzthiazolyl, carbazolyl, and azepinyl.

The amino groups are preferably $C_{0-30}$, more preferably $C_{0-20}$, especially preferably $C_{0-10}$ amino groups. Examples include amino, methylamino, dimethylamino, diethylamino, dibenzylamino, diphenylamino, and ditolylamino.

The alkoxy groups are preferably $C_{1-30}$, more preferably $C_{1-20}$, especially preferably $C_{1-10}$ alkoxy groups. Examples include methoxy, ethoxy, butoxy, and 2-ethylhexyloxy.

The aryloxy groups are preferably $C_{6-30}$, more preferably $C_{6-20}$, especially preferably $C_{6-12}$ aryloxy groups. Examples include phenyloxy, 1-naphthyloxy, and 2-naphthyloxy.

The heterocyclic oxy groups are preferably $C_{1-30}$, more preferably $C_{1-20}$, especially preferably $C_{1-12}$ heterocyclic oxy groups. Examples include pyridyloxy, pyrazyloxy, pyrimidyloxy, and quinolyloxy.

The acyl groups are preferably $C_{2-30}$, more preferably $C_{2-20}$, especially preferably $C_{2-12}$ acyl groups. Examples include acetyl, benzoyl, formyl, and pivaloyl.

The alkoxycarbonyl groups are preferably $C_{2-30}$, more preferably $C_{2-20}$, especially preferably $C_{2-12}$ alkoxycarbonyl groups. Examples include methoxycarbonyl and ethoxycarbonyl.

The aryloxycarbonyl groups are preferably $C_{7-30}$, more preferably $C_{7-20}$, especially preferably $C_{7-12}$ aryloxycarbonyl groups. Examples include phenyloxycarbonyl.

The acyloxy groups are preferably $C_{2-30}$, more preferably $C_{2-20}$, especially preferably $C_{2-10}$ acyloxy groups. Examples include acetoxy and benzoyloxy.

The acylamino groups are preferably $C_{2-30}$, more preferably $C_{2-20}$, especially preferably $C_{2-10}$ acylamino groups. Examples include acetylamino and benzoylamino.

The alkoxycarbonylamino groups are preferably $C_{2-30}$, more preferably $C_{2-20}$, especially preferably $C_{2-12}$ alkoxycarbonylamino groups. Examples include methoxycarbonylamino.

The aryloxycarbonylamino groups are preferably $C_{7-30}$, more preferably $C_{7-20}$, especially preferably $C_{7-12}$ aryloxycarbonylamino groups. Examples include phenyloxycarbonylamino.

The sulfonylamino groups are preferably $C_{1-30}$, more preferably $C_{1-20}$, especially preferably $C_{1-12}$ sulfonylamino groups. Examples include methanesulfonylamino and benzenesulfonylamino.

The sulfamoyl groups are preferably $C_{0-30}$, more preferably $C_{0-20}$, especially preferably $C_{0-12}$ sulfamoyl groups. Examples include sulfamoyl, methylsulfamoyl, dimethylsulfamoyl, and phenylsulfamoyl.

The carbamoyl groups are preferably $C_{1-30}$, more preferably $C_{1-20}$, especially preferably $C_{1-12}$ carbamoyl groups. Examples include carbamoyl, methylcarbamoyl, diethylcarbamoyl, and phenylcarbamoyl.

The alkylthio groups are preferably $C_{1-30}$, more preferably $C_{1-20}$, especially preferably $C_{1-12}$ alkylthio groups. Examples include methylthio and ethylthio.

The arylthio groups are preferably $C_{6-30}$, more preferably $C_{6-20}$, especially preferably $C_{6-12}$ arylthio groups. Examples include phenylthio.

The heteroarylthio groups are preferably $C_{1-30}$, more preferably $C_{1-20}$, especially preferably $C_{1-12}$ heteroarylthio groups. Examples include pyridylthio, 2-benzimidazolylthio, 2-benzoxazolylthio, and 2-benzthiazolylthio.

The sulfonyl groups are preferably $C_{1-30}$, more preferably $C_{1-20}$, especially preferably $C_{1-12}$ sulfonyl groups. Examples include mesyl, tosyl, and trifluoromethanesulfonyl.

The sulfinyl groups are preferably $C_{1-30}$, more preferably $C_{1-20}$, especially preferably $C_{1-12}$ sulfinyl groups. Examples include methanesulfinyl and benzenesulfinyl.

The ureido groups are preferably $C_{1-30}$, more preferably $C_{1-20}$, especially preferably $C_{1-12}$ ureido groups. Examples include ureido, methylureido, and phenylureido.

The phosphoric acid amide groups are preferably $C_{1-30}$, more preferably $C_{1-20}$, especially preferably $C_{1-12}$ phosphoric acid amide groups. Examples include diethylphosphoric acid amide and phenylphosphoric acid amide.

Examples of the halogen atoms include fluorine, chlorine, bromine, and iodine atoms.

The heterocyclic groups other than the heteroaryl groups are preferably $C_{1-30}$, more preferably $C_{1-12}$ heterocyclic groups other than the heteroaryl groups and having, as a heteroatom, a nitrogen atom, an oxygen atom, or a sulfur atom. Specific examples include piperidyl, morpholino, and pyrrolidyl.

The silyl groups are preferably $C_{3-40}$, more preferably $C_{3-30}$, especially preferably $C_{3-24}$ silyl groups. Examples include trimethylsilyl, triethylsilyl, triisopropylsilyl, dimethyl-tert-butylsilyl, dimethylphenylsilyl, diphenyl-tert-butylsilyl, triphenylsilyl, tri-1-naphthylsilyl, and tri-2-naphthylsilyl.

The silyloxy groups are preferably $C_{3-40}$, more preferably $C_{3-30}$, especially preferably $C_{3-24}$ silyloxy groups. Examples include trimethylsilyloxy and triphenylsilyloxy.

Each of $R_{1a}$ to $R_{1i}$ represents preferably a hydrogen atom, a hydrocarbon substituent (preferably, a $C_{1-10}$ alkyl group, a cycloalkyl group, or a $C_{6-18}$ aryl group), a cyano group, a fluoro group, $OR_{2a}$, $SR_{2a}$, $NR_{2a}R_{2b}$, $BR_{2a}R_{2b}$, or $SiR_{2a}R_{2b}R_{2c}$, more preferably a hydrogen atom, a hydrocarbon substituent (preferably, a $C_{1-10}$ alkyl group, a cycloalkyl group, or a $C_{6-18}$ aryl group), a cyano group, a fluoro group, $OR_{2a}$, $SR_{2a}$, $NR_{2a}R_{2b}$, or $SiR_{2a}R_{2b}R_{2c}$; most preferably a hydrogen atom, a $C_{1-10}$ alkyl group, or a $C_{6-18}$ aryl group. Each of $R_{2a}$ to $R_{2c}$ independently represents a hydrocarbon substituent, or a hydrocarbon substituent having at least one carbon atom substituted with a hetero atom. The preferred ranges of $R_{2a}$ to $R_{2c}$ are the same as those of the hydrocarbon substituents represented by $R_{1a}$ to $R_{1i}$. The hetero atom is preferably an oxygen, sulfur, or nitrogen atom, more preferably a nitrogen atom. Two of $R_{1a}$ to $R_{1i}$ and $R_{2a}$ to $R_{2c}$ may be coupled to each other to form a saturated or unsaturated, aromatic or non-aromatic ring. Examples of the ring thus formed include a benzene ring, a pyridine ring, a pyrazine ring, a pyridazine ring, a pyrimidine ring, an imidazole ring, an oxazole ring, a thiazole ring, a pyrazole ring, a pyrrole ring, a thiophene ring, and a furan ring.

These substituents may have a further substituent if possible and examples of the further substituent include substituents selected from the substituent group Z. The preferred ranges of them are the same as those of $R_{1a}$ to $R_{1i}$.

When it is coupled to a nitrogen atom, none of $R_{1a}$ to $R_{1i}$ exists.

At least one of $R_{1a}$ to $R_{1i}$ is preferably an aryl group having a dihedral angle of 70 degrees or greater with its basic structure, more preferably a substituent represented by the below-described formula ss-1, still more preferably a 2,6-disubstituted aryl group. It is most preferred that $R_{1b}$ is a 2,6-disubstituted aryl group.

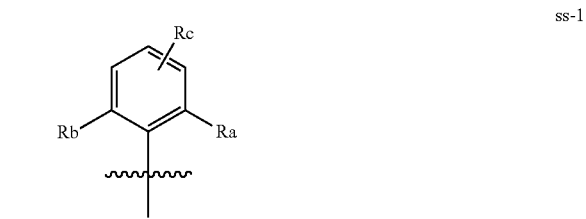

ss-1

In the formula ss-1, each of Ra, Rb, and Rc independently represents any of a hydrogen atom, an alkyl group, and an aryl group, and the number of Rcs is from 0 to 3.

The alkyl group represented by Ra, Rb, or Rc is preferably a $C_{1-30}$, more preferably $C_{1-20}$, especially preferably $C_{1-10}$ alkyl group. Examples include methyl, ethyl, n-propyl, isopropyl, n-butyl, tert-butyl, n-octyl, n-nonyl, n-decyl, n-dodecyl, n-octadecyl, n-hexadecyl, cyclopropyl, cyclobutyl, cyclopentyl, cyclopentyl, cyclohexyl, cyclooctyl, 1-adamantyl, and trifluoromethyl. Of these, methyl and isopropyl groups are preferred.

The aryl group represented by Ra, Rb, or Rc is preferably a $C_{6-30}$, more preferably $C_{6-20}$ especially preferably $C_{6-12}$ aryl group. Examples include phenyl, o-methylphenyl, m-methylphenyl, p-methylphenyl, 2,6-xylyl, p-cumenyl, mesityl, naphthyl, and anthranyl. Of these, phenyl, 2,6-xylyl, and mesityl groups are preferred, with a phenyl group being more preferred.

At least one of Ra and Rb is selected preferably from the alkyl groups and the aryl groups. It is preferred that at least one of Ra and Rb is selected from the alkyl groups, more preferred that both of Ra and Rb are selected from the alkyl groups, most preferred that both of Ra and Rb are methyl groups or isopropyl groups.

The 2,6-disubstituted aryl group is preferably a 2,6-dimethylphenyl group, a 2,4,6-trimethylphenyl group, a 2,6-diisopropylphenyl group, a 2,4,6-triisopropylphenyl group, a 2,6-dimethyl-4-phenylphenyl group, a 2,6-dimethyl-4-(2,6-dimethylpyridin-4-yl)phenyl group, a 2,6-diphenylphenyl group, a 2,6-diphenyl-4-isopropylphenyl group, a 2,4,6-triphenylphenyl group, a 2,6-diisopropyl-4-(4-isopropylphenyl)phenyl group, a 2,6-diisopropyl-4-(3,5-dimethylphenyl)phenyl group, a 2,6-diisopropyl-4-(pyridin-4-yl)phenyl group, or a 2,6-di-(3,5-dimethylphenyl)phenyl group.

The number of Rcs is preferably 0 or 1. When there is a plurality of Rcs, they may be the same or different.

It is preferred that at least one of $R_{1a}$ to $R_{1i}$ is the alkyl group, more preferred that $R_{1e}$ is the alkyl group. The alkyl group is preferably composed of four or more carbon atoms and branched at a site distant from the benzyl position, more preferably a methyl group or neopentyl group, still more preferably a neopentyl group.

It is preferred that at least one of $R_{1a}$ and $R_{1b}$ is an electron donating group; more preferably $R_{1a}$ represents an electron donating substituent, still more preferably $R_{1a}$ represents a methyl group.

The metal which the phosphorescent metal complex has in the invention is preferably a metal having an atomic weight of 40 or greater and belonging to groups from VIII to X of the periodic table. In addition, it is preferably a nonradioactive metal. The metal which the phosphorescent metal complex has in the invention is more preferably any of Re, Ru, Os, Rh, Ir, Pd, Pt, Cu, or Au, still more preferably any of Os, Ir, or Pt, especially preferably Ir or Pt. From the standpoint of high emission efficiency, high complex stability, and controllability of a carrier balance in hole/electron transport in the light emitting layer, Ir is most preferred.

In the invention, the metal complex having the ligand of the formula may be composed of a main ligand or tautomer thereof and an ancillary ligand or tautomer thereof; or all the ligands of the metal complex may be composed only of a partial structure represented by the main ligand or tautomer thereof.

The metal complex may have, as an ancillary ligand, ligands which are used for the formation of conventionally known metal complexes and are known, as a so-called ligand, to those skilled in the art (which may also be called "coordination compounds") if necessary.

In order to successfully gain the advantage described in the invention, the complex contains preferably one or two ligands, more preferably one ligand. Using two ligands is also preferred from the standpoint of ease of synthesis.

As the ligands used for conventionally known metal complexes, there are various known ligands. Examples include those described in H. Yersin, *Photochemistry and Photophysics of Coordination Compounds*, Springer-Verlag A. G. (1987) and Akio Yamamoto, *Organometallic Chemistry—Fundamental and Application*—Shokabo Publishing Co., Ltd. (1982), for example, halogen ligands (preferably a chlorine ligand), a cyano ligand, a phosphine ligand, nitrogen-containing heteroaryl ligands (such as bipyridyl and phenanthroline), and diketone ligands (such as acetylacetone). Of these, the diketones and picolinic acid derivatives are preferred.

The following are specific examples of the ancillary ligand but the invention is not limited thereto.

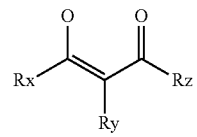

(I-1)

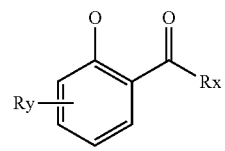

(I-2)

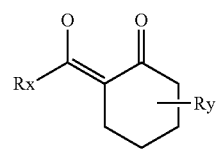

(I-3)

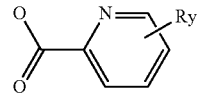

(I-4)

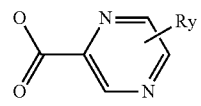

(I-5)

(I-6)

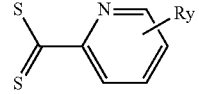

(I-7)

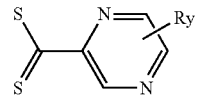

(I-8)

(I-9)

-continued

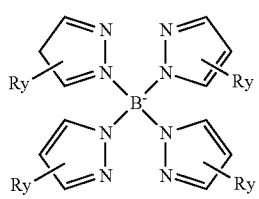
(I-10)

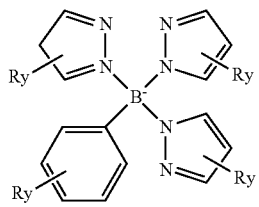
(I-11)

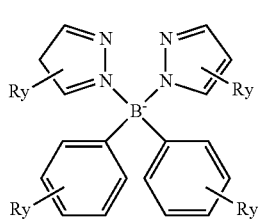
(I-12)

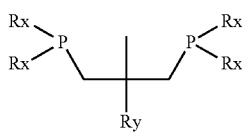
(I-13)

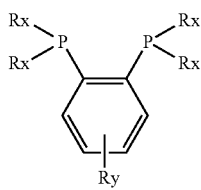
(I-14)

wherein, each of Rx, Ry, and Rz independently represents a hydrogen atom or a substituent.

Preferably, each of Rx and Ry independently represents any of alkyl groups, perfluoroalkyl groups, halogen atoms, and aryl groups, more preferably a $C_{1-4}$ alkyl group, a $C_{1-4}$ perfluoroalkyl group, a fluorine atom, or a phenyl group which may be substituted, most preferably, a methyl group, an ethyl group, a trifluoromethyl group, a fluorine atom, or a phenyl group. Ry represents preferably any of a hydrogen atom, alkyl groups, perfluoroalkyl groups, halogen atoms, and aryl groups, more preferably a hydrogen atom, a $C_{1-4}$ alkyl group, or a substituted or unsubstituted phenyl group, most preferably either a hydrogen atom or a methyl group. These ancillary ligands are not the sites on which electrons are concentrated due to electron transport or excitation in the device so that Rx, Ry, and Rz are only required to have chemical stability and have no influence on the advantage of the invention.

The bidentate ligand represented by any of the formulas (A1) to (A4) is preferably represented by the formula (A1) or (A3).

The bidentate ligand represented by the formula (A1) or (A3) is preferably a monoanionic bidentate ligand represented by the following formula (A1-1) or (A3-1).

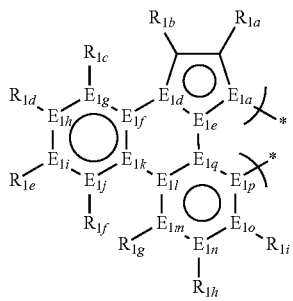
(A1-1)

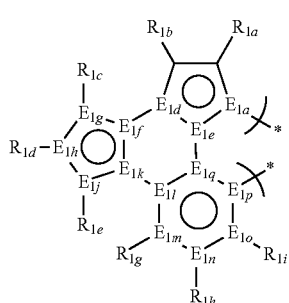
(A3-1)

wherein, each of $E_{1a}$, $E_{1d}$, and $E_{1e}$ to $E_{1q}$ independently represents a carbon atom or a hetero atom and each of $R_{1a}$ to $R_{1i}$ independently represents a hydrogen atom or a substituent; and the skeleton represented by the formula (A1-1) or the formula (A3-1) has, in total, a 18π electron structure.

In the formulas (A1-1) and (A3-1), preferred examples of $E_{1a}$, $E_{1d}$, $E_{1e}$ to $E_{1q}$, and $R_{1a}$ to $R_{1i}$ are the same as those of $E_{1a}$, $E_{1d}$, $E_{1e}$ to $E_{1q}$, and $R_{1a}$ to $R_{1i}$ defined in the formulas (A1) and (A3).

In the invention, the monoanionic bidentate ligands represented by the formula (A1-1) are more preferred.

The bidentate ligands represented by the formula (A1-1) or (A3-1) are preferably monoanionic bidentate ligands represented by the following formula (A1-2) or (A3-2).

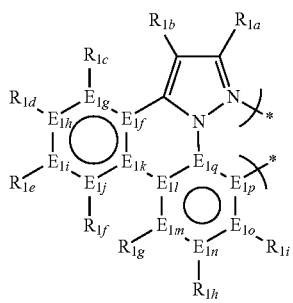
(A1-2)

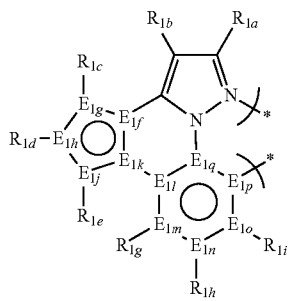
(A3-2)

wherein, each of $E_{1f}$ to $E_{1q}$ independently represents a carbon atom or a hetero atom; each of $R_{1a}$ to $R_{1i}$ independently represents a hydrogen atom or a substituent; and the skeleton represented by the formula (A1-2) or the formula (A3-2) has, in total, a 18π electron structure.

In the formulas (A1-2) and (A3-2), preferred examples of $E_{1f}$ to $E_{1q}$, and $R_{1a}$ to $R_{1i}$ are the same as those of $E_{1f}$ to $E_{1q}$, and $R_{1a}$ to $R_{1i}$ defined in the formulas (A1-1) and (A3-1).

The monoanionic bidentate ligand represented by the formula (A1-1) or (A3-1) is more preferably a monoanionic bidentate ligand represented by the formula (A1-3) or (A3-3).

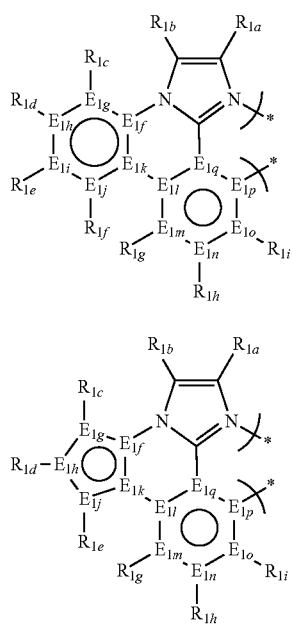

(A1-3)

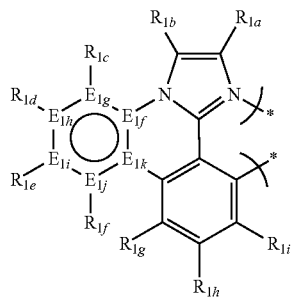

(A3-3)

wherein, each of $E_{1f}$ to $E_{1q}$ independently represents a carbon atom or a hetero atom; each of $R_{1a}$ to $R_{1i}$ independently represents a hydrogen atom or a substituent; and the skeleton represented by the formula (A1-3) or (A3-3) has, in total, a 18π electron structure.

In the formulas (A1-3) and (A3-3), preferred examples of $E_{1f}$ to $E_{1q}$ and $R_{1a}$ to $R_{1i}$ are the same as those of $E_{1f}$ to $E_{1q}$ and $R_{1a}$ to $R_{1i}$ defined in the formulas (A1-1) and (A2-1).

The monoanionic bidentate ligand represented by the formula (A1-3) or (A3-3) is more preferably a monoanionic bidentate ligand represented by the formula (A1-4) or (A3-4).

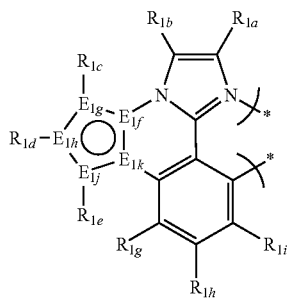

(A1-4)

(A3-4)

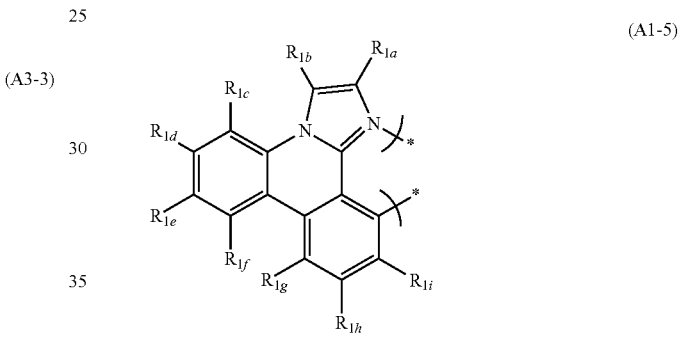

wherein, each of $E_{1f}$ to $E_{1k}$ independently represents a carbon atom or a hetero atom; each of $R_{1a}$ to $R_{1i}$ independently represents a hydrogen atom or a substituent; and the skeleton represented by the formula (A1-4) or (A3-4) has, in total, a 18π electron structure.

The monoanionic bidentate ligand represented by the formula (A1-4) or (A3-4) is preferably a monoanionic bidentate ligand represented by the formula (A1-5).

(A1-5)

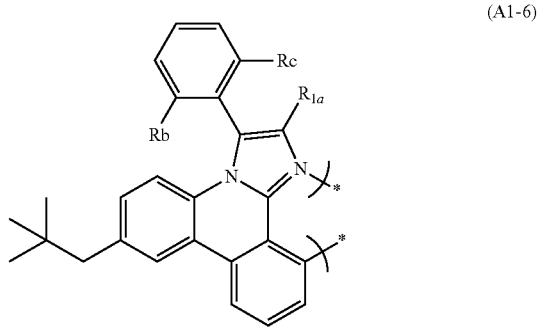

wherein, each of $R_{1a}$ to $R_{1i}$ independently represents a hydrogen atom or a substituent.

In the formula (A1-5), preferred examples of $R_{1a}$ to $R_{1i}$ are the same as those of $R_{1a}$ to $R_{1i}$ in the formula (A1-3).

In order to suppress steric hindrance due to a substituent and keep chemical stability of the ligand, each of $R_{1c}$, $R_{1f}$, and $R_{1i}$ preferably represents a hydrogen atom.

The bidentate ligand represented by the formula (A1-5) is preferably a bidentate ligand represented by the following formula (A1-6):

(A1-6)

wherein, $R_{1a}$ represents a hydrogen atom or a substituent; each of Rb and Rc independently represents a hydrogen atom, an alkyl group, or an aryl group.

In the formula (A1-6), preferred examples of $R_{1a}$ are the same as those of $R_{1a}$ in the formula (A1-1) and preferred examples of Rb and Rc are the same as those of Rb and Rc in the formula ss-1.

In the invention, the phosphorescent metal complex containing a monoanionic bidentate ligand represented by the formula (A) and a metal having an atomic weight of 40 or greater is preferably a phosphorescent metal complex represented by the following formula (A10).

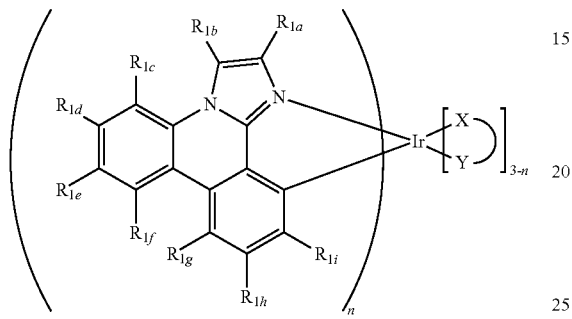

(A10)

wherein, each of $R_{1a}$ to $R_{1i}$ independently represents a hydrogen atom or a substituent; X—Y represents at least one monoanionic bidentate ligand selected from the above-described (1-1) to (1-14); and n stands for an integer from 1 to 3.

In the formula (A10), preferred examples of $R_{1a}$ to $R_{1i}$ are the same as those of $R_{1a}$ to $R_{1i}$ in the formula (A1).

X—Y is preferably an acetylacetonate ligand or a substituted acetylacetonate ligand.

From the standpoint of synthesis ease, n is preferably 3, but it is also preferred to set n to 1 or 2 and replace the remaining one or two with an inexpensive ancilliary ligand from the standpoint of cost reduction.

When n stands for 3, the formula (A10) is represented by the following formula

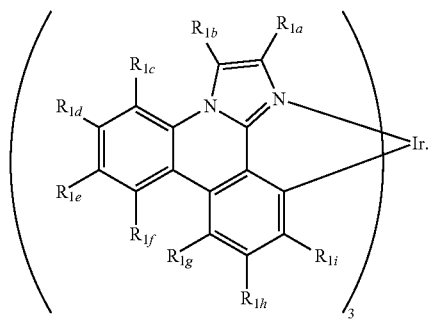

(A10-1)

wherein, each of $R_{1a}$ to $R_{1i}$ independently represents a hydrogen atom or a substituent.

In the formula (A10-1), preferred examples of $R_{1a}$ to $R_{1i}$ are the same as those of $R_{1a}$ to $R_{1i}$ in the formula (A1).

The phosphorescent metal complex represented by the formula (A10) is especially preferably represented by the following formula (A11-1), (A11-2), or (A11-3).

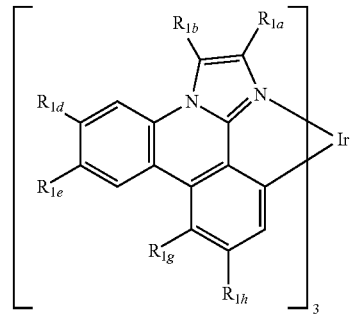

(A11-1)

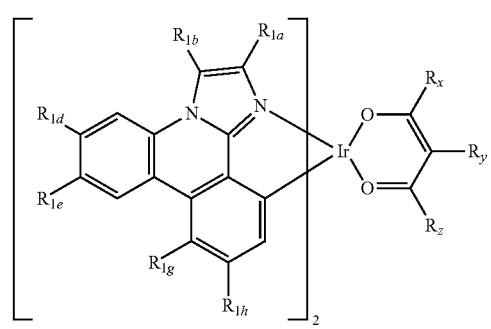

(A11-2)

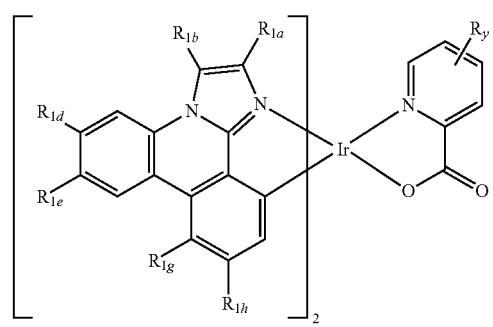

(A11-3)

wherein, each of $R_{1a}$, $R_{1b}$, $R_{1d}$, $R_{1e}$, $R_{1g}$, and $R_{1h}$ independently represents a hydrogen atom, an alkyl group, a cycloalkyl group, an aryl group, a cyano group, a fluoro group, —$OR_{2a}$, —$SR_{2a}$, —$NR_{2a}R_{2b}$, —$BR_{2a}R_{2b}$, or —$SiR_{2a}R_{2b}R_{2c}$. Each of $R_{2a}$ to $R_{2c}$ independently represents a hydrocarbon substituent or a hetero-substituted hydrocarbon substituent. Each of Rx and Rz independently represents any of alkyl groups, perfluoroalkyl groups, halogen atoms, and aryl groups and Ry represents any of a hydrogen atom, alkyl groups, perfluoroalkyl groups, halogen atoms, and aryl groups.

In the formulas (A11-1), (A11-2), and (A11-3), each of $R_{1a}$ to $R_h$ independently represents a hydrogen atom, an alkyl group, a cycloalkyl group, an aryl group, a cyano group, a fluoro group, —$OR_{2a}$, —$SR_{2a}$, —$NR_{2a}R_{2b}$, —$BR_{2a}R_{2b}$, or —$SiR_{2a}R_{2b}R_{2c}$. Each of $R_{2a}$ to $R_{2c}$ independently represents a hydrocarbon substituent or a hetero-substituted hydrocarbon substituent. Each of $R_{1a}$ to $R_h$ preferably represents a hydrogen atom, an alkyl group (preferably, $C_{1-10}$), a cycloalkyl group, an aryl group (preferably, $C_{6-18}$), a cyano group, a fluoro group, —$OR_{2a}$, —$SR_{2a}$, —$NR_{2a}R_{2b}$, or —$SiR_{2a}R_{2b}R_{2c}$. Each of $R_{2a}$ to $R_{2c}$ preferably represents an alkyl group (preferably, $C_{1-10}$), a cycloalkyl group, or an aryl group (preferably, $C_{6-18}$). The hetero atom is preferably an oxygen, sulfur, or nitrogen atom, more preferably a nitrogen atom.

Each of Rx and Rz independently represents any of alkyl groups (preferably $C_{1-6}$), perfluoroalkyl groups (preferably $C_{1-6}$), halogen atoms and aryl groups (preferably, $C_{6-18}$). Ry represents any of a hydrogen atom, alkyl groups (preferably $C_{1-6}$), perfluoroalkyl groups (preferably $C_{1-6}$), halogen atoms, and aryl groups (preferably, $C_{6-18}$).

More specifically, the bidentate ligand represented by the formula (A) has preferably any of the structures shown below. Of these, structures (X-64) to (X-68) are most preferred.

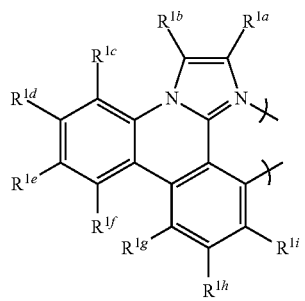

X-1

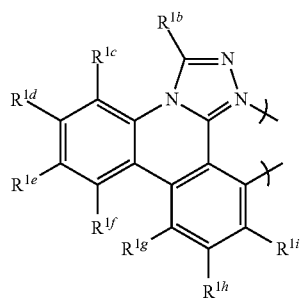

X-2

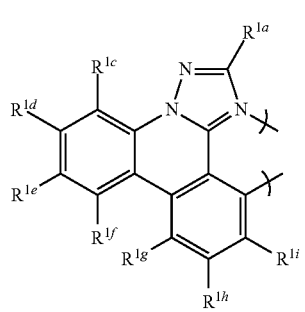

X-3

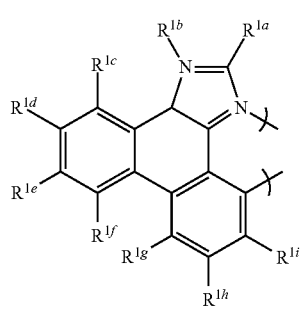

X-4

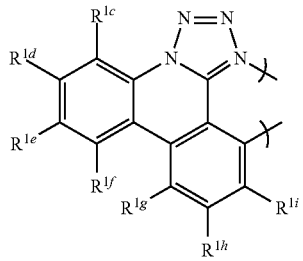

X-5

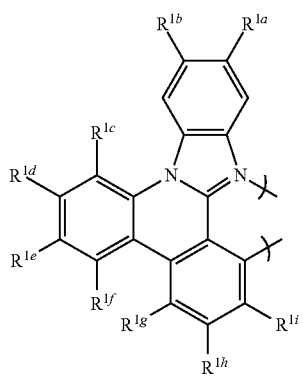

X-6

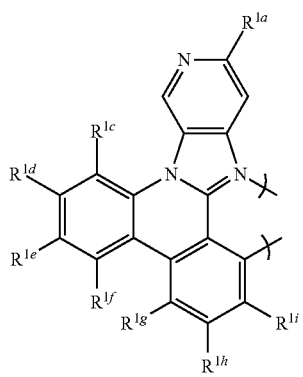

X-7

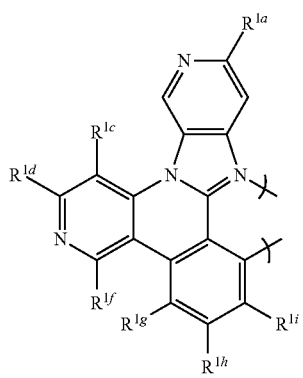

X-8

-continued
X-9
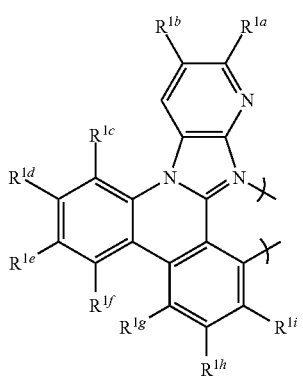
X-10
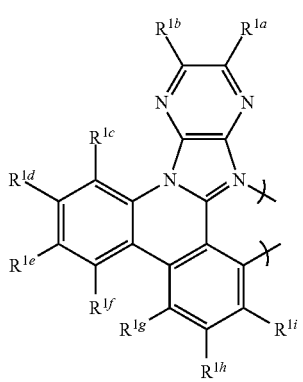
X-11
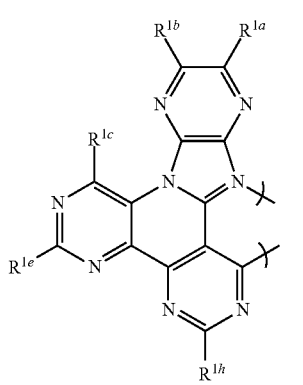
X-12
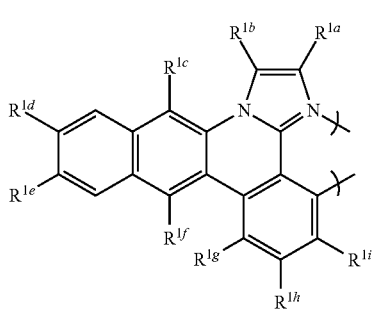
X-13
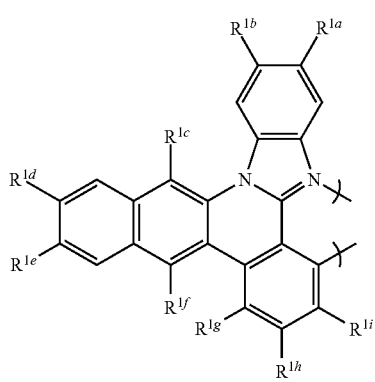
X-14
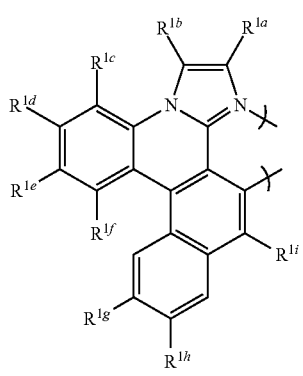
X-15
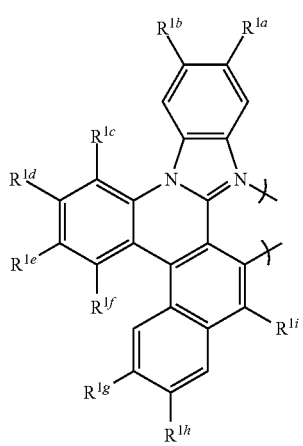
X-16
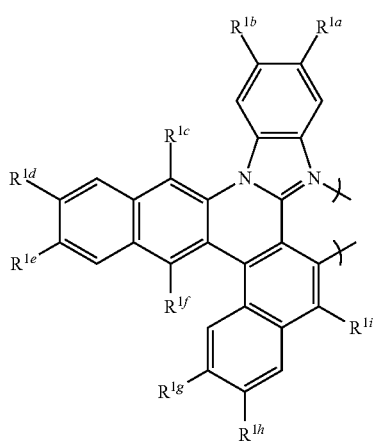

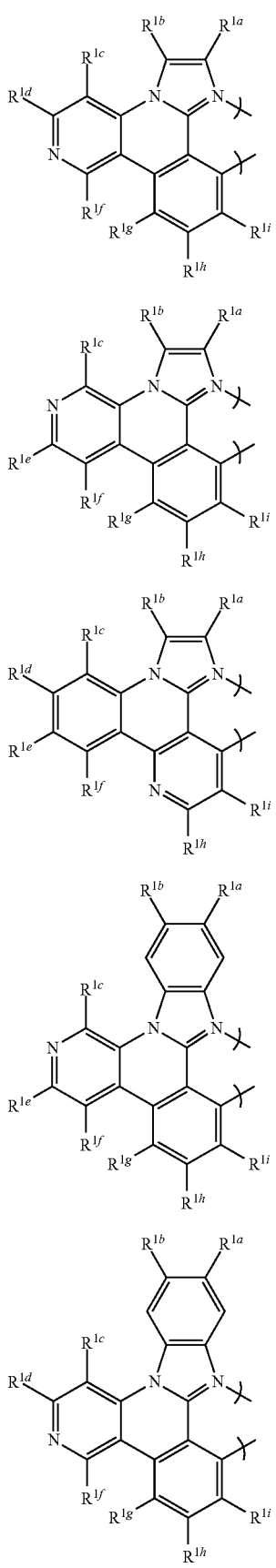
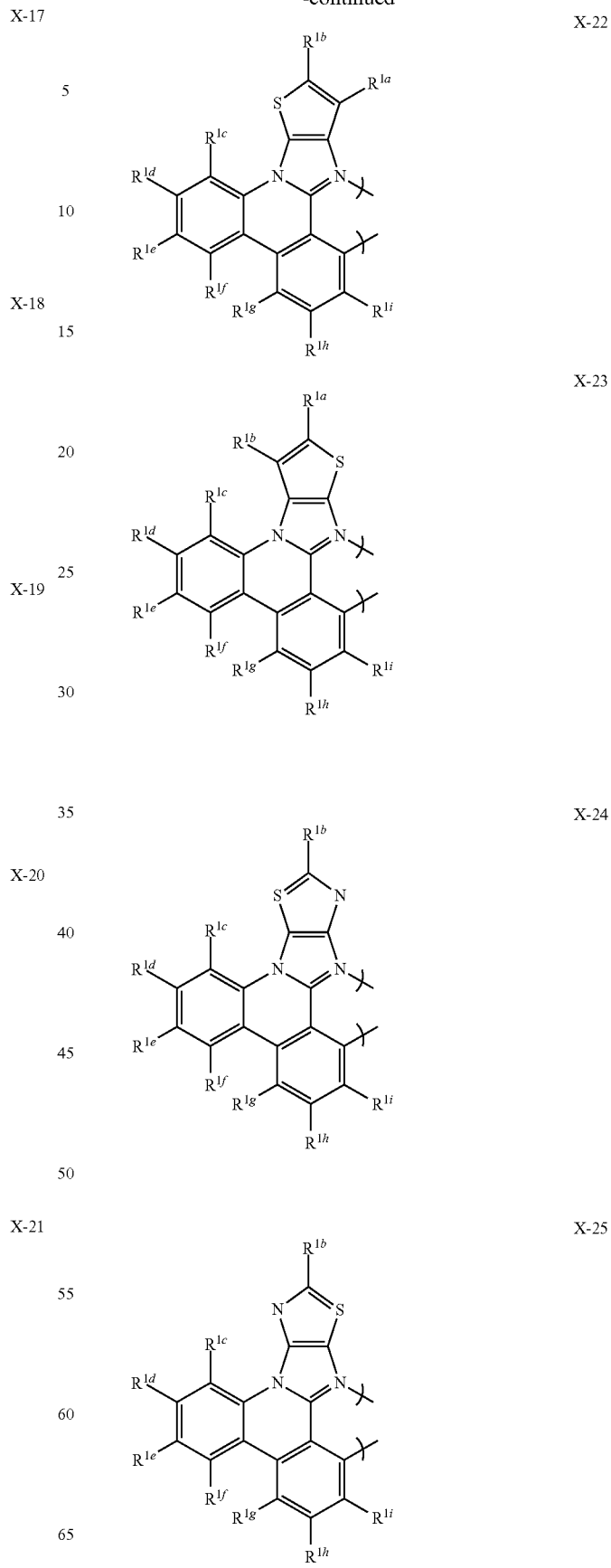

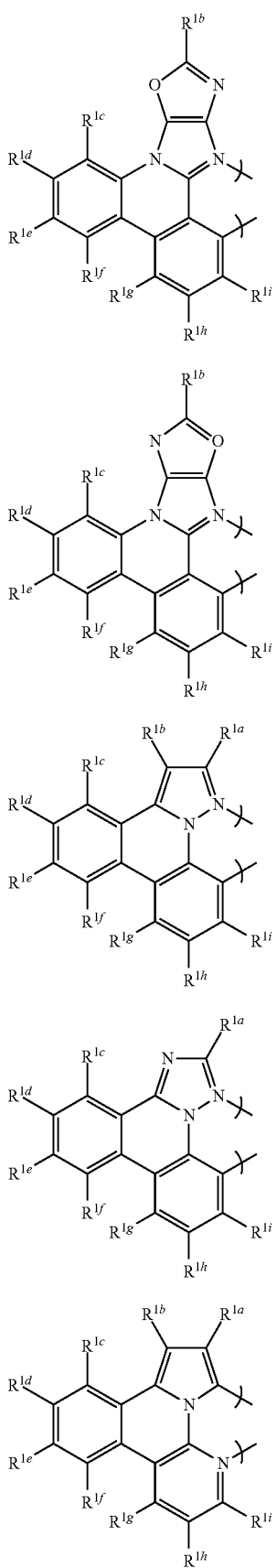
X-26
X-27
X-28
X-29
X-30
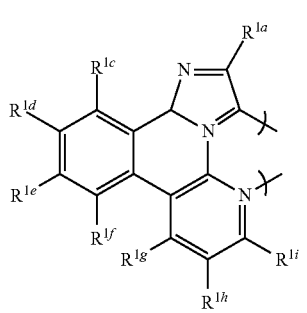
X-31
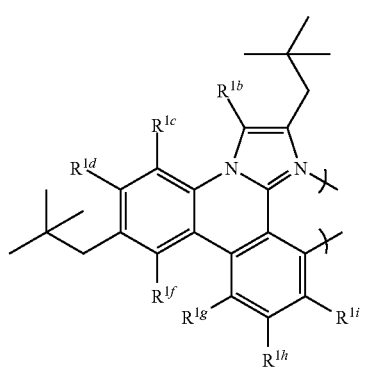
X-32
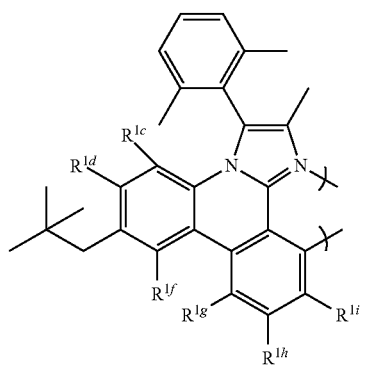
X-33
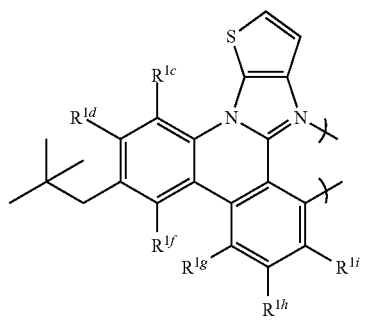
X-34

X-35 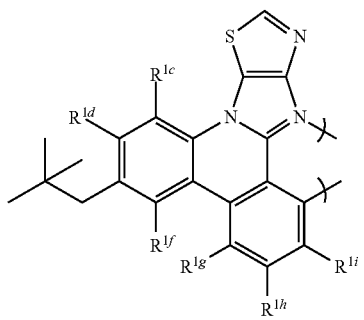
X-39 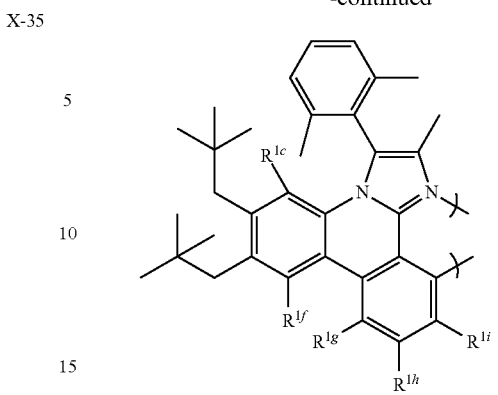
X-36 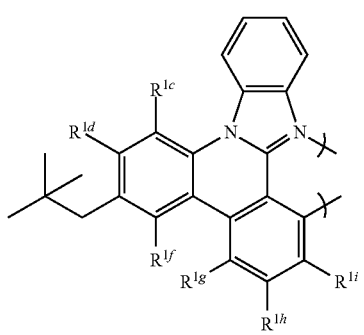
X-40 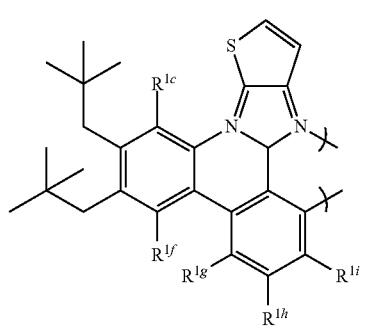
X-37 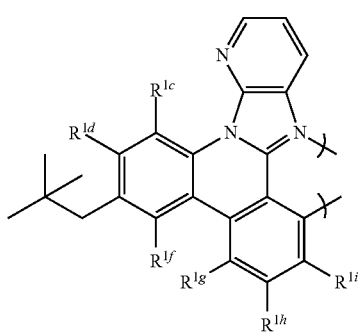
X-41 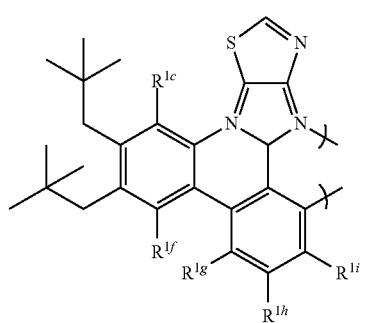
X-38 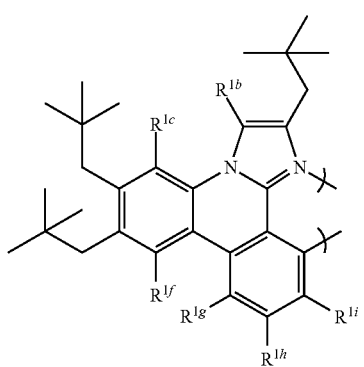
X-42 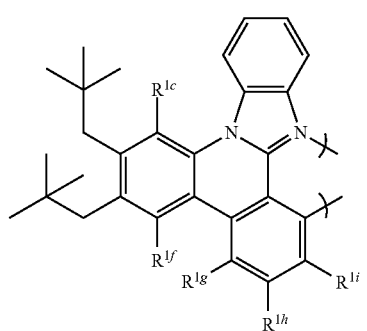

-continued
X-43
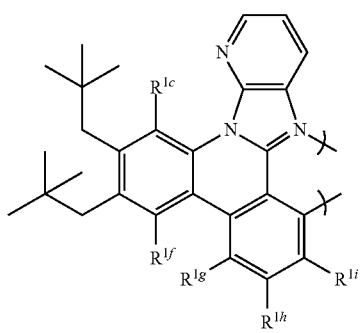
X-44
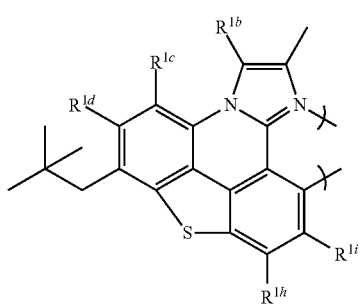
X-45
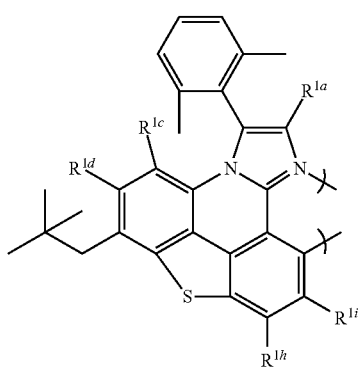
X-46
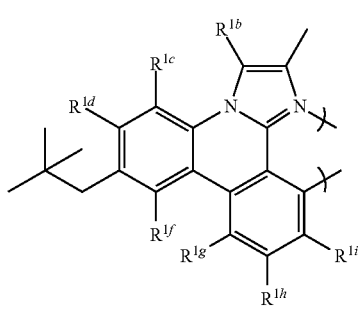
X-47
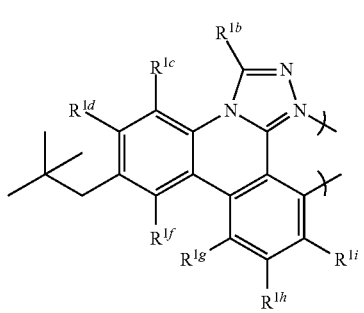
-continued
X-48
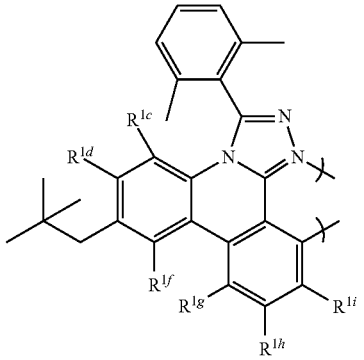
X-49
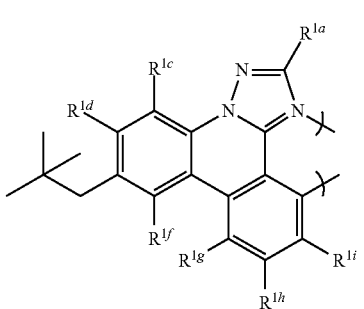
X-50
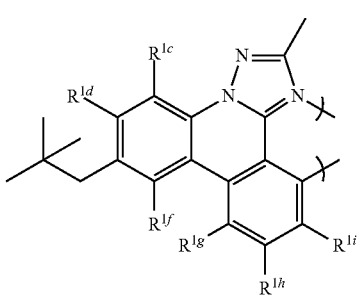
X-51
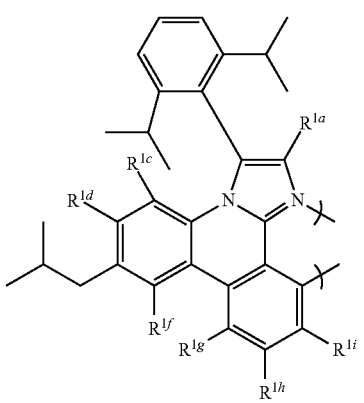

X-52 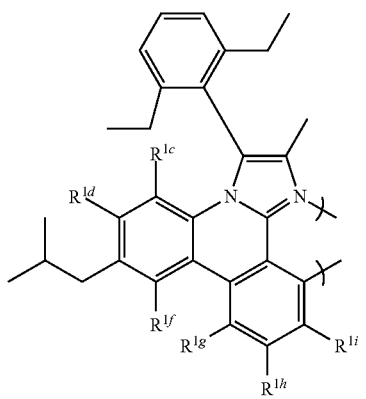
X-53 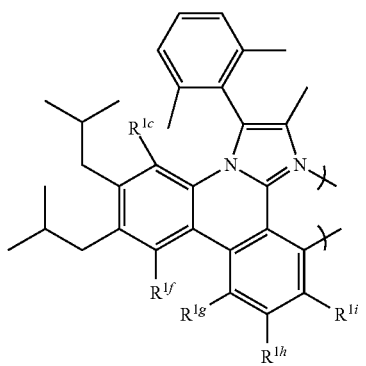
X-54 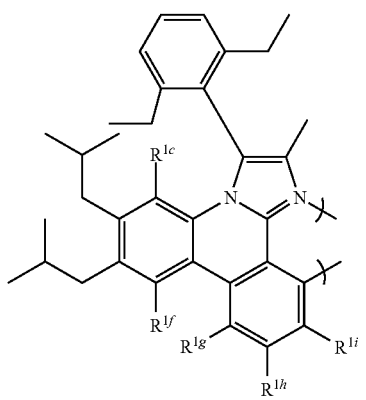
X-55 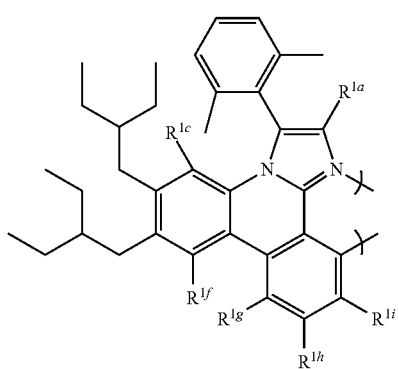
X-56 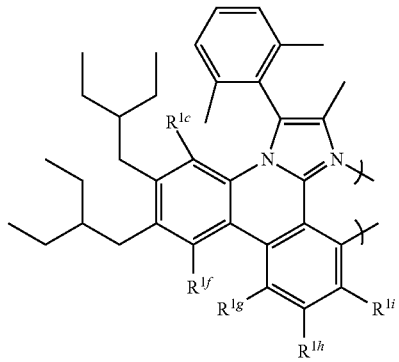
X-57 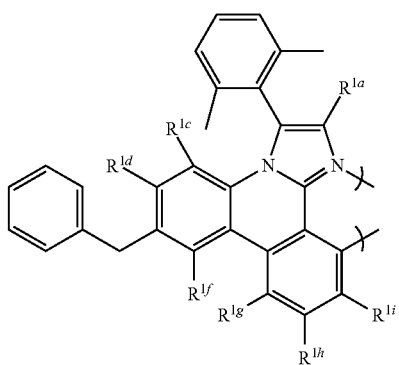
X-58 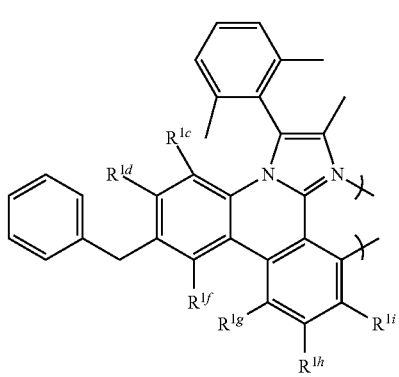
X-59 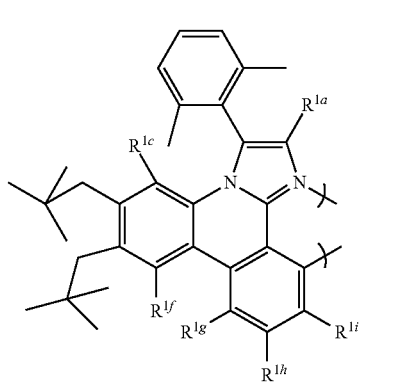

X-60
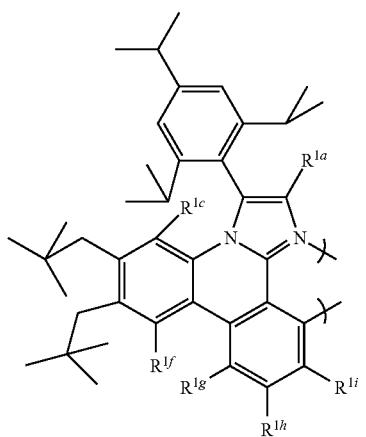
X-61
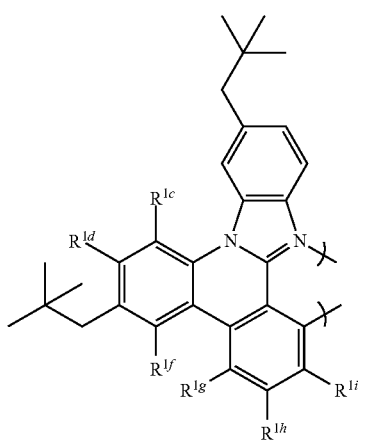
X-62
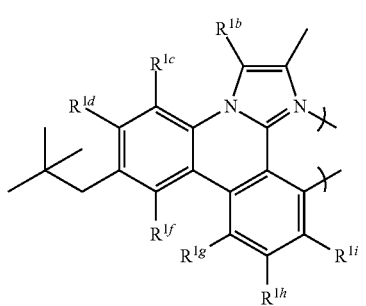
X-63
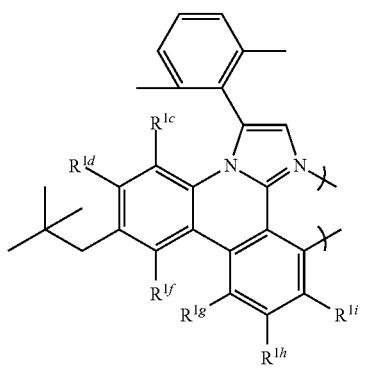
X-64
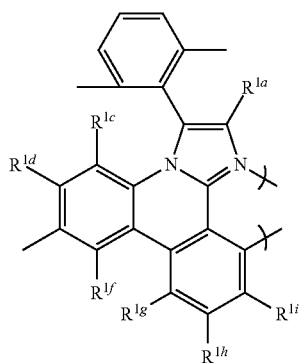
X-65
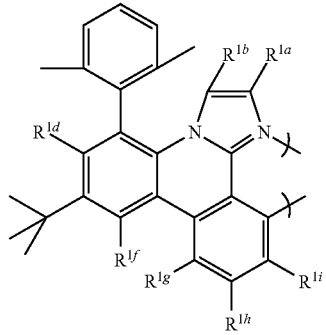
X-66
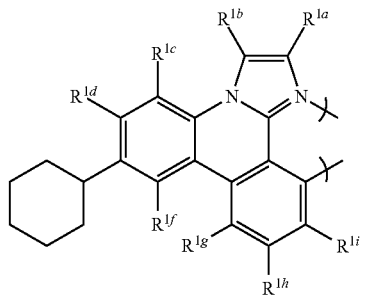
X-67
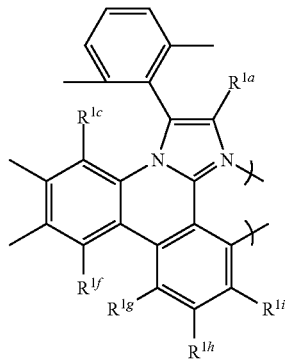

X-68

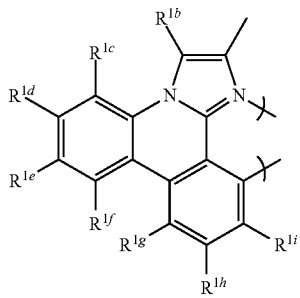

$R^{1a}$ to $R^{1i}$ have the same meanings as $R^{1a}$ to $R^{1i}$ defined in the formula (A1). Preferred examples of them are also the same as those in the formula (A1). It is preferred that all of $R^{1a}$ to $R^{1i}$ represent a hydrogen atom.

The phosphorescent metal complex containing the monoanionic bidentate ligand represented by any of the formulas (A1) to (A4) and a metal having an atomic weight of 40 or greater can be synthesized by various processes such as those described in US2007/0190359 or US2008/0297033.

For example, it can be obtained by cooling, to a temperature not greater than room temperature, or heating (not only ordinary heating but also heating with microwaves is also effective) a ligand or dissociate thereof and a metal compound in a solvent (such as halogen solvent, alcohol solvent, ether solvent, ester solvent, ketone solvent, nitrile solvent, amide solvent, sulfone solvent, sulfoxide solvent, or water) or in a solventless manner in the presence or absence of a base (various inorganic or organic bases such as sodium methoxide, t-butoxy potassium, triethylamine, and potassium carbonate). More specifically, X-64 can be synthesized by a process described in paragraphs [0132] to [0134] of US2007/0190359 while using 7-methylimidazophenanthridine as a starting raw material. XM-63 can be synthesized by a process described in paragraphs [0281] to [0287] of US2008/0297033.

The compounds represented by the formulas (A) to (A10-1) will next be described more specifically, but the invention is not limited to them.

The compounds represented by the formulas (A) to (A10-1) are preferably represented by the following formulas A-1 to A-22.

A-1

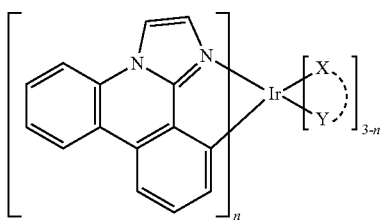

A-2

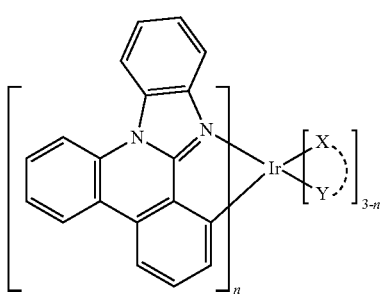

A-3

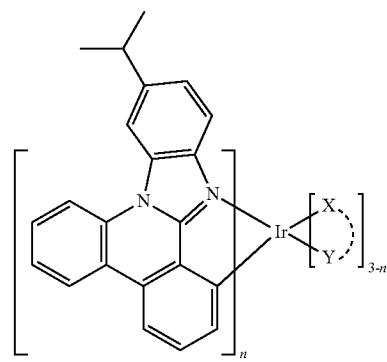

A-4

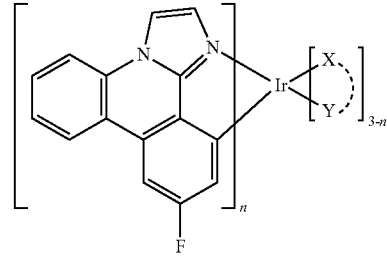

A-5

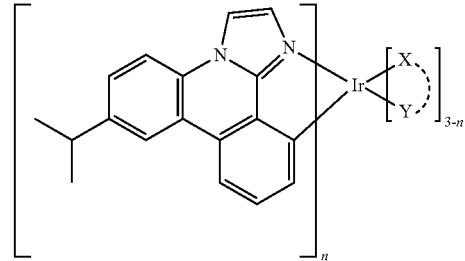

A-6

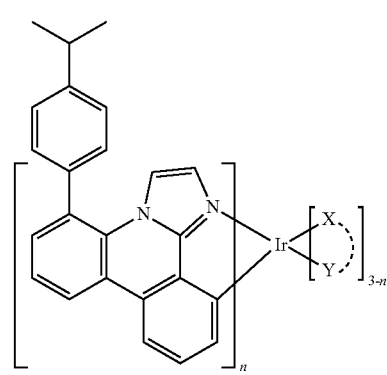

A-7

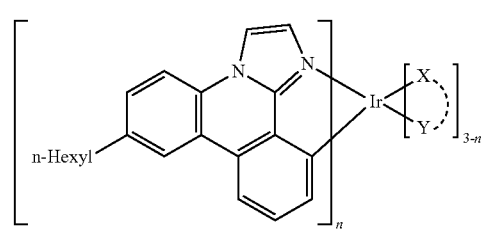

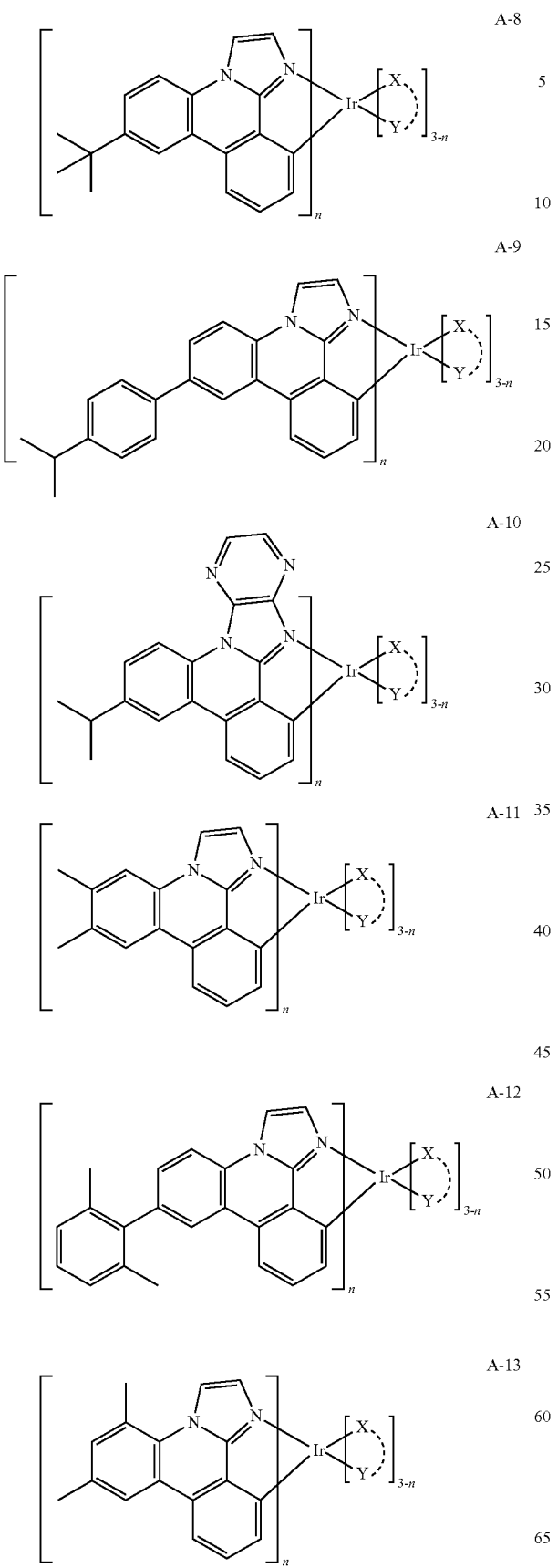
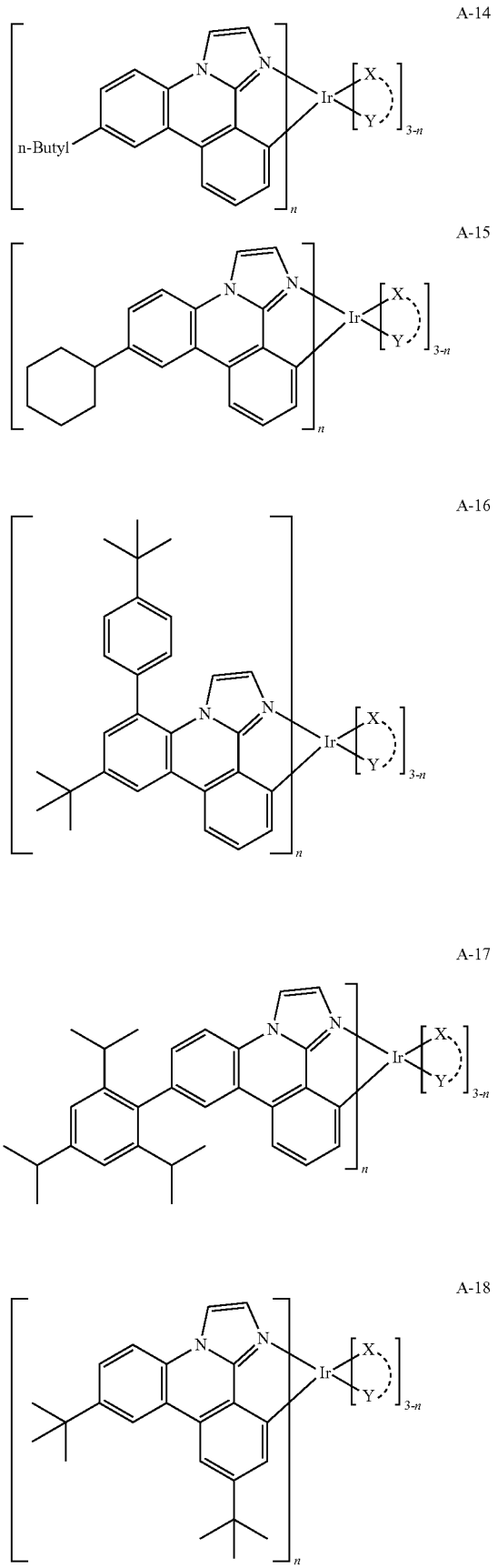

-continued
A-19
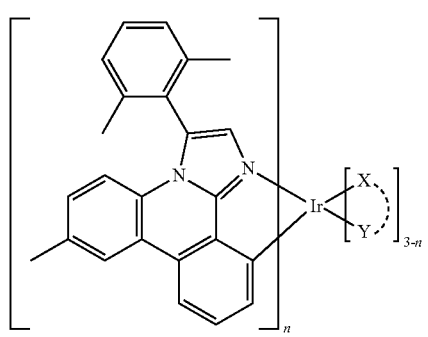
A-20
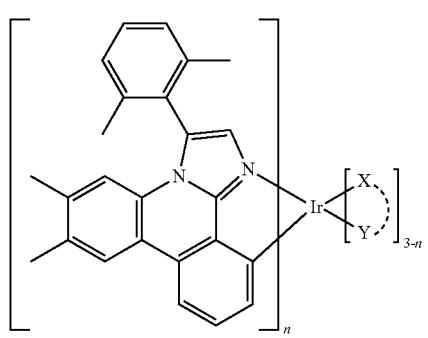
A-21
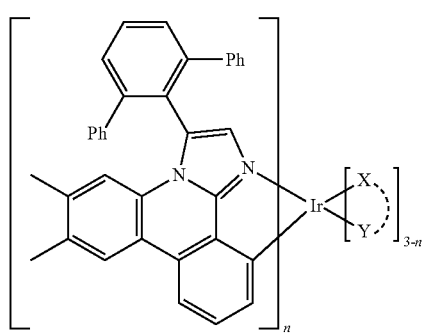
A-22
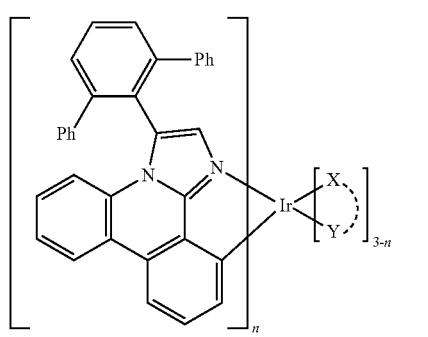
A-23
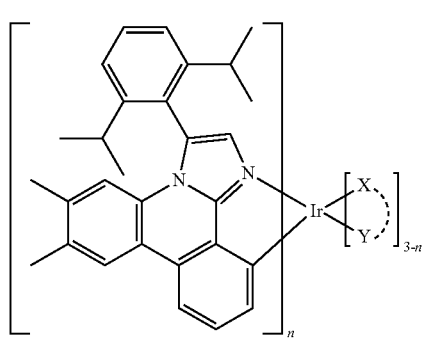
-continued
A-24
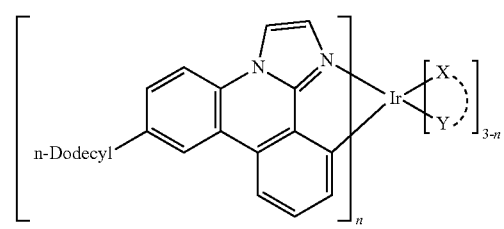
A-25
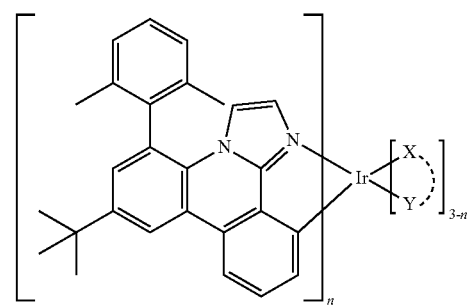
A-26
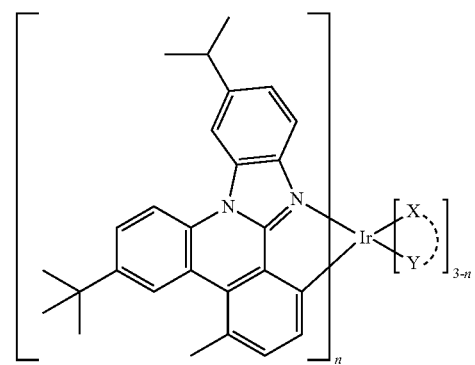
A-27
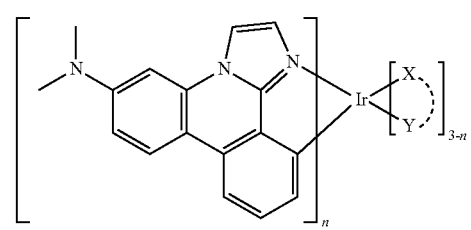
A-28
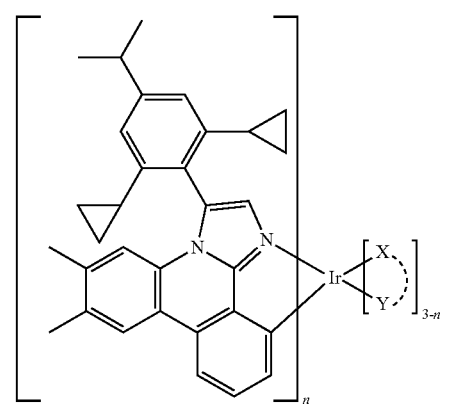

-continued
A-29
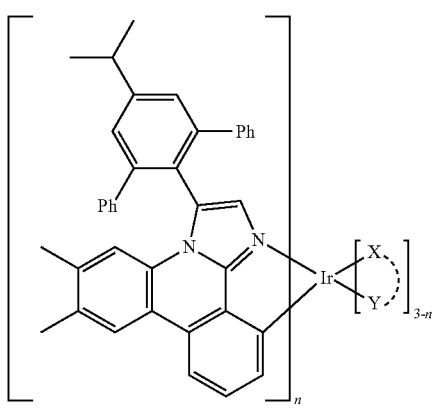
A-30
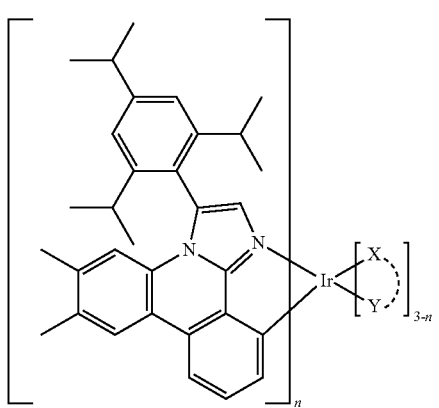
A-31
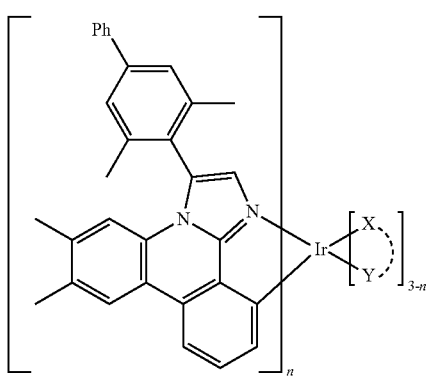
A-32
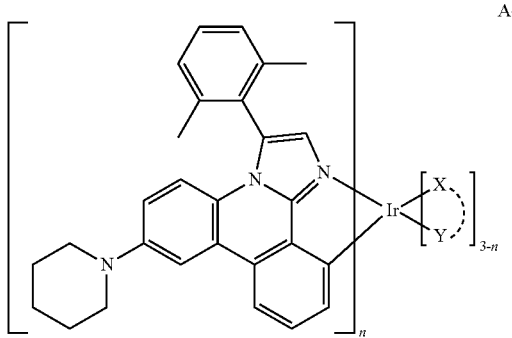
-continued
A-33
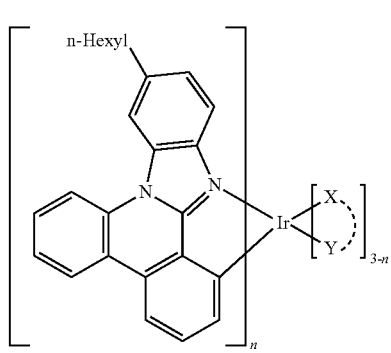
A-34
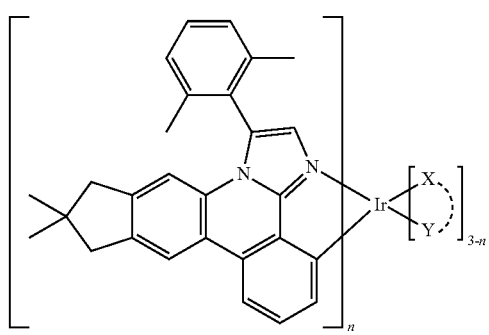
A-35
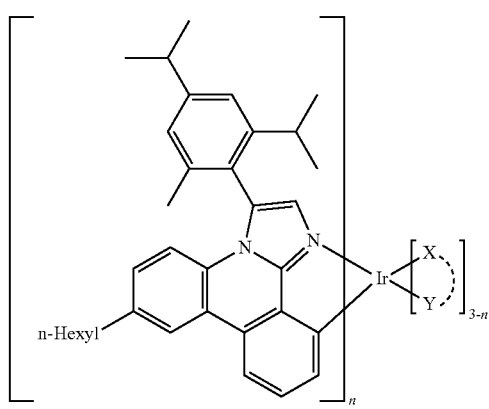
A-36
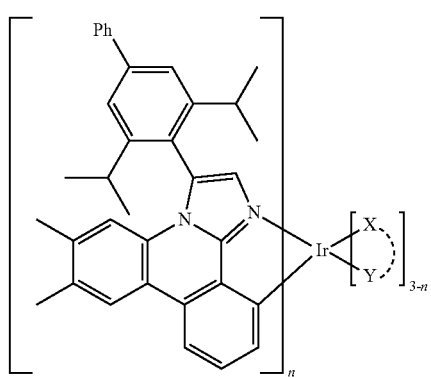

-continued
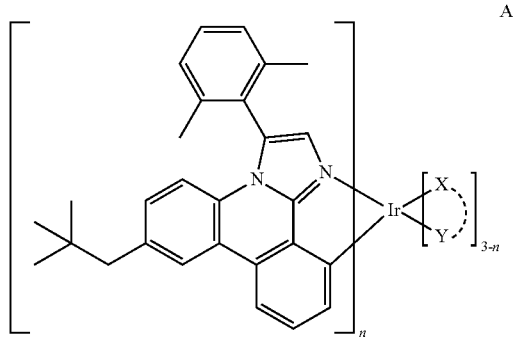
A-37
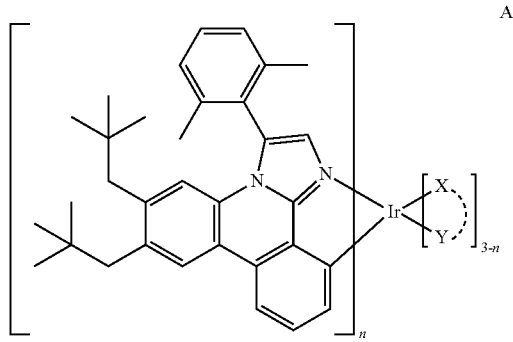
A-38
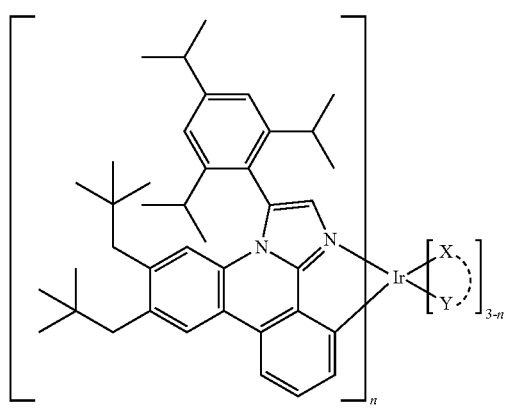
A-39
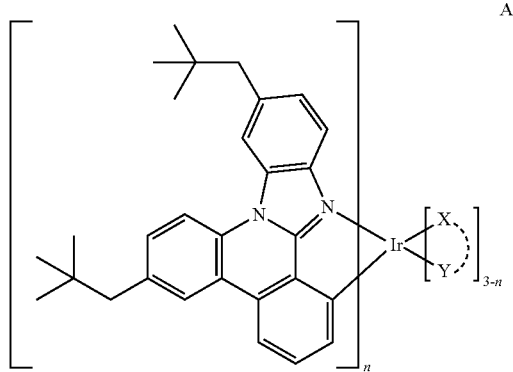
A-40
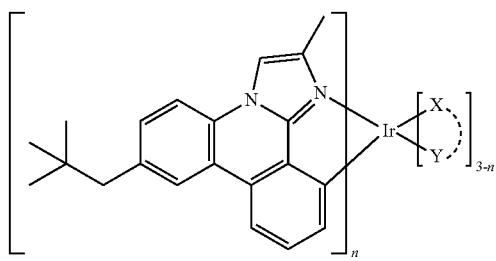
A-41
A-42
A-43
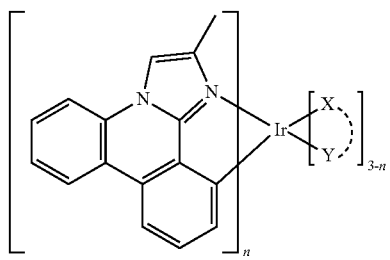
A-44
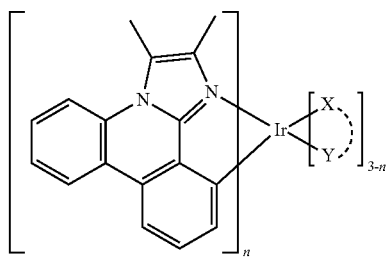
A-45
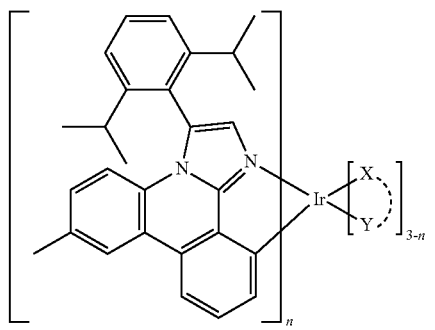

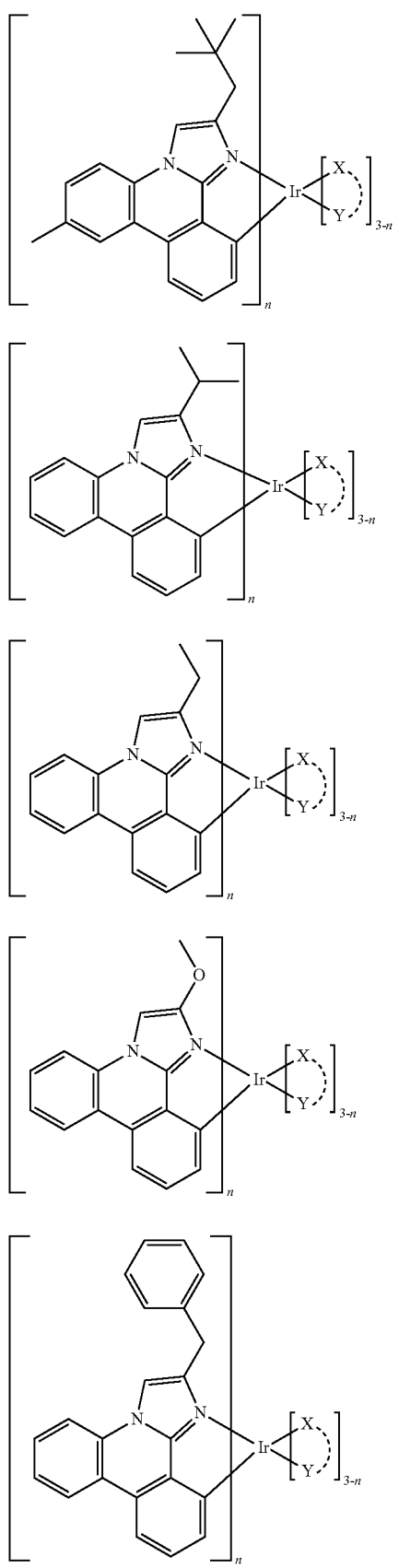
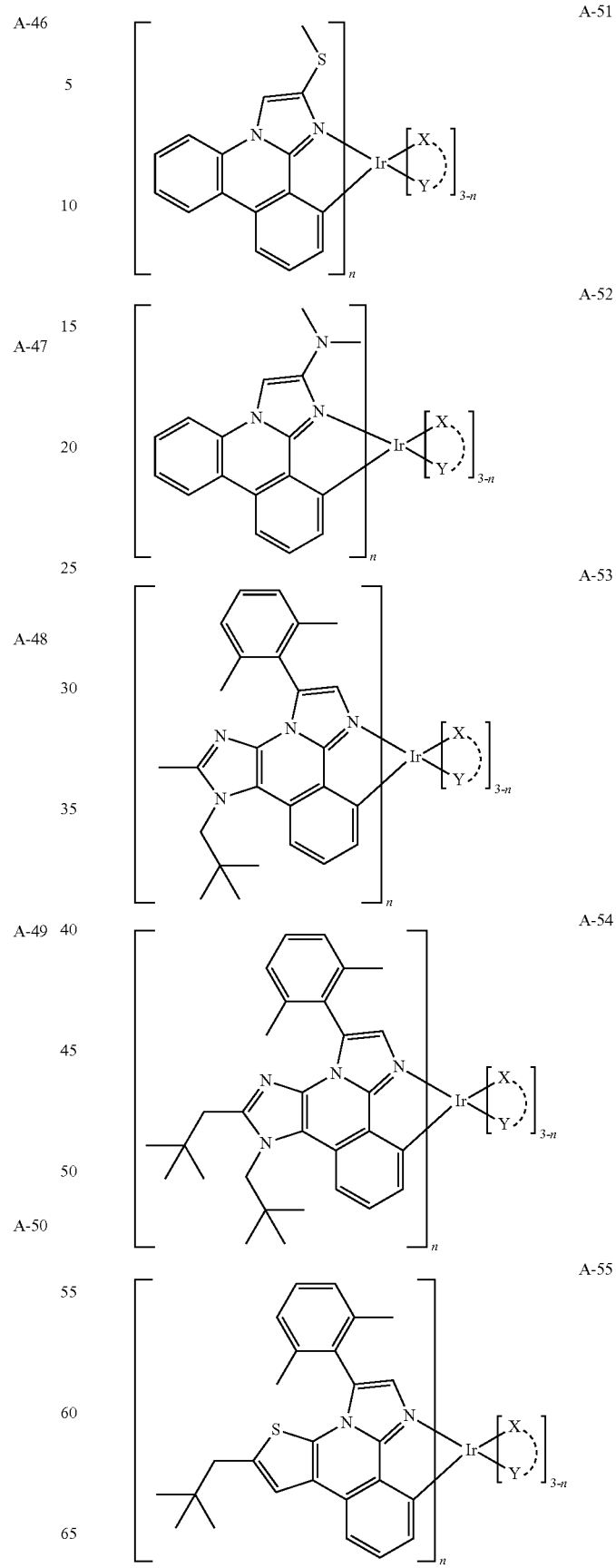

A-56
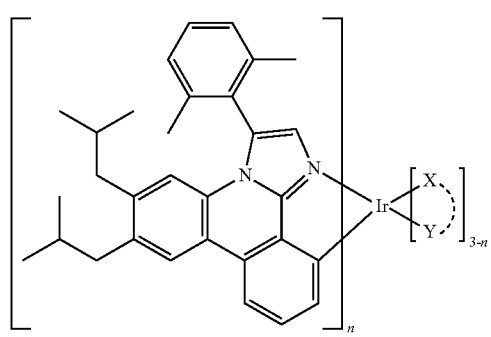
A-57
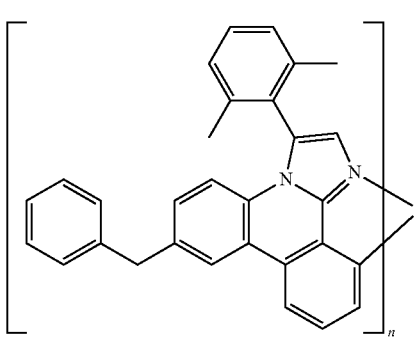
A-58
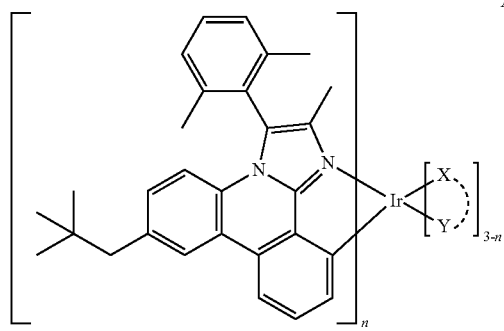
A-59
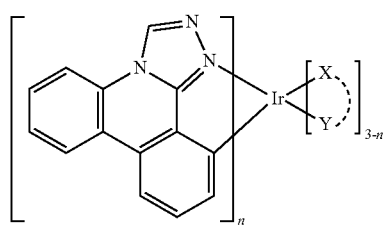
A-60
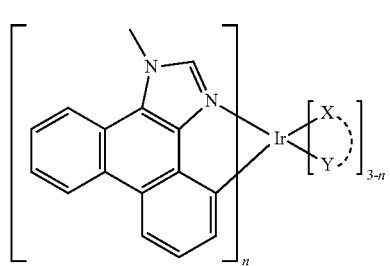
A-61
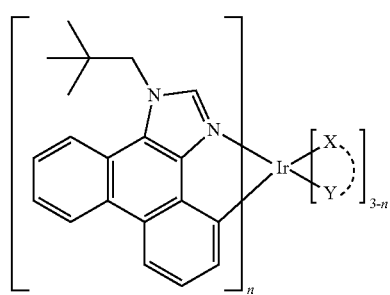
A-62
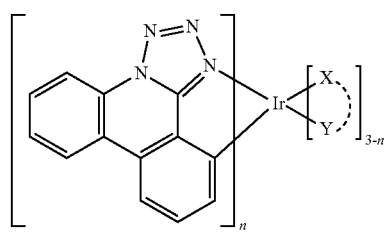
A-63
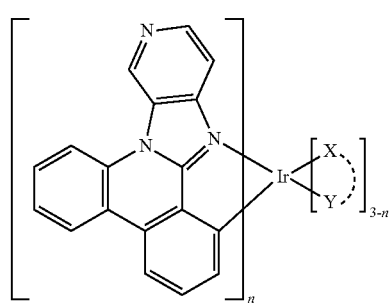
A-64
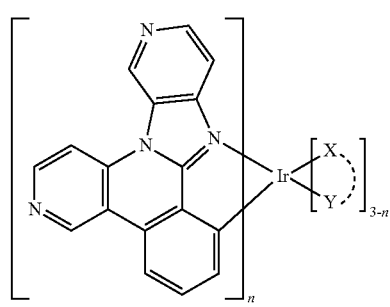
A-65
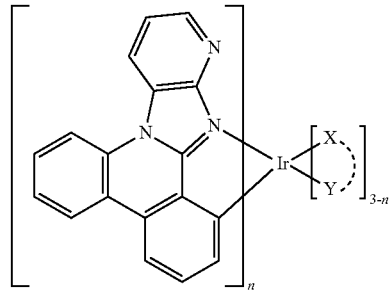

A-66
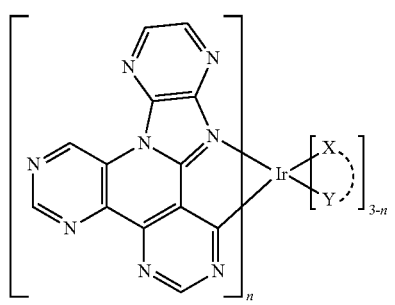
A-67
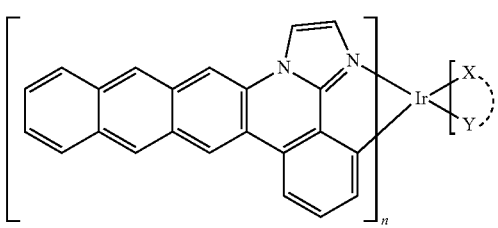
A-68
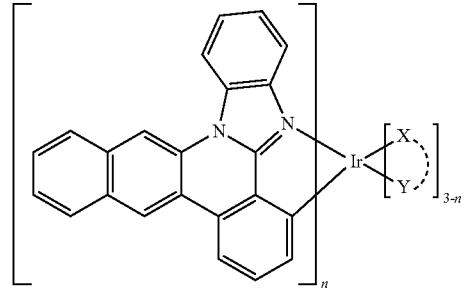
A-69
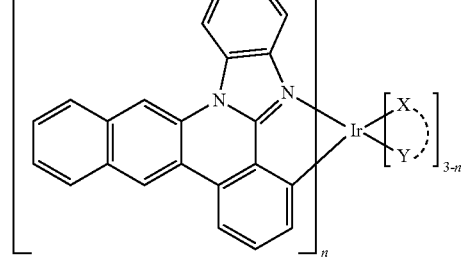
A-70
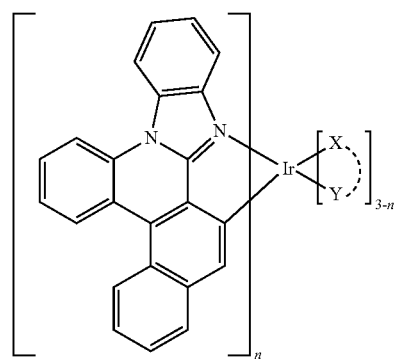
A-71
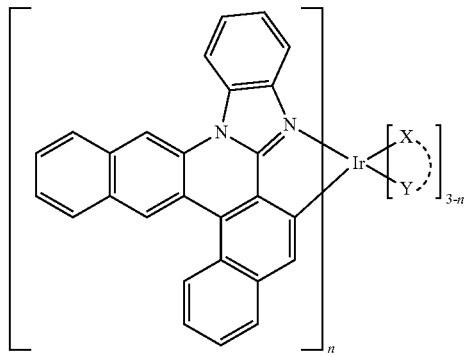
A-72
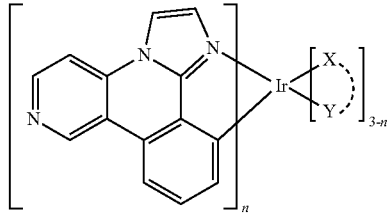
A-73
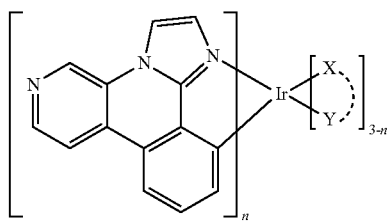
A-74
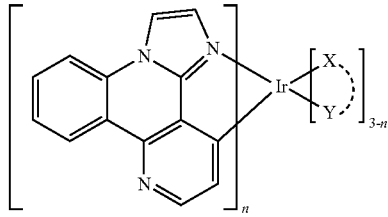
A-75
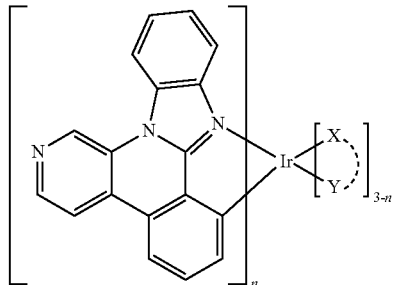
A-76
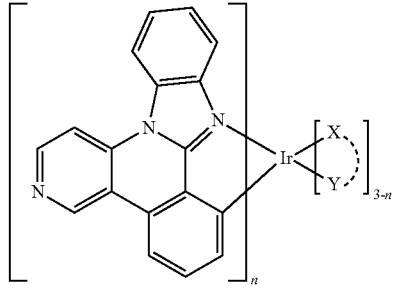

A-77
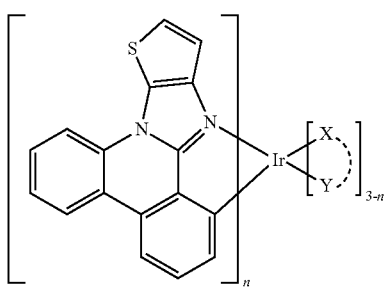
A-78
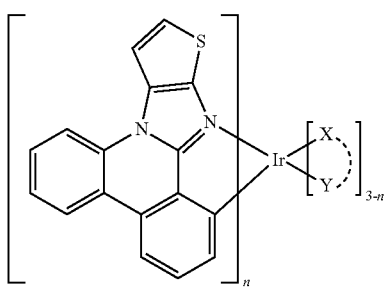
A-79
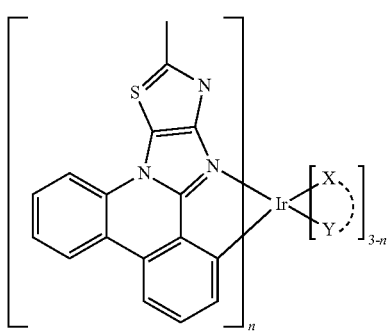
A-80
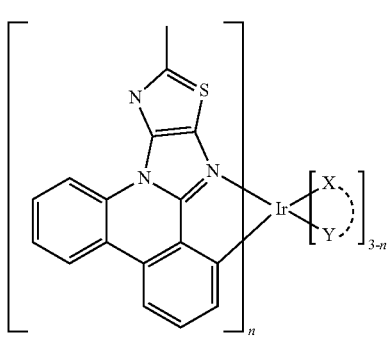
A-81
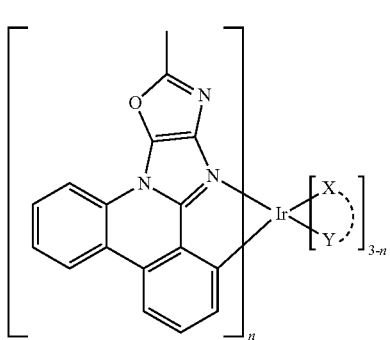
A-82
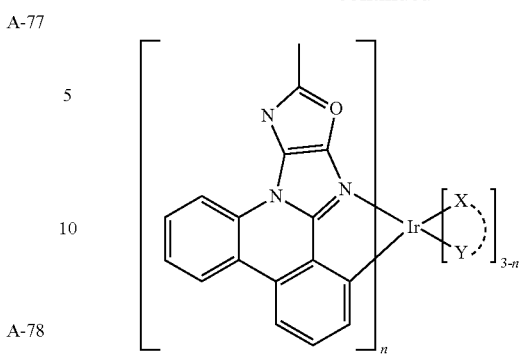
A-83
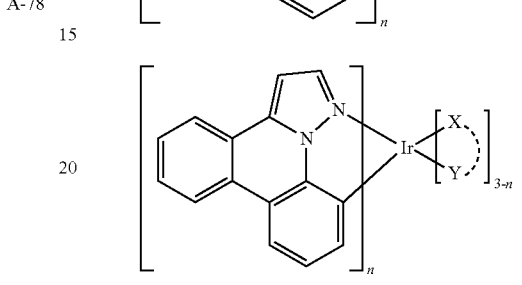
A-84
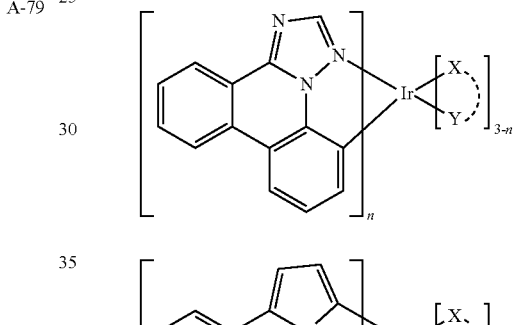
A-85
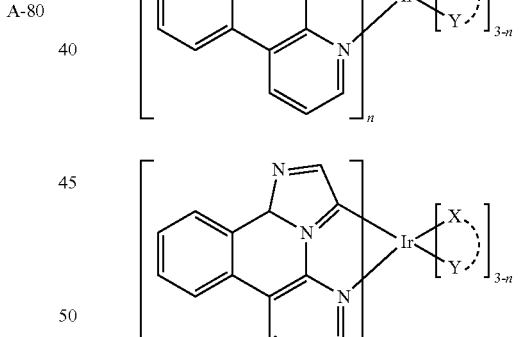
A-86
A-87
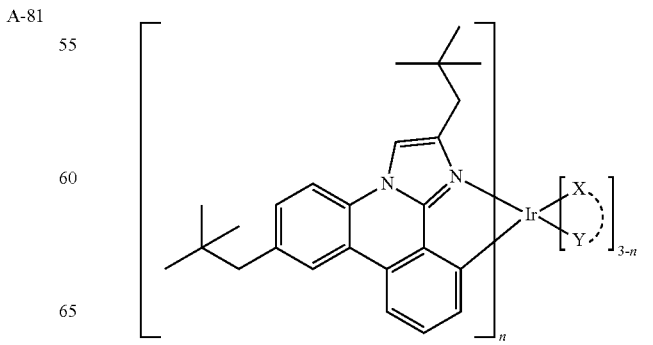

A-88 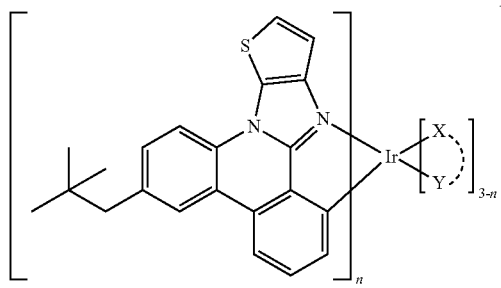
A-89 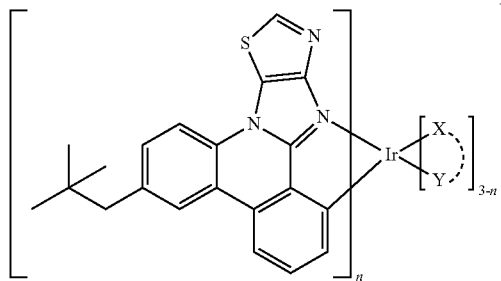
A-90 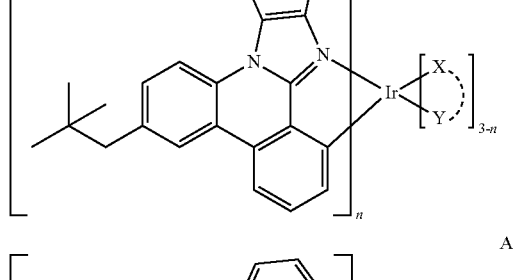
A-91 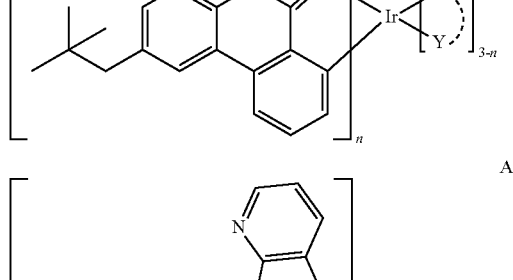
A-92 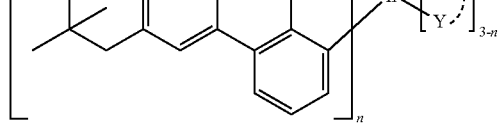
A-93 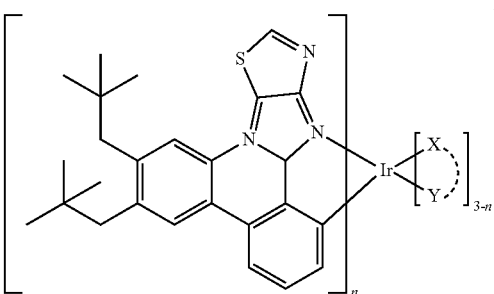
A-94 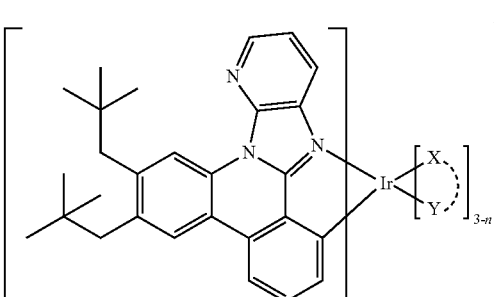
A-95 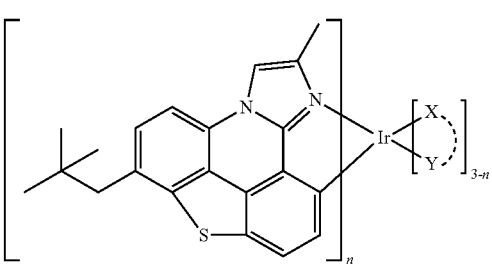
A-96 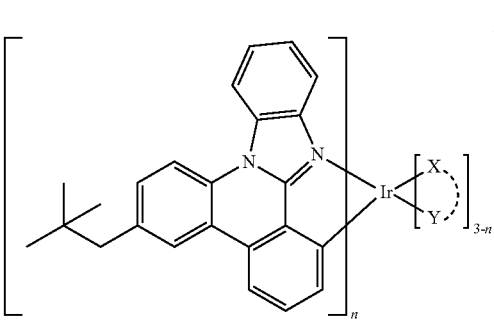
A-97 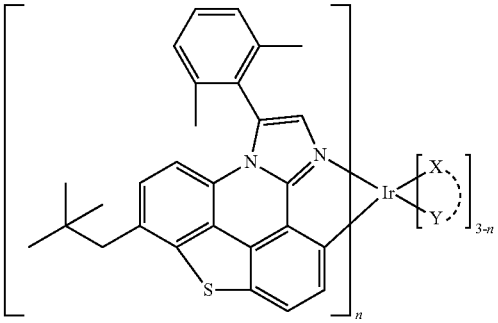

A-98 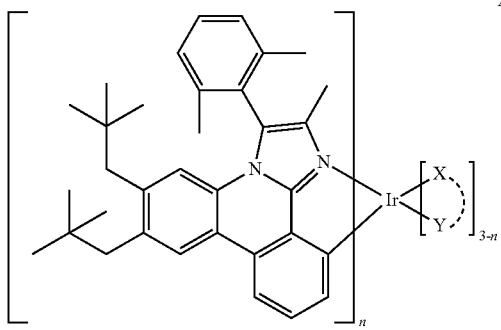
A-99 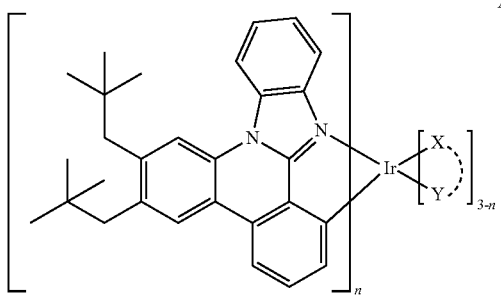
A-100 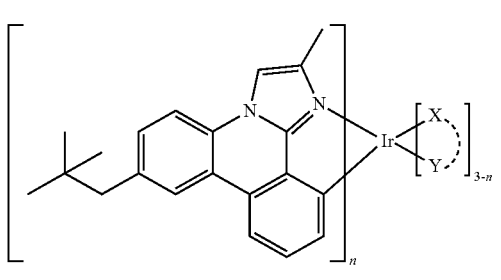
A-101 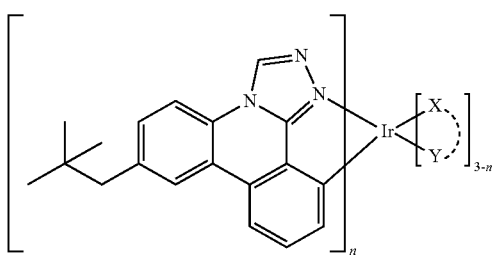
A-102 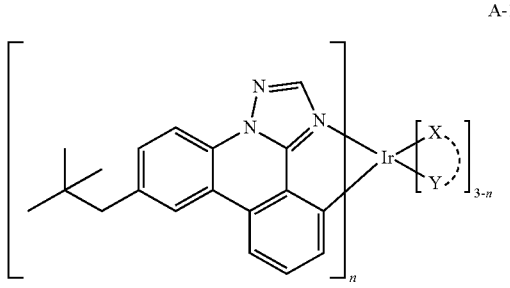
A-103 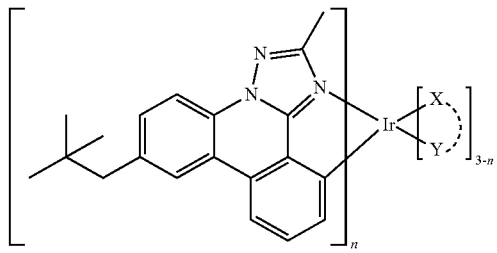
A-104 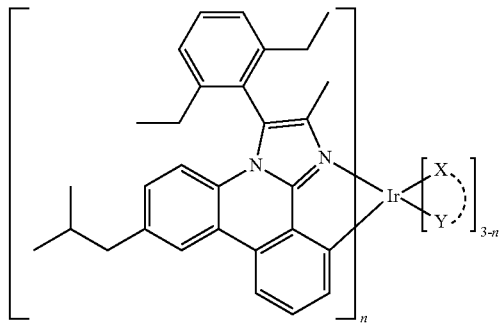
A-105 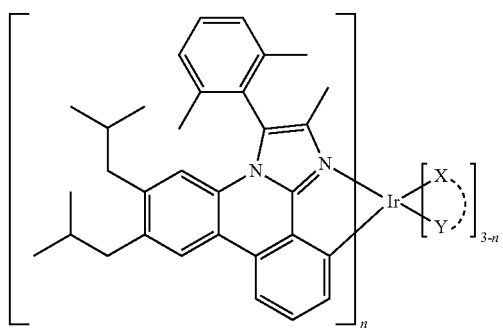
A-106 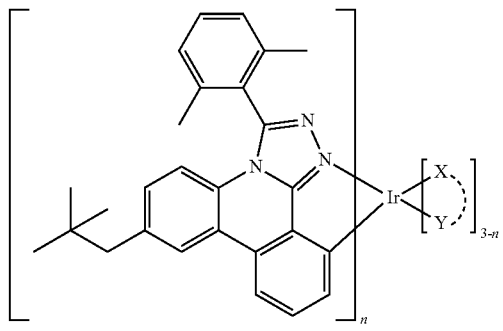

-continued
A-107
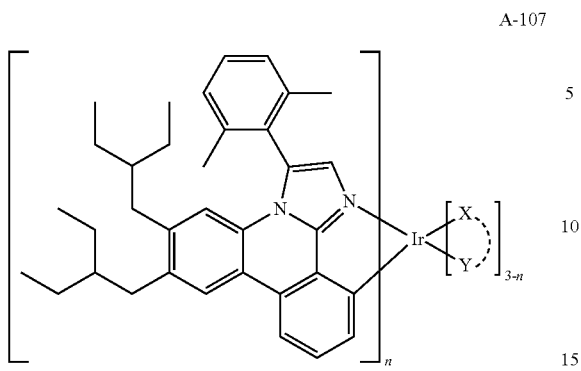
A-108
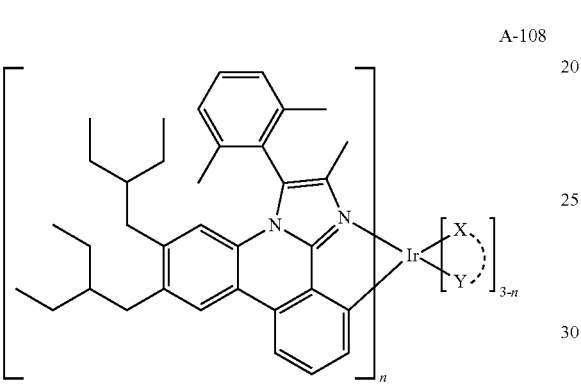
A-109
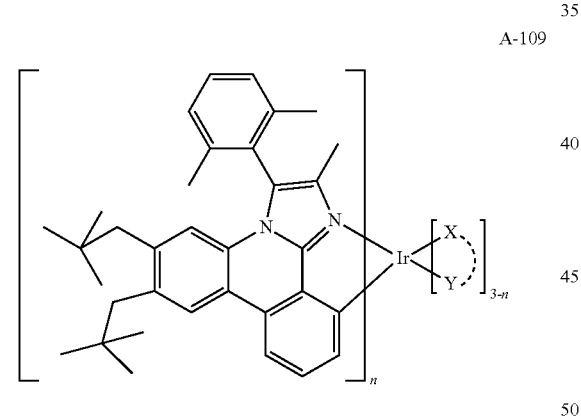
A-110
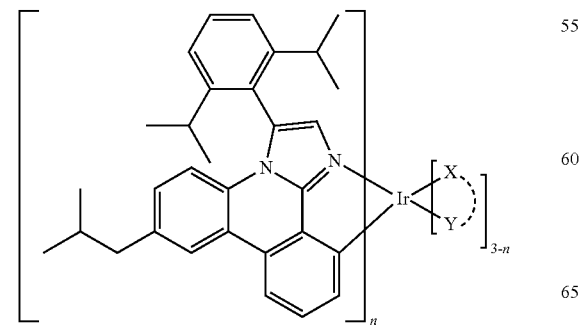
-continued
A-111
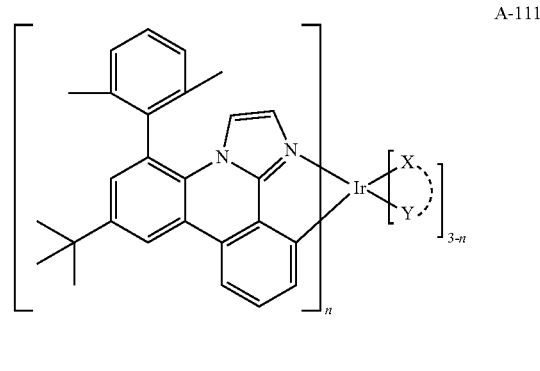
A-112
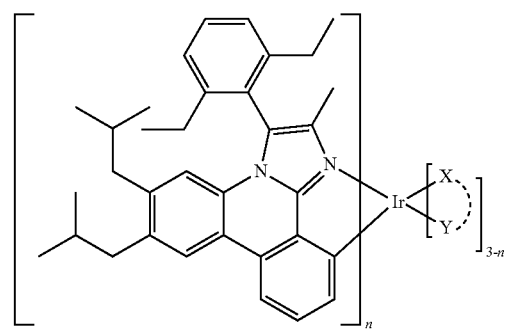
A-113
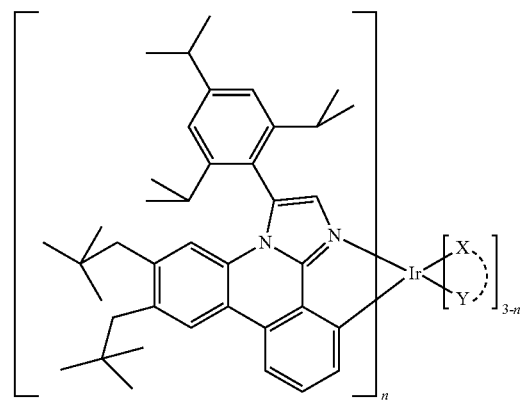
A-114
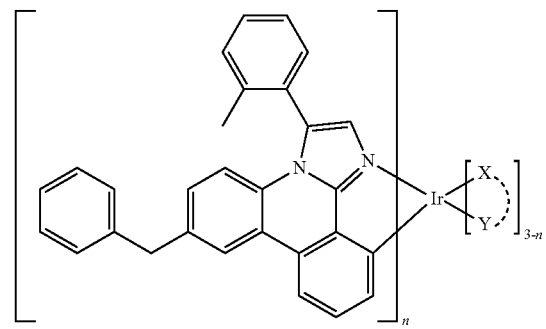

A-115
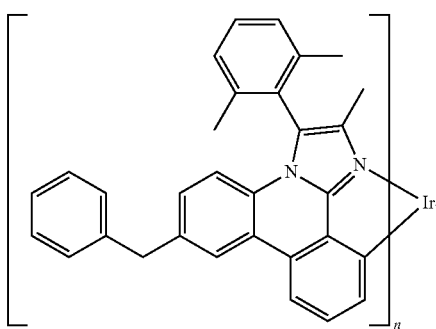
A-116
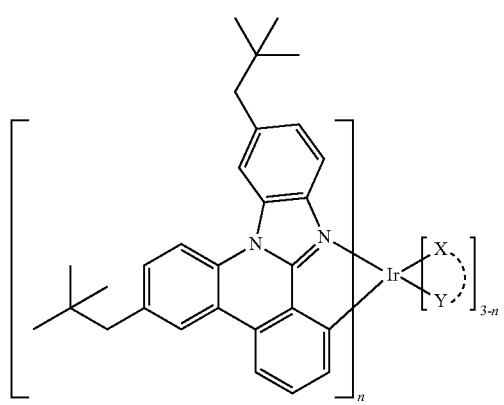
A-117
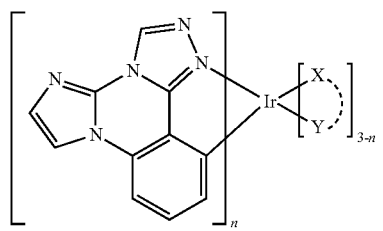
A-118
A-119
A-120
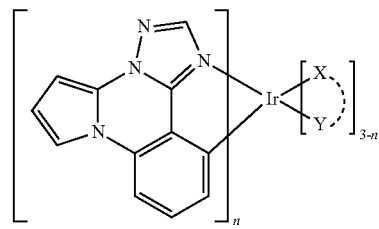
A-121
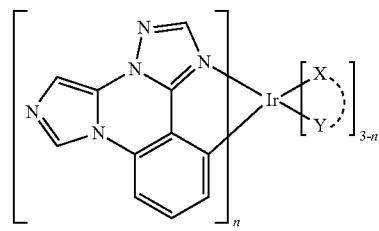
A-122
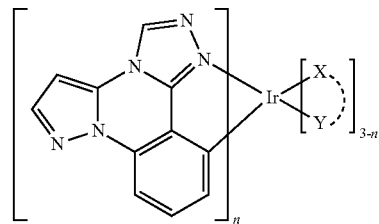
A-123
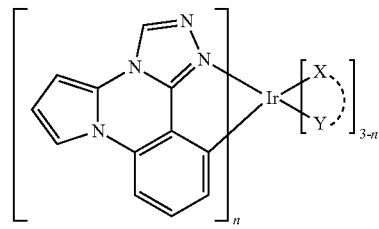
A-124
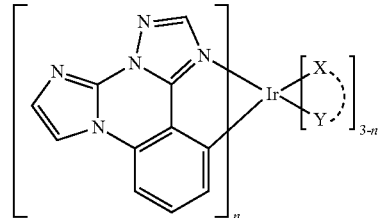
A-125
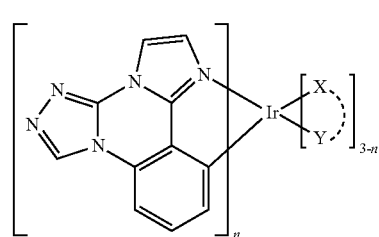
A-126
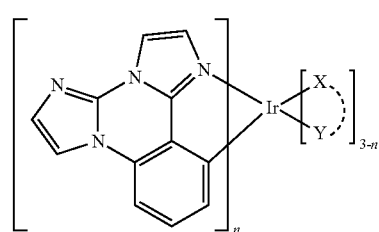

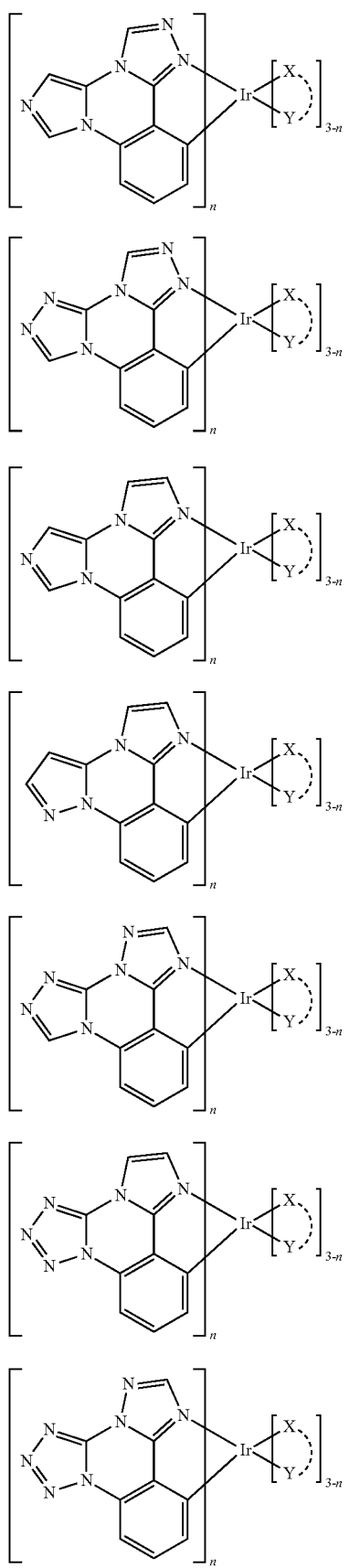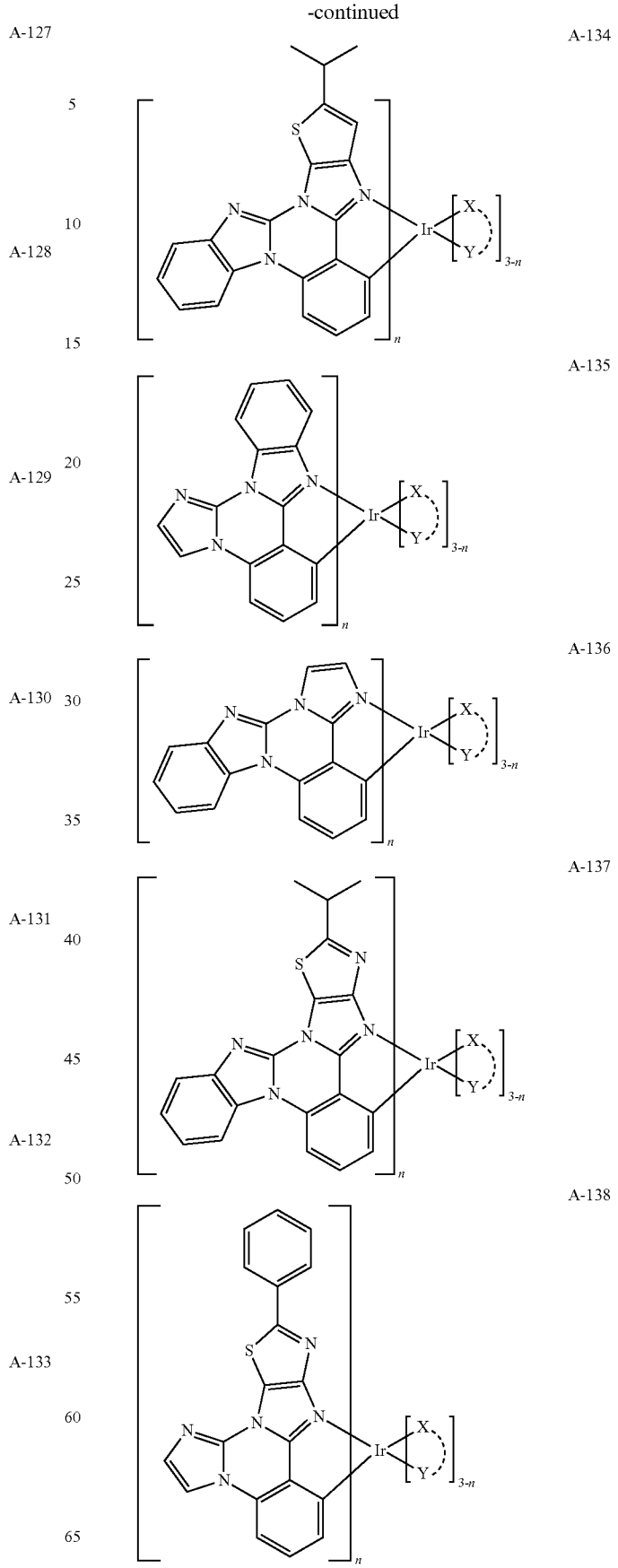

-continued
A-139
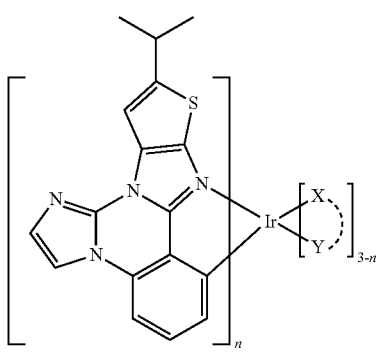
A-140
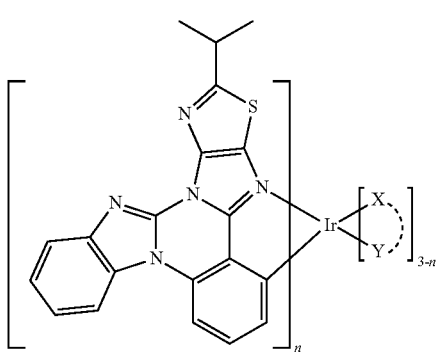
A-141
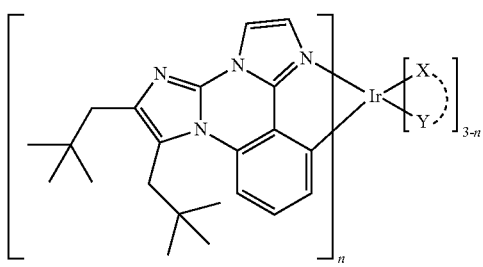
A-142
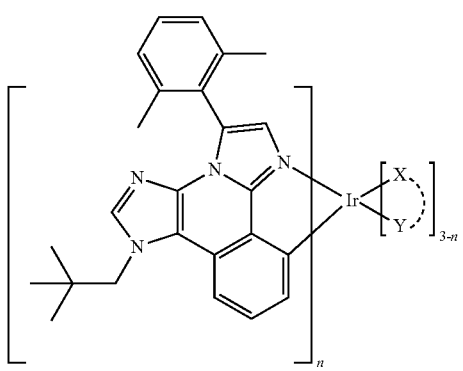
A-143
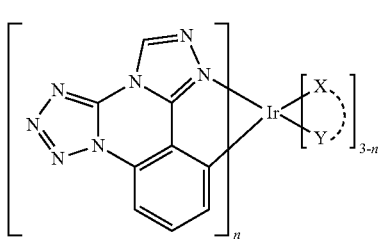
-continued
A-144
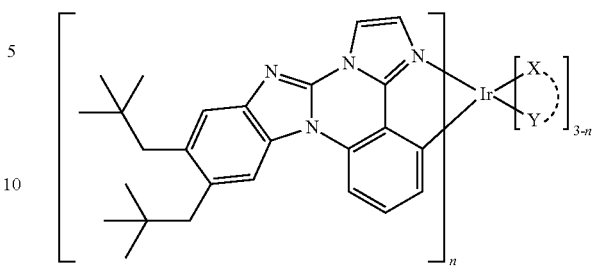
A-145
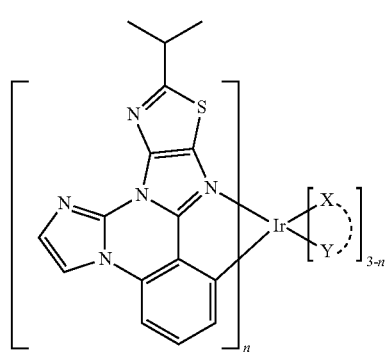
A-146
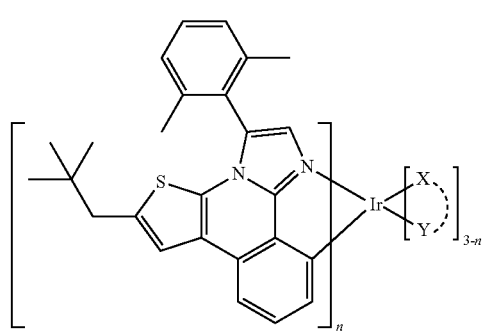
A-147
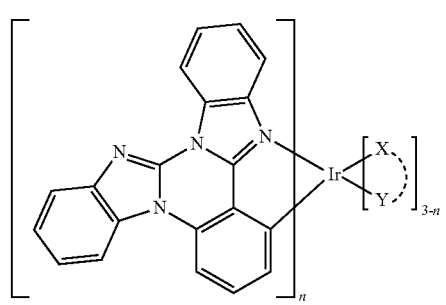
A-148
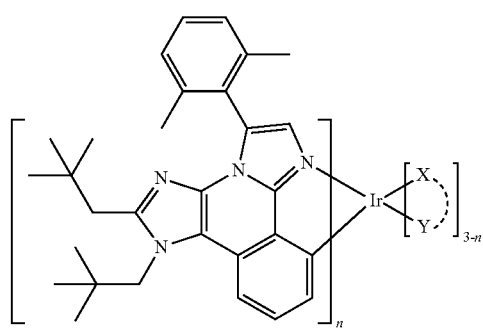

A-149
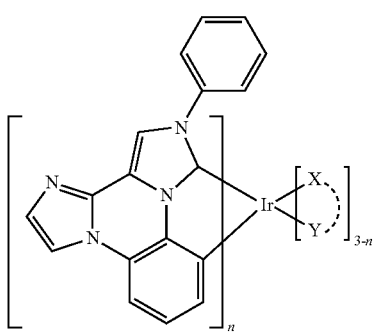
A-150
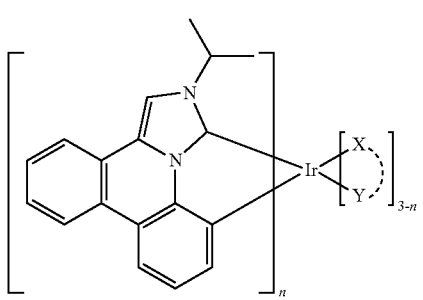
A-151
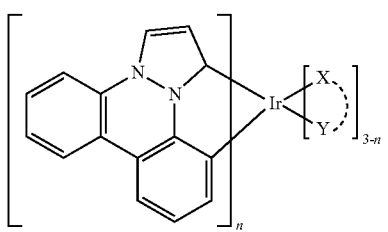
A-152
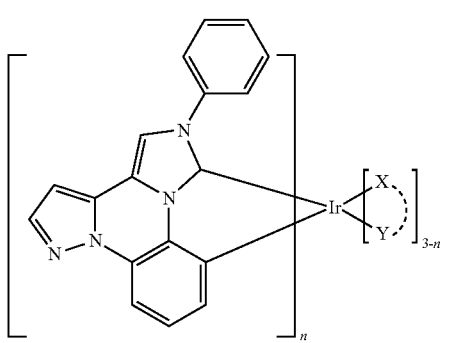
A-153
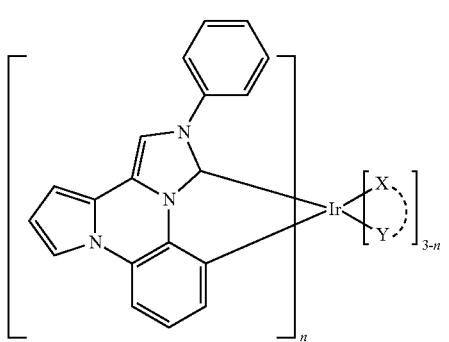
A-154
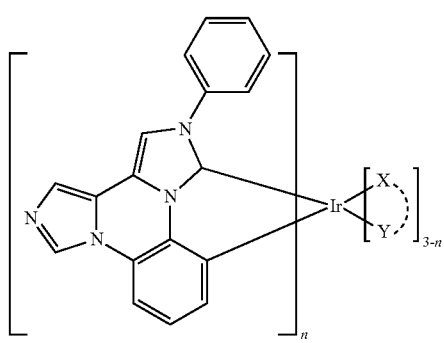
A-155
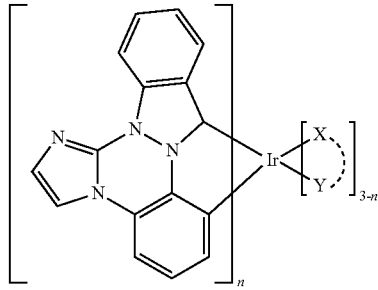
A-156
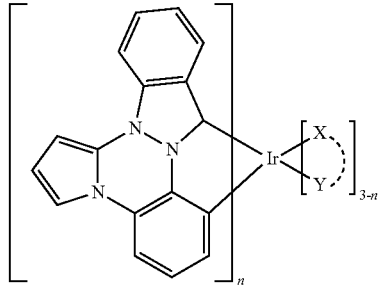
A-157
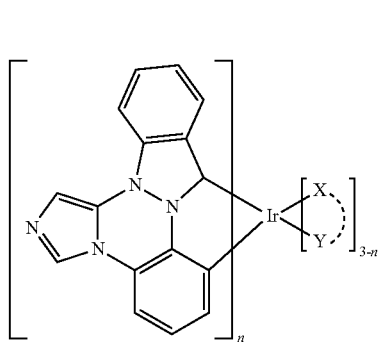
A-158
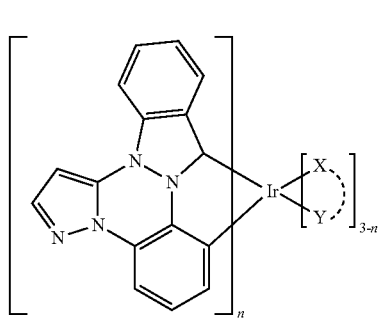

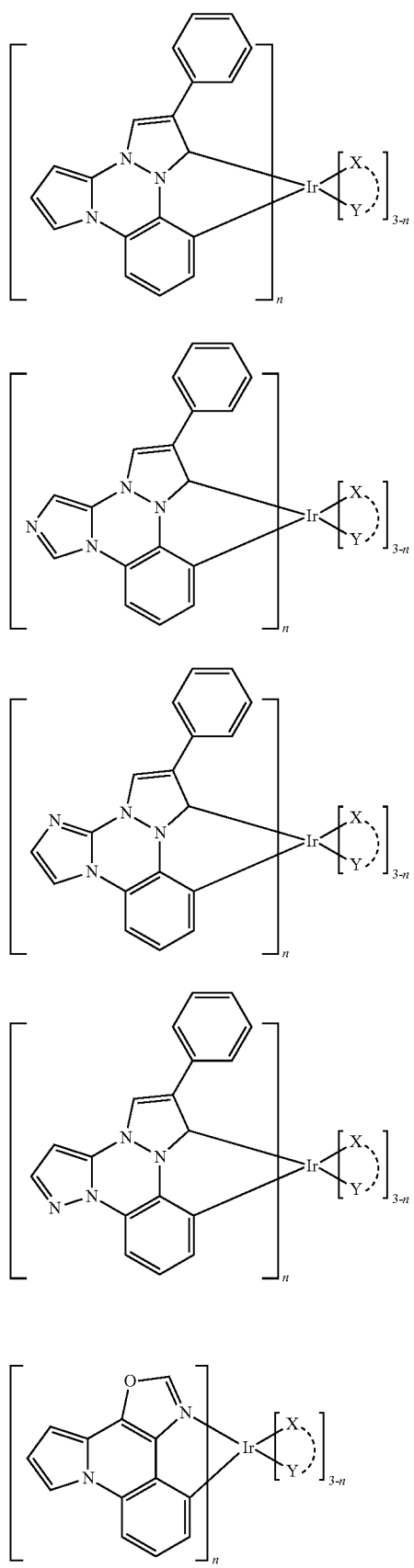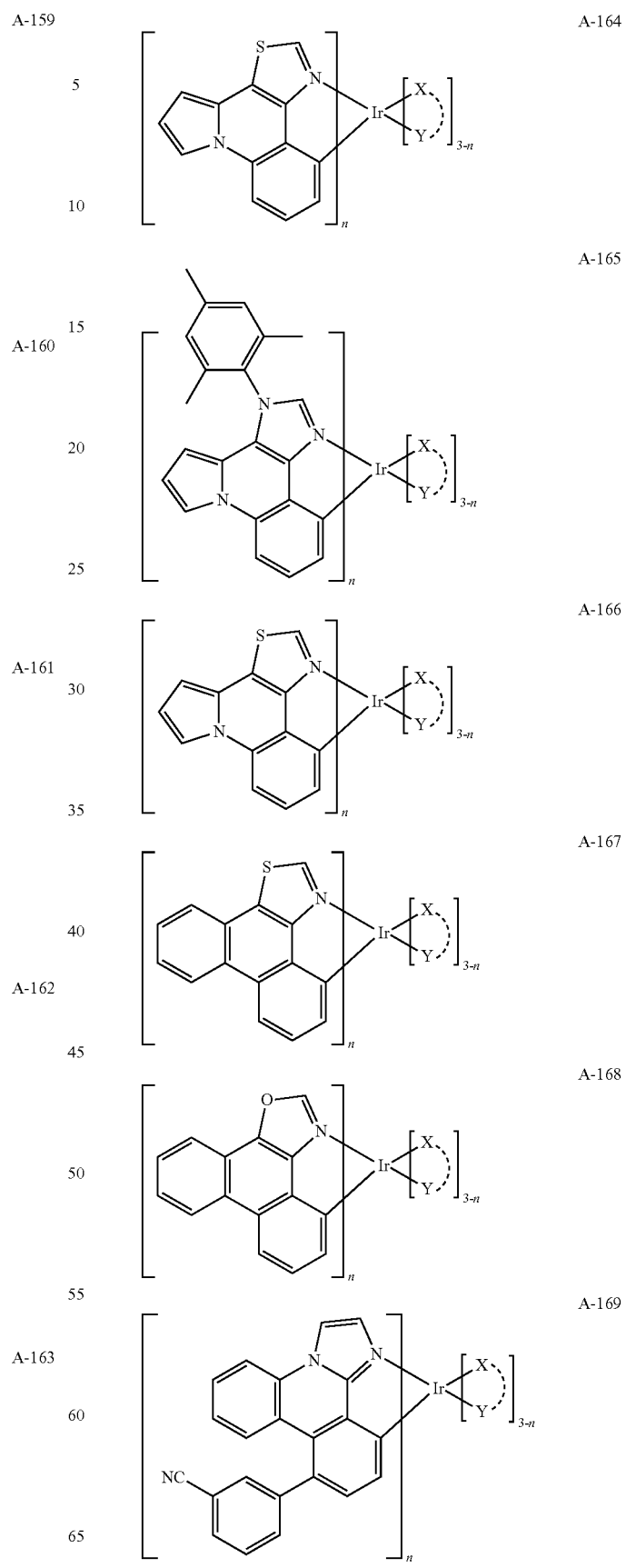

A-170
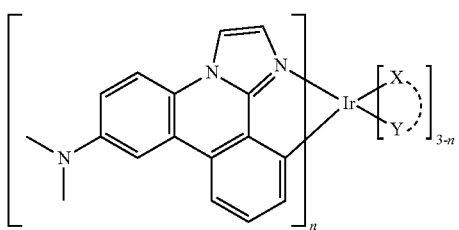
A-171
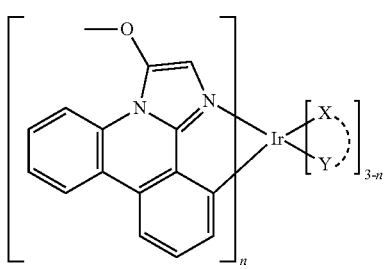
A-172
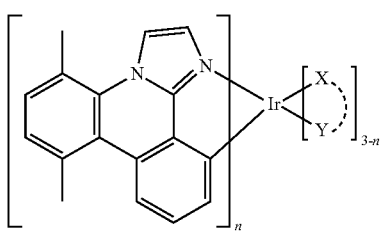
A-173
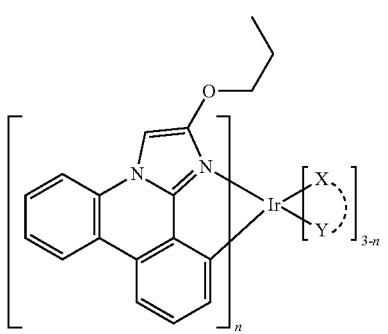
A-174
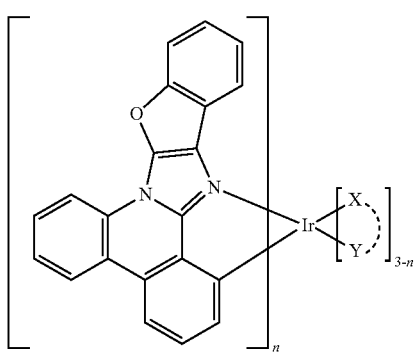
A-175
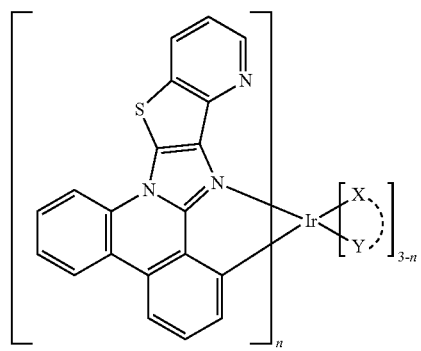
A-176
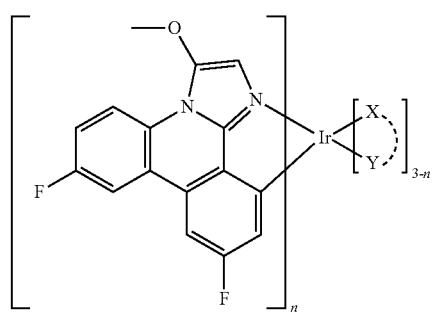
A-177
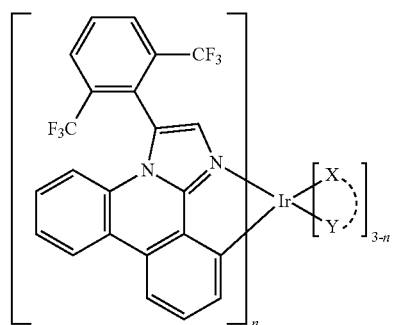
A-178
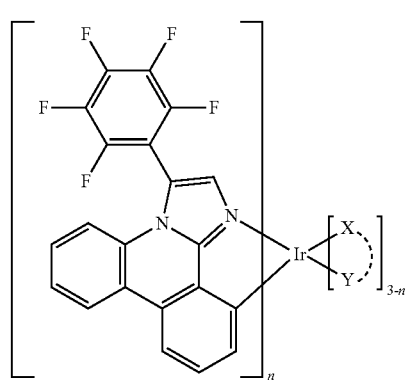

77
-continued
A-179
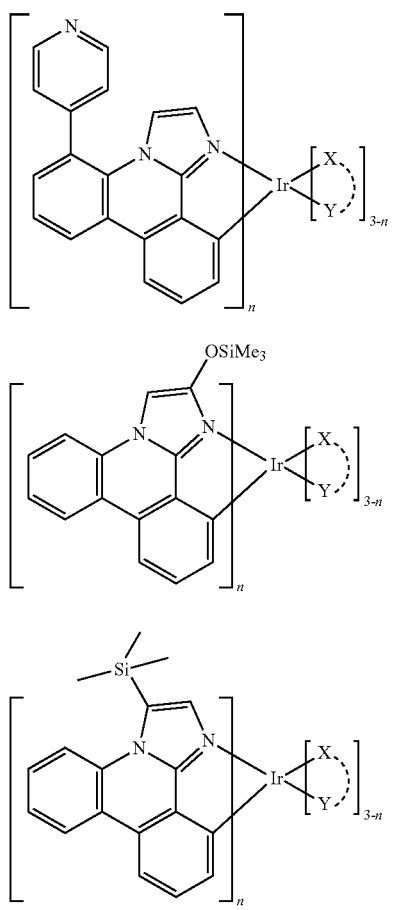
A-180
A-181
A-182
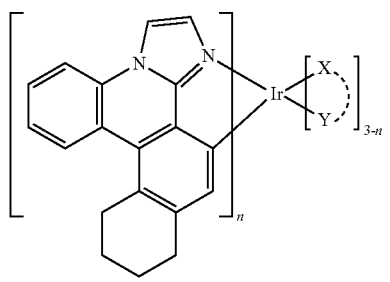
A-183
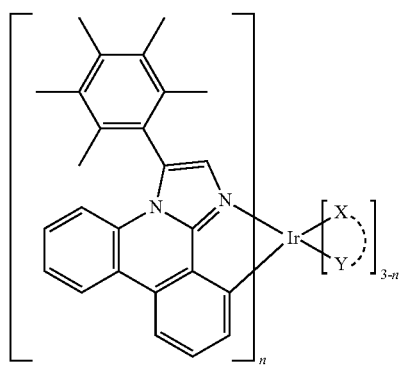
78
-continued
A-184
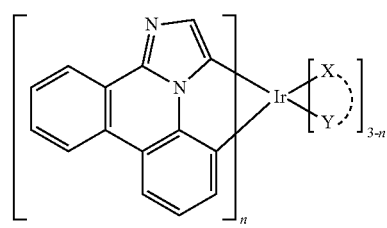
A-185
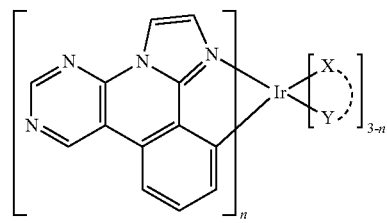
A-186
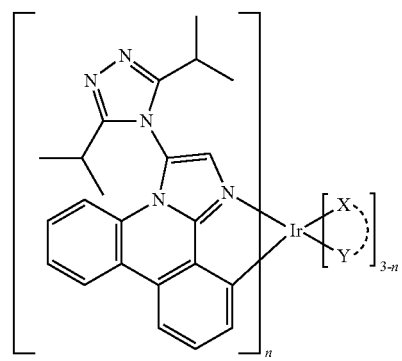
A-187
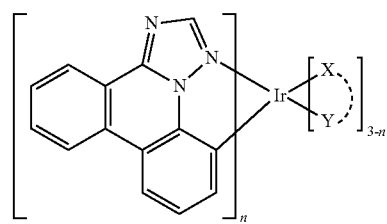
A-188
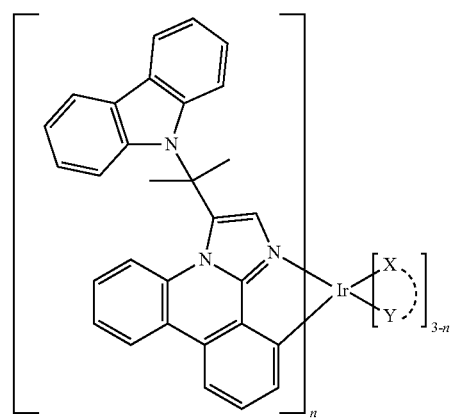

A-189
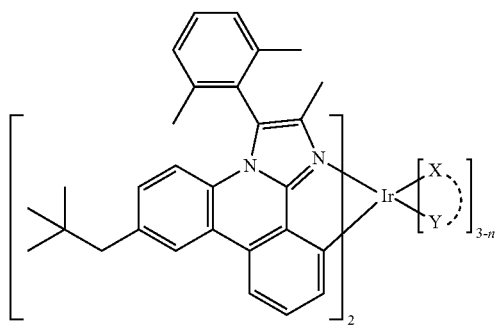
A-190
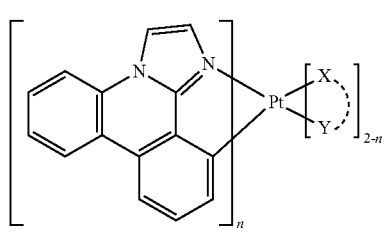
A-191
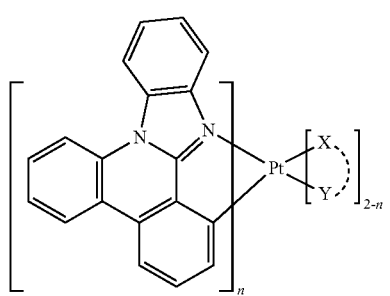
A-192
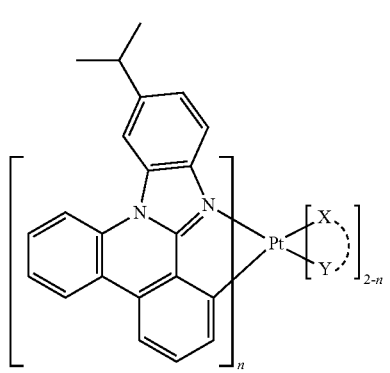
A-193
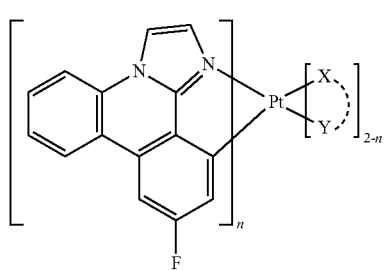
A-194
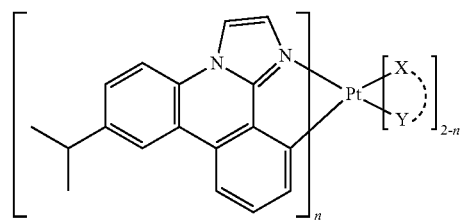
A-195
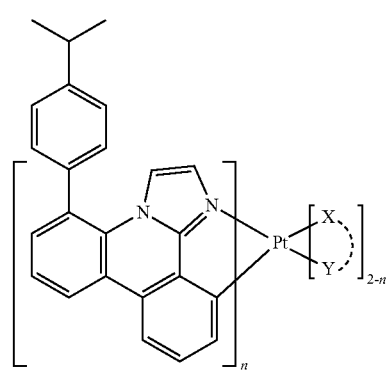
A-196
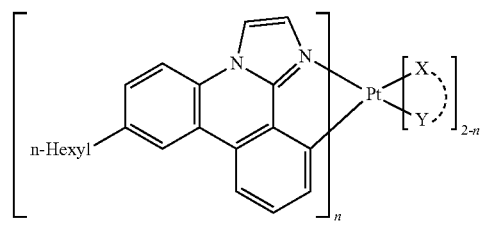
A-197
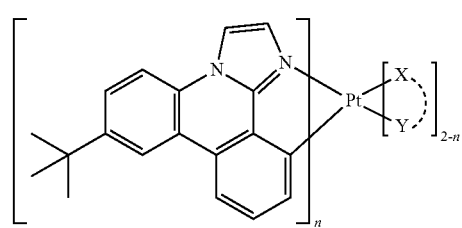
A-198
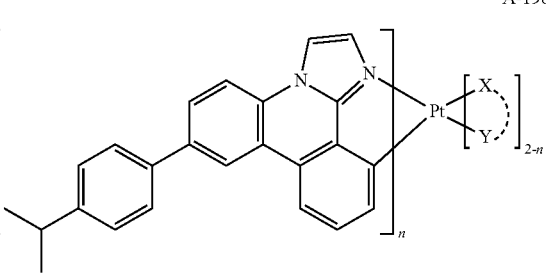
A-199
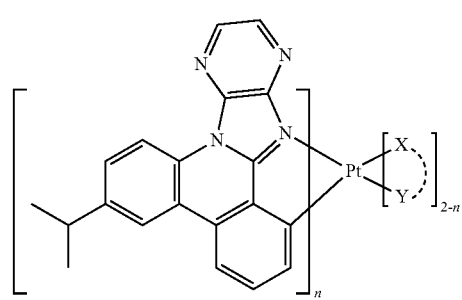

A-200
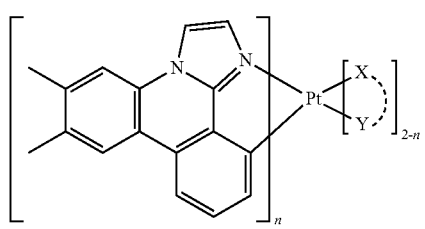
A-201
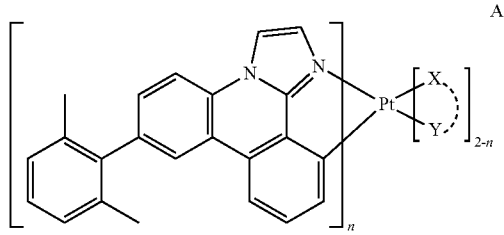
A-202
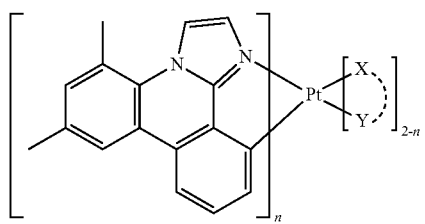
A-203
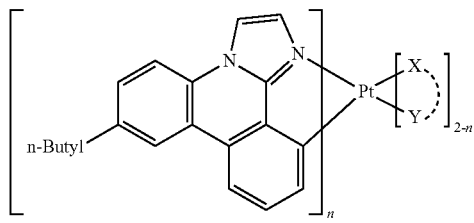
A-204
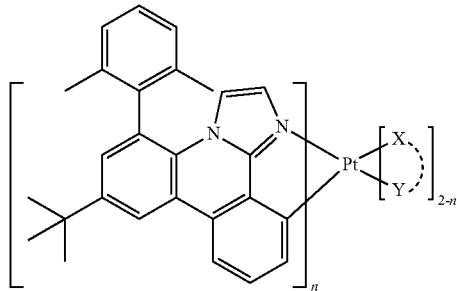
A-205
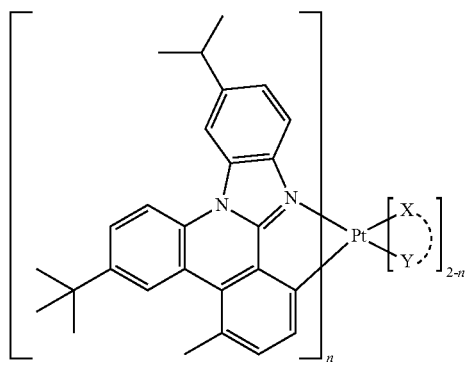
A-206
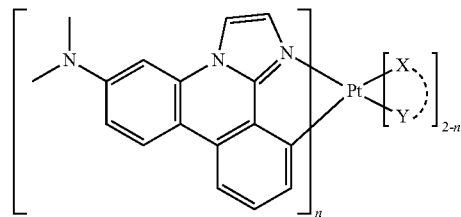
A-207
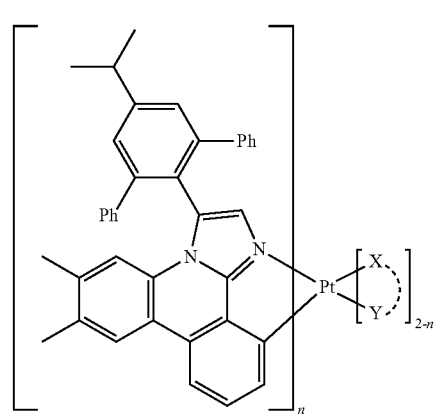
A-208
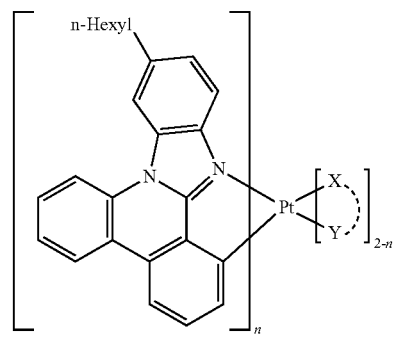
A-209
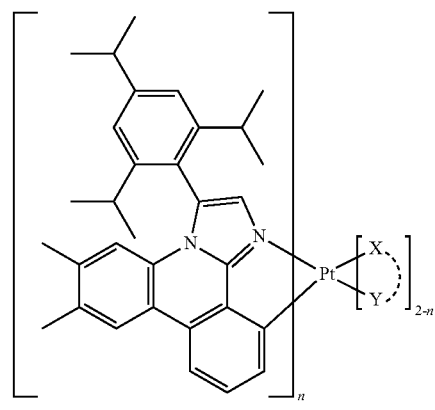

A-210
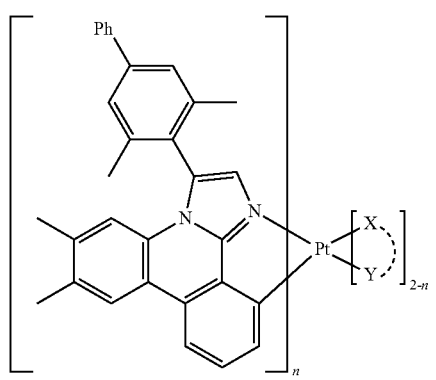
A-211
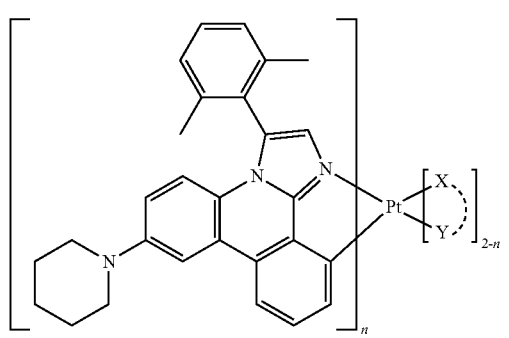
A-212
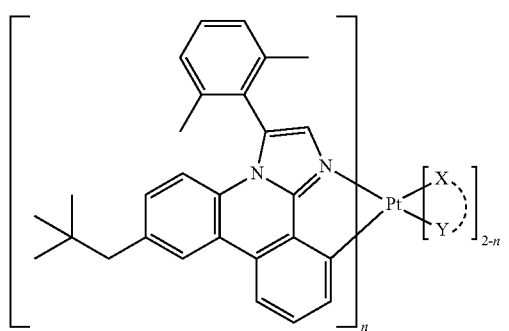
A-213
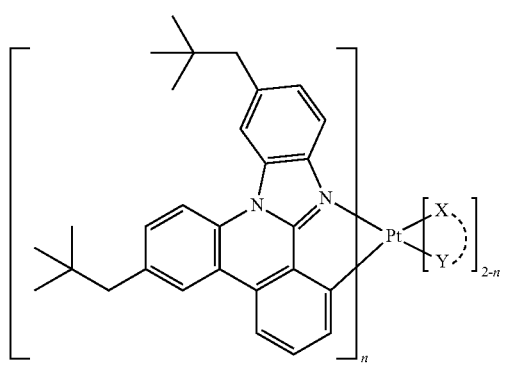
A-214
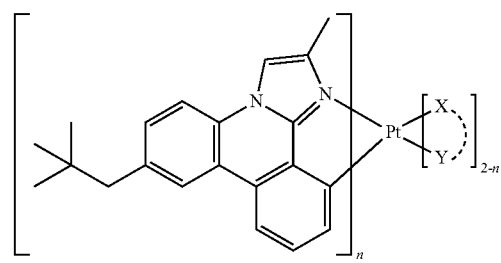
A-215
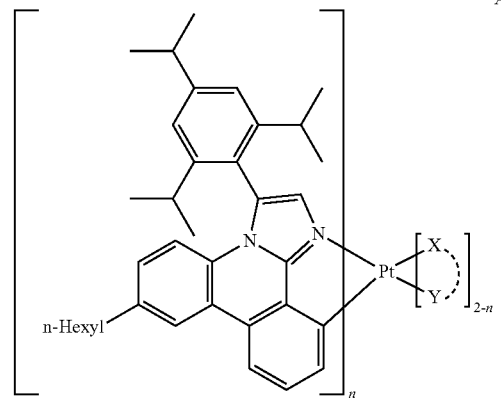
A-216
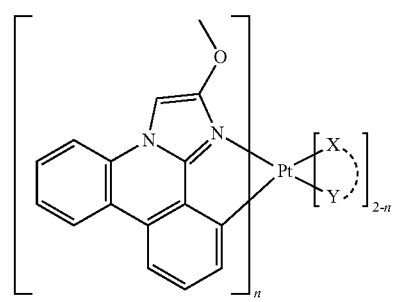
A-217
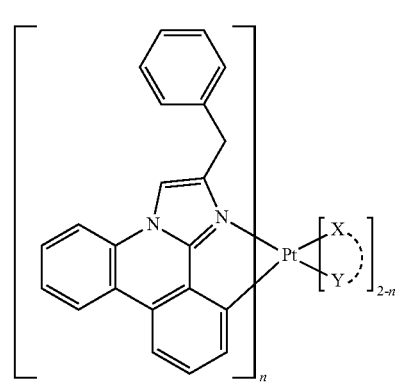
A-218
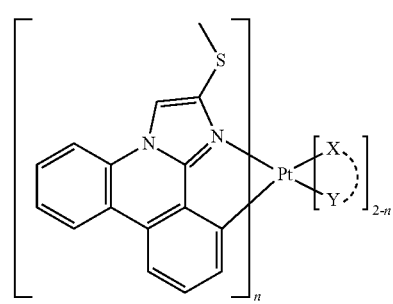

A-219 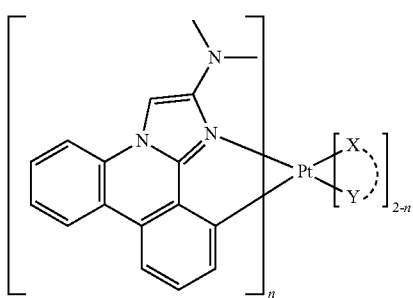
A-220 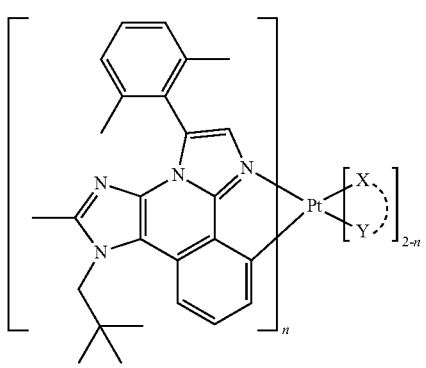
A-221 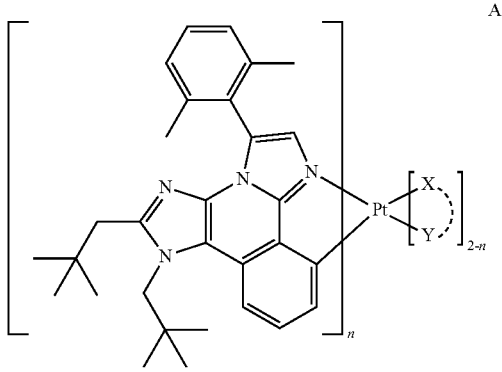
A-222 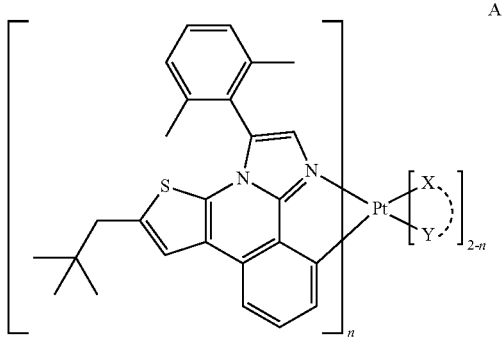
In the above formulas, X—Y may be coupled to each other to form any of the following structures.
L1 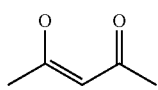
L2 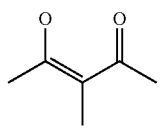
L3 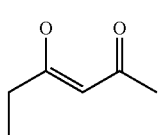
L4 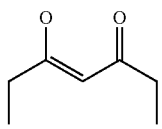
L5 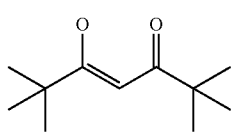
L6 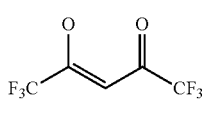
L7 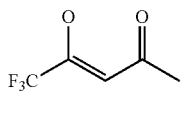
L8 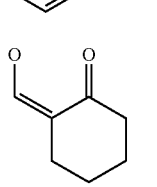
L9 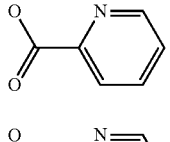
L10 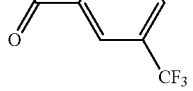
L11 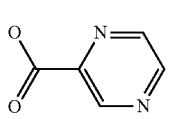
L12 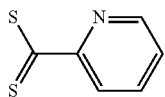
L13

-continued
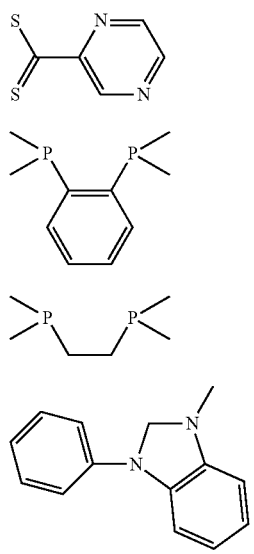
In addition, X may represent the following neutral monodentate ligand and Y may represent the following anionic ligand.
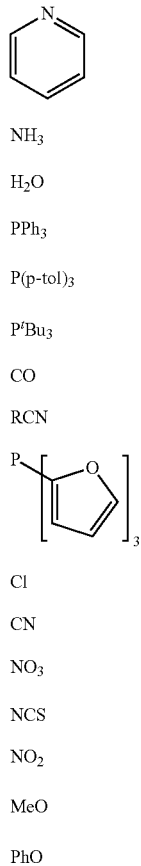
| | |
|---|---|
| | L14 |
| | L15 |
| | L16 |
| | L17 |
| | L18 |
| | L19 |
| | L20 |
| | L21 |
| | L22 |
| | L23 |
| | L24 |
| | L25 |
| | L26 |
| | L27 |
| | L28 |
| | L29 |
| | L30 |
| | L31 |
| | L32 |
| | L33 |
The following are examples of the compound to be used in the invention obtained using any of the above formulas A-1 to A-222 and X—Y in combination.
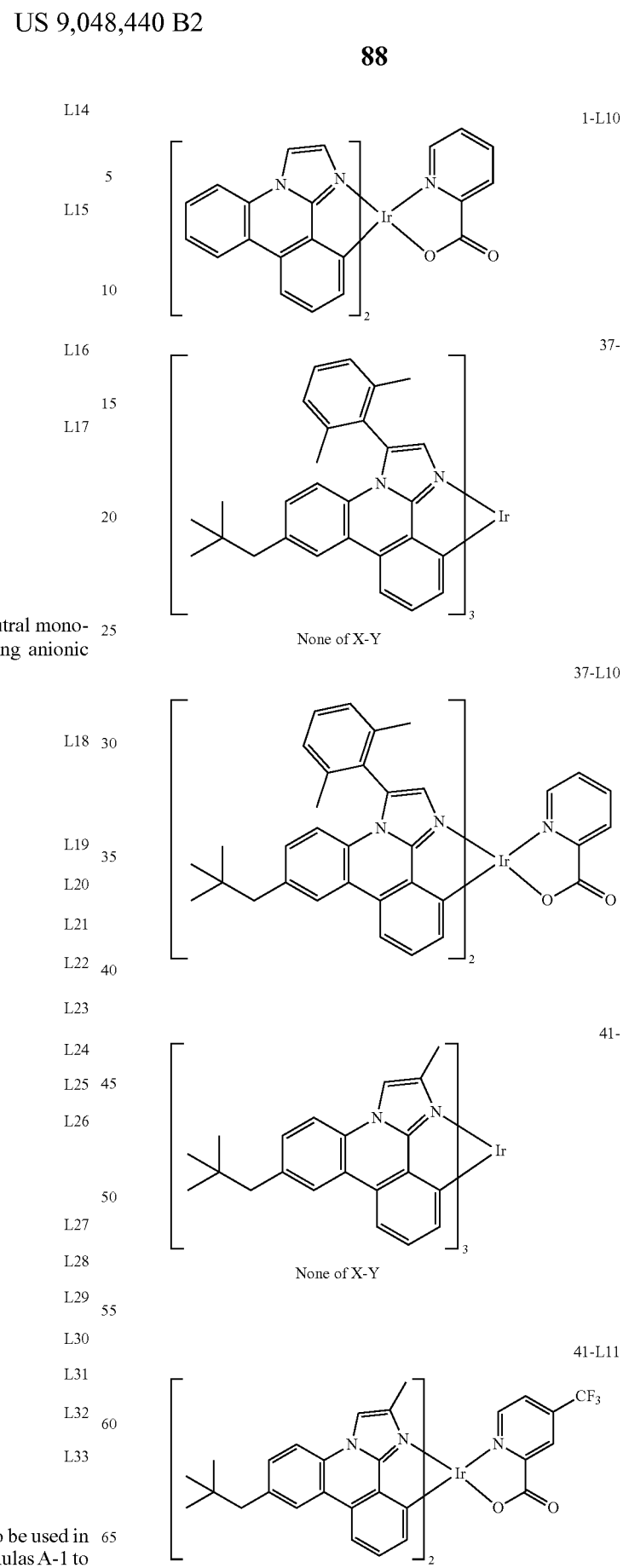

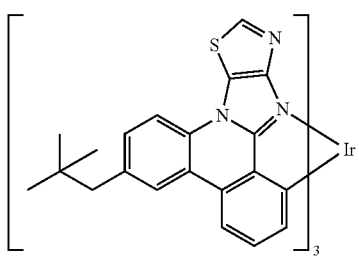
None of X-Y
89-L17
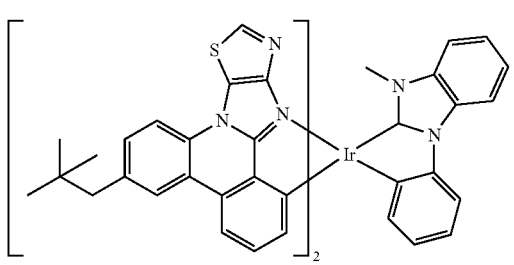
B-1
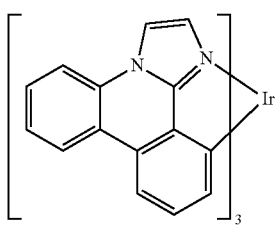
B-2
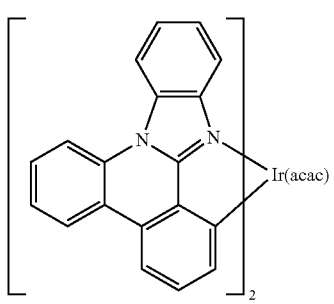
B-3
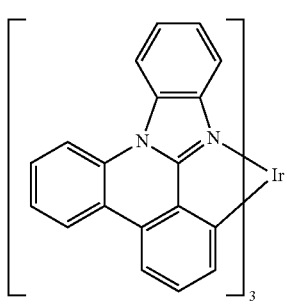
B-4
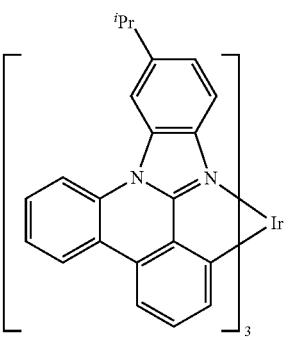
B-5
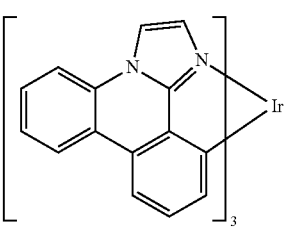
B-6
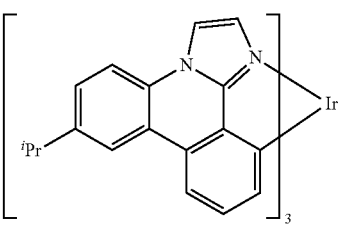
B-7
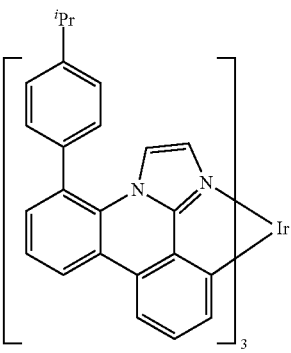
B-8
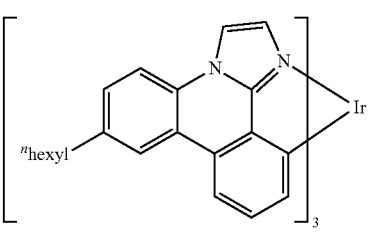
B-9
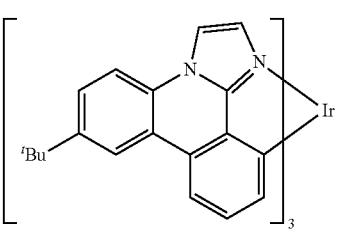

-continued
B-10
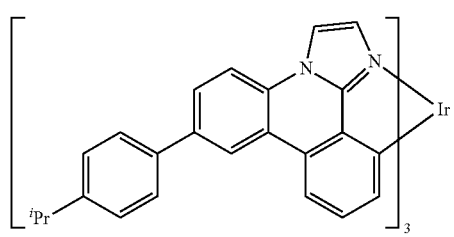
B-11
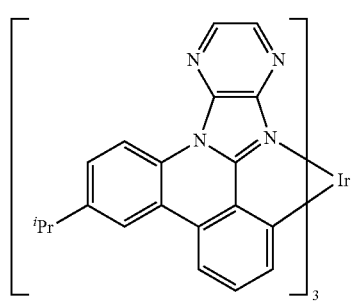
B-12
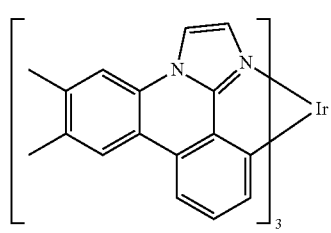
B-13
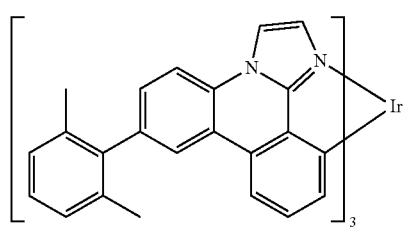
B-14
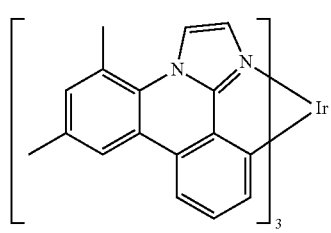
B-15)
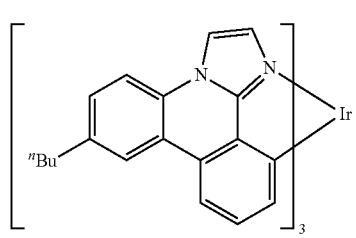
-continued
B-16
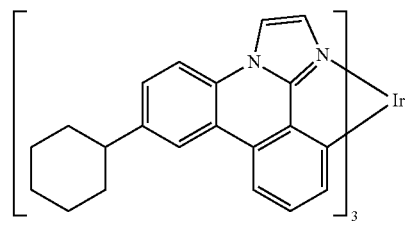
B-17
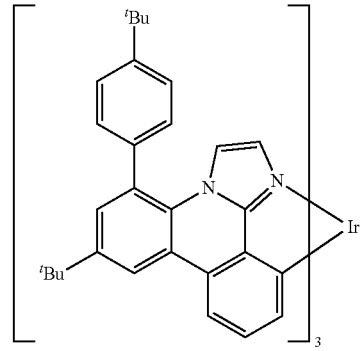
B-18
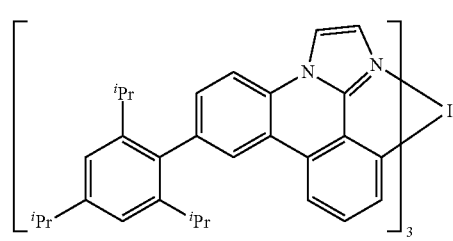
B-19
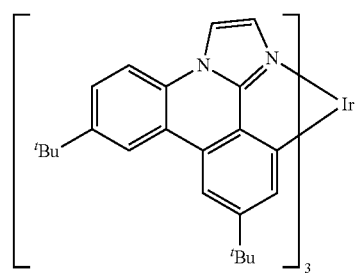
B-20
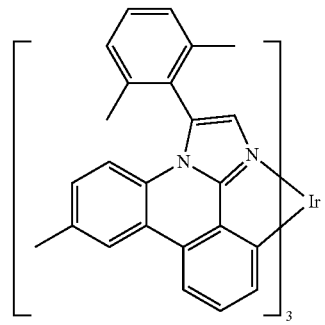

B-21 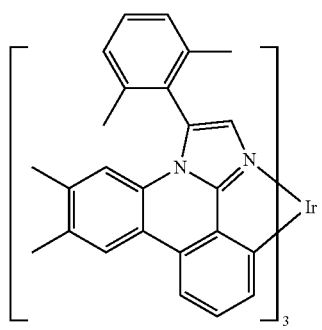
B-22 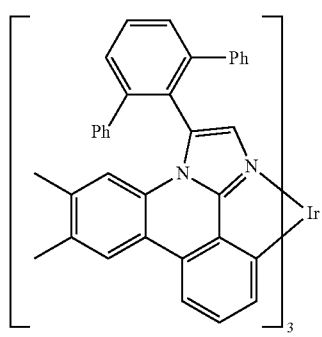
B-23 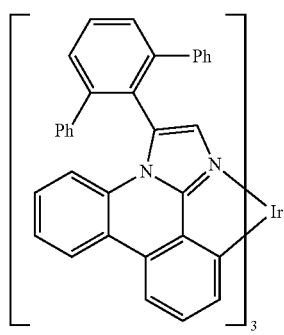
B-24 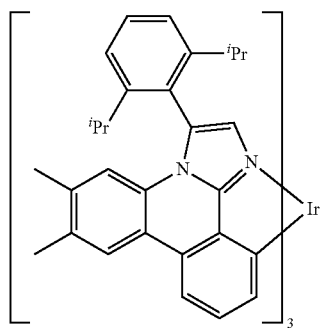
B-25 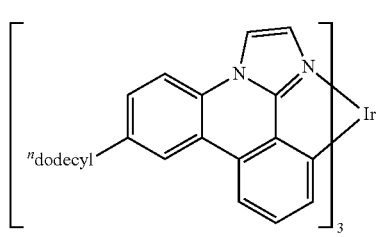
B-26 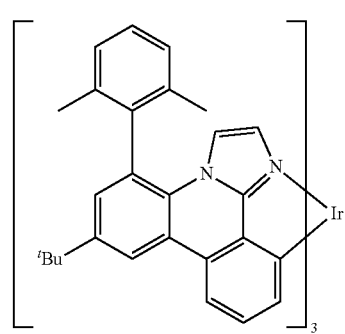
B-27 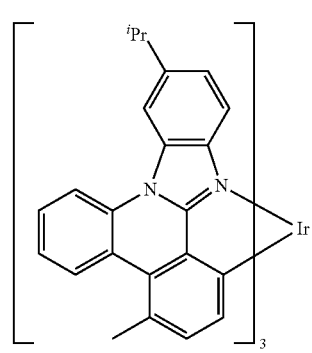
B-28 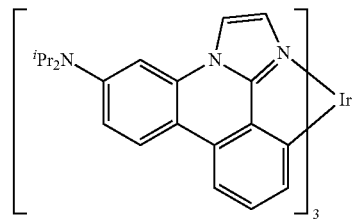
B-29 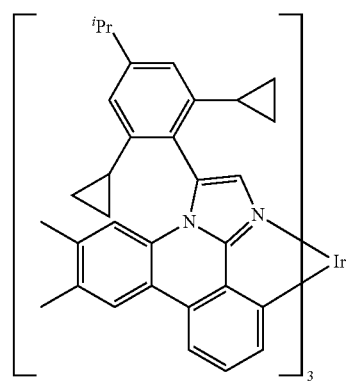
B-30 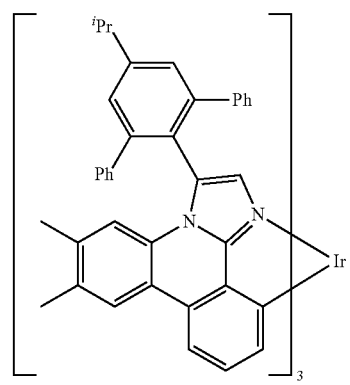

-continued
B-31
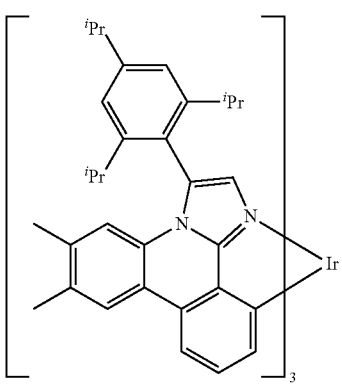
B-32
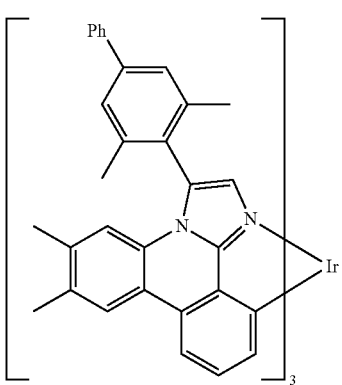
B-33
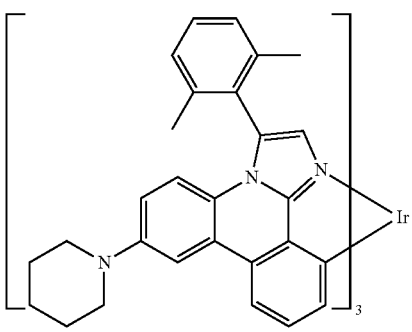
B-34
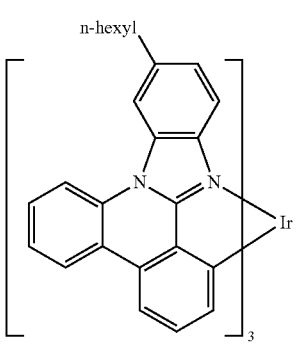
-continued
B-35
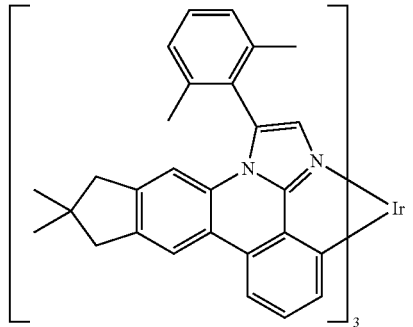
B-36
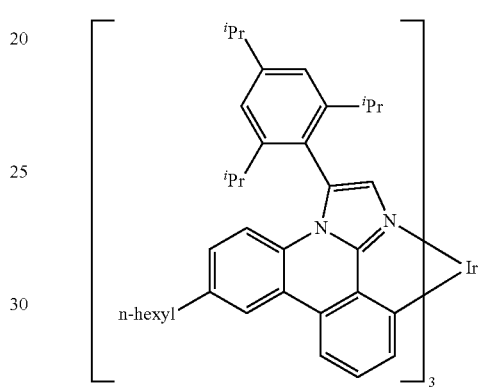
B-37
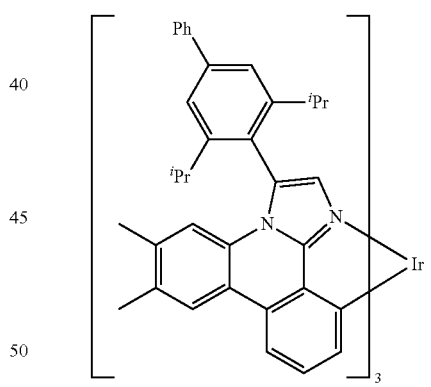
B-38
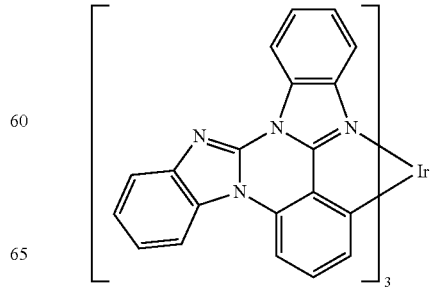

B-39 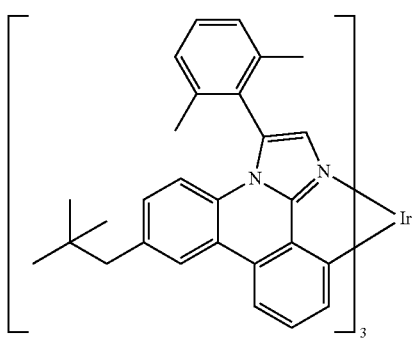
B-40 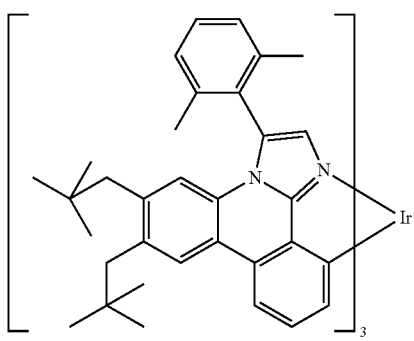
B-41 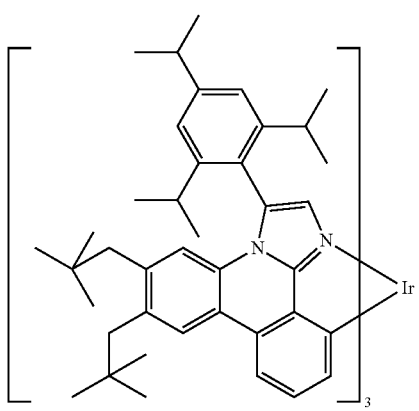
B-42 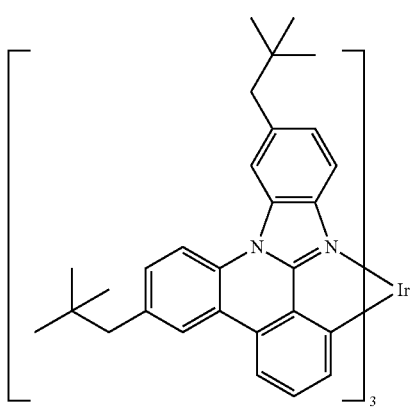
B-43 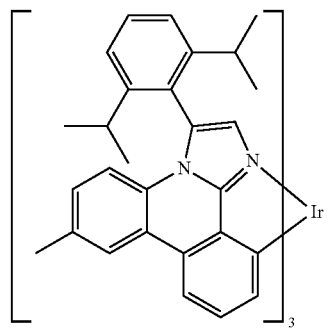
B-44 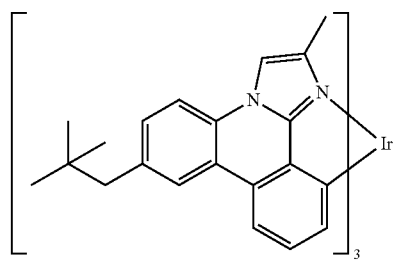
B-45 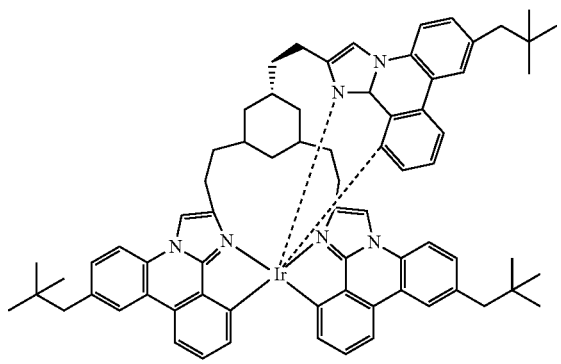
B-46 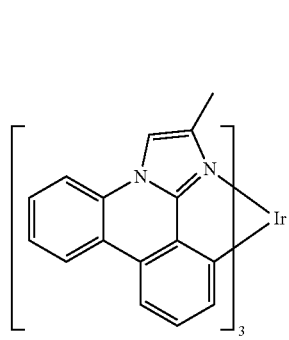
B-47 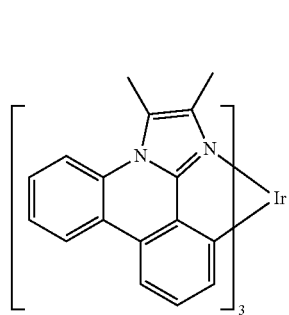

-continued
B-48
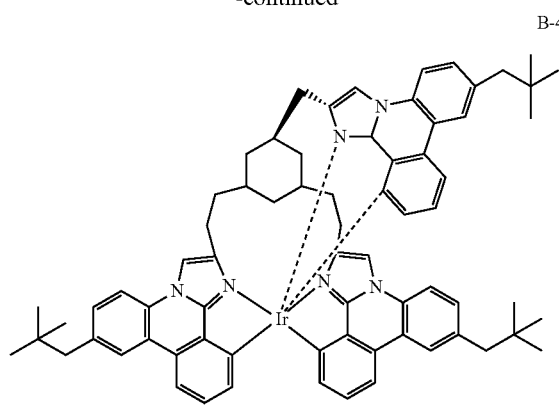
B-49
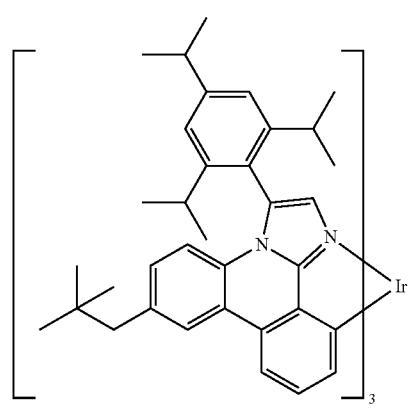
B-50
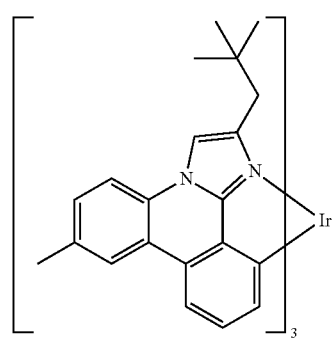
B-51
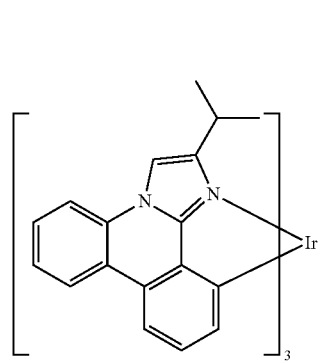
-continued
B-52
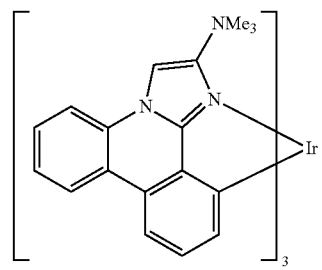
B-53
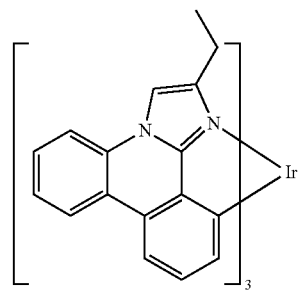
B-54
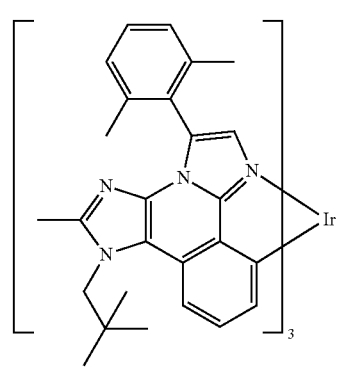
B-55
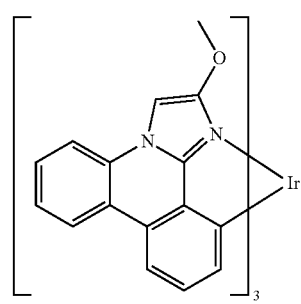
B-56
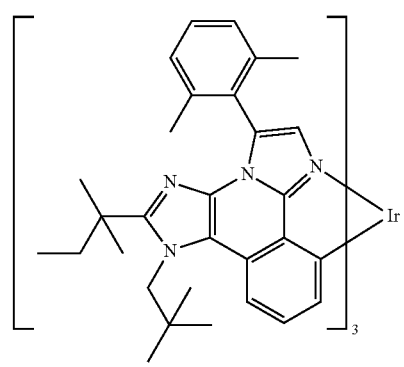

-continued
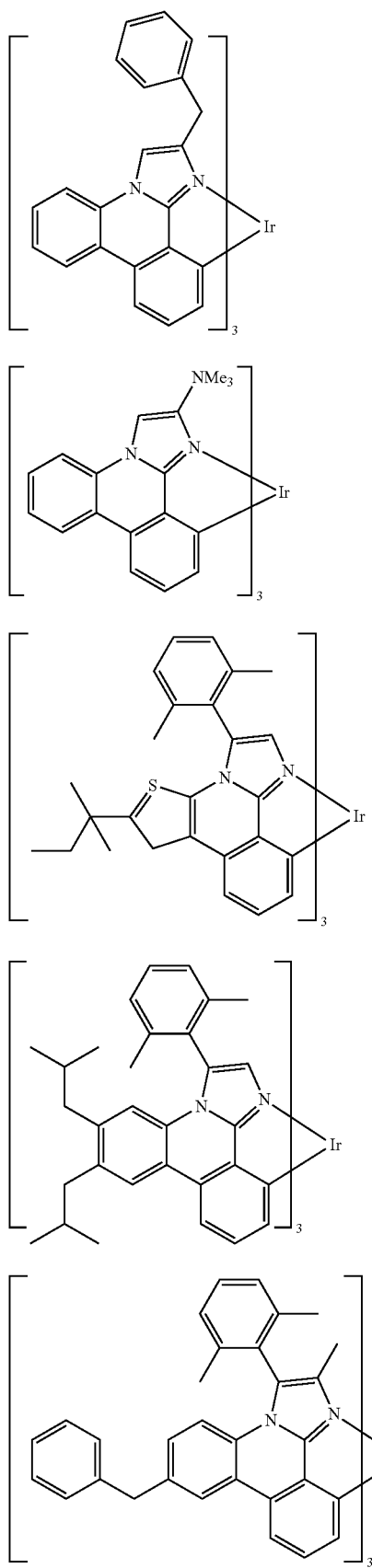
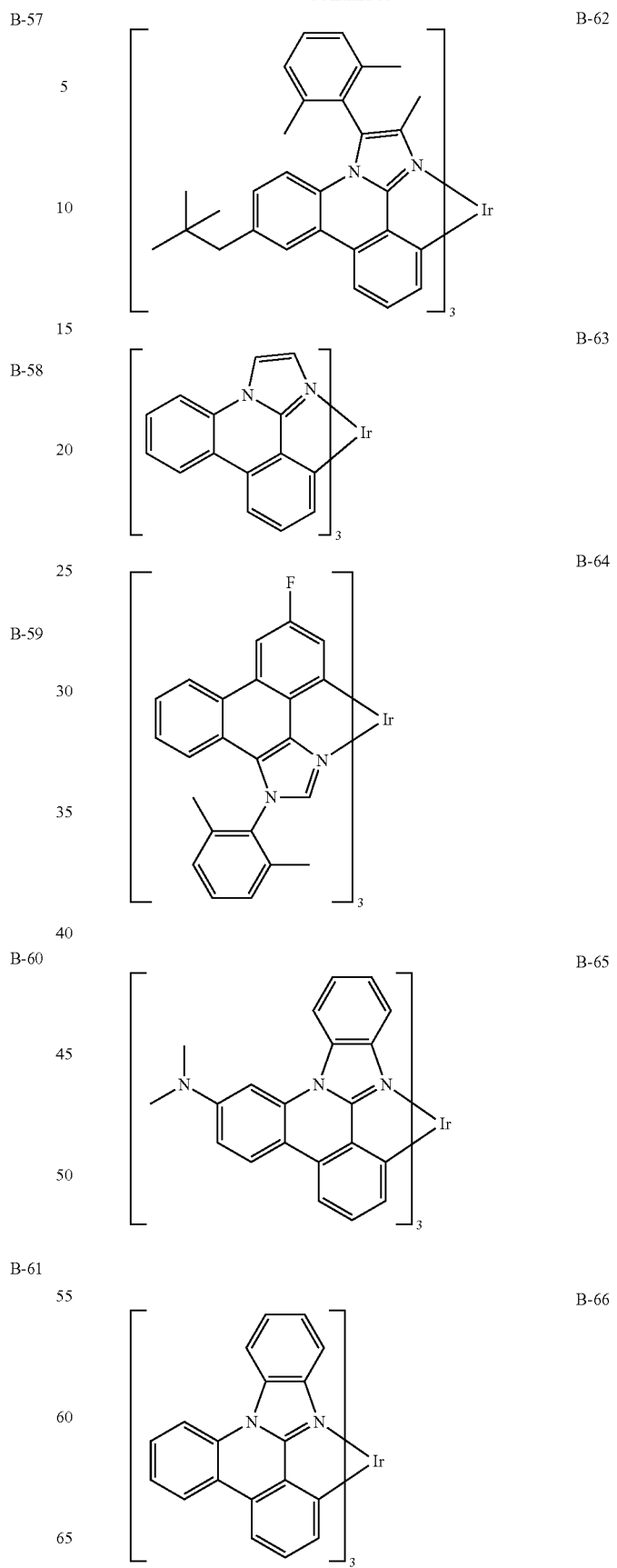

103
-continued
B-67
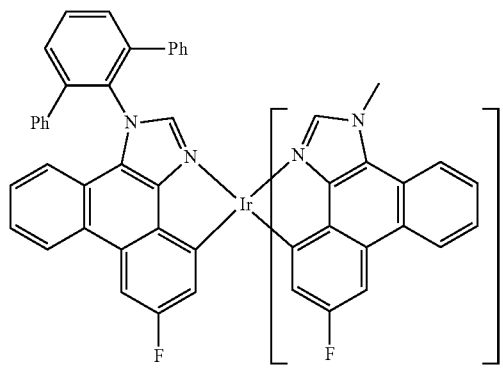
B-68
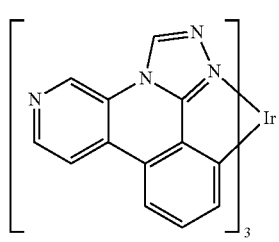
B-69
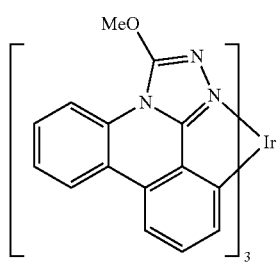
B-70
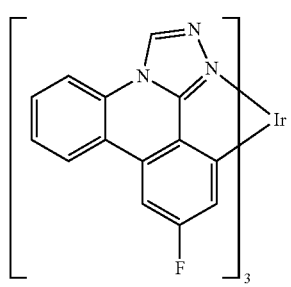
B-71
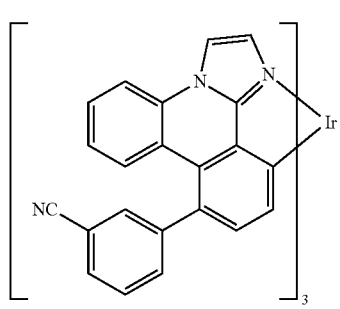
104
-continued
B-72
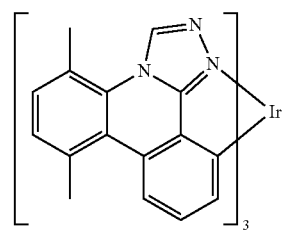
B-73
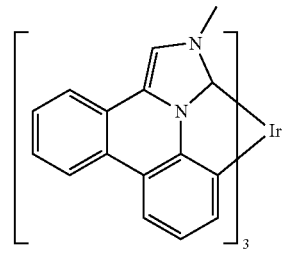
B-74
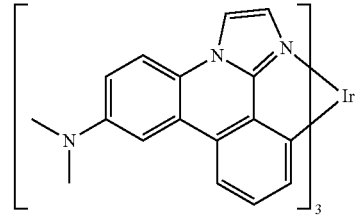
B-75
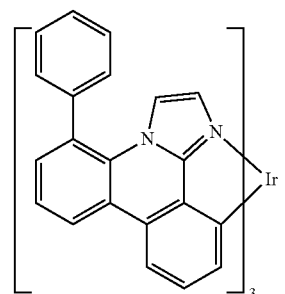
B-76
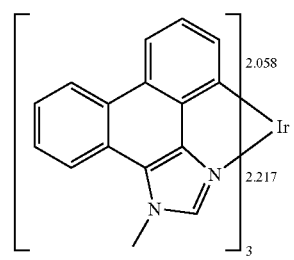
B-77
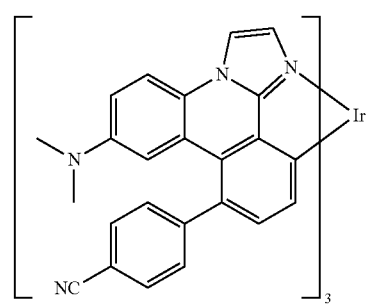

-continued
B-78
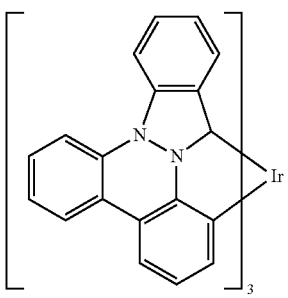
B-79
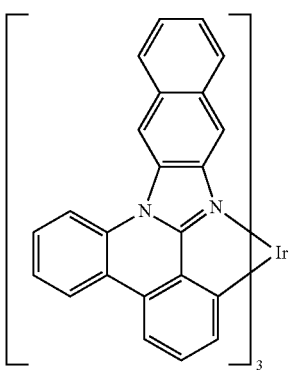
B-80
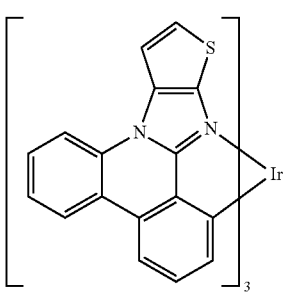
B-81
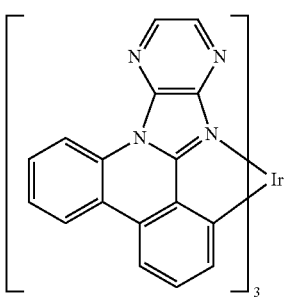
B-82
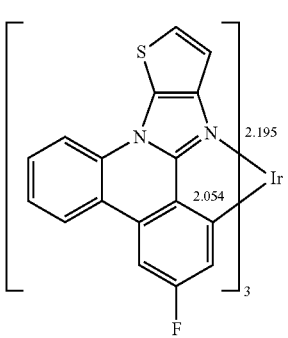
-continued
B-83
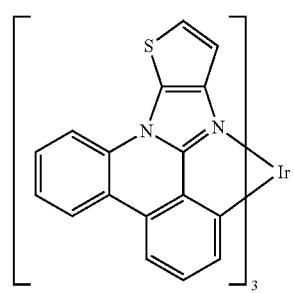
B-84
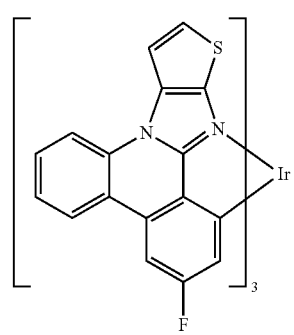
B-85
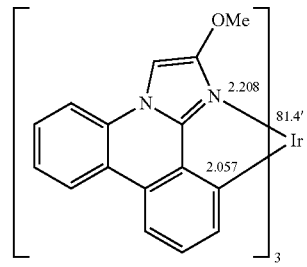
B-86
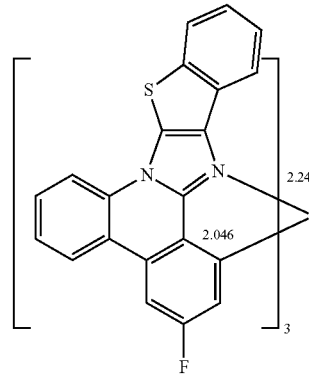
B-87
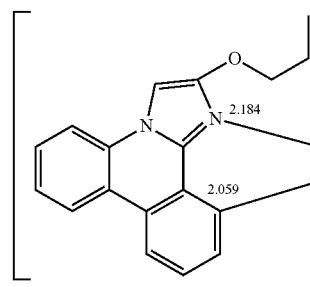

B-88
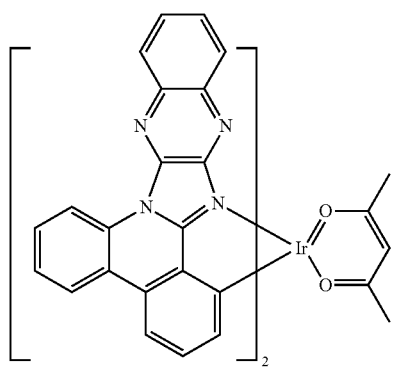
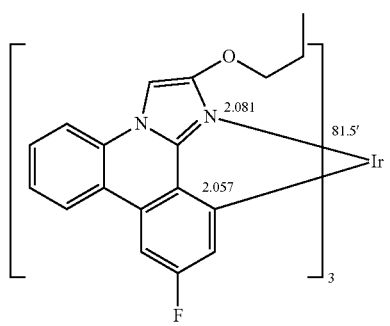
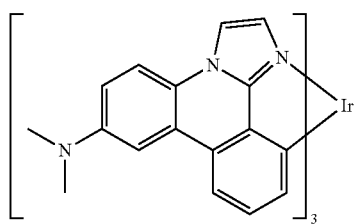
B-91
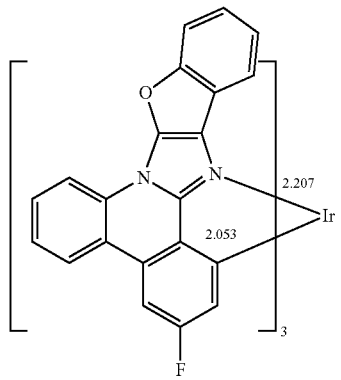
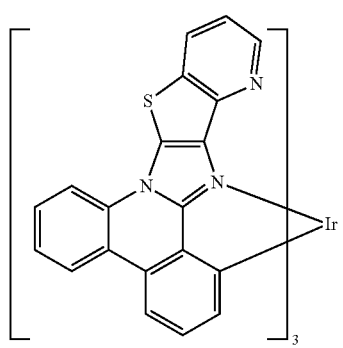
B-93
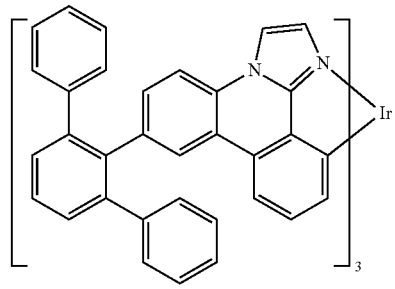
B-94
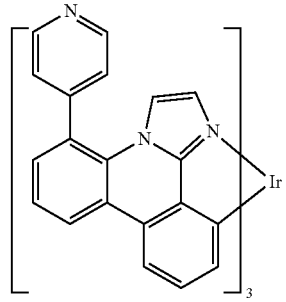
B-95
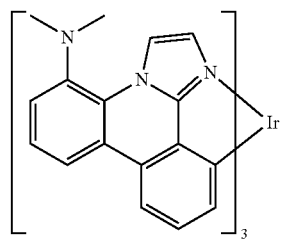
B-96
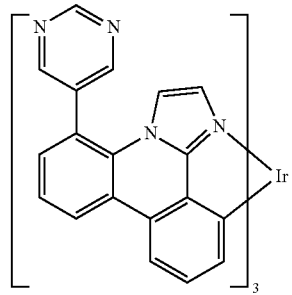
B-97
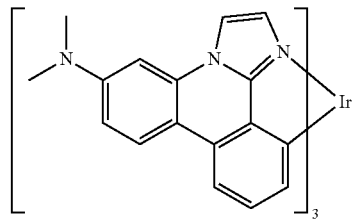
B-98
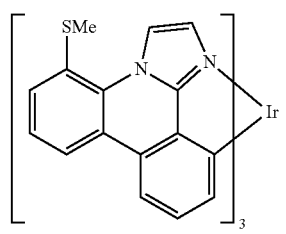

B-99
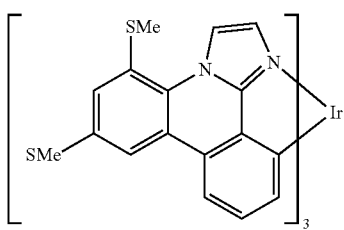
B-100
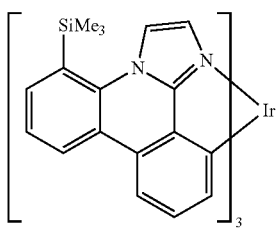
B-101
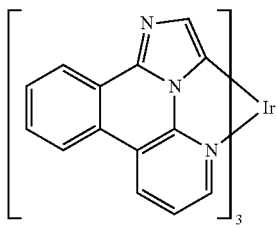
B-102
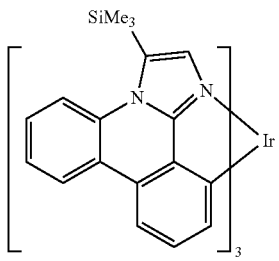
B-103
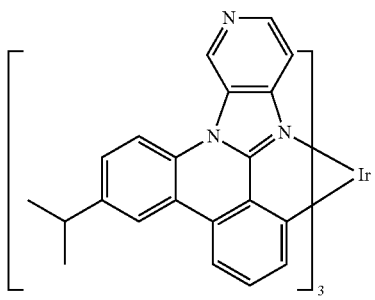
B-104
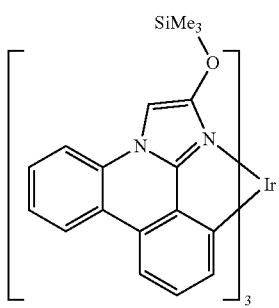
B-105
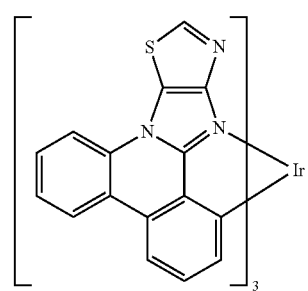
B-106
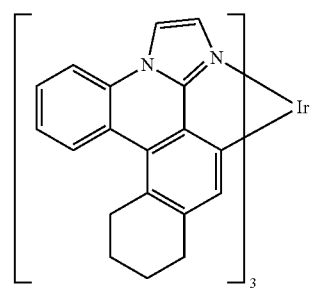
B-107
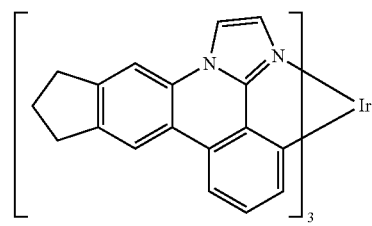
B-108
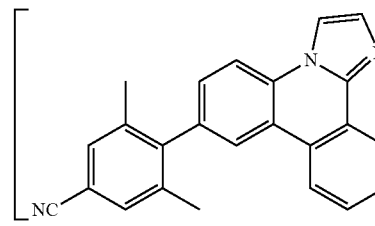
B-109
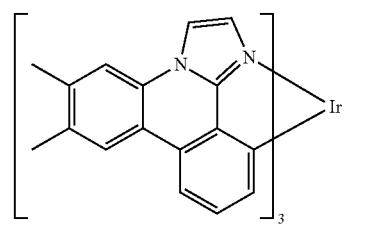
B-110
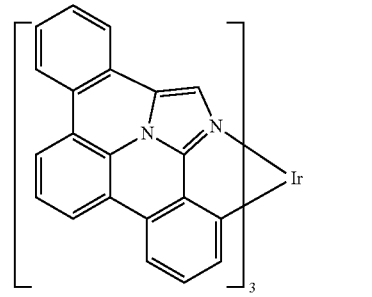

B-111
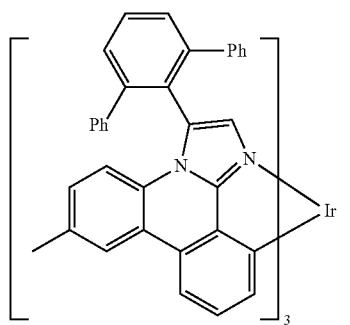
B-112
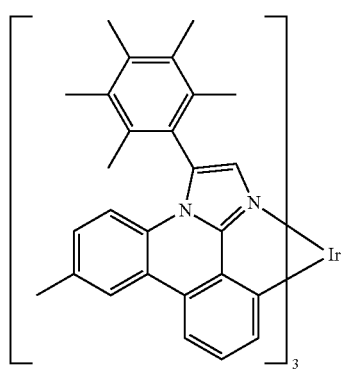
B-113
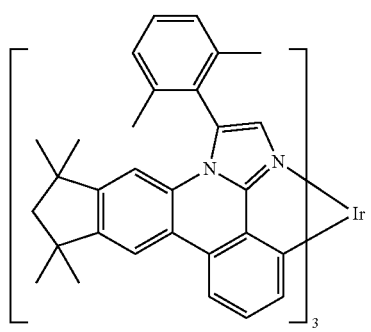
B-114
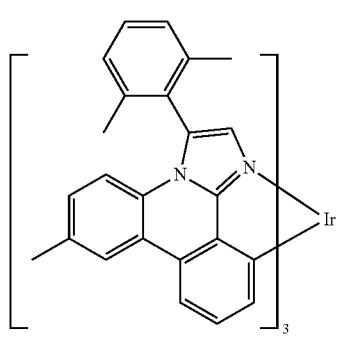
B-115
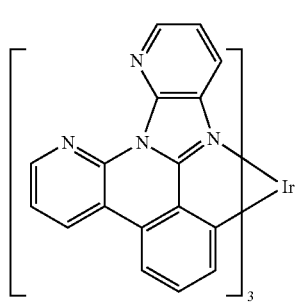
B-116
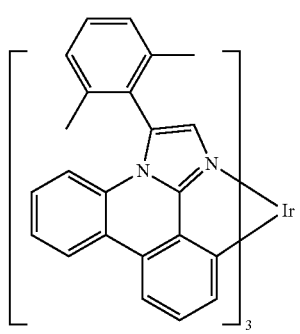
B-117
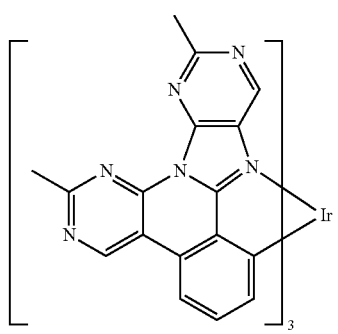
B-118
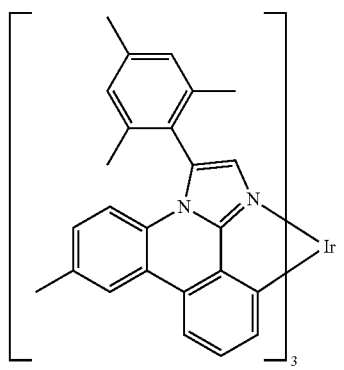
B-119
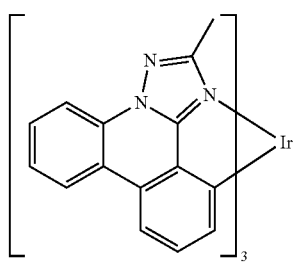
B-120
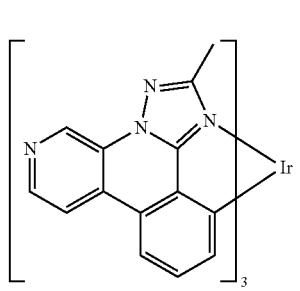

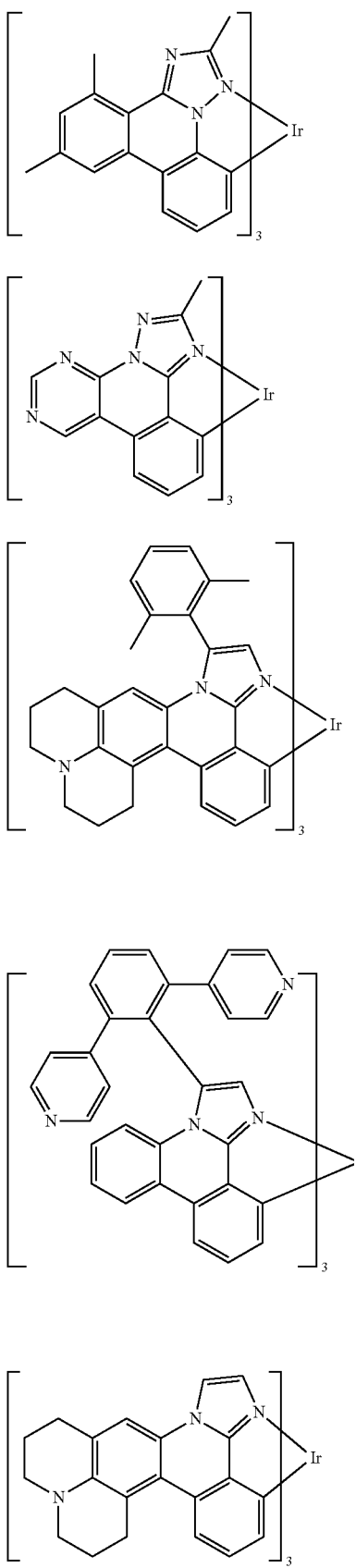
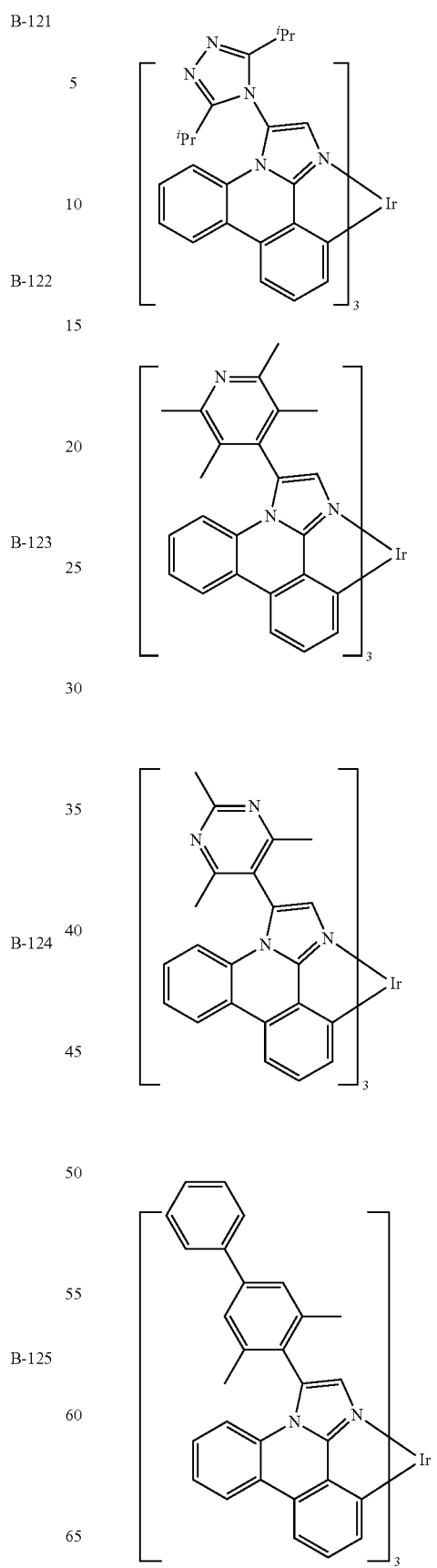

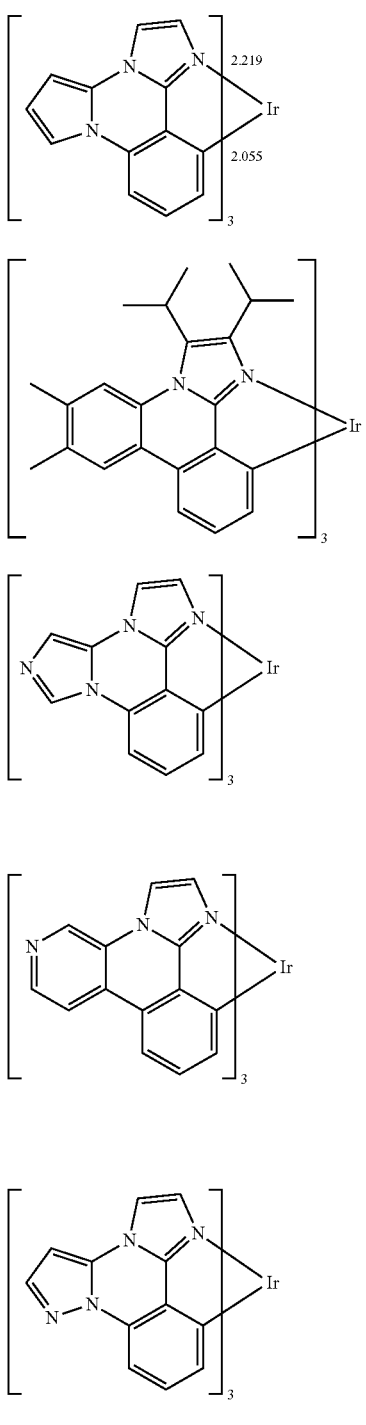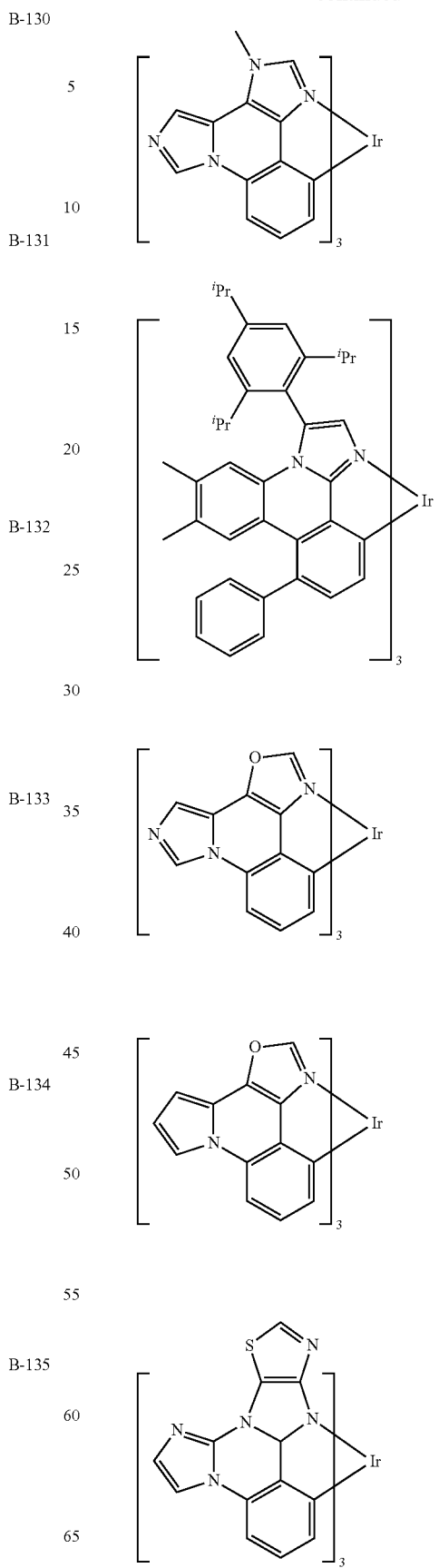

B-141
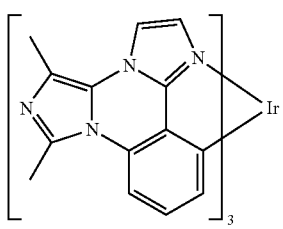
B-142
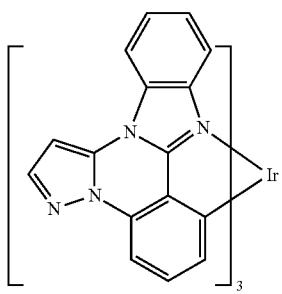
B-143
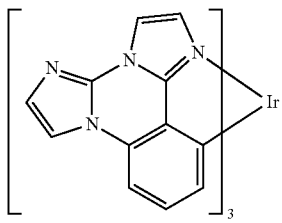
B-144
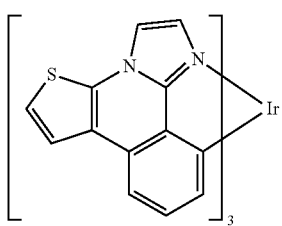
B-145
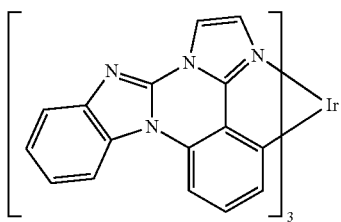
B-146
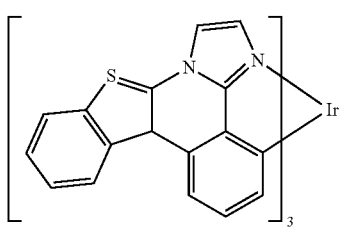
B-147
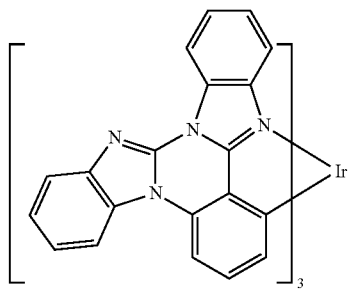
B-148
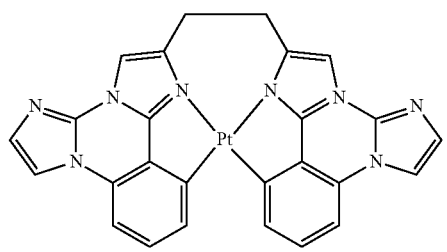
B-149
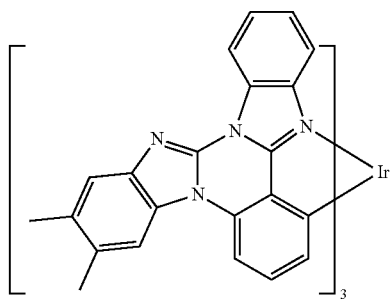
B-150
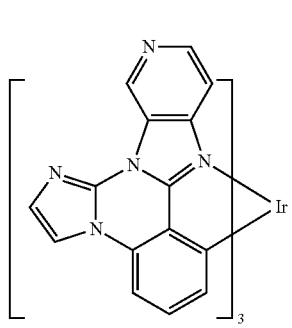
B-151
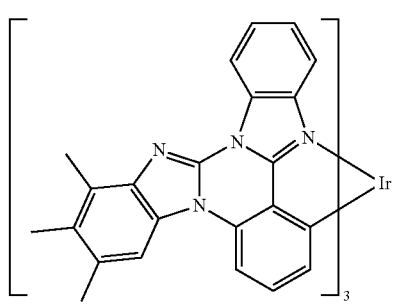

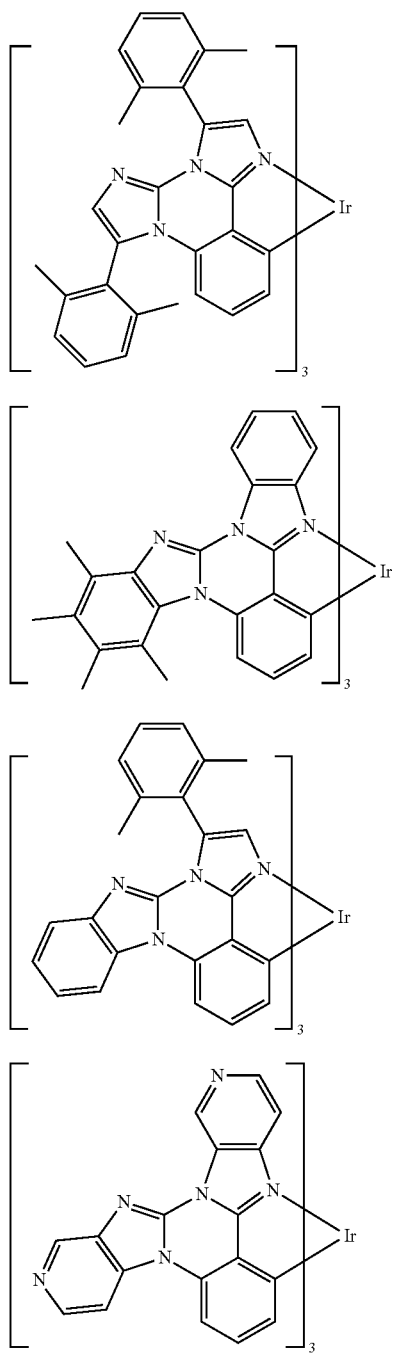

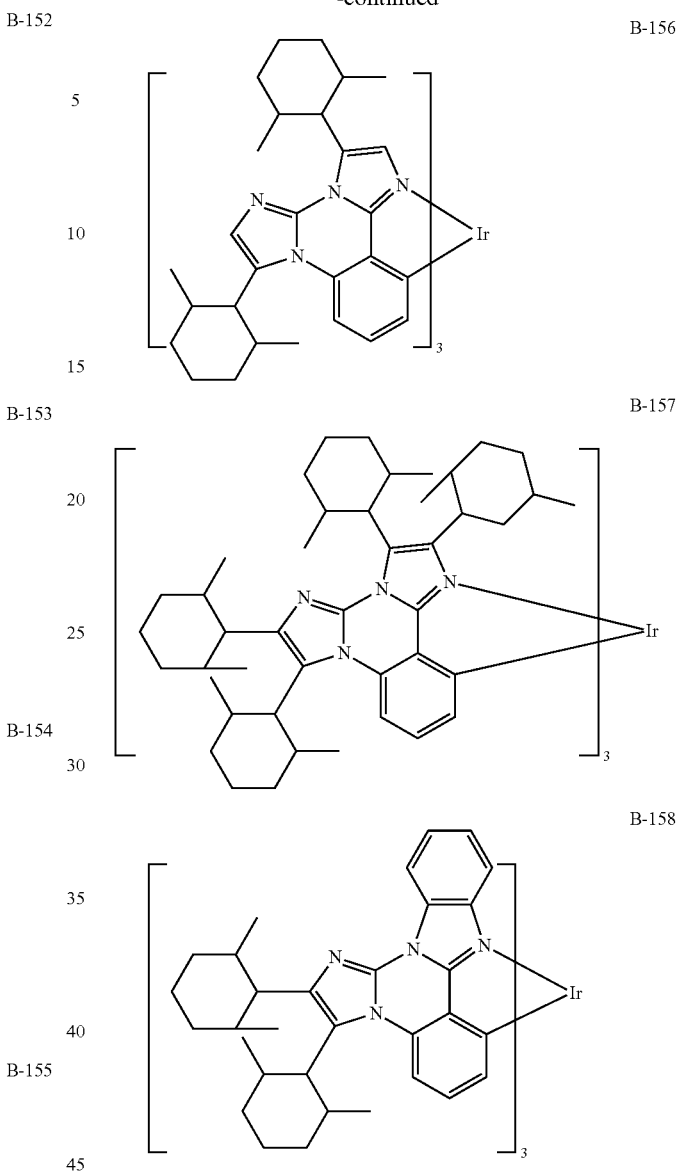

Specific examples of materials available from the above-described combinations and containing the compound (metal complex (a)) represented by any of the formulas (A) to (A10-1) and the structural isomer (b) of the compound are shown below in Tables 1 to 4. In Tables 1 to 4, the numeral in the column of the structure is the numeral from 1 to 222 in the formulas A-1 to A-222.

TABLE 1

| No. of specific examples | Structural formula | | | Steric structure | | Content ratio (%) | No. of specific examples | Structural formula | | | Steric structure | | Content ratio (%) |
| | Structure | n | X-Y | Metal complex (a) | Metal complex (b) | of Complex (b) | | Structure | n | X-Y | Metal complex (a) | Metal complex (b) | of Complex (b) |
| --- | --- | --- | --- | --- | --- | --- | --- | --- | --- | --- | --- | --- | --- |
| f1-0-1 | 1 | 3 | — | fac | mer | 0.05 | f1-10-1 | 1 | 2 | L10 | fac | mer | 0.05 |
| f1-0-2 | 1 | 3 | — | fac | mer | 0.06 | f1-10-2 | 1 | 2 | L10 | fac | mer | 0.06 |
| f1-0-3 | 1 | 3 | — | fac | mer | 0.07 | f1-10-3 | 1 | 2 | L10 | fac | mer | 0.07 |
| f1-0-4 | 1 | 3 | — | fac | mer | 0.08 | f1-10-4 | 1 | 2 | L10 | fac | mer | 0.08 |

TABLE 1-continued

| No. of specific examples | Structural formula Structure | n | X-Y | Steric structure Metal complex (a) | Steric structure Metal complex (b) | Content ratio (%) of Complex (b) | No. of specific examples | Structural formula Structure | n | X-Y | Steric structure Metal complex (a) | Steric structure Metal complex (b) | Content ratio (%) of Complex (b) |
|---|---|---|---|---|---|---|---|---|---|---|---|---|---|
| f1-0-5 | 1 | 3 | — | fac | mer | 0.09 | f1-10-5 | 1 | 2 | L10 | fac | mer | 0.09 |
| f1-0-6 | 1 | 3 | — | fac | mer | 0.1 | f1-10-6 | 1 | 2 | L10 | fac | mer | 0.1 |
| f1-0-7 | 1 | 3 | — | fac | mer | 0.2 | f1-10-7 | 1 | 2 | L10 | fac | mer | 0.2 |
| f1-0-8 | 1 | 3 | — | fac | mer | 0.3 | f1-10-8 | 1 | 2 | L10 | fac | mer | 0.3 |
| f1-0-9 | 1 | 3 | — | fac | mer | 0.4 | f1-10-9 | 1 | 2 | L10 | fac | mer | 0.4 |
| f1-0-10 | 1 | 3 | — | fac | mer | 0.5 | f1-10-10 | 1 | 2 | L10 | fac | mer | 0.5 |
| f1-0-11 | 1 | 3 | — | fac | mer | 0.6 | f1-10-11 | 1 | 2 | L10 | fac | mer | 0.6 |
| f1-0-12 | 1 | 3 | — | fac | mer | 0.7 | f1-10-12 | 1 | 2 | L10 | fac | mer | 0.7 |
| f1-0-13 | 1 | 3 | — | fac | mer | 0.8 | f1-10-13 | 1 | 2 | L10 | fac | mer | 0.8 |
| f1-0-14 | 1 | 3 | — | fac | mer | 0.9 | f1-10-14 | 1 | 2 | L10 | fac | mer | 0.9 |
| f1-0-15 | 1 | 3 | — | fac | mer | 1 | f1-10-15 | 1 | 2 | L10 | fac | mer | 1 |
| f1-0-16 | 1 | 3 | — | fac | mer | 2 | f1-10-16 | 1 | 2 | L10 | fac | mer | 2 |
| f1-0-17 | 1 | 3 | — | fac | mer | 3 | f1-10-17 | 1 | 2 | L10 | fac | mer | 3 |
| f1-0-18 | 1 | 3 | — | fac | mer | 4 | f1-10-18 | 1 | 2 | L10 | fac | mer | 4 |
| f1-0-19 | 1 | 3 | — | fac | mer | 5 | f1-10-19 | 1 | 2 | L10 | fac | mer | 5 |
| f41-0-1 | 41 | 3 | — | fac | mer | 0.05 | f41-11-1 | 41 | 2 | L-11 | fac | mer | 0.05 |
| f41-0-2 | 41 | 3 | — | fac | mer | 0.06 | f41-11-2 | 41 | 2 | L-11 | fac | mer | 0.06 |
| f41-0-3 | 41 | 3 | — | fac | mer | 0.07 | f41-11-3 | 41 | 2 | L-11 | fac | mer | 0.07 |
| f41-0-4 | 41 | 3 | — | fac | mer | 0.08 | f41-11-4 | 41 | 2 | L-11 | fac | mer | 0.08 |
| f41-0-5 | 41 | 3 | — | fac | mer | 0.09 | f41-11-5 | 41 | 2 | L-11 | fac | mer | 0.09 |
| f41-0-6 | 41 | 3 | — | fac | mer | 0.1 | f41-11-6 | 41 | 2 | L-11 | fac | mer | 0.1 |
| f41-0-7 | 41 | 3 | — | fac | mer | 0.2 | f41-11-7 | 41 | 2 | L-11 | fac | mer | 0.2 |
| f41-0-8 | 41 | 3 | — | fac | mer | 0.3 | f41-11-8 | 41 | 2 | L-11 | fac | mer | 0.3 |
| f41-0-9 | 41 | 3 | — | fac | mer | 0.4 | f41-11-9 | 41 | 2 | L-11 | fac | mer | 0.4 |
| f41-0-10 | 41 | 3 | — | fac | mer | 0.5 | f41-11-10 | 41 | 2 | L-11 | fac | mer | 0.5 |
| f41-0-11 | 41 | 3 | — | fac | mer | 0.6 | f41-11-11 | 41 | 2 | L-11 | fac | mer | 0.6 |
| f41-0-12 | 41 | 3 | — | fac | mer | 0.7 | f41-11-12 | 41 | 2 | L-11 | fac | mer | 0.7 |
| f41-0-13 | 41 | 3 | — | fac | mer | 0.8 | f41-11-13 | 41 | 2 | L-11 | fac | mer | 0.8 |
| f41-0-14 | 41 | 3 | — | fac | mer | 0.9 | f41-11-14 | 41 | 2 | L-11 | fac | mer | 0.9 |
| f41-0-15 | 41 | 3 | — | fac | mer | 1 | f41-11-15 | 41 | 2 | L-11 | fac | mer | 1 |
| f41-0-16 | 41 | 3 | — | fac | mer | 2 | f41-11-16 | 41 | 2 | L-11 | fac | mer | 2 |
| f41-0-17 | 41 | 3 | — | fac | mer | 3 | f41-11-17 | 41 | 2 | L-11 | fac | mer | 3 |
| f41-0-18 | 41 | 3 | — | fac | mer | 4 | f41-11-18 | 41 | 2 | L-11 | fac | mer | 4 |
| f41-0-19 | 41 | 3 | — | fac | mer | 5 | f41-11-19 | 41 | 2 | L-11 | fac | mer | 5 |
| f189-0-1 | 189 | 3 | — | fac | mer | 0.05 | f189-17-1 | 189 | 2 | L-17 | fac | mer | 0.05 |
| f189-0-2 | 189 | 3 | — | fac | mer | 0.06 | f189-17-2 | 189 | 2 | L-17 | fac | mer | 0.06 |
| f189-0-3 | 189 | 3 | — | fac | mer | 0.07 | f189-17-3 | 189 | 2 | L-17 | fac | mer | 0.07 |
| f189-0-4 | 189 | 3 | — | fac | mer | 0.08 | f189-17-4 | 189 | 2 | L-17 | fac | mer | 0.08 |
| f189-0-5 | 189 | 3 | — | fac | mer | 0.09 | f189-17-5 | 189 | 2 | L-17 | fac | mer | 0.09 |
| f189-0-6 | 189 | 3 | — | fac | mer | 0.1 | f189-17-6 | 189 | 2 | L-17 | fac | mer | 0.1 |
| f189-0-7 | 189 | 3 | — | fac | mer | 0.2 | f189-17-7 | 189 | 2 | L-17 | fac | mer | 0.2 |
| f189-0-8 | 189 | 3 | — | fac | mer | 0.3 | f189-17-8 | 189 | 2 | L-17 | fac | mer | 0.3 |
| f189-0-9 | 189 | 3 | — | fac | mer | 0.4 | f189-17-9 | 189 | 2 | L-17 | fac | mer | 0.4 |
| f189-0-10 | 189 | 3 | — | fac | mer | 0.5 | f189-17-10 | 189 | 2 | L-17 | fac | mer | 0.5 |
| f189-0-11 | 189 | 3 | — | fac | mer | 0.6 | f189-17-11 | 189 | 2 | L-17 | fac | mer | 0.6 |
| f189-0-12 | 189 | 3 | — | fac | mer | 0.7 | f189-17-12 | 189 | 2 | L-17 | fac | mer | 0.7 |
| f189-0-13 | 189 | 3 | — | fac | mer | 0.8 | f189-17-13 | 189 | 2 | L-17 | fac | mer | 0.8 |
| f189-0-14 | 189 | 3 | — | fac | mer | 0.9 | f189-17-14 | 189 | 2 | L-17 | fac | mer | 0.9 |
| f189-0-15 | 189 | 3 | — | fac | mer | 1 | f189-17-15 | 189 | 2 | L-17 | fac | mer | 1 |
| f189-0-16 | 189 | 3 | — | fac | mer | 2 | f189-17-16 | 189 | 2 | L-17 | fac | mer | 2 |
| f189-0-17 | 189 | 3 | — | fac | mer | 3 | f189-17-17 | 189 | 2 | L-17 | fac | mer | 3 |
| f189-0-18 | 189 | 3 | — | fac | mer | 4 | f189-17-18 | 189 | 2 | L-17 | fac | mer | 4 |
| f189-0-19 | 189 | 3 | — | fac | mer | 5 | f189-17-19 | 189 | 2 | L-17 | fac | mer | 5 |
| f37-0-1 | 37 | 3 | — | fac | mer | 0.05 | m37-10-1 | 1 | 2 | L10 | mer | fac | 0.05 |
| f37-0-2 | 37 | 3 | — | fac | mer | 0.06 | m37-10-2 | 1 | 2 | L10 | mer | fac | 0.06 |
| f37-0-3 | 37 | 3 | — | fac | mer | 0.07 | m37-10-3 | 1 | 2 | L10 | mer | fac | 0.07 |
| f37-0-4 | 37 | 3 | — | fac | mer | 0.08 | m37-10-4 | 1 | 2 | L10 | mer | fac | 0.08 |
| f37-0-5 | 37 | 3 | — | fac | mer | 0.09 | m37-10-5 | 1 | 2 | L10 | mer | fac | 0.09 |
| f37-0-6 | 37 | 3 | — | fac | mer | 0.1 | m37-10-6 | 1 | 2 | L10 | mer | fac | 0.1 |
| f37-0-7 | 37 | 3 | — | fac | mer | 0.2 | m37-10-7 | 1 | 2 | L10 | mer | fac | 0.2 |
| f37-0-8 | 37 | 3 | — | fac | mer | 0.3 | m37-10-8 | 1 | 2 | L10 | mer | fac | 0.3 |
| f37-0-9 | 37 | 3 | — | fac | mer | 0.4 | m37-10-9 | 1 | 2 | L10 | mer | fac | 0.4 |
| f37-0-10 | 37 | 3 | — | fac | mer | 0.5 | m37-10-10 | 1 | 2 | L10 | mer | fac | 0.5 |
| f37-0-11 | 37 | 3 | — | fac | mer | 0.6 | m37-10-11 | 1 | 2 | L10 | mer | fac | 0.6 |
| f37-0-12 | 37 | 3 | — | fac | mer | 0.7 | m37-10-12 | 1 | 2 | L10 | mer | fac | 0.7 |
| f37-0-13 | 37 | 3 | — | fac | mer | 0.8 | m37-10-13 | 1 | 2 | L10 | mer | fac | 0.8 |
| f37-0-14 | 37 | 3 | — | fac | mer | 0.9 | m37-10-14 | 1 | 2 | L10 | mer | fac | 0.9 |
| f37-0-15 | 37 | 3 | — | fac | mer | 1 | m37-10-15 | 1 | 2 | L10 | mer | fac | 1 |

TABLE 2

| No. of specific examples | Structural formula Structure | n | X-Y | Steric structure Metal complex (a) | Steric structure Metal complex (b) | Content ratio (%) of Complex (b) | No. of specific examples | Structural formula Structure | n | X-Y | Steric structure Metal complex (a) | Steric structure Metal complex (b) | Content ratio (%) of Complex (b) |
|---|---|---|---|---|---|---|---|---|---|---|---|---|---|
| f5-0-1 | 5 | 3 | — | fac | mer | 0.05 | f39-0-1 | 39 | 3 | — | fac | mer | 0.05 |
| f5-0-2 | 5 | 3 | — | fac | mer | 0.1 | f39-0-2 | 39 | 3 | — | fac | mer | 0.06 |
| f5-0-3 | 5 | 3 | — | fac | mer | 0.5 | f39-0-3 | 39 | 3 | — | fac | mer | 0.25 |
| f5-0-4 | 5 | 3 | — | fac | mer | 0.7 | f39-0-4 | 39 | 3 | — | fac | mer | 0.75 |
| f5-0-5 | 5 | 3 | — | fac | mer | 1 | f39-11-1 | 39 | 2 | L11 | fac | mer | 0.05 |
| f5-0-6 | 5 | 3 | — | fac | mer | 3 | f39-11-2 | 39 | 2 | L11 | fac | mer | 0.08 |
| f5-0-7 | 5 | 3 | — | fac | mer | 4 | f39-11-3 | 39 | 2 | L11 | fac | mer | 0.4 |
| f5-0-8 | 5 | 3 | — | fac | mer | 5 | f39-11-4 | 39 | 2 | L11 | fac | mer | 1.1 |
| f5-12-1 | 5 | 2 | L12 | fac | mer | 0.5 | f42-0-1 | 42 | 3 | — | fac | mer | 0.5 |
| f5-12-2 | 5 | 2 | L12 | fac | mer | 1 | f42-0-2 | 42 | 3 | — | fac | mer | 2.4 |
| f12-0-1 | 12 | 3 | — | fac | mer | 0.05 | f42-14-1 | 42 | 2 | L14 | fac | mer | 1 |
| f12-0-2 | 12 | 3 | — | fac | mer | 0.06 | f42-14-2 | 42 | 2 | L14 | fac | mer | 2 |
| f12-0-3 | 12 | 3 | — | fac | mer | 1 | f42-14-3 | 42 | 2 | L14 | fac | mer | 5 |
| f12-0-4 | 12 | 3 | — | fac | mer | 1.1 | f42-10-1 | 42 | 2 | L10 | fac | mer | 0.6 |
| f12-0-5 | 12 | 3 | — | fac | mer | 1.5 | f42-10-2 | 42 | 2 | L10 | fac | mer | 1.2 |
| f12-0-6 | 12 | 3 | — | fac | mer | 2 | f42-10-3 | 42 | 2 | L10 | fac | mer | 1.8 |
| f12-0-7 | 12 | 3 | — | fac | mer | 2.4 | m42-10-1 | 42 | 2 | L10 | mer | fac | 1.1 |
| f12-0-8 | 12 | 3 | — | fac | mer | 2.6 | m42-10-2 | 42 | 2 | L10 | mer | fac | 2.2 |
| f12-0-9 | 12 | 3 | — | fac | mer | 3.1 | m42-10-3 | 42 | 2 | L10 | mer | fac | 3.3 |
| f12-0-10 | 12 | 3 | — | fac | mer | 4 | f49-0-1 | 49 | 3 | — | fac | mer | 0.4 |
| f12-0-11 | 12 | 3 | — | fac | mer | 4.2 | f49-0-2 | 49 | 3 | — | fac | mer | 0.7 |
| f12-0-12 | 12 | 3 | — | fac | mer | 4.6 | f49-0-3 | 49 | 3 | — | fac | mer | 1 |
| f12-0-13 | 12 | 3 | — | fac | mer | 5 | f49-0-4 | 49 | 3 | — | fac | mer | 1.5 |
| f18-8-1 | 18 | 2 | L8 | fac | mer | 0.05 | f49-0-5 | 49 | 3 | — | fac | mer | 2.1 |
| f18-8-2 | 18 | 2 | L8 | fac | mer | 0.1 | f49-0-6 | 49 | 3 | — | fac | mer | 4.5 |
| f18-8-3 | 18 | 2 | L8 | fac | mer | 0.8 | f51-0-1 | 51 | 3 | — | fac | mer | 0.07 |
| f18-13-1 | 18 | 2 | L13 | fac | mer | 0.5 | f51-0-2 | 51 | 3 | — | fac | mer | 0.1 |
| f18-13-2 | 18 | 2 | L13 | fac | mer | 1.5 | f51-0-3 | 51 | 3 | — | fac | mer | 0.15 |
| f18-10-1 | 18 | 1 | L10 | fac | mer | 0.06 | f51-0-4 | 51 | 3 | — | fac | mer | 0.5 |
| f18-10-2 | 18 | 1 | L10 | fac | mer | 1 | f51-0-5 | 51 | 3 | — | fac | mer | 0.85 |
| f18-10-3 | 18 | 1 | L10 | fac | mer | 1.2 | f51-0-6 | 51 | 3 | — | fac | mer | 1.1 |
| f18-10-4 | 18 | 1 | L10 | fac | mer | 4.8 | f51-0-7 | 51 | 3 | — | fac | mer | 2.6 |
| f24-0-1 | 24 | 3 | — | fac | mer | 0.05 | f51-13-1 | 51 | 2 | L13 | fac | mer | 0.05 |
| f24-0-2 | 24 | 3 | — | fac | mer | 0.07 | f51-13-2 | 51 | 2 | L13 | fac | mer | 0.1 |
| f24-0-3 | 24 | 3 | — | fac | mer | 0.09 | f54-0-1 | 54 | 3 | — | fac | mer | 0.05 |
| f24-0-4 | 24 | 3 | — | fac | mer | 1.3 | f54-0-2 | 54 | 3 | — | fac | mer | 0.07 |
| f24-14-1 | 24 | 2 | L14 | fac | mer | 0.5 | f54-0-3 | 54 | 3 | — | fac | mer | 0.12 |
| f24-14-2 | 24 | 2 | L14 | fac | mer | 1.4 | f54-0-4 | 54 | 3 | — | fac | mer | 0.77 |
| f24-14-3 | 24 | 2 | L14 | fac | mer | 1.6 | f54-0-5 | 54 | 3 | — | fac | mer | 1.31 |
| f24-14-4 | 24 | 2 | L14 | fac | mer | 2.8 | f54-10-1 | 54 | 2 | L10 | fac | mer | 0.09 |
| f24-11-1 | 24 | 2 | L11 | fac | mer | 0.4 | f54-10-2 | 54 | 2 | L10 | fac | mer | 1.1 |
| f24-11-2 | 24 | 2 | L11 | fac | mer | 0.8 | f59-0-1 | 59 | 3 | — | fac | mer | 0.1 |
| f24-11-3 | 24 | 2 | L11 | fac | mer | 1.3 | f59-0-2 | 59 | 3 | — | fac | mer | 0.3 |
| f24-11-4 | 24 | 2 | L11 | fac | mer | 2.6 | f59-0-3 | 59 | 3 | — | fac | mer | 0.6 |
| f24-11-5 | 24 | 2 | L11 | fac | mer | 5 | f59-12-1 | 59 | 2 | L12 | fac | mer | 1.5 |
| f27-0-1 | 27 | 3 | — | fac | mer | 0.05 | f59-12-2 | 59 | 2 | L12 | fac | mer | 3 |
| f27-0-2 | 27 | 3 | — | fac | mer | 0.07 | f59-12-3 | 59 | 2 | L12 | fac | mer | 4.5 |
| f27-0-3 | 27 | 3 | — | fac | mer | 0.1 | f61-0-1 | 61 | 3 | — | fac | mer | 0.06 |
| f27-0-4 | 27 | 3 | — | fac | mer | 0.5 | f61-0-2 | 61 | 3 | — | fac | mer | 0.07 |
| f27-0-5 | 27 | 3 | — | fac | mer | 0.75 | f61-0-3 | 61 | 3 | — | fac | mer | 0.5 |
| f27-0-6 | 27 | 3 | — | fac | mer | 0.06 | f61-0-4 | 61 | 3 | — | fac | mer | 2.8 |
| f27-0-7 | 27 | 3 | — | fac | mer | 0.07 | f65-0-1 | 65 | 3 | — | fac | mer | 1.1 |
| f27-0-8 | 27 | 3 | — | fac | mer | 0.9 | f65-0-2 | 65 | 3 | — | fac | mer | 2.5 |
| f27-0-9 | 27 | 3 | — | fac | mer | 2.2 | f65-0-3 | 65 | 3 | — | fac | mer | 3.5 |
| f27-0-10 | 27 | 3 | — | fac | mer | 4.7 | f65-0-4 | 65 | 3 | — | fac | mer | 4.1 |
| f27-0-11 | 27 | 3 | — | fac | mer | 4.75 | f65-0-5 | 65 | 3 | — | fac | mer | 4.3 |
| f27-10-1 | 27 | 2 | L10 | fac | mer | 0.05 | f65-0-6 | 65 | 3 | — | fac | mer | 4.5 |
| f27-10-2 | 27 | 2 | L10 | fac | mer | 0.06 | f65-0-7 | 65 | 3 | — | fac | mer | 5 |
| f27-10-3 | 27 | 2 | L10 | fac | mer | 0.1 | f65-11-1 | 65 | 2 | L11 | fac | mer | 0.07 |
| f27-10-4 | 27 | 2 | L10 | fac | mer | 0.4 | f65-11-2 | 65 | 2 | L11 | fac | mer | 0.12 |
| f27-10-5 | 27 | 2 | L10 | fac | mer | 0.6 | f65-11-3 | 65 | 2 | L11 | fac | mer | 0.33 |
| f27-10-6 | 27 | 2 | L10 | fac | mer | 0.8 | f70-0-1 | 70 | 3 | — | fac | mer | 0.1 |
| f27-10-7 | 27 | 2 | L10 | fac | mer | 1 | f70-0-2 | 70 | 3 | — | fac | mer | 0.6 |
| f27-10-8 | 27 | 2 | L10 | fac | mer | 2 | f70-0-3 | 70 | 3 | — | fac | mer | 0.8 |
| f27-10-9 | 27 | 2 | L10 | fac | mer | 3 | f70-0-4 | 70 | 3 | — | fac | mer | 1.3 |
| f27-10-10 | 27 | 2 | L10 | fac | mer | 4 | f70-12-1 | 70 | 2 | L12 | fac | mer | 0.5 |
| f27-10-11 | 27 | 2 | L10 | fac | mer | 5 | f70-12-2 | 70 | 2 | L12 | fac | mer | 1 |
| f27-12-1 | 27 | 2 | L12 | fac | mer | 0.5 | f70-12-3 | 70 | 2 | L12 | fac | mer | 1.5 |

TABLE 2-continued

| No. of specific examples | Structural formula | | | Steric structure Metal complex (a) | Steric structure Metal complex (b) | Content ratio (%) of Complex (b) | No. of specific examples | Structural formula | | | Steric structure Metal complex (a) | Steric structure Metal complex (b) | Content ratio (%) of Complex (b) |
|---|---|---|---|---|---|---|---|---|---|---|---|---|---|
| | Structure | n | X-Y | | | | | Structure | n | X-Y | | | |
| f27-12-2 | 27 | 2 | L12 | fac | mer | 1.5 | f70-13-1 | 70 | 2 | L13 | fac | mer | 1 |
| f33-11-1 | 33 | 2 | L11 | fac | mer | 0.08 | f70-13-2 | 70 | 2 | L13 | fac | mer | 1.5 |
| f33-11-2 | 33 | 2 | L11 | fac | mer | 0.45 | f70-11-1 | 70 | 1 | L11 | fac | mer | 0.05 |
| f33-11-3 | 33 | 2 | L11 | fac | mer | 0.65 | f70-11-2 | 70 | 1 | L11 | fac | mer | 5 |

TABLE 3

| No. of specific examples | Structural formula | | | Steric structure Metal complex (a) | Steric structure Metal complex (b) | Content ratio (%) of Complex (b) | No. of specific examples | Structural formula | | | Steric structure Metal complex (a) | Steric structure Metal complex (b) | Content ratio (%) of Complex (b) |
|---|---|---|---|---|---|---|---|---|---|---|---|---|---|
| | Structure | n | X-Y | | | | | Structure | n | X-Y | | | |
| f81-0-1 | 81 | 3 | — | fac | mer | 0.05 | f148-0-1 | 148 | 3 | — | fac | mer | 0.07 |
| f81-0-2 | 81 | 3 | — | fac | mer | 0.07 | f148-0-2 | 148 | 3 | — | fac | mer | 0.12 |
| f81-0-3 | 81 | 3 | — | fac | mer | 0.1 | f148-0-3 | 148 | 3 | — | fac | mer | 0.33 |
| f81-0-4 | 81 | 3 | — | fac | mer | 0.5 | f148-0-4 | 148 | 3 | — | fac | mer | 0.5 |
| f81-0-5 | 81 | 3 | — | fac | mer | 0.75 | f148-0-5 | 148 | 3 | — | fac | mer | 0.6 |
| f81-0-6 | 81 | 3 | — | fac | mer | 0.06 | f148-0-6 | 148 | 3 | — | fac | mer | 0.8 |
| f81-0-7 | 81 | 3 | — | fac | mer | 0.07 | f148-0-7 | 148 | 3 | — | fac | mer | 1.3 |
| f81-0-8 | 81 | 3 | — | fac | mer | 0.9 | f148-0-8 | 148 | 3 | — | fac | mer | 2.2 |
| f81-0-9 | 81 | 3 | — | fac | mer | 2.2 | f148-0-9 | 148 | 3 | — | fac | mer | 3.4 |
| f81-10-1 | 81 | 2 | L10 | fac | mer | 0.07 | f148-0-10 | 148 | 3 | — | fac | mer | 4.4 |
| f81-10-2 | 81 | 2 | L10 | fac | mer | 0.5 | f148-0-11 | 148 | 3 | — | fac | mer | 4.8 |
| f81-10-3 | 81 | 2 | L10 | fac | mer | 2.8 | f148-10-1 | 148 | 2 | L10 | fac | mer | 0.05 |
| f81-10-4 | 81 | 2 | L10 | fac | mer | 1.1 | f148-10-2 | 148 | 2 | L10 | fac | mer | 0.1 |
| f81-10-5 | 81 | 2 | L10 | fac | mer | 2.5 | f148-10-3 | 148 | 2 | L10 | fac | mer | 0.25 |
| f81-10-6 | 81 | 2 | L10 | fac | mer | 3.5 | f148-10-4 | 148 | 2 | L10 | fac | mer | 0.3 |
| f81-10-7 | 81 | 2 | L10 | fac | mer | 4.1 | f148-10-5 | 148 | 2 | L10 | fac | mer | 0.55 |
| f81-10-8 | 81 | 2 | L10 | fac | mer | 4.3 | f148-10-6 | 148 | 2 | L10 | fac | mer | 0.71 |
| f81-11-1 | 81 | 2 | L11 | fac | mer | 0.08 | f148-10-7 | 148 | 2 | L10 | fac | mer | 0.8 |
| f81-11-2 | 81 | 2 | L11 | fac | mer | 0.45 | f148-10-8 | 148 | 2 | L10 | fac | mer | 1 |
| f81-11-3 | 81 | 2 | L11 | fac | mer | 0.65 | f148-10-9 | 148 | 2 | L10 | fac | mer | 3 |
| f81-11-4 | 81 | 2 | L11 | fac | mer | 0.95 | f148-10-10 | 148 | 2 | L10 | fac | mer | 4 |
| f81-11-5 | 81 | 2 | L11 | fac | mer | 1.25 | f148-10-11 | 148 | 2 | L10 | fac | mer | 5 |
| f81-11-6 | 81 | 2 | L11 | fac | mer | 2.65 | m148-17-1 | 148 | 2 | L17 | mer | fac | 0.05 |
| f81-10-9 | 81 | 1 | L10 | fac | mer | 2 | m148-17-2 | 148 | 2 | L17 | mer | fac | 0.08 |
| f81-10-10 | 81 | 1 | L10 | fac | mer | 2.5 | m148-17-3 | 148 | 2 | L17 | mer | fac | 0.4 |
| f85-0-1 | 85 | 3 | — | fac | mer | 0.05 | m148-17-4 | 148 | 2 | L17 | mer | fac | 1.1 |
| f85-0-2 | 85 | 3 | — | fac | mer | 0.06 | m148-17-5 | 148 | 2 | L17 | mer | fac | 1.5 |
| f85-0-3 | 85 | 3 | — | fac | mer | 1 | m148-17-6 | 148 | 2 | L17 | mer | fac | 1.88 |
| f85-0-4 | 85 | 3 | — | fac | mer | 1.1 | m148-17-7 | 148 | 2 | L17 | mer | fac | 2.2 |
| f85-0-5 | 85 | 3 | — | fac | mer | 1.5 | m148-17-8 | 148 | 2 | L17 | mer | fac | 3.5 |
| f85-10-1 | 85 | 2 | L10 | fac | mer | 0.06 | f160-0-1 | 160 | 3 | — | fac | mer | 0.05 |
| f85-10-2 | 85 | 2 | L10 | fac | mer | 0.07 | f160-0-2 | 160 | 3 | — | fac | mer | 0.06 |
| f85-10-3 | 85 | 2 | L10 | fac | mer | 0.9 | f160-0-3 | 160 | 3 | — | fac | mer | 1 |
| f85-17-1 | 85 | 2 | L17 | fac | mer | 0.1 | f160-0-4 | 160 | 3 | — | fac | mer | 3.1 |
| f85-17-2 | 85 | 2 | L17 | fac | mer | 0.3 | f160-0-5 | 160 | 3 | — | fac | mer | 4 |
| f98-0-1 | 98 | 3 | — | fac | mer | 0.07 | f160-0-6 | 160 | 3 | — | fac | mer | 4.2 |
| f98-0-2 | 98 | 3 | — | fac | mer | 0.12 | f160-0-7 | 160 | 3 | — | fac | mer | 4.6 |
| f98-0-3 | 98 | 3 | — | fac | mer | 0.33 | f160-0-8 | 160 | 3 | — | fac | mer | 5 |
| f98-0-4 | 98 | 3 | — | fac | mer | 0.9 | f160-13-1 | 160 | 2 | L13 | fac | mer | 0.08 |
| f98-0-5 | 98 | 3 | — | fac | mer | 2.2 | f160-13-2 | 160 | 2 | L13 | fac | mer | 0.12 |
| f98-0-6 | 98 | 3 | — | fac | mer | 4.7 | f160-13-3 | 160 | 2 | L13 | fac | mer | 0.6 |
| f98-0-7 | 98 | 3 | — | fac | mer | 4.75 | f177-0-1 | 177 | 3 | — | fac | mer | 0.06 |
| f98-0-8 | 98 | 3 | — | fac | mer | 4.9 | f177-0-2 | 177 | 3 | — | fac | mer | 0.07 |
| f98-17-1 | 98 | 2 | L17 | fac | mer | 0.4 | f177-0-3 | 177 | 3 | — | fac | mer | 0.5 |
| f98-17-2 | 98 | 2 | L17 | fac | mer | 0.6 | f177-0-4 | 177 | 3 | — | fac | mer | 2.8 |
| f122-0-1 | 122 | 3 | — | fac | mer | 0.05 | f177-0-5 | 177 | 3 | — | fac | mer | 1.1 |
| f122-0-2 | 122 | 3 | — | fac | mer | 0.06 | f177-0-6 | 177 | 3 | — | fac | mer | 2.5 |
| f122-0-3 | 122 | 3 | — | fac | mer | 1 | f177-0-7 | 177 | 3 | — | fac | mer | 3.5 |
| f122-0-4 | 122 | 3 | — | fac | mer | 1.1 | f177-0-8 | 177 | 3 | — | fac | mer | 4.1 |
| f122-0-5 | 122 | 3 | — | fac | mer | 1.5 | f177-0-9 | 177 | 3 | — | fac | mer | 4.3 |
| f122-0-6 | 122 | 3 | — | fac | mer | 2 | f177-0-10 | 177 | 3 | — | fac | mer | 4.5 |
| f122-0-7 | 122 | 3 | — | fac | mer | 2.4 | f177-10-1 | 177 | 2 | L10 | fac | mer | 0.05 |
| f122-0-8 | 122 | 3 | — | fac | mer | 2.6 | f177-10-2 | 177 | 2 | L10 | fac | mer | 0.07 |
| f122-0-9 | 122 | 3 | — | fac | mer | 3.1 | f177-10-3 | 177 | 2 | L10 | fac | mer | 0.9 |

TABLE 3-continued

| No. of specific examples | Structural formula Structure | n | X-Y | Steric structure Metal complex (a) | Metal complex (b) | Content ratio (%) of Complex (b) | No. of specific examples | Structural formula Structure | n | X-Y | Steric structure Metal complex (a) | Metal complex (b) | Content ratio (%) of Complex (b) |
|---|---|---|---|---|---|---|---|---|---|---|---|---|---|
| f122-0-10 | 122 | 3 | — | fac | mer | 4 | f177-10-4 | 177 | 1 | L10 | fac | mer | 1 |
| f122-0-11 | 122 | 3 | — | fac | mer | 5 | f177-10-5 | 177 | 1 | L10 | fac | mer | 1.6 |
| f122-11-1 | 122 | 2 | L11 | fac | mer | 0.05 | f177-10-6 | 177 | 1 | L10 | fac | mer | 2.2 |
| f122-11-2 | 122 | 2 | L11 | fac | mer | 0.06 | f181-11-1 | 181 | 2 | L11 | fac | mer | 0.05 |
| f122-11-3 | 122 | 2 | L11 | fac | mer | 0.25 | f181-11-2 | 181 | 2 | L11 | fac | mer | 0.06 |
| f122-11-4 | 122 | 2 | L11 | fac | mer | 0.75 | f181-11-3 | 181 | 2 | L11 | fac | mer | 0.09 |
| f134-0-1 | 134 | 3 | — | fac | mer | 0.06 | f188-0-1 | 188 | 3 | — | fac | mer | 0.05 |
| f134-0-2 | 134 | 3 | — | fac | mer | 1 | f188-0-2 | 188 | 3 | — | fac | mer | 0.25 |
| f134-0-3 | 134 | 3 | — | fac | mer | 1.1 | f188-0-3 | 188 | 3 | — | fac | mer | 0.75 |
| f134-0-4 | 134 | 3 | — | fac | mer | 1.5 | f188-0-4 | 188 | 3 | — | fac | mer | 1.2 |
| f134-0-5 | 134 | 3 | — | fac | mer | 2 | f188-0-5 | 188 | 3 | — | fac | mer | 1.25 |
| f134-0-6 | 134 | 3 | — | fac | mer | 2.4 | f188-0-6 | 188 | 3 | — | fac | mer | 3 |
| f134-10-1 | 134 | 2 | L10 | fac | mer | 0.05 | f188-0-7 | 188 | 3 | — | fac | mer | 3.25 |
| f134-10-2 | 134 | 2 | L10 | fac | mer | 0.08 | f188-0-8 | 188 | 3 | — | fac | mer | 3.75 |
| f134-10-3 | 134 | 2 | L10 | fac | mer | 4 | f188-0-9 | 188 | 3 | — | fac | mer | 4.5 |
| f134-10-4 | 134 | 2 | L10 | fac | mer | 4.2 | f188-13-1 | 188 | 2 | L13 | fac | mer | 0.5 |
| m134-10-1 | 134 | 2 | L10 | mer | fac | 2.6 | f188-13-2 | 188 | 2 | L13 | fac | mer | 0.6 |
| m134-10-2 | 134 | 2 | L10 | mer | fac | 3.1 | f188-13-3 | 188 | 2 | L13 | fac | mer | 1.5 |

TABLE 4

| No. of specific examples | Structural formula Structure | n | X-Y | Steric structure Metal complex (a) | Metal complex (b) | Content ratio (%) of Complex (b) | No. of specific examples | Structural formula Structure | n | X-Y | Steric structure Metal complex (a) | Metal complex (b) | Content ratio (%) of Complex (b) |
|---|---|---|---|---|---|---|---|---|---|---|---|---|---|
| c190-0-1 | 190 | 2 | — | cis | trans | 0.05 | t190-10-1 | 190 | 1 | L10 | cis | trans | 0.05 |
| c190-0-2 | 190 | 2 | — | cis | trans | 0.06 | t190-10-2 | 190 | 1 | L10 | cis | trans | 0.06 |
| c190-0-3 | 190 | 2 | — | cis | trans | 0.07 | t190-10-3 | 190 | 1 | L10 | cis | trans | 0.07 |
| c190-0-4 | 190 | 2 | — | cis | trans | 0.08 | t190-10-4 | 190 | 1 | L10 | cis | trans | 0.08 |
| c190-0-5 | 190 | 2 | — | cis | trans | 0.09 | t190-10-5 | 190 | 1 | L10 | cis | trans | 0.09 |
| c190-0-6 | 190 | 2 | — | cis | trans | 0.1 | t190-10-6 | 190 | 1 | L10 | cis | trans | 0.1 |
| c190-0-7 | 190 | 2 | — | cis | trans | 0.2 | t190-10-7 | 190 | 1 | L10 | cis | trans | 0.2 |
| c190-0-8 | 190 | 2 | — | cis | trans | 0.3 | t190-10-8 | 190 | 1 | L10 | cis | trans | 0.3 |
| c190-0-9 | 190 | 2 | — | cis | trans | 0.4 | t190-10-9 | 190 | 1 | L10 | cis | trans | 0.4 |
| c190-0-10 | 190 | 2 | — | cis | trans | 0.5 | t190-10-10 | 190 | 1 | L10 | cis | trans | 0.5 |
| c190-0-11 | 190 | 2 | — | cis | trans | 0.6 | t190-10-11 | 190 | 1 | L10 | cis | trans | 0.6 |
| c190-0-12 | 190 | 2 | — | cis | trans | 0.7 | t190-10-12 | 190 | 1 | L10 | cis | trans | 0.7 |
| c190-0-13 | 190 | 2 | — | cis | trans | 0.8 | t190-10-13 | 190 | 1 | L10 | cis | trans | 0.8 |
| c190-0-14 | 190 | 2 | — | cis | trans | 0.9 | t190-10-14 | 190 | 1 | L10 | cis | trans | 0.9 |
| c190-0-15 | 190 | 2 | — | cis | trans | 1 | t190-10-15 | 190 | 1 | L10 | cis | trans | 1 |
| c190-0-16 | 190 | 2 | — | cis | trans | 2 | t190-10-16 | 190 | 1 | L10 | cis | trans | 2 |
| c190-0-17 | 190 | 2 | — | cis | trans | 3 | t190-10-17 | 190 | 1 | L10 | cis | trans | 3 |
| c190-0-18 | 190 | 2 | — | cis | trans | 4 | t190-10-18 | 190 | 1 | L10 | cis | trans | 4 |
| c190-0-19 | 190 | 2 | — | cis | trans | 5 | t190-10-19 | 190 | 1 | L10 | cis | trans | 5 |

As the invention compound, Compounds (1) to (60), A-1 to A-204, C-1 to C-248, D-1 to D-49, A-1 to A-204 and P-201 to P-339 described in the paragraphs [0102] to [0253] of WO2008-140114, Compounds (B-1) to (B-146) described in the paragraphs [0116] to [0130] of Japanese Patent Laid-Open No. 2008-311607, and Compounds DM-1-1 to DM-5-47 described in the paragraphs [0115] to [0125] and Compounds P-A to P-C, each of Japanese Patent Laid-Open No. 2008-311608, are used preferably.

[Organic Electroluminescence Device]

The organic electroluminescence device of the invention will next be described.

The organic electroluminescence device of the invention has, on a substrate thereof, a pair of electrodes and one or more organic layers including a light emitting layer between the electrodes. At least one of the organic layers contains therein a phosphorescent metal complex containing a monoanionic bidentate ligand represented by the above-described formula (A) and a metal having an atomic weight of 40 or greater.

The organic electroluminescence device of the invention preferably contains, in the light emitting layer, the phosphorescent metal complex containing a monoanionic bidentate ligand represented by the formula (A) and a metal having an atomic weight of 40 or greater.

In the organic electroluminescence device of the invention, the light emitting layer is an organic layer, but the device may have a plurality of organic layers further.

In consideration of the properties of the luminescence device, at least one of the anode and the cathode is preferably transparent or translucent.

FIG. 1 illustrates an example of the constitution of the organic electroluminescence device according to the invention. An organic electroluminescence device 10 of FIG. 1 according to the invention has, on a supporting substrate 12, a light emitting layer 6 sandwiched between an anode 3 and a cathode 9. More specifically, a hole injection layer 4, a hole transport layer 5, the light emitting layer 6, a hole blocking layer 7, and an electron transport layer 8 are stacked one after another in the order of mention between the anode 3 and the cathode 9.

<Constitution of Organic Layers>

No particular limitation is imposed on the layer constitution of the organic layers and it can be selected as needed, depending on the intended use or using purpose of the organic electroluminescence device. The organic layers are formed preferably on the transparent electrode or a back-side electrode. In this case, the organic layer is formed on the front surface or whole surface of the transparent electrode or the back-side electrode.

The shape, size, and thickness of the organic layers are not particularly limited and can be selected as needed in accordance with the using purpose.

The following are specific examples of the layer constitution but the layer constitution of the invention is not limited to them.

Anode/hole transport layer/light emitting layer/electron transport layer/cathode Anode/hole transport layer/light emitting layer/blocking layer/electron transport layer/cathode Anode/hole transport layer/light emitting layer/blocking layer/electron transport layer/electron injection layer/cathode Anode/hole injection layer/hole transport layer/light emitting layer/blocking layer/electron transport layer/cathode Anode/hole injection layer/hole transport layer/light emitting layer/electron transport layer/electron injection layer/cathode Anode/hole injection layer/hole transport layer/light emitting layer/blocking layer/electron transport layer/electron injection layer/cathode The device structure, substrate, cathode, and anode of organic electroluminescence devices are described in detail, for example, in Japanese Patent Laid-Open No. 2008-270736 and the description therein can be applied to the invention.

<Substrate>

The substrate to be used in the invention preferably does not scatter or attenuate a light emitted from the organic layer. A substrate made of an organic material is preferred because it is excellent in heat resistance, size stability, solvent resistance, electrical insulating properties, and processability.

<Anode>

The anode usually needs to have only a function of supplying holes to the organic layer. The shape, structure, size, and the like thereof are not particularly limited, and can be selected as needed from known electrode materials, depending on the intended use or using purpose of the luminescence device. As described above, it is usually provided as a transparent anode.

<Cathode>

The cathode usually needs to have only a function of injecting electrons to the organic layer. The shape, structure, size, and the like thereof are not particularly limited, and can be selected as needed from known electrode materials, depending on the intended use or using purpose of the luminescence device.

With regards to the substrate, anode, and cathode, the description in the paragraphs from [0070] to [0089] of Japanese Patent Laid-Open No. 2008-270736 can be applied to the invention.

<Organic Layer>

The organic layer of the invention will next be described.
—Formation of Organic Layer—

In the organic electroluminescence device of the invention, each organic layer can be formed suitably by any of dry film formation process such as vapor deposition or sputtering, wet film formation process such as solution coating, transfer process, printing process, and the like.

(Light Emitting Layer)

<Light Emitting Material>

The light emitting material in the invention is preferably the phosphorescent metal complex having a mono anionic bidentate ligand represented by the formula (A) and a metal having an atomic weight of 40 or greater.

The light emitting material is usually contained in an amount of from 0.1 mass % to 50 mass % in the light emitting layer based on the total mass of the compounds constituting the light emitting layer. From the standpoint of durability and external quantum efficiency, the amount is preferably from 1 mass % to 50 mass %, more preferably from 2 mass % to 40 mass %.

The specific phosphorescent metal complex is contained in the light emitting layer preferably in an amount of from 1 mass % to 30 mass %, more preferably from 5 mass % to 20 mass % from the standpoint of durability and the hue of a light emitted.

Although the thickness of the light emitting layer is not particularly limited, usually a thickness of from 2 nm to 500 nm is preferred. From the standpoint of external quantum efficiency, it is more preferably from 3 nm to 200 nm, still more preferably from 5 nm to 100 nm.

The light emitting layer in the device of the invention may be composed only of a light emitting material or may be a mixed layer of a host material and a light emitting material. The light emitting material may be either a fluorescent material or a phosphorescent material. As a dopant, one or more dopants may be used. The host material is preferably a charge transport material. As the host material, one or more host materials may be used. For example, a mixture of an electron transporting host material and a hole transporting host material may be used. The light emitting layer may contain a material having no charge transport property and emitting no light.

The light emitting layer may be composed of one layer or two or more layers. These layers may emit lights of different colors, respectively.

<Host Material>

The light emitting layer may contain the following compounds as a host material to be used in the invention. Examples include pyrrole, indole, carbazole (for example, CBP (4,4'-di(9-carbazoyl)biphenyl)), azaindole, azacarbazole, triazole, oxazole, oxadiazole, pyrazole, imidazole, thiophene, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, porphyrin compounds, polysilane compounds, poly (N-vinylcarbazole), aniline copolymers, electrically conductive high-molecular oligomers such as thiophene oligomers, polythiophene, and the like, organosilanes, carbon films, pyridine, pyrimidine, triazine, imidazole, pyrazole, triazole, oxazole, oxadiazole, fluorenone, anthraquinodimethane, anthrone, diphenylquinone, thiopyran dioxide, carbodiimide, fluorenylidenemethane, distyrylpyrazine, fluorine-substituted aromatic compounds, heterocyclic tetracarboxylic anhydrides such as naphthalene tetracarboxylic anhydride and perylene tetracarboxylic anhydride, phthalocyanine, and a variety of metal complexes typified by metal complexes of a 8-quinolinol derivative, metal phthalocyanine, and metal complexes having benzoxazole or benzothiazole as the ligand thereof, and derivatives thereof (which may have a substituent or a condensed ring).

In the light-emitting layer in the invention, it is preferred that the lowest triplet excitation energy ($T_1$ energy) of the host material is higher than $T_1$ energy of the phosphorescent material in view of color purity, emission efficiency, and drive durability.

Although the content of the host compound in the invention is not particularly limited, it is preferably 15 mass % or greater but not greater than 95 mass % based on the total mass of the compounds constituting the light emitting layer from the standpoint of emission efficiency and drive voltage.

The light emitting layer preferably contains a compound represented by any of the formulas (A) to (A10-1) and in addition, a host material. The host material may be either a hole transporting host material or an electron transporting host material, but the hole transporting host material can be used.

In the invention, the light emitting layer preferably contains the compound represented by any of the formulas (A) to (A10-1) and at least one compound represented by the formula (4-1) or (4-2).

The compound represented by the formula (4-1) or (4-2) is contained in the light emitting layer in an amount of preferably from 30 to 99 mass %, more preferably from 40 to 97 mass %, especially preferably from 50 to 95 mass %. When the compound represented by the formula (4-1) or (4-2) is contained in a plurality of organic layers, it is preferably contained in each of the layers in an amount within the above range.

The compound represented by the formula (4-1) or (4-2) may be contained singly in any of the organic layers. Alternatively, two or more compounds represented by the formula (4-1) or (4-2) used in combination at a desired ratio may be incorporated in the organic layer.

The host material is preferably the compound represented by the following formula (4-1) or (4-2).

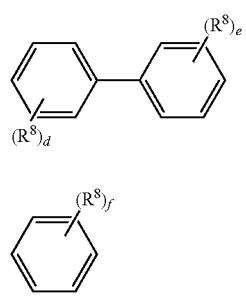

(4-1)

(4-2)

wherein, d and e each stands for an integer from 0 to 3, with the proviso that at least one of them is 1 or greater, f stands for an integer from 1 to 4, and $R^8$s each represents a substituent, with the proviso that when d, e, and f each stands for 2 or greater, $R^8$s may be the same or different and at least one of $R^8$s represents a carbazole group represented by the following formula (5):

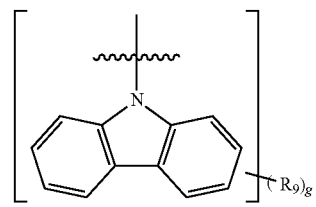

(5)

wherein, each of $R^9$s independently represents a substituent and g stands for an integer from 0 to 8.

Each of $R^8$s independently represents a substituent and specific examples include halogen atoms, alkoxy groups, a cyano group, a nitro group, alkyl groups, aryl groups, heterocyclic groups, and substituents represented by the formula (5). When $R^8$ does not represent the formula (5), it is preferably an alkyl group having 10 or less carbon atoms or a substituted or unsubstituted aryl group having 10 or less carbon atoms, more preferably an alkyl group having 6 or less carbon atoms.

Each of $R^9$s independently represents a substituent and specific examples include halogen atoms, alkoxy groups, a cyano group, a nitro group, alkyl groups, aryl groups, and heterocyclic groups. Of these, alkyl groups having 10 or less carbon atoms and substituted or unsubstituted aryl groups having 10 or less carbon atoms are preferred, with alkyl groups having 6 or less carbon atoms being more preferred.

The alphabet "g" stands for an integer from 0 to 8. It is preferably from 0 to 4 from the standpoint of not excessively blocking a carbazole skeleton involved in charge transport. From the standpoint of synthesis ease, when the carbazole has a substituent, it is preferred to have the substituent symmetrical relative to the nitrogen atom.

In the formula (4-1), the sum of d and e is preferably 2 or greater from the standpoint of keeping the charge transport ability. Further, it is preferred that $R^8$ is substituted in the meta position relative to the other benzene ring, because in ortho substitution, the steric hindrance between substituents adjacent to each other is large, which may cause easy cleavage of the linkage and deterioration of durability. In para substitution, on the other hand, the molecule approximates a rigid rod shape and tends to cause crystallization so that device deterioration easily occurs under high temperature conditions. Specifically, the compound represented by the following structure is preferred.

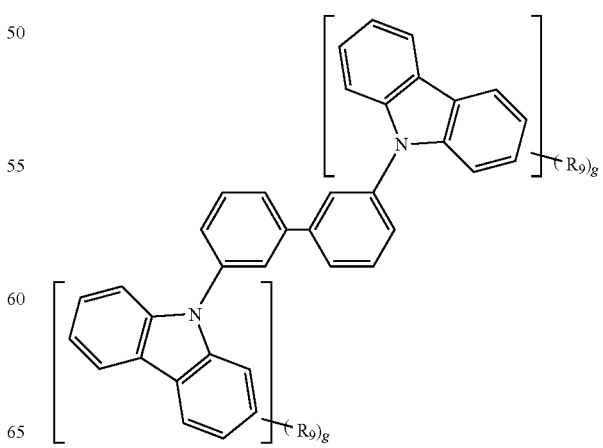

In the formula (4-2), f stands for preferably 2 or greater from the viewpoint of keeping the charge transport ability. When f stands for 2 or 3, meta-substitution between $R^8$s is preferred from the same standpoint. Specifically, it is preferably a compound represented by the following structure.

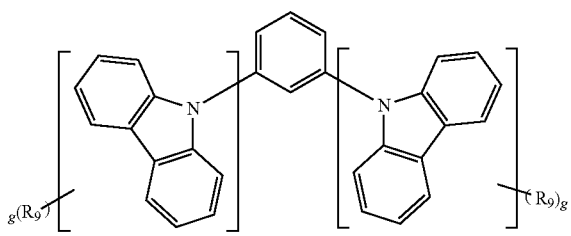

When the formula (4-1) or (4-2) has hydrogen atoms, the hydrogen atoms may contain an isotope thereof (such as deuterium atom). In this case, all the hydrogen atoms contained in the compound may be replaced with hydrogen isotopes or the compound may be a mixture containing hydrogen isotopes partially. Preferably, $R^9$ in the formula (5) is substituted with a deuterium, with the following structures being especially preferred.

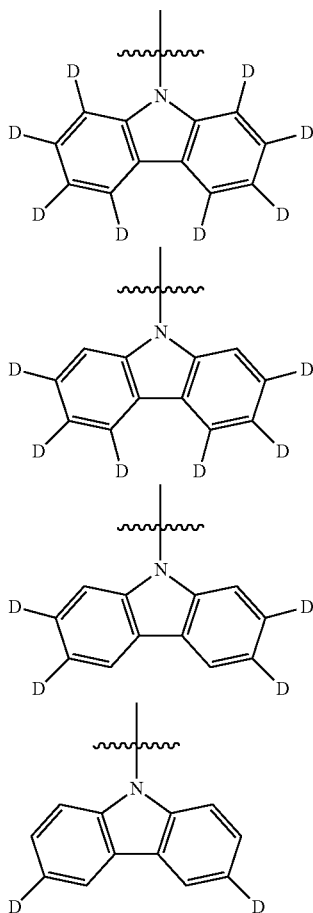

Further, the atom constituting the substituent may include an isotope thereof.

The compound represented by the formula (4-1) or (4-2) can be synthesized using various known synthesis processes in combination. It is the most common to prepare, for example, a carbazole compound by carrying out an aza-Cope rearrangement reaction of a condensate between an aryl hydrazine and a cyclohexane derivative, followed by dehydroaromatization (L. F. Tietze and Th. Eicher, *Precision Organic Synthesis*, translated by Takano and Ogasawara, published by Nankodo, p 339). For a coupling reaction between the resulting carbazole compound and an aryl halide compound in the presence of a palladium catalyst, processes described in *Tetrahedron Letters*, 39, 617(1998), 39, 2367 (1998), and 40, 6393(1999) can be used. No particular limitation is imposed on the reaction temperature and reaction time and conditions described in the above literatures can be employed. Some of commercially available compounds such as mCP can also be used preferably.

In the invention, it is preferred to form a thin layer of the compound represented by the formula (4-1) or (4-2) by using vapor deposition, but wet process such as solution coating is preferred. The compound has a molecular weight of preferably 2000 or less, more preferably 1200 or less, especially preferably 800 or less from the standpoints of deposition suitability and solubility. From the viewpoint of deposition suitability, the compound has a molecular weight of preferably 250 or greater, especially preferably 300 or greater, because too small molecular weights decrease the vapor pressure and prevent occurrence of a change from a gas phase to a solid phase, making it difficult to form an organic layer.

The compound represented by the formula (4-1) or (4-2) is preferably a compound having the following structure or having the following structure in which one or more of the hydrogen atoms have been substituted with a deuterium atom.

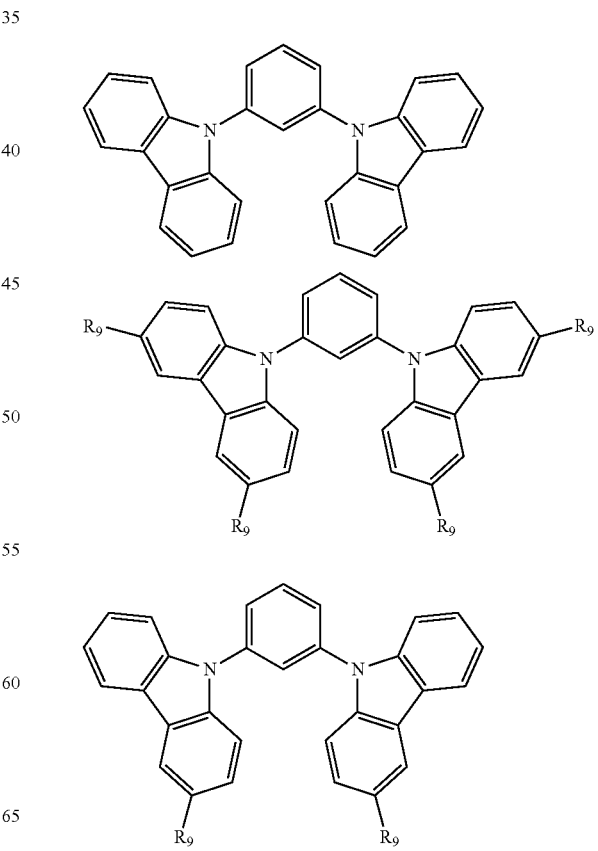

135
-continued
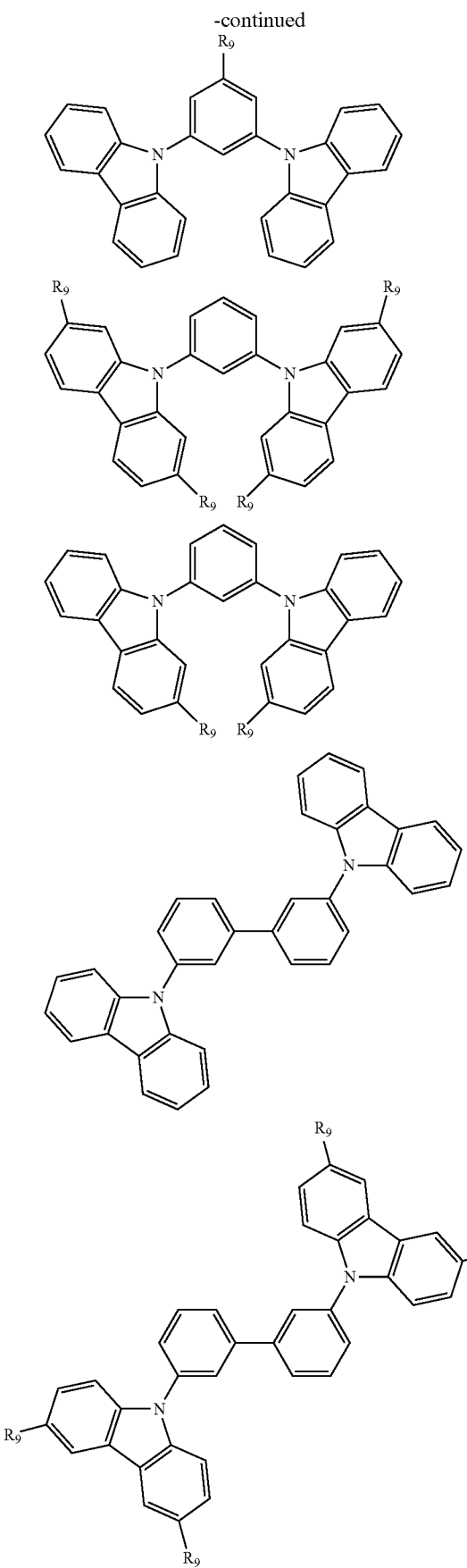
136
-continued
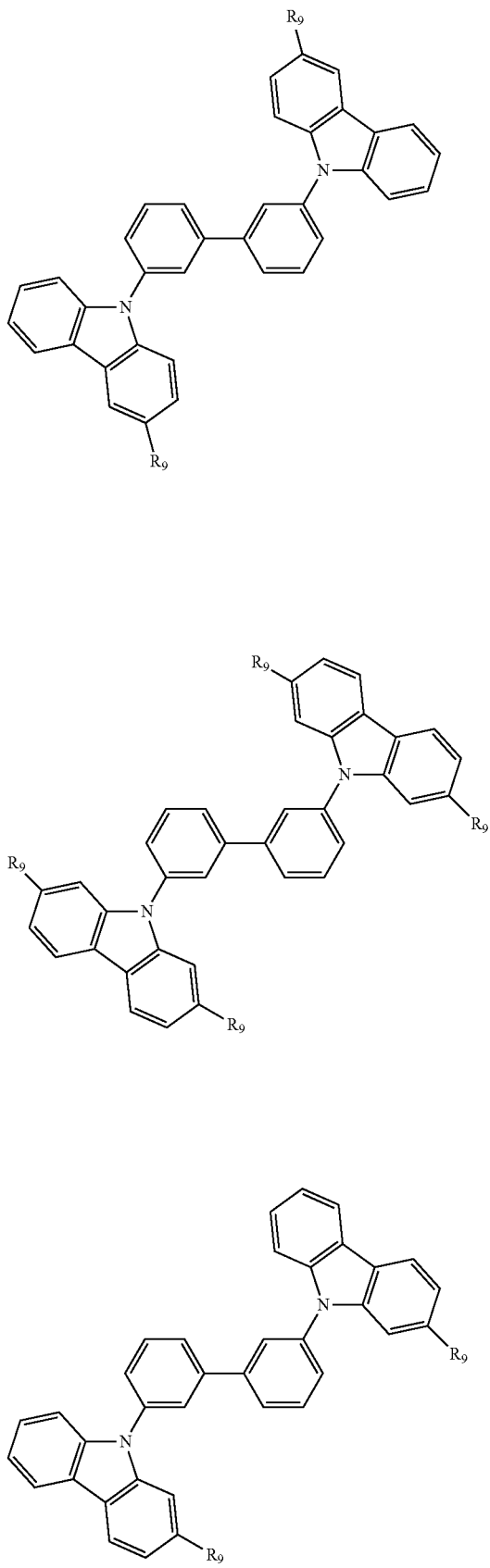

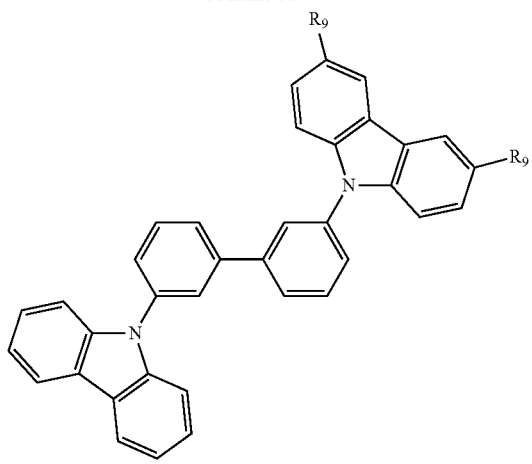
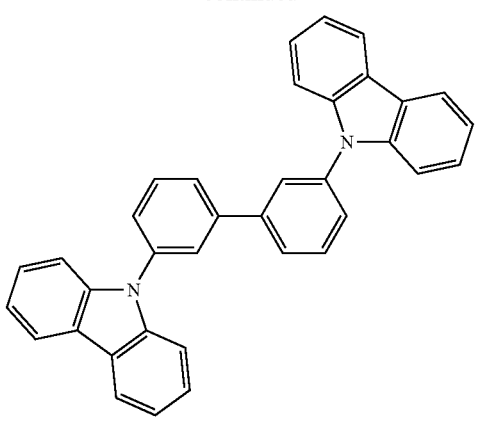
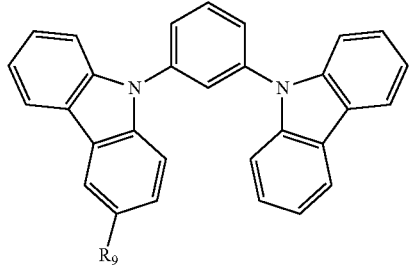
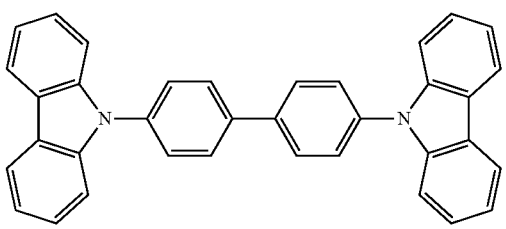
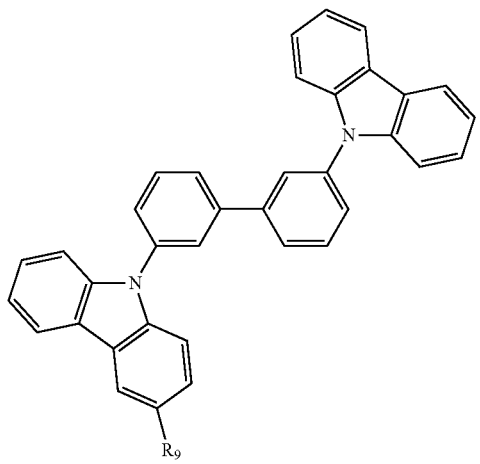
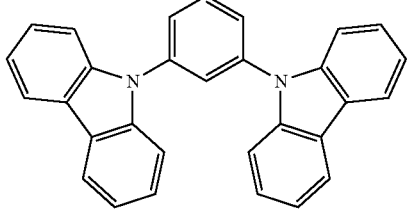
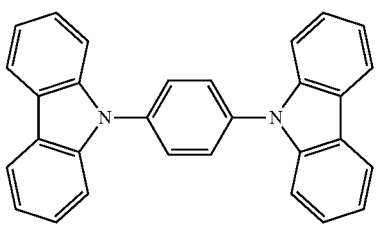
The following are specific examples of the compound represented by the formula (4-1) or (4-2) in the invention, but the invention is not limited to them.
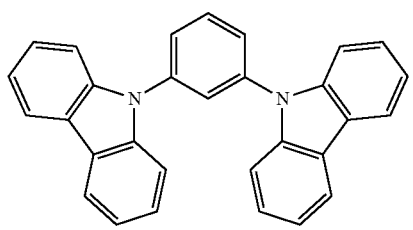
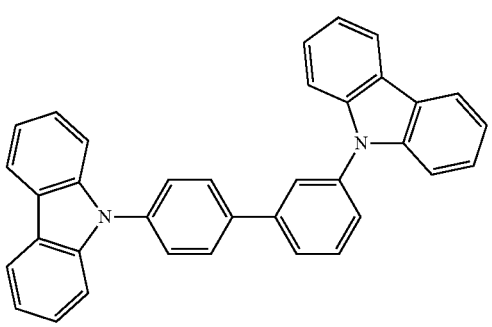

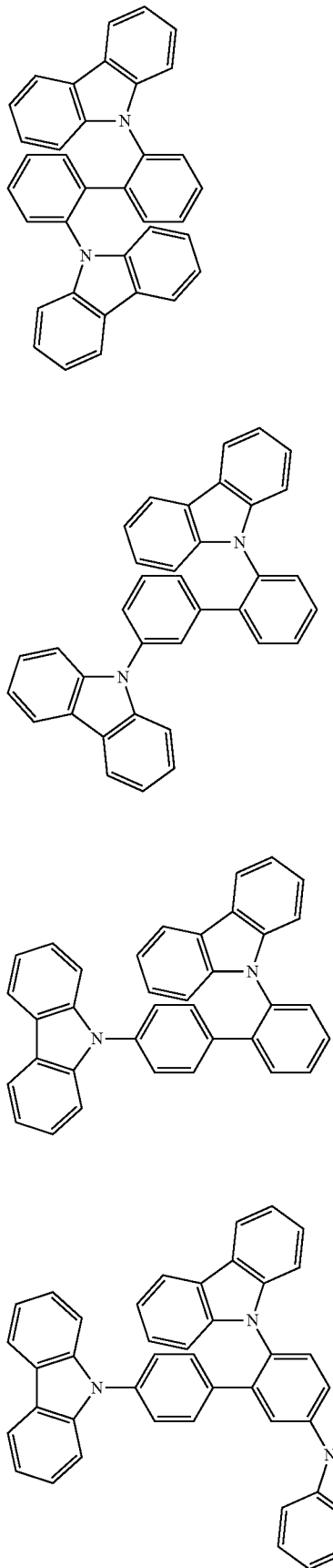
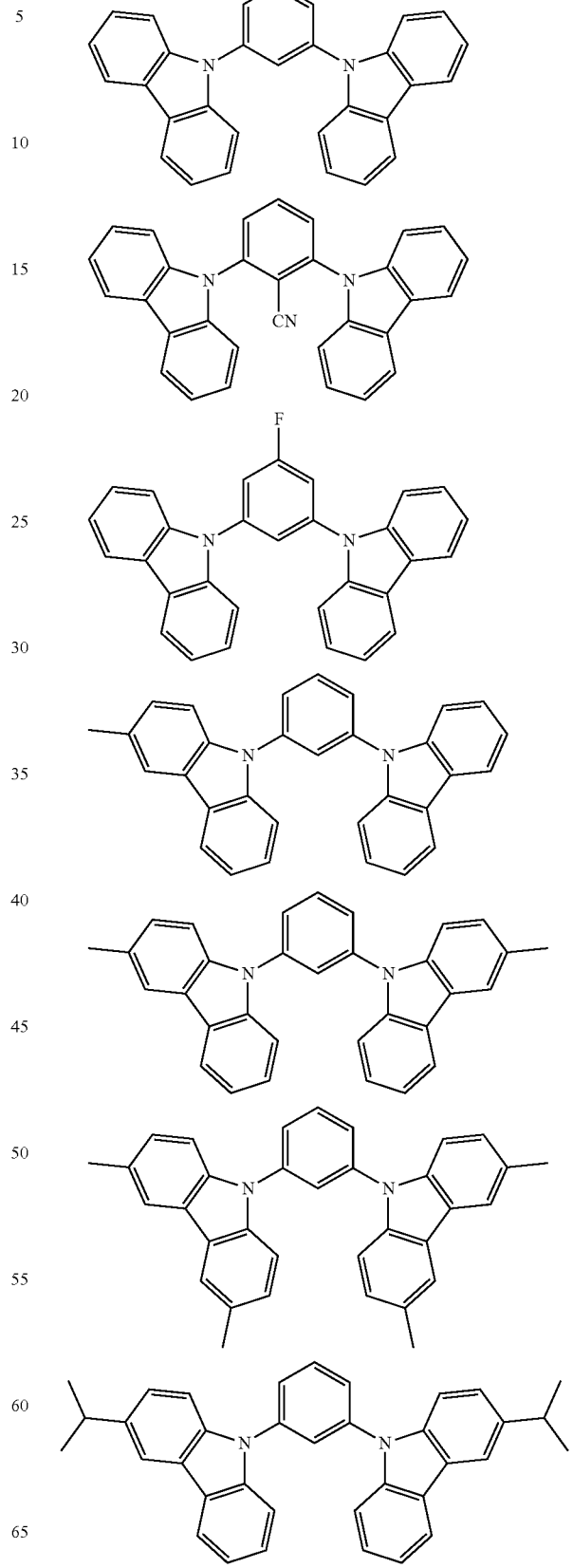

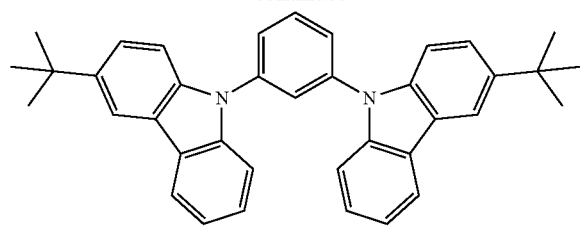
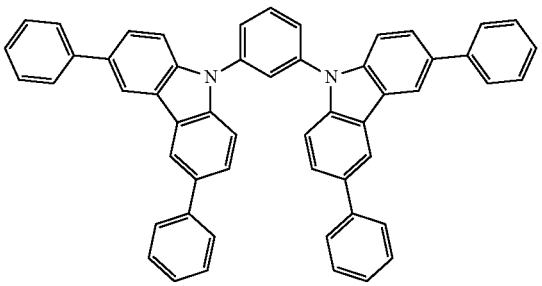
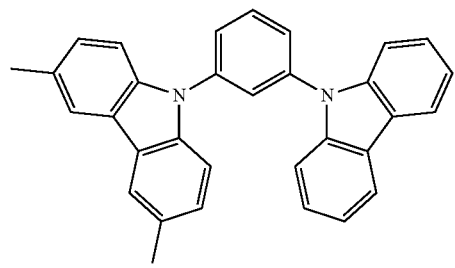
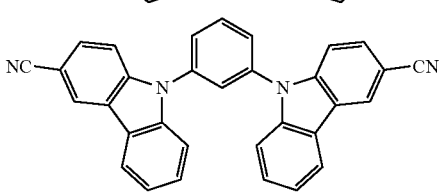
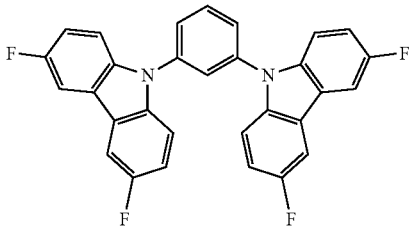
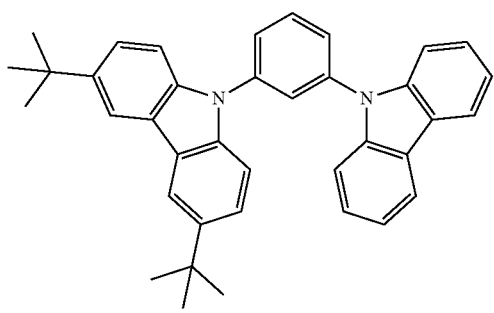
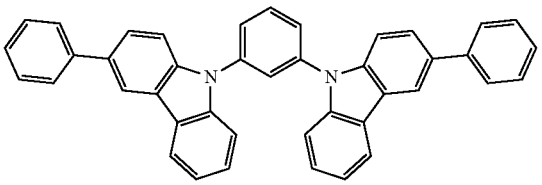
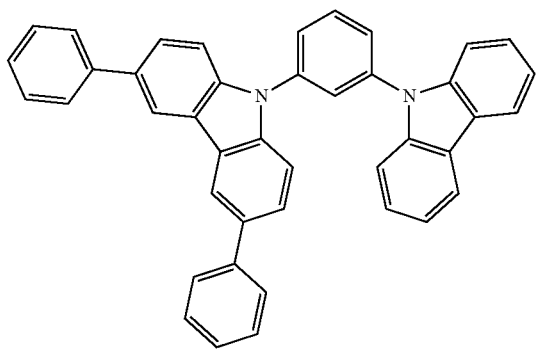
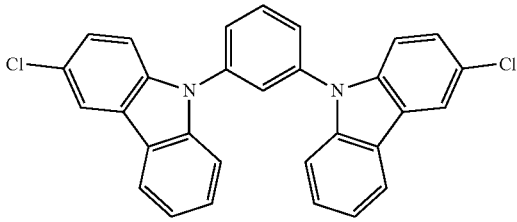
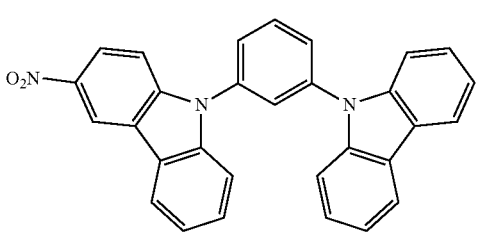
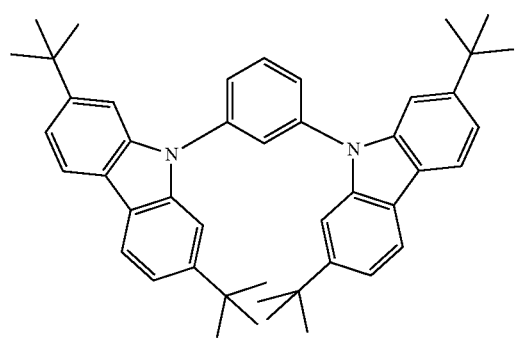
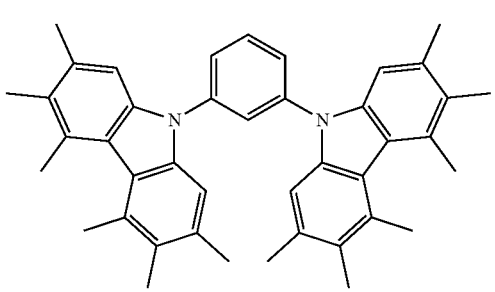

143
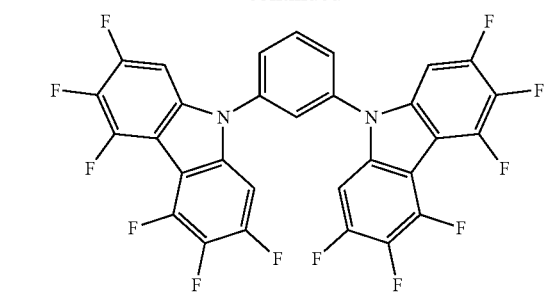
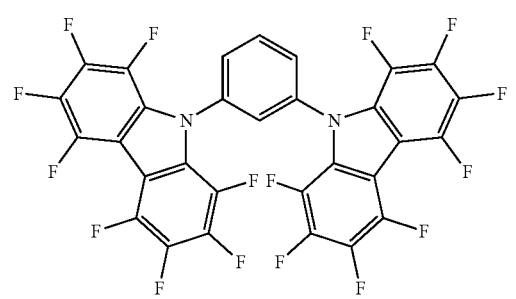
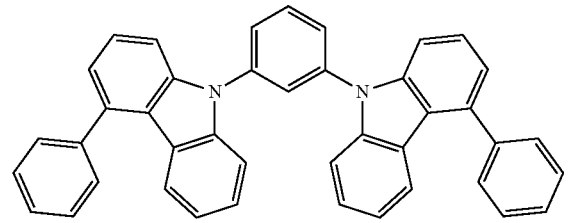
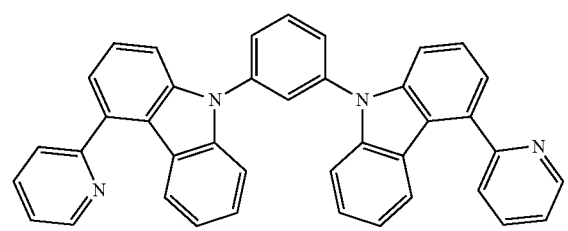
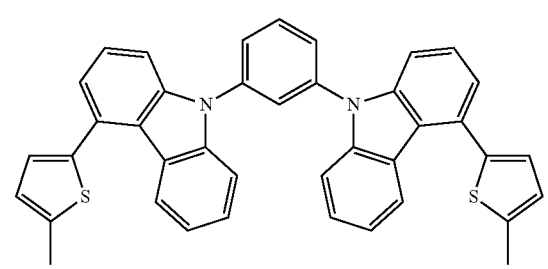
144
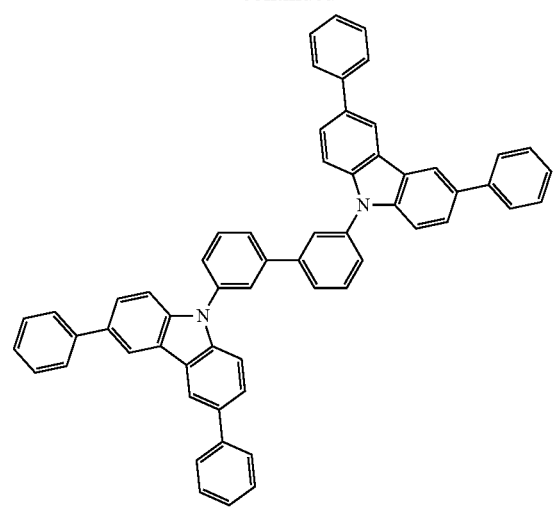
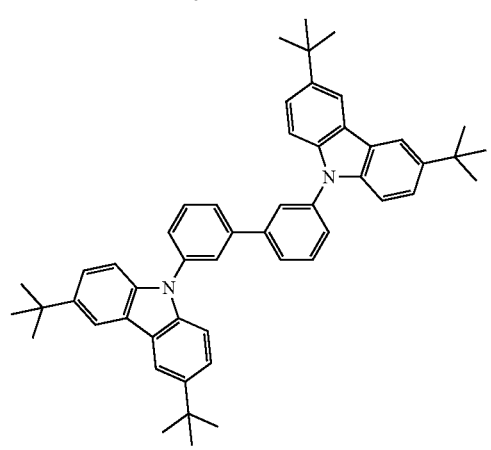
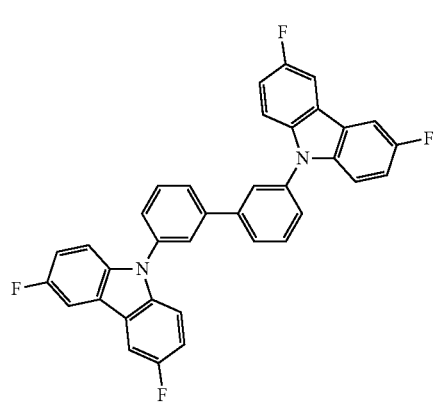
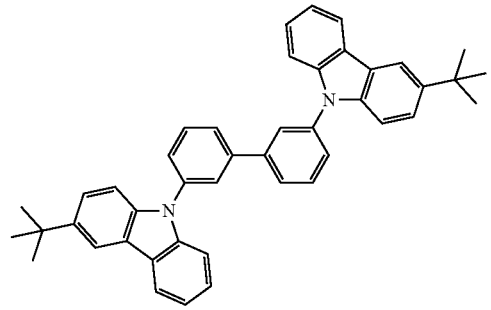

145
-continued
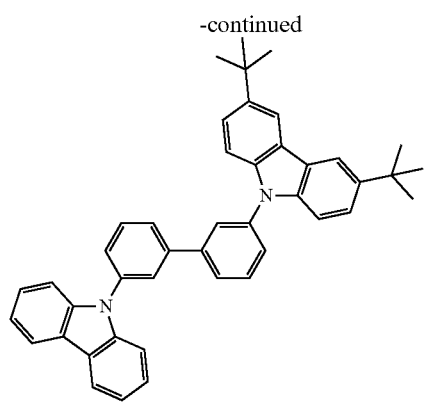
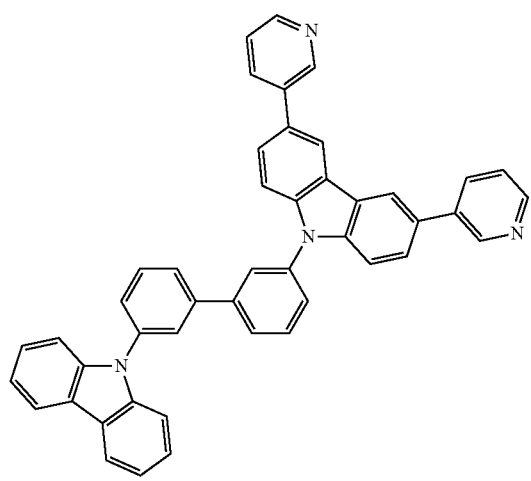
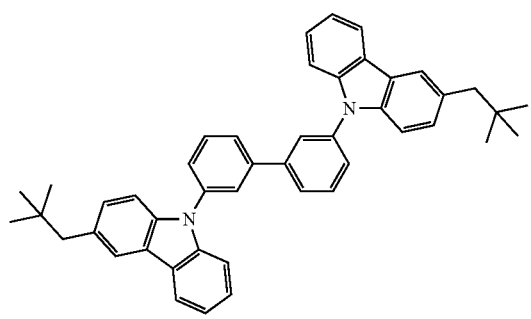
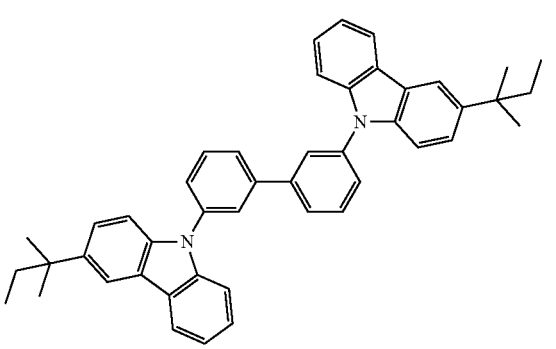
146
-continued
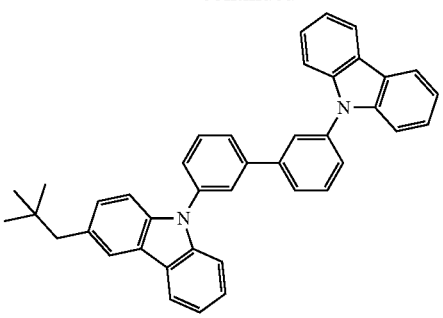
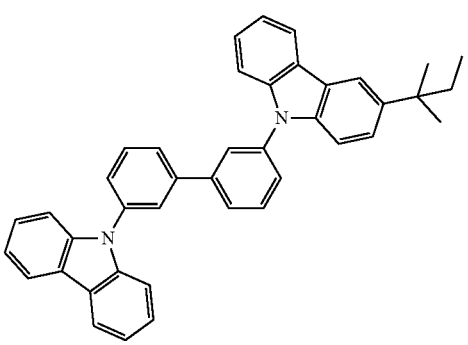
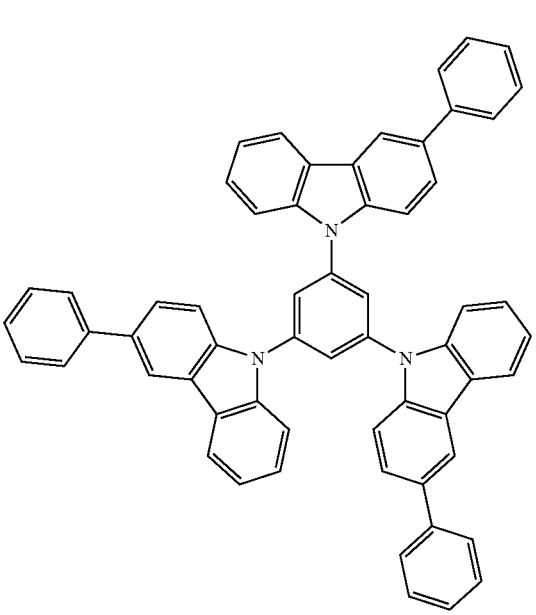

147
-continued
148
-continued
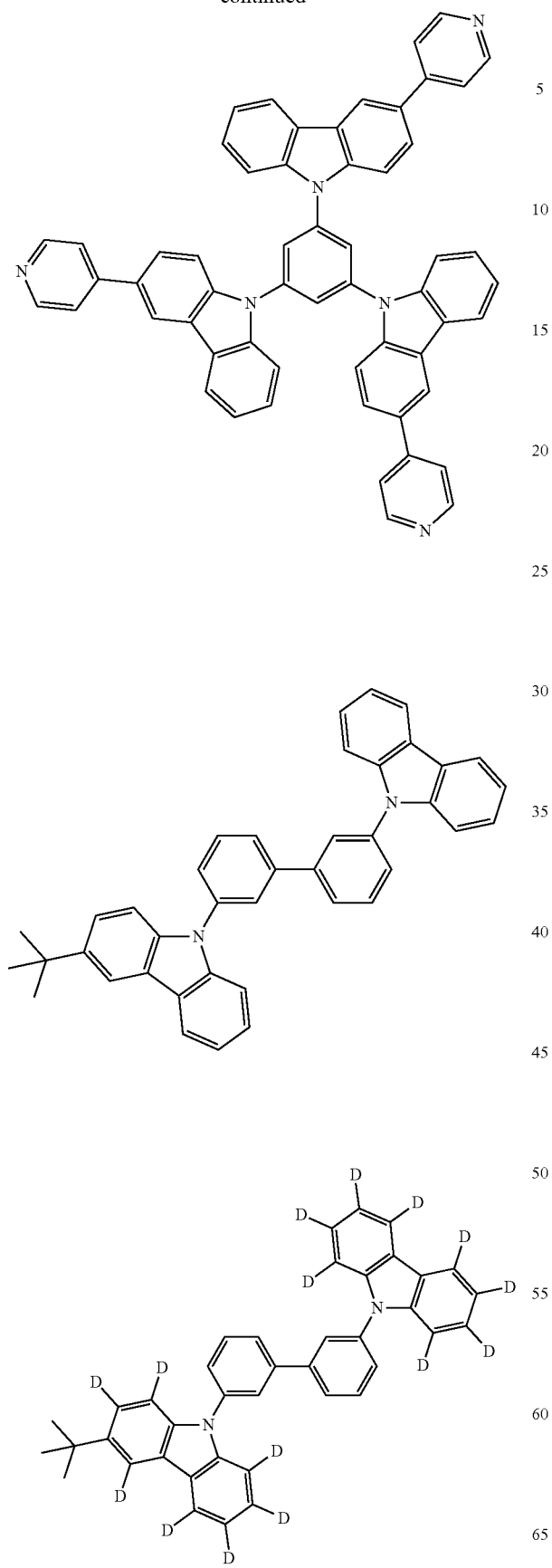
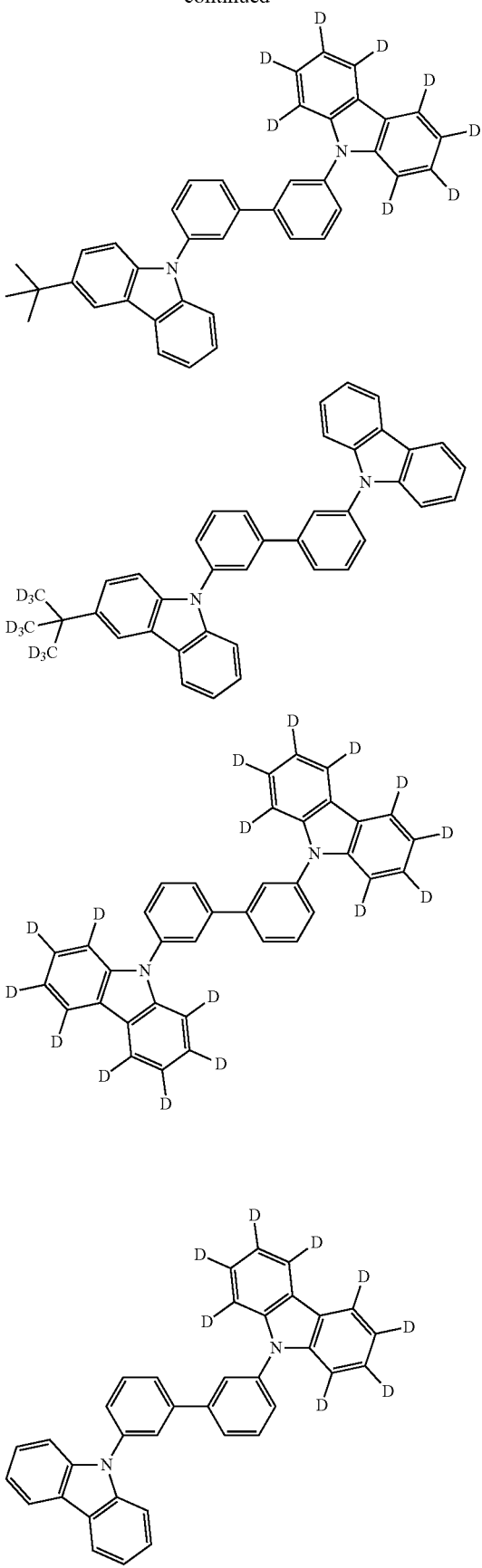

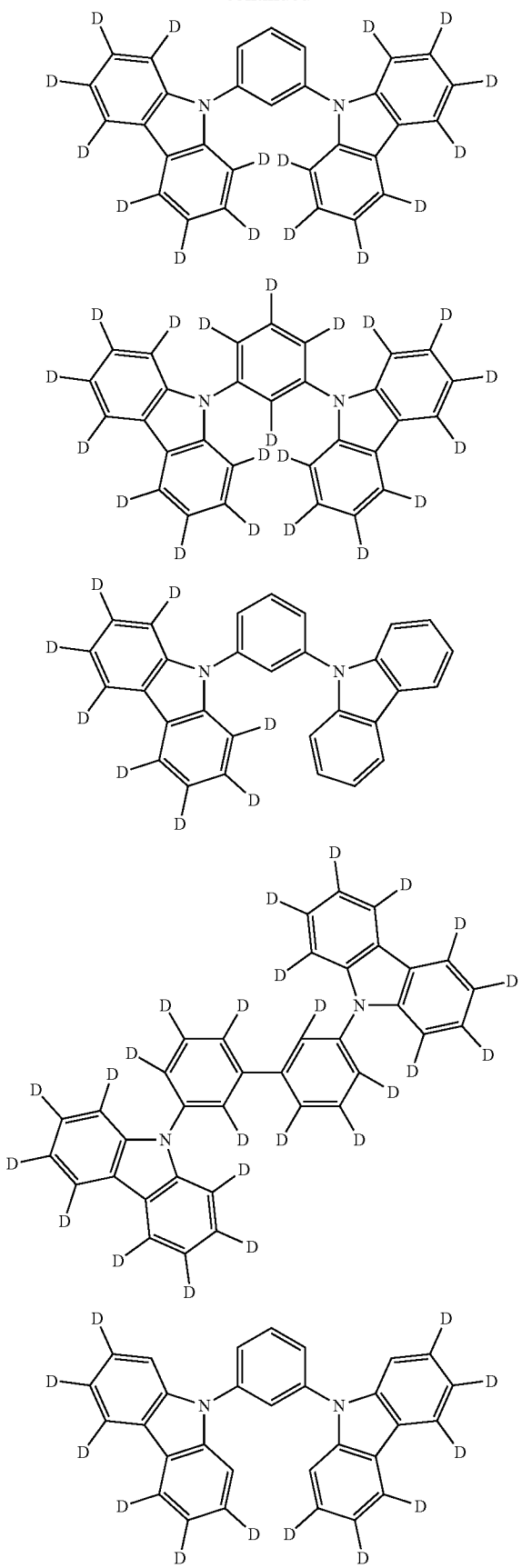

(Fluorescent Material)

Examples of the fluorescent material usable in the invention include benzoxazole derivatives, benzimidazole derivatives, benzothiazole derivatives, styrylbenzene derivatives, polyphenyl derivatives, diphenylbutadiene derivatives, tetraphenylbutadiene derivatives, naphthalimide derivatives, coumarin derivatives, condensed aromatic compounds, perinone derivatives, oxadiazole derivatives, oxazine derivatives, aldazine derivatives, pyralidine derivatives, cyclopentadiene derivatives, bisstyrylanthracene derivatives, quinacridone derivatives, pyrrolopyridine derivatives, thiadiazolopyridine derivatives, cyclopentadiene derivatives, styryl amine derivatives, diketopyrrolopyrrole derivatives, aromatic dimethylidyne compounds, various complexes typified by complexes of a 8-quinolinol derivative or a pyrromethene derivative, polymer compounds such as polythiophene, polyphenylene, and polyphenylenevinylene, and organosilane derivatives.

(Phosphorescent Material)

Examples of the phosphorescent material usable in the invention include phosphorescent compounds described in patent documents such as U.S. Pat. Nos. 6,303,238B1 and 6,097,147, WO 00/57676, 00/70655, 01/08230, 01/39234A2, 01/41512A1, 02/02714A2, 02/15645A1, 02/44189A1, and 05/19373A2, Japanese Patent Laid-Open Nos. 2001-247859, 2002-302671, 2002-117978, 2003-133074, 2002-235076, 2003-123982, and 2002-170684, EP 1211257, Japanese Patent Laid-Open Nos. 2002-226495, 2002-234894, 2001-247859, 2001-298470, 2002-173674, 2002-203678, 2002-203679, 2004-357791, 2006-256999, 2007-19462, 2007-84635, and 2007-96259. Of these, more preferred as a light emitting dopant are Ir complexes, Pt complexes, Cu complexes, Re complexes, W complexes, Rh complexes, Ru complexes, Pd complexes, Os complexes, Eu complexes, Tb complexes, Gd complexes, Dy complexes, and Ce complexes, of which Ir complexes, Pt complexes, and Re complexes are especially preferred. Of these, Ir complexes, Pt complexes, and Re complexes each containing at least one coordination mode of a metal-carbon bond, a metal-nitrogen bond, a metal-oxygen bond, and a metal-sulfur bond are preferred. Furthermore, from the standpoint of emission efficiency, drive durability, and chromaticity, Ir complexes, Pt complexes and Re complexes each containing a tridentate or higher-dentate ligand are especially preferred.

The content of the phosphorescent material in the light emitting layer is preferably 0.1 mass % or greater but not greater than 50 mass %, more preferably 0.2 mass % or greater but not greater than 50 mass %, still more preferably 0.3 mass % or greater but not greater than 40 mass %, most preferably 5 mass % or greater but not greater than 30 mass %, each based on the total mass of the light emitting layer.

The content of the phosphorescent material (the specific phosphorescent metal complex and/or a phosphorescent material used in combination) usable in the invention is preferably 0.1 mass % or greater but not greater than 50 mass %, more preferably 1 mass % or greater but not greater than 40 mass %, most preferably 5 mass % or greater but not greater than 30 mass %, each based on the total mass of the light emitting layer. In particular, when the content of it is in a range of 5 mass % or greater but not greater than 30 mass %, the chromaticity of the light emitted from the organic electroluminescence device does not largely depend on the concentration of the phosphorescent material.

The organic electroluminescence device of the invention contains most preferably from 5 to 30 mass % of at least one of the specific phosphorescent metal complexes based on the total mass of the light emitting layer.

The organic electroluminescence device contains preferably a hydrocarbon compound further in any of the organic layers, more preferably in the light emitting layer.

The hydrocarbon compound is preferably a compound represented by the following formula (VI).

By appropriately using the compound represented by the formula (VI) together with the light emitting material, an intermolecular mutual action of the material is appropriately controlled and an energy gap mutual action between adjacent molecules is made uniform. Thus, it becomes possible to reduce the drive voltage further.

Also, the compound represented by the formula (VI) to be used in the organic electroluminescence device is excellent in chemical stability, suppresses a change in the quality of the material such as decomposition during when the device is driven, and capable of preventing reduction in the efficiency of the organic electroluminescence device or reduction of the device life due to a decomposition product of the material.

The compound represented by the formula (VI) is described.

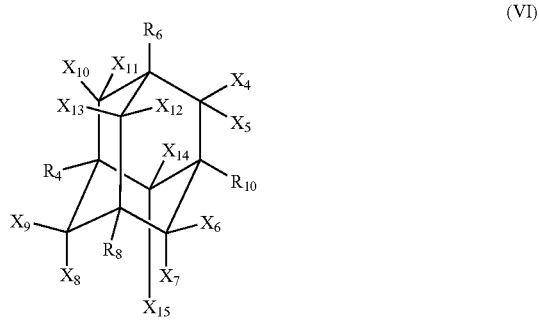

(VI)

wherein, each of $R_4$, $R_6$, $R_8$, $R_{10}$, and $X_4$ to $X_{15}$ independently represents a hydrogen atom, an alkyl group, or an aryl group.

The alkyl group represented by each of $R_4$, $R_6$, $R_8$, $R_{10}$, and $X_4$ to $X_{15}$ in the formula (VI) may be substituted with an adamantane structure or an aryl structure. The alkyl group has preferably from 1 to 70 carbon atoms, more preferably from 1 to 50 carbon atoms, still more preferably from 1 to 30 carbon atoms, still more preferably from 1 to 10 carbon atoms, especially preferably from 1 to 6 carbon atoms, with a linear $C_{2-6}$ alkyl group being most preferred.

Examples of the alkyl group represented by each of $R_4$, $R_6$, $R_8$, $R_{10}$, and $X_4$ to $X_{15}$ in the formula (VI) include an $n\text{-}C_{50}H_{101}$ group, an $n\text{-}C_{30}H_{61}$ group, a 3-(3,5,7-triphenyladamantan-1-yl)propyl group (having 31 carbon atoms), a trityl group (having 19 carbon atoms), a 3-(adamantan-1-yl)propyl group (having 13 carbon atoms), a 9-decalyl group (having 10 carbon atoms), a benzyl group (having 7 carbon atoms), a cyclohexyl group (having 6 carbon atoms), an n-hexyl group (having 6 carbon atoms), an n-pentyl group (having 5 carbon atoms), an n-butyl group (having 4 carbon atoms), an n-propyl group (having 3 carbon atoms), a cyclopropyl group (having 3 carbon atoms), an ethyl group (having 2 carbon atoms), and a methyl group (having 1 carbon atom).

The aryl group represented by each of $R_4$, $R_6$, $R_8$, $R_{10}$, and $X_4$ to $X_{15}$ in the formula (VI) may be substituted with an adamantane structure or an alkyl structure. The aryl group has preferably from 6 to 30 carbon atoms, more preferably from 6 to 20 carbon atoms, further preferably from 6 to 15 carbon atoms, especially preferably from 6 to 10 carbon atoms, most preferably 6 carbon atoms.

Examples of the aryl group represented by each of $R_4$, $R_6$, $R_8$, $R_{10}$, and $X_4$ to $X_{15}$ in the general formula (VI) include a 1-pyrenyl group (having 16 carbon atoms), a 9-anthracenyl group (having 14 carbon atoms), a 1-naphthyl group (having 10 carbon atoms), a 2-naphthyl group (having 10 carbon atoms), a p-t-butylphenyl group (having 10 carbon atoms), a 2-m-xylyl group (having 8 carbon atoms), a 5-m-xylyl group (having 8 carbon atoms), an o-tolyl group (having 7 carbon atoms), an m-tolyl group (having 7 carbon atoms), a p-tolyl group (having 7 carbon atoms), and a phenyl group (having 6 carbon atoms).

Although each of $R_4$, $R_6$, $R_8$, $R_{10}$ in the formula (VI) may be a hydrogen atom, an alkyl group, or an aryl group, it is preferred that at least one of them is an aryl group; more preferred that at least two of them are an aryl group; especially preferred that three or four of them are an aryl group from the viewpoint that a high glass transition temperature is preferred.

Although each of $X_4$ to $X_{15}$ in the formula (VI) may be a hydrogen atom, an alkyl group or an aryl group, each of them is preferably a hydrogen atom or an aryl group, especially preferably a hydrogen atom.

Since the organic electroluminescence device is prepared using a vacuum vapor deposition process or a solution coating process, the molecular weight of the compound represented by the formula (VI) in the invention is preferably 2000 or less, more preferably 1200 or less, especially preferably 1000 or less from the viewpoint of vapor deposition suitability and solubility. Also, from the viewpoint of vapor deposition suitability, when the molecular weight becomes too low, a vapor pressure decreases and a change from a gas phase to a solid phase does not take place, making it difficult to form an organic layer. Therefore, the molecular weight is preferably 250 or greater, more preferably 350 or greater, especially preferably 400 or greater.

The compound represented by the formula (VI) is a solid preferably at room temperature (25° C.), more preferably in a temperature range from room temperature (25° C.) to 40° C., especially preferably in a temperature range of from room temperature (25° C.) to 60° C.

When a compound that is represented by the formula (VI) and does not form a solid at room temperature (25° C.) is employed, using another material in combination enables the formation of a solid phase at normal temperature.

The intended use of the compound represented by the formula (VI) is not limited and the compound may be contained in any of the organic layers. The compound represented by the formula (VI) in the invention is introduced into any one or a plurality of a light emitting layer, a hole injection layer, a hole transport layer, an electron transport layer, an electron injection layer, an exciton blocking layer, and a charge blocking layer; more preferably any one or a plurality of a light emitting layer, a hole injection layer, a hole transport layer, an electron transport layer, and an electron injection layer; especially preferably any one or a plurality of a light emitting layer, a hole injection layer, and a hole transport layer; most preferably a light emitting layer.

When the compound represented by the formula (VI) is used in the organic layer, a content of the compound represented by the formula (VI) should be controlled so as not to hinder the charge transport properties. The content of the compound represented by the formula (VI) is preferably from 0.1 to 70 mass %, more preferably from 0.1 to 30 mass %, especially preferably from 0.1 to 25 mss %.

Also, in the case where the compound represented by the formula (VI) is used in two or more organic layers, the compound is contained in an amount falling within the above-described range in each of the layers.

Only one of the compounds represented by the formula (VI) may be contained in any of the organic layers or a plurality of the compounds represented by the formula (VI) used in combination in an arbitrary proportion may be contained in any of the organic layers.

The following are specific examples of the compound represented by the formula (VI), but the invention is not limited thereto.

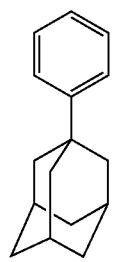

(1-1)

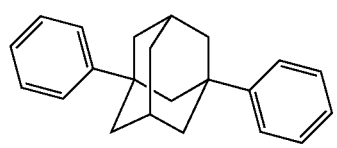

(1-2)

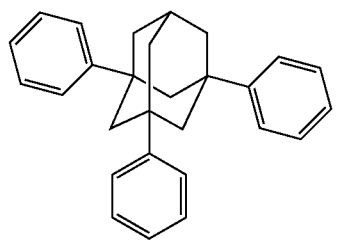

(1-3)

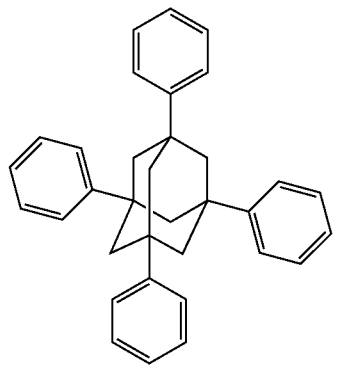

(1-4)

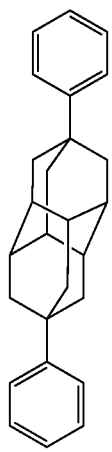

(1-5)

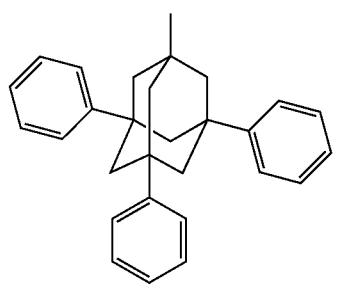

(1-6)

(1-7)
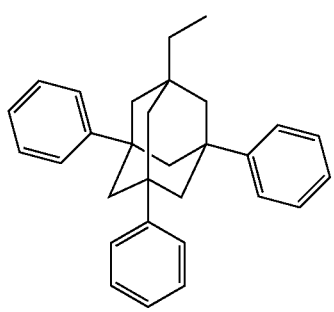
(1-8)
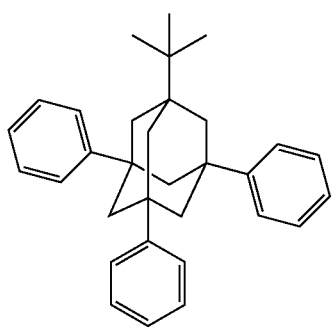
(1-9)
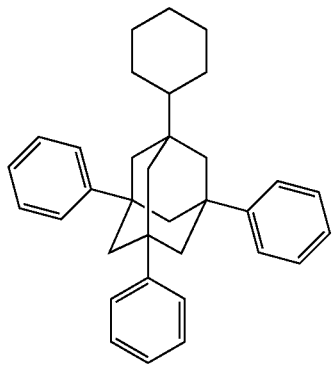
(1-10)
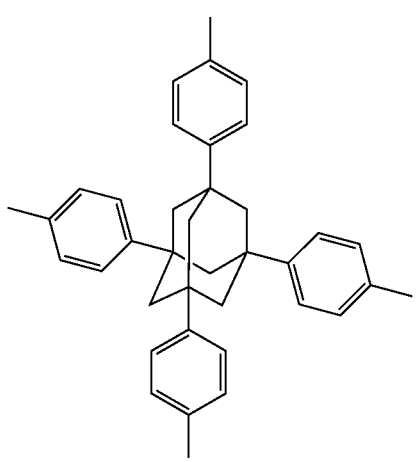
(1-11)
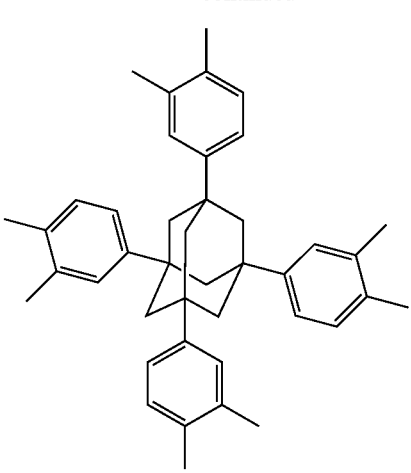
(1-12)
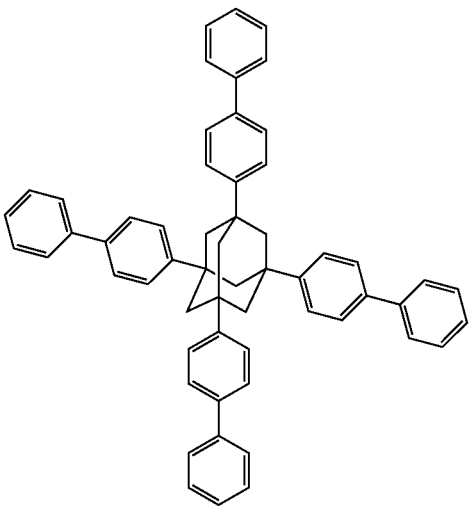
(1-13)
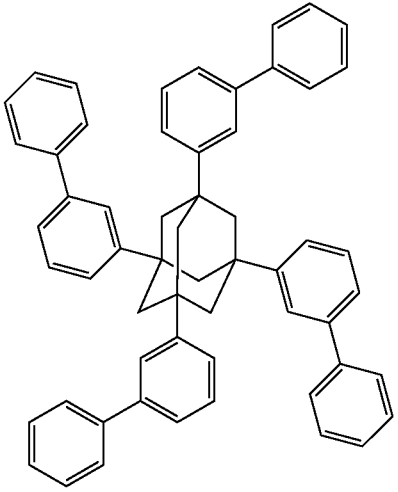

(1-14)
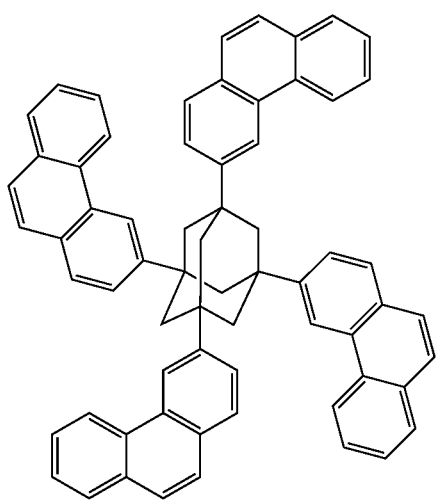
(1-15)
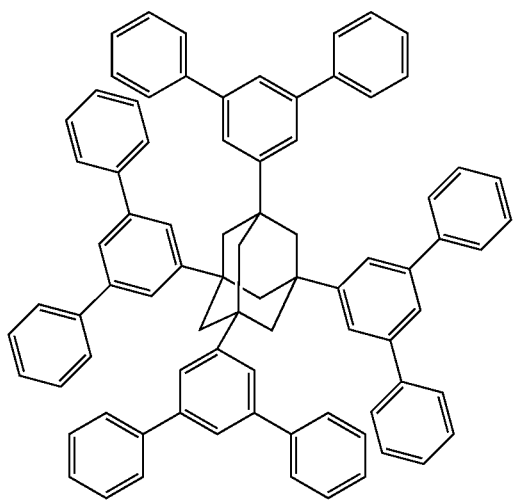
(1-16)
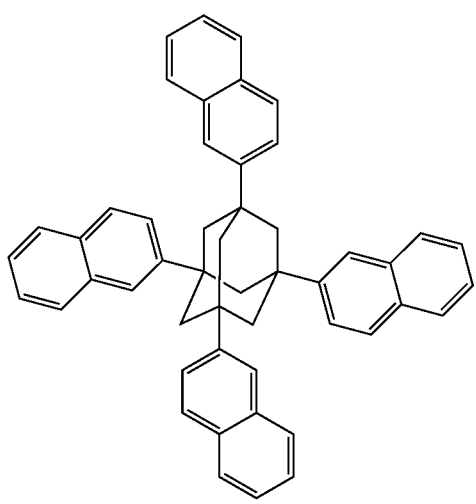
(1-17)
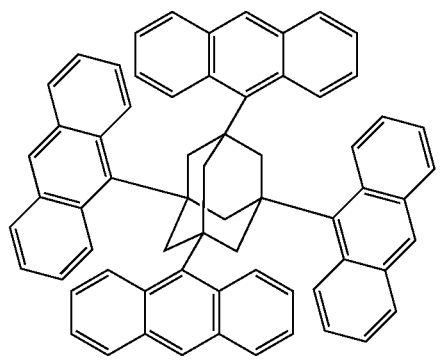
(1-18)
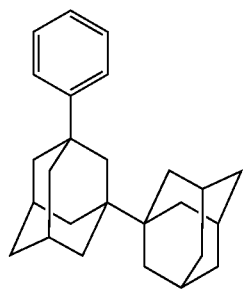
(1-19)
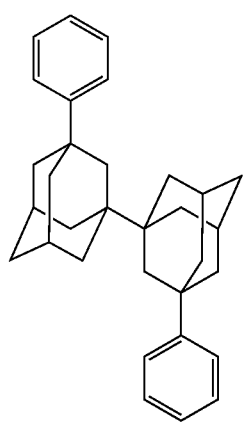
(1-20)
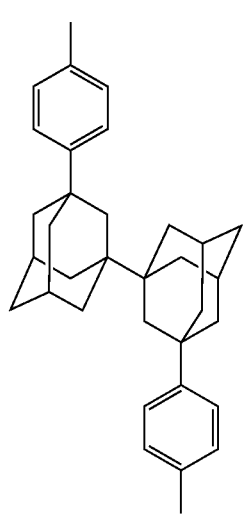

(1-21)
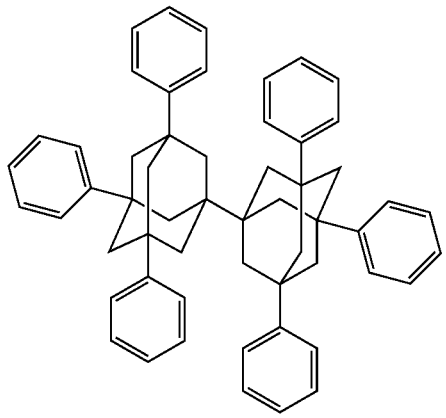
(1-22)
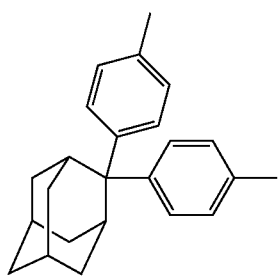
(1-23)
(1-24)
(1-25)
(1-26)
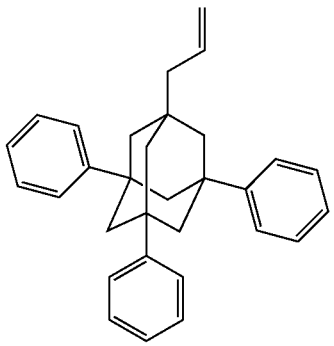
(1-27)
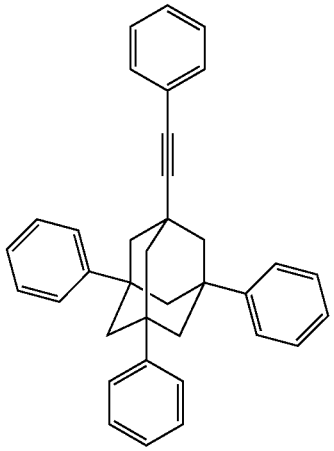
(1-28)
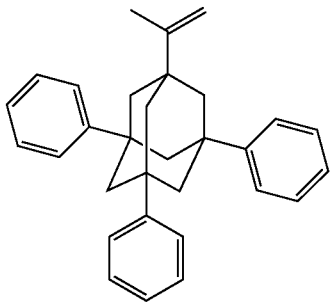
(1-29)
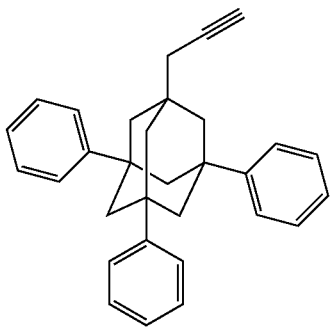

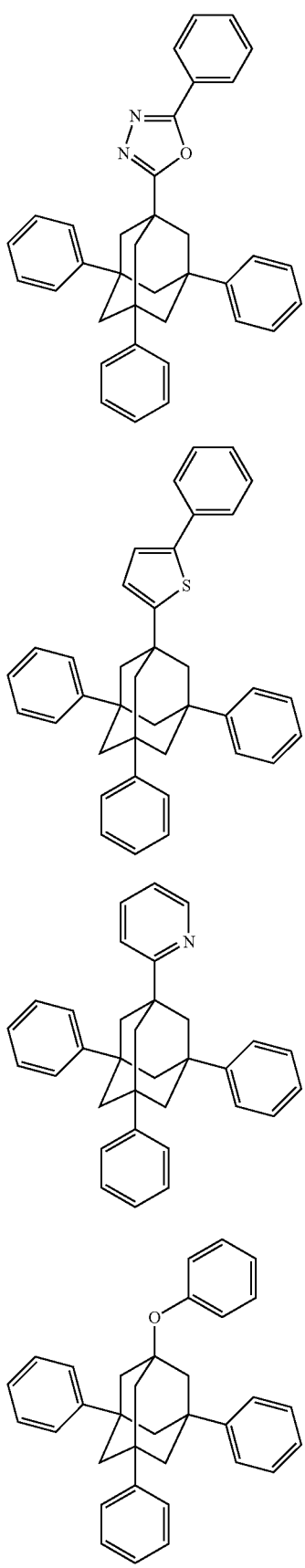
(1-30)
(1-31)
(1-32)
(1-33)
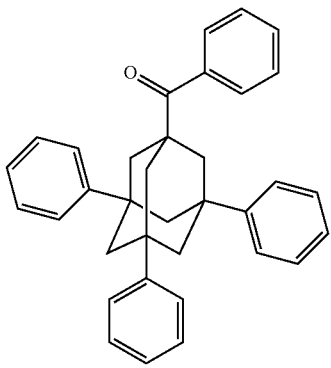
(1-34)
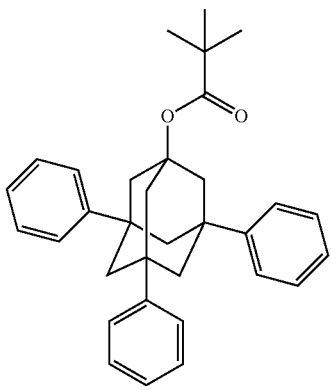
(1-35)
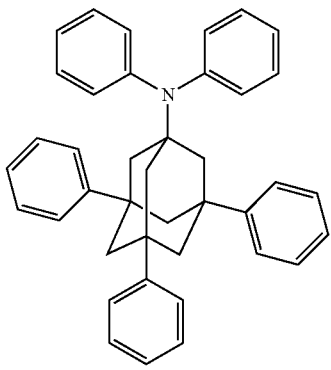
(1-36)
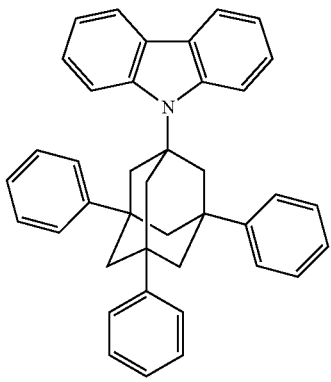
(1-37)

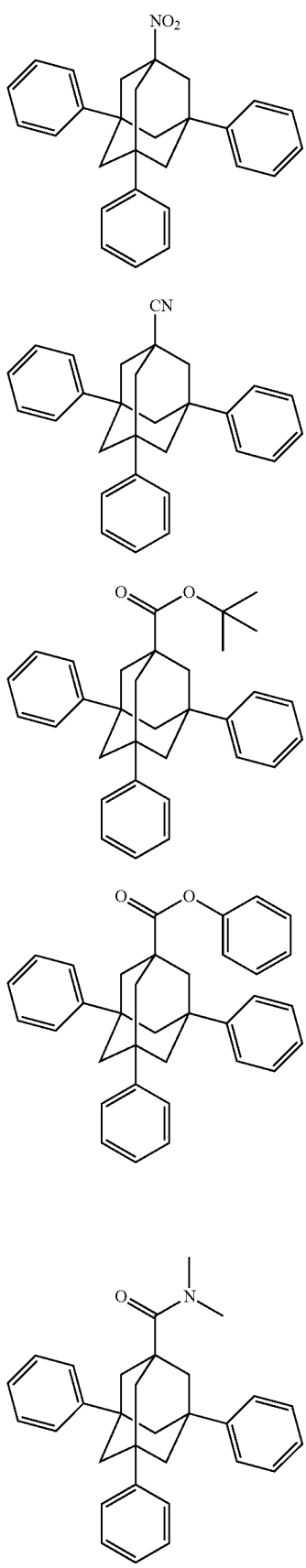
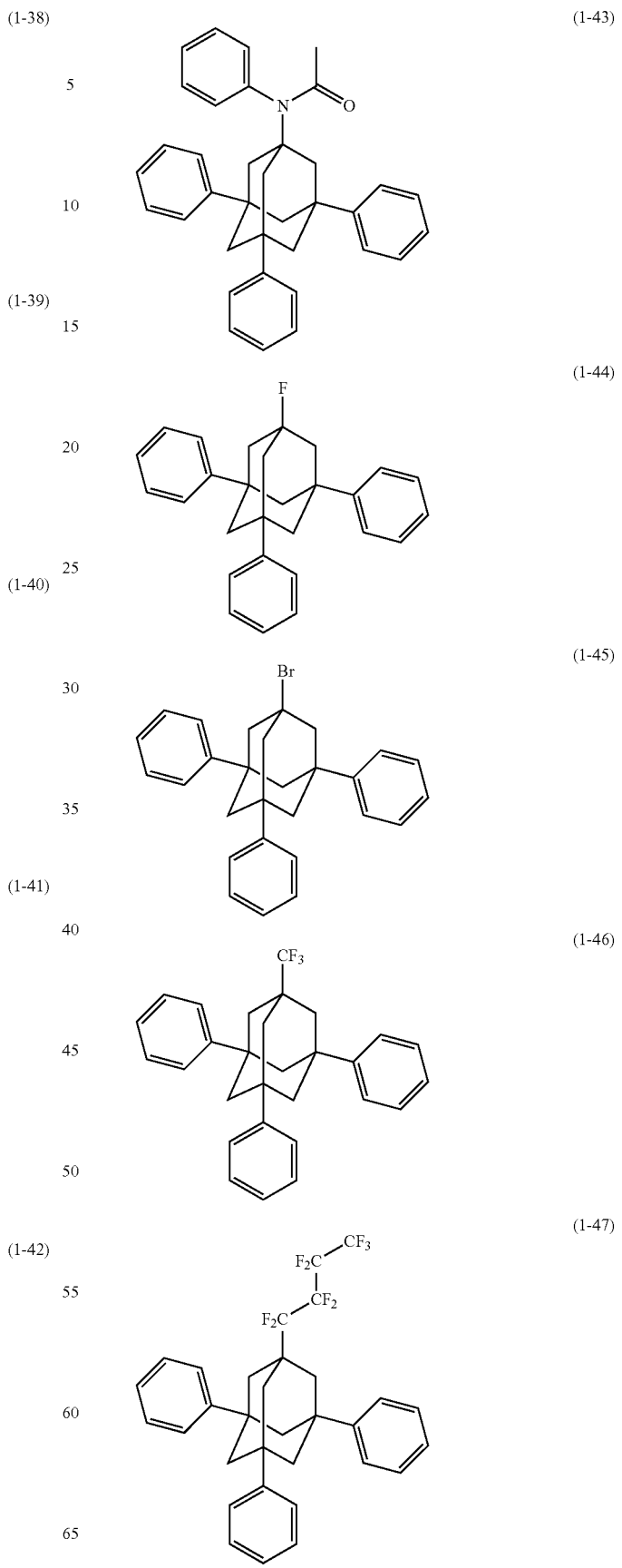

-continued (1-48)

(1-49)

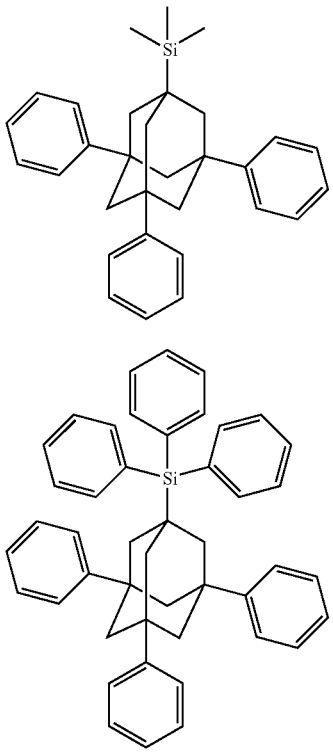

The compound represented by the formula (VI) can be synthesized by properly combining adamantane or halogenated adamantane with an alkyl halide or alkyl magnesium halide (Grignard reagent). For example, a halogenated adamantane and an alkyl halide can be coupled by using indium (Document 1). It is also possible to convert an alkyl halide into a corresponding alkyl copper reagent and couple it with a Grignard reagent of an aromatic compound (Document 2). It is also possible to couple an alkyl halide and a proper aryl boric acid in the presence of a palladium catalyst (Document 3).

Document 1: *Tetrahedron Lett.,* 39, 9557-9558 (1998)
Document 2: *Tetrahedron Lett.,* 39, 2095-2096 (1998)
Document 3: *J. Am. Chem. Soc.,* 124, 13662-13663 (2002)

An adamantane skeleton having an aryl group can be synthesized by using adamantane or a halogenated adamantane and a corresponding arene or aryl halide in proper combination.

In the above-described preparation processes, when defined substituents change under the condition of a certain synthesis process or they are inappropriate to perform the process, the compound can be prepared more easily by protecting or deprotecting functional groups (e.g., T. W. Greene, *Protective Groups in Organic Synthesis,* John Wiley & Sons Inc. (1981)). Further, if necessary, it is also possible to change the order of reaction steps such as introduction of a substituent as needed.

Although the thickness of the light emitting layer is not particularly limited, usually it is preferably from 1 nm to 500 nm, more preferably from 5 to 200 nm, still more preferably from 10 to 100 nm.

—Hole Injection Layer, Hole Transport Layer—

A hole injection layer and a hole transport layer are layers having a function of receiving holes from an anode or anode side and transporting them to a cathode side.

In the invention, a hole injection layer or a hole transport layer containing an electron accepting dopant is preferably contained as an organic layer.

—Electron Injection Layer, Electron Transport Layer—

An electron injection layer and an electron transport layer are layers having a function of receiving electrons from a cathode or a cathode side and transporting them to an anode side.

The description in the paragraphs from [0165] to [0167] of Japanese Patent Laid-Open No. 2008-270736 can be applied to the hole injection layer, hole transport layer, hole injection layer, and hole transport layer of the invention.

—Hole Blocking Layer—

The hole blocking layer is a layer having a function of preventing the holes, which have been transported from the anode side to the light emitting layer, from passing through to the cathode side. In the invention, the hole blocking layer can be provided as an organic layer adjacent to the light emitting layer on the cathode side.

Examples of organic compounds constituting the hole blocking layer include aluminum complexes such as aluminum (III) bis(2-methyl-8-quinolinato)-4-phenylphenolate (which will be abbreviated as BAlq), triazole derivatives, and phenanthroline derivatives such as 2,9-dimethyl-4,7-diphenyl-1,10-phenanthroline (which will be abbreviated as BCP). The thickness of the hole blocking layer is preferably from 1 nm to 500 nm, more preferably from 5 nm to 200 nm, still more preferably from 10 nm to 100 nm.

The hole blocking layer may have a single layer structure composed of one or more of the above materials or may have a multilayer structure composed of two or more layers having the same composition or different compositions.

—Electron Blocking Layer—

The electron blocking layer is a layer having a function of preventing the electrons, which have been transported from the cathode side to the light emitting layer, from passing through to the anode side. In the invention, the electron blocking layer can be provided as an organic layer adjacent to the light emitting layer on the anode side.

As the organic compound constituting the electron blocking layer, the hole transport materials exemplified above can be used, for example.

The thickness of the electron blocking layer is preferably from 1 nm to 500 nm, more preferably from 5 nm to 200 nm, still more preferably from 10 nm to 100 nm.

The electron blocking layer may have a single layer structure composed of one or more of the above materials or may be a multilayer structure composed of two or more layers having the same composition or different compositions.

<Protective Layer>

In the invention, the organic EL device may be entirely protected with a protective layer.

The description in the paragraphs from [0169] to [0170] of Japanese Patent Laid-Open No. 2008-270736 can be applied to the protective layer of the invention.

<Sealing Container>

The device may be entirely sealed with a sealing container.

The description in the paragraph [0171] of Japanese Patent Laid-Open No. 2008-270736 can be applied to the sealing container of the invention.

(Drive)

By applying a DC (if necessary, may contain an AC component) voltage (generally from 2 volts to 15 volts) or a DC current between the anode and the cathode, the organic electroluminescence device can be caused to emit light.

For driving of the organic electroluminescence device of the invention, the driving methods described in Japanese Patent Laid-Open Nos. 148687/1990, 301355/1994, 29080/1993, 134558/1995, 234685/1996, and 241047/1996, Japanese Patent No. 2784615, and U.S. Pat. Nos. 5,828,429 and 6,023,308 can be employed.

The luminescence device of the invention can have an improved light collection efficiency by various known contrivances. For example, the luminescence device of the invention can have an improved light collection efficiency and an improved external quantum efficiency by processing the shape of the substrate surface (for example, by forming a minute rugged pattern), by controlling the refractive index of the substrate, an ITO layer, or the organic layer, or by controlling the thickness of the substrate, ITO layer, or organic layer.

The luminescence device may employ a so-called top emission system in which light is collected from the anode side.

The organic EL device of the invention may have a resonator structure. For example, the organic EL device having such a structure is obtained by stacking, on a transparent substrate, a multilayer-film mirror composed of two or more films with different refractive indices, a transparent or translucent electrode, a light emitting layer, and a metal electrode one after another. Light generated in the light emitting layer repeats reflection between the multilayer-film mirror and the metal electrode, which serve as reflector plates, to cause resonance.

In another preferred embodiment, a transparent or translucent electrode and a metal electrode on a transparent substrate function as reflector plates, respectively, and light generated in the light emitting layer repeats reflection between them to cause resonance. In order to form the resonant structure, effective refractive indices of two reflector plates and an optical path length determined by the refractive index and the thickness of the respective layer(s) provided between the reflector plates are adjusted to be optimum values for achieving a desired resonant wavelength. A calculation formula in the first aspect is described in Japanese Patent Laid-Open No. 180883/1997, while a calculation formula in the second aspect is described in Japanese Patent Laid-Open No. 2004-127795.

The external quantum efficiency of the organic electroluminescence device of the invention is preferably 5% or greater, more preferably 7% or greater. As to the numerical value of the external quantum efficiency, a maximum value of the external quantum efficiency obtained when the device is driven at 20° C. or a value of the external quantum efficiency in the vicinity of from 100 to 300 cd/m$^2$ obtained when the device is driven at 20° C. can be employed.

An internal quantum efficiency of the electroluminescence device of the invention is preferably 30% or greater, more preferably 50% or greater, still more preferably 70% or greater. The internal quantum efficiency of the device is calculated by dividing the external quantum efficiency by a light collection efficiency. Although in usual organic EL devices, the light collection efficiency is about 20%, it can be increased to 20% or greater by devising the shape of the substrate, the shape of the electrode, the thickness of the organic layer, the thickness of the inorganic layer, the refractive index of the organic layer, the refractive index of the inorganic layer or the like.

The organic electroluminescence device of the invention has a maximum emission wavelength (maximum intensity wavelength of emission spectrum) preferably at 350 nm or greater but not greater than 700 nm, more preferably at 350 nm or greater but not greater than 600 nm, still more preferably at 400 nm or greater but not greater than to 520 nm, especially preferably at 400 nm or greater but not greater than 470 nm.

(Intended Use of Luminescence Device of the Invention)

The luminescence device of the invention can be suitably utilized for light emission apparatuses, pixels, display devices, displays, backlights, electrophotography, illumination light sources, recording light sources, exposure light sources, read light sources, markers, signboards, interiors, optical communications and the like. In particular, it can be used preferably for apparatuses to be driven in a region having a high luminous brightness such as light emission apparatuses, illumination apparatuses and display apparatuses.

The light emission apparatus of the invention will hereinafter be described referring to FIG. 2.

The light emission apparatus of the invention comprises the organic electroluminescence device.

Figure 2:
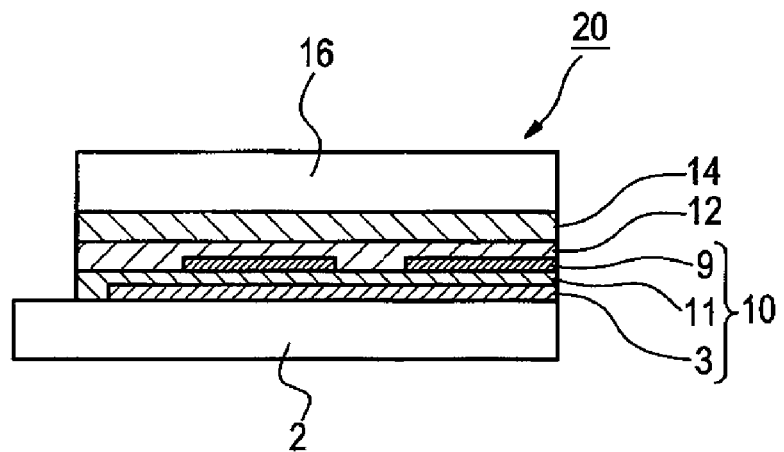
FIG. 2 is a schematic view illustrating an example (second embodiment) of a light emission apparatus according to the invention.

FIG. 2 is a cross-sectional view schematically illustrating an example of the light emission apparatus of the invention.

A light emission apparatus 20 illustrated in FIG. 2 is composed of a transparent substrate (supporting substrate) 2, an organic electroluminescence device 10, a sealing container 16, and the like.

The organic electroluminescence device 10 has, on the substrate 2, an anode (first electrode) 3, an organic layer 11, and a cathode (second electrode) 9 stacked successively. A protective layer 12 is stacked on the cathode 9 and further, and the sealing container 16 is provided on the protective layer 12 via an adhesion layer 14. A part of each of the electrodes 3 and 9, a partition, an insulating layer and the like are omitted.

Here, a photocurable adhesive or a thermosetting adhesive such as an epoxy resin can be used as the adhesive layer 14. For example, a thermosetting adhesive sheet can also be used.

The intended use of the light emission apparatus of the invention is not particularly limited, and examples thereof include, in addition to illumination apparatuses, display apparatuses of television receiver, personal computer, mobile phone, electronic paper, or the like.

(Illumination Apparatus)

Next, an illumination apparatus according to the embodiment of the invention will be described referring to FIG. 3.

Figure 3:
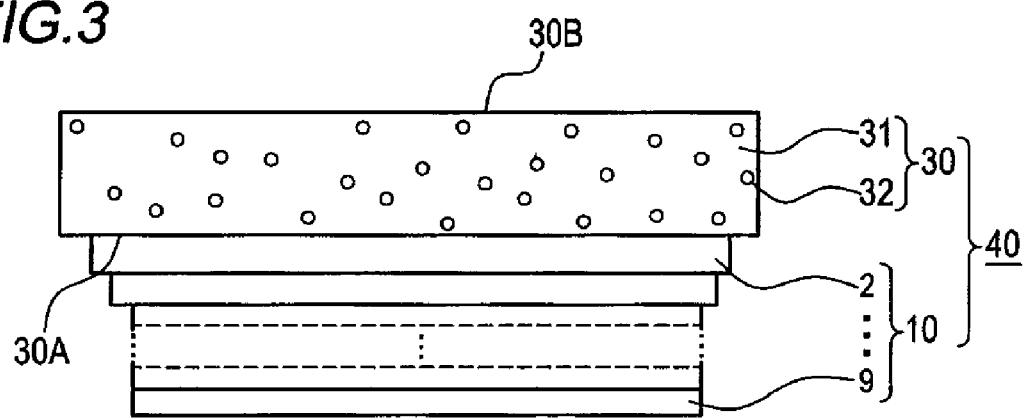
FIG. 3 is a schematic view illustrating an example (third embodiment) of an illumination apparatus according to the invention.

FIG. 3 is a cross-sectional view schematically illustrating an example of the illumination apparatus according to an embodiment of the invention.

As shown in FIG. 3, an illumination apparatus 40 according to an embodiment of the invention is provided with the above-described organic EL device 10 and a light scattering member 30. More specifically, in the illumination apparatus 40, a substrate 2 of the organic EL device 10 and the light scattering member 30 come into contact with each other.

The light scattering member 30 is not particularly limited insofar as it can scatter light. In FIG. 3, it is a member having fine particles 32 dispersed in a transparent substrate 31. As the transparent substrate 31, a glass substrate can be given as a preferred example. As the fine particles 32, transparent resin fine particles can be given as a preferred example. As the glass substrate and the transparent resin fine particle, those which are known can be used. The illumination apparatus 40 having such a structure is a unit which when light emitted from the organic electroluminescence device 10 comes into a light incident surface 30A of the light scattering member 30, scatters the incident light by the light scattering member 30 and outputs the scattered light as illumination light from a light output surface 30B.

EXAMPLES

The present invention will hereinafter be described in further detail by examples. It should however be borne in mind that the scope of the invention is not limited by the following examples.

As organic materials, those purified by sublimation were used in Examples and Comparative Examples. Following are the structure of the compounds used in Examples and Comparative Examples.

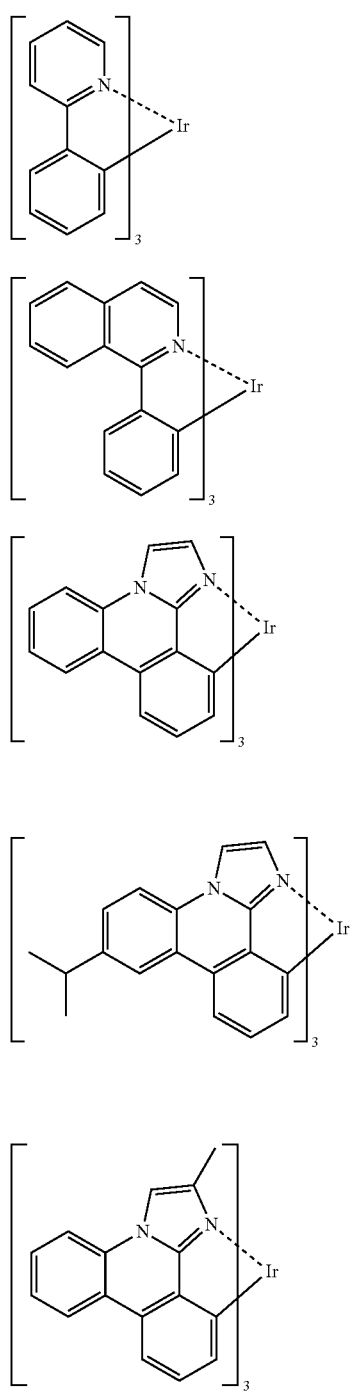

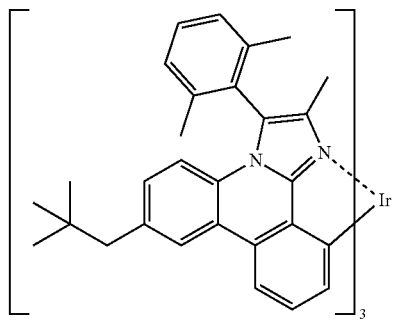

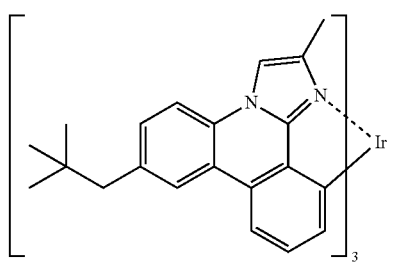

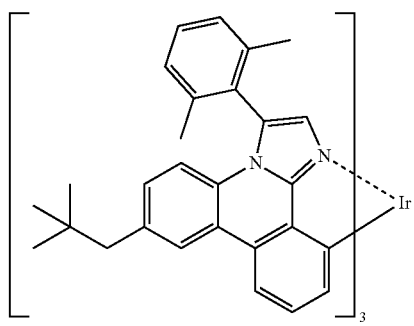

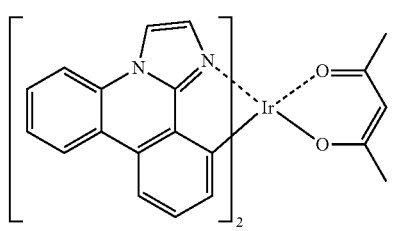

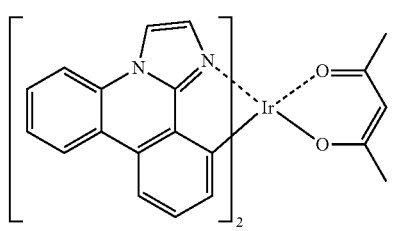

-continued
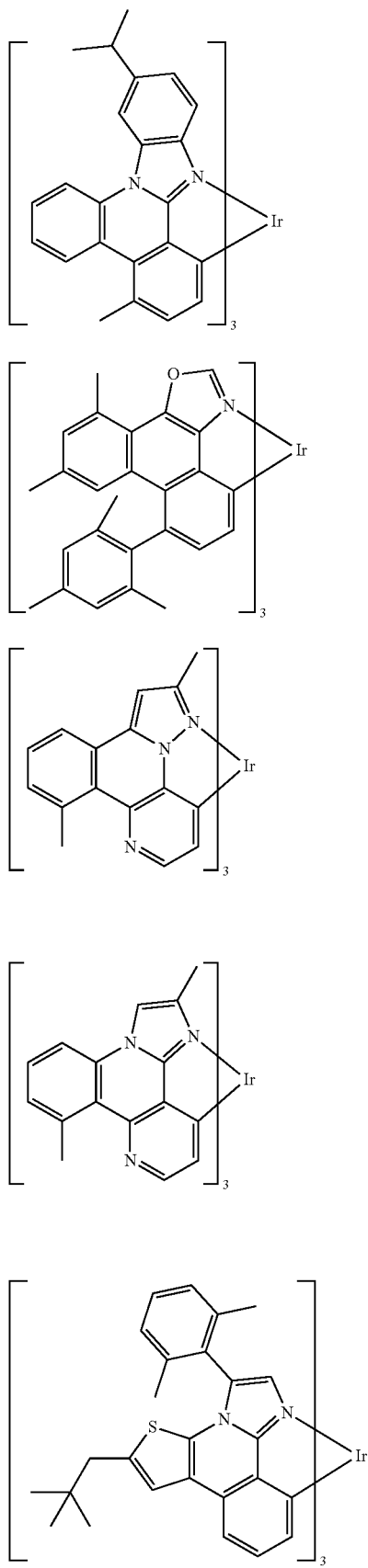
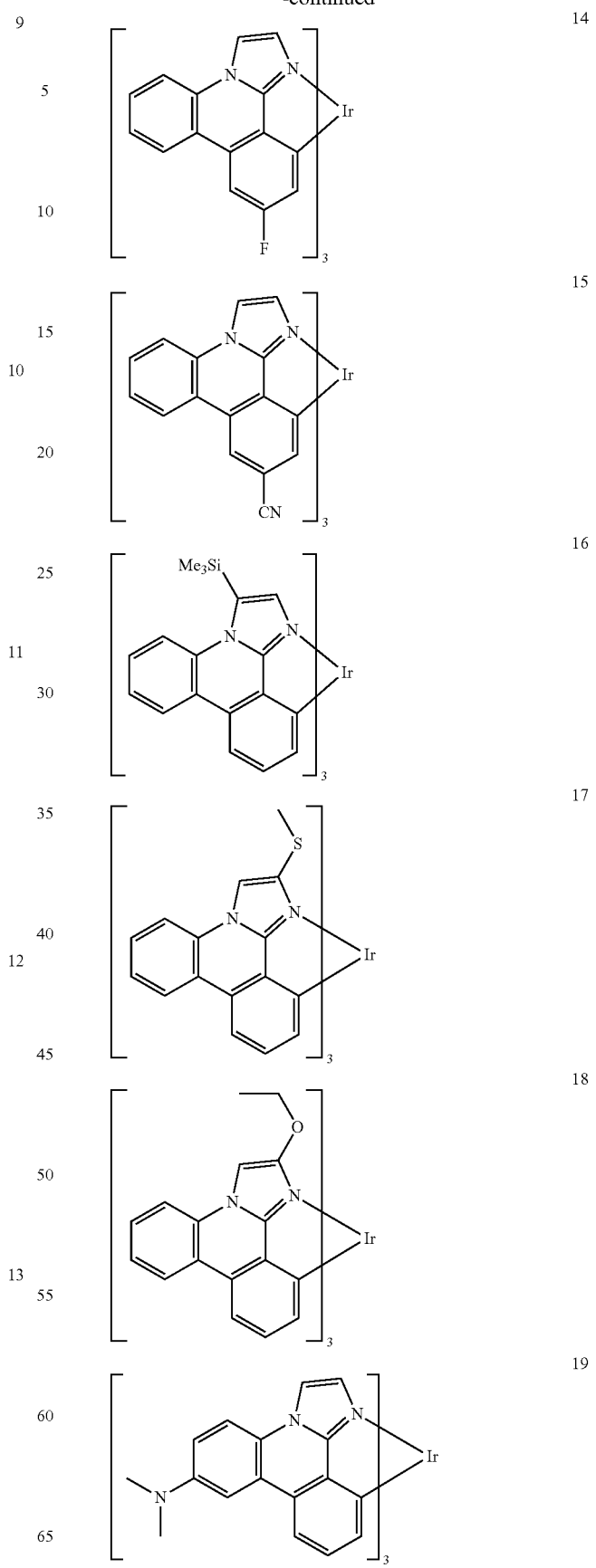

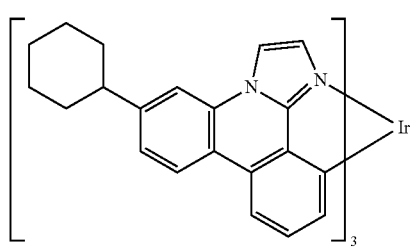
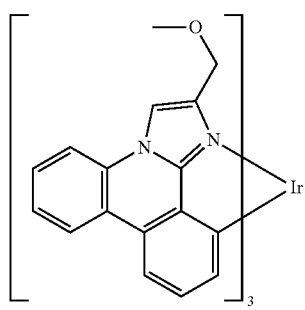
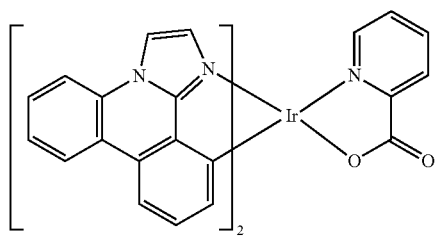
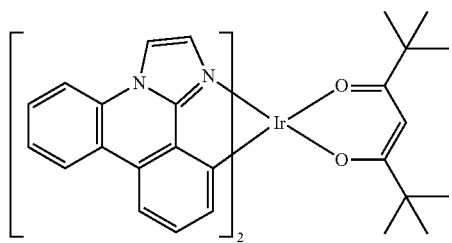
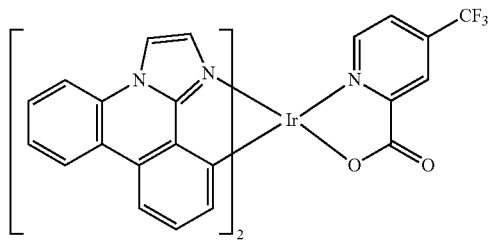
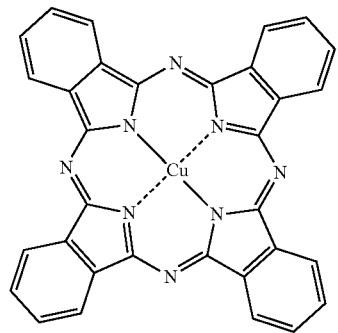
CuPc
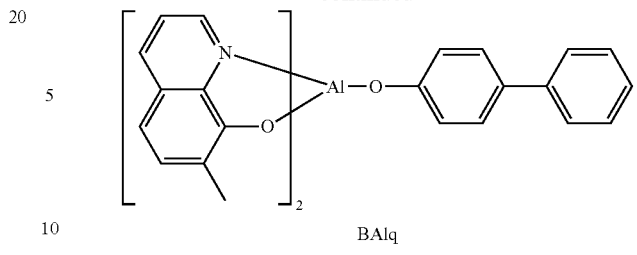
BAlq
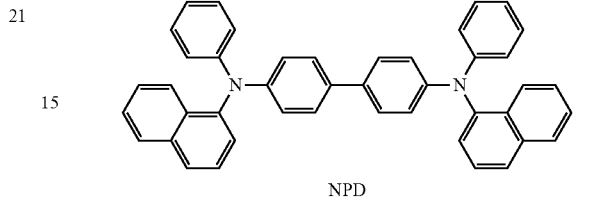
NPD
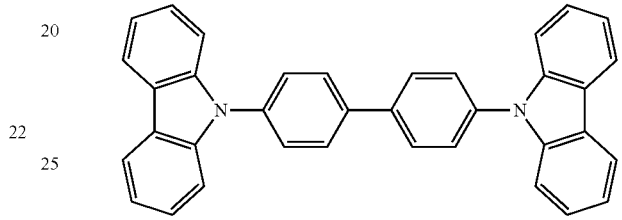
CBP
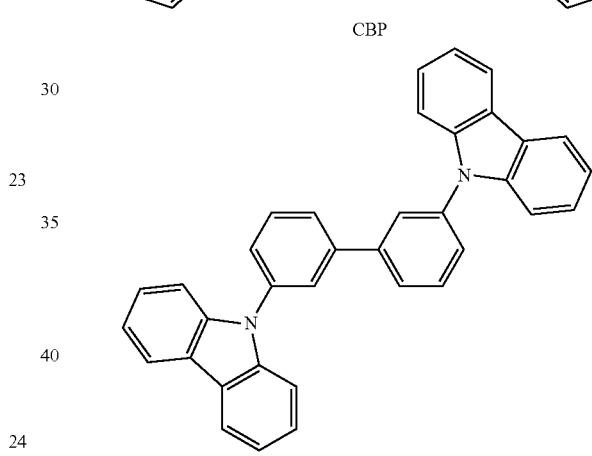
mCBP
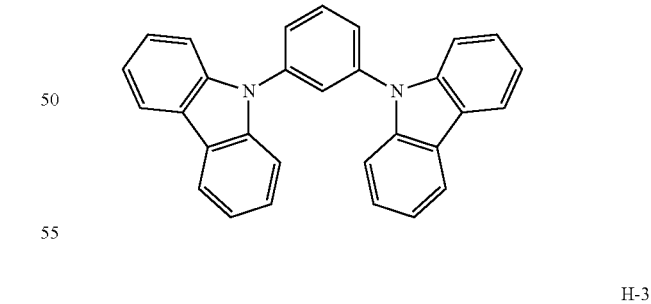
H-2
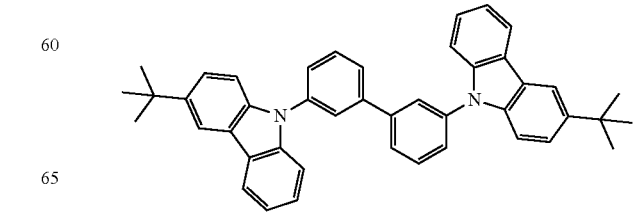
H-3

-continued

H-4

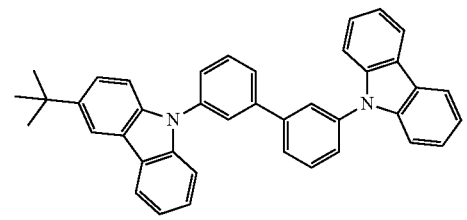

H-5

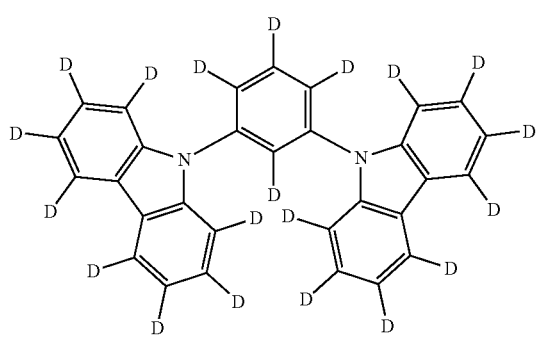

H-6

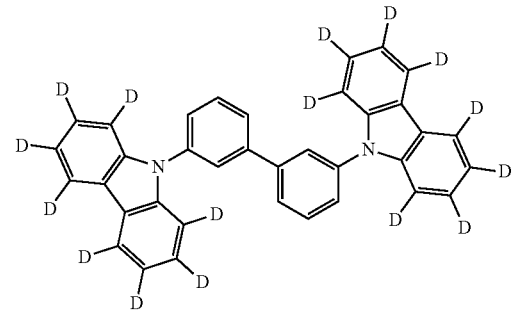

The metal complexes to be used in Examples and Comparative Examples were synthesized by using various methods such as those described in, for example, U.S. Patent Application Publication No. 2007/0190359 or U.S. Patent Application Publication No. 2008/0297033. Compounds 1 to 7 were prepared using the synthesis process described in the paragraphs from [129] on page 55 of US 2008/0297033. Compounds 11 and 12 were synthesized using the synthesis process described in the paragraphs [288] to [302] on page 189 of Japanese Patent Laid-Open No. 2009-102533. The structural isomer of each metal complex can be isolated in a manner similar to that described in the paragraph [84] of Japanese Patent Laid-Open No. 2005-344124. Structural isomers of each of the compounds obtained upon complex formation reaction were isolated by column chromatography, followed by purification by sublimation. After the structures of them were identified using ¹H-NMR, they were mixed at a mixing ratio described in each Example and the resulting mixture was provided for the device formation. For example, the complex of Compound 1 can be formed in the following manner.

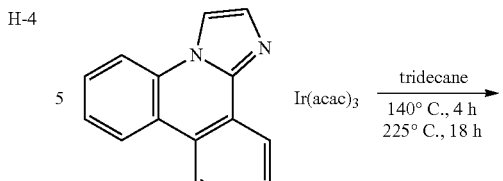

L1

Compound L1 (1.1 g, 5.0 mmol) and tris(acetylacetonato) iridium (0.49 g, 1.0 mmol) were charged in a flask. Then, tridecane (0.3 mL) was added and the flask was purged sufficiently with dry nitrogen. The reaction vessel was heated under a yellow lamp for a predetermined time. The reaction mixture was allowed to cool and then dissolved in dichloromethane, followed by crude purification by using the process described in US2008-0297033. The light yellow powder thus obtained was dissolved in dichloromethane and the resulting solution was subjected to column chromatography to obtain the facial isomer (0.3 g) and the meridional isomer (0.01 g) of Compound 1, respectively.

The structural isomers of the other compounds can also be obtained in a similar manner.

Example 1

A glass substrate having an indium tin oxide (ITO) film of 100 μm thick and 2.5 cm square (manufactured by GEO-MATEC, surface resistance: 10Ω/□) was placed in a washing vessel and ultrasonically washed in 2-propanol. Then, UV-ozone treatment was performed for 30 minutes. On the resulting transparent anode (ITO film), the following organic layers were successively deposited by using vacuum vapor deposition.

First layer: CuPc (copper phthalocyanine), film thickness: 120 nm

Second layer: NPD ((N,N'-di-α-naphthyl-N,N'-diphenyl)benzidine), 7 nm thick

Third layer: CBP (4,4'-di(9-carbazoyl)biphenyl)), film thickness: 3 nm

Fourth layer (light emitting layer): having Compound 1 (9 mass %) as a light emitting material (dopant) and mCBP (91 mass %) as a host material, film thickness: 30 nm Fifth layer: first electron transport material (Balq): film thickness: 30 nm A cathode was obtained by successively depositing, on the fifth layer, lithium fluoride and metal aluminum to give film thicknesses of 1 nm and 100 nm, respectively.

The stack thus obtained was then put in a glove box purged with an argon gas without exposing it to the air and sealed using a sealing can made of stainless steel and a UV-curable adhesive ("XNR5516HV", product of Nagase Ciba) to obtain Device 1 of Example of the invention.

In a manner similar to that employed for the preparation of Device 1 except that the light emitting material and host material of the device were changed as shown below in Table 5, Invention Devices 2 to 84 of Examples of the invention, and Comparative Devices 1 to 40 of Comparative Examples were obtained.

(Evaluation of Performance of Organic Electroluminescence Device)

The performances of various devices thus obtained were evaluated in the following manners.

Brightness of each device when a voltage was applied thereto to give a current density of 10 mA/cm² was measured.

Then, a light emitting material (Metal complexes 1 to 24, ref-1, and ref-2) to be used for each device was put in a clear bottle, placed in an oven "PH-10" (trade name; product of ESPEC CORP) irradiating a white light equipped therein, and heated in the atmosphere under the conditions described in Table 5 (for example, Device 1 was heated at 60° C. for 24 hours). After it was allowed to cool, the material was taken out and a device was prepared using it as described above. The brightness of it was measured. The brightness thus measured was expressed as a relative value supposing that the brightness of Device 1 before exposure to light and heat was 100 and a brightness keeping ratio was determined from the value after exposure relative to that before exposure.

Brightness keeping ratio=(brightness after exposure)/(brightness before exposure)×100(%)

TABLE 5

| No. of device | Light emitting material (content ratio) | Host material | Brightness before exposure (relative value) | Storing conditions | Brightness after exposure (relative value) | Brightness keeping ratio (%) |
|---|---|---|---|---|---|---|
| Invention device 1 | 1 (fac:mer = 100:0.5) | mCBP | 100.0 | 60° C., 24 h | 99.7 | 99.7 |
| Invention device 2 | 2 (fac:mer = 100:0.5) | mCBP | 61.1 | 60° C., 24 h | 59.8 | 97.9 |
| Invention device 3 | 3 (fac:mer = 100:0.5) | mCBP | 420.0 | 60° C., 24 h | 420.0 | 100.0 |
| Invention device 4 | 4 (fac:mer = 100:0.5) | mCBP | 355.6 | 60° C., 24 h | 354.5 | 99.7 |
| Invention device 5 | 5 (fac:mer = 100:0.5) | mCBP | 300.2 | 60° C., 24 h | 295.7 | 98.5 |
| Invention device 6 | 6 (fac:mer = 100:0.5) | mCBP | 211.1 | 60° C., 24 h | 209.2 | 99.1 |
| Invention device 7 | 7 (fac:mer = 100:0.5) | mCBP | 98.6 | 60° C., 24 h | 98.2 | 99.6 |
| Invention device 8 | 8 (fac:mer = 100:0.5) | mCBP | 105.6 | 60° C., 24 h | 105.3 | 99.7 |
| Invention device 9 | 9 (fac:mer = 100:0.5) | mCBP | 256.8 | 60° C., 24 h | 258.3 | 100.6 |
| Invention device 10 | 10 (fac:mer = 100:0.5) | mCBP | 67.8 | 60° C., 24 h | 67.9 | 100.1 |
| Invention device 11 | 11 (fac:mer = 100:0.5) | mCBP | 88.9 | 60° C., 24 h | 86.9 | 97.7 |
| Invention device 12 | 12 (fac:mer = 100:0.5) | mCBP | 91.0 | 60° C., 24 h | 88.6 | 97.4 |
| Invention device 13 | 13 (fac:mer = 100:0.5) | mCBP | 101.2 | 60° C., 24 h | 96.2 | 95.1 |
| Invention device 14 | 14 (fac:mer = 100:0.5) | mCBP | 102.8 | 60° C., 24 h | 102.2 | 99.4 |
| Invention device 15 | 15 (fac:mer = 100:0.5) | mCBP | 95.7 | 60° C., 24 h | 92.6 | 96.8 |
| Invention device 16 | 16 (fac:mer = 100:0.5) | mCBP | 100.4 | 60° C., 24 h | 99.7 | 99.3 |
| Invention device 17 | 17 (fac:mer = 100:0.5) | mCBP | 89.7 | 60° C., 24 h | 87.5 | 97.6 |
| Invention device 18 | 18 (fac:mer = 100:0.5) | mCBP | 94.5 | 60° C., 24 h | 93.0 | 98.4 |
| Invention device 19 | 19 (fac:mer = 100:0.5) | mCBP | 124.7 | 60° C., 24 h | 122.3 | 98.1 |
| Invention device 20 | 20 (fac:mer = 100:0.5) | mCBP | 103.4 | 60° C., 24 h | 100.9 | 97.6 |
| Invention device 21 | 21 (fac:mer = 100:0.5) | mCBP | 100.1 | 60° C., 24 h | 99.4. | 99.3 |
| Invention device 22 | 22 (fac:mer = 100:0.5) | mCBP | 100.4 | 60° C., 24 h | 97.2 | 96.8 |
| Invention device 23 | 23 (fac:mer = 100:0.5) | mCBP | 102.4 | 60° C., 24 h | 98.8 | 96.5 |
| Invention device 24 | 24 (fac:mer = 100:0.5) | mCBP | 99.6 | 60° C., 24 h | 98.3 | 98.7 |
| Comparative device 1 | ref-1 (fac:mer = 100:0) | mCBP | 266.7 | 60° C., 24 h | 201.9 | 75.7 |
| Comparative device 2 | ref-1 (fac:mer = 100:0.5) | mCBP | 266.9 | 60° C., 24 h | 202.3 | 75.8 |
| Comparative device 3 | ref-1 (fac:mer = 100:5) | mCBP | 268.1 | 60° C., 24 h | 200.8 | 74.9 |
| Comparative device 4 | ref-2 (fac:mer = 100:0.5) | mCBP | 121 | 60° C., 24 h | 80.3 | 66.4 |
| Comparative device 5 | 3/1 (100:0.5) | mCBP | 250.4 | 60° C., 24 h | 114.7 | 45.8 |
| Comparative device 6 | 1 (fac:mer = 100:0) | mCBP | 100.0 | 60° C., 24 h | 21.0 | 21.0 |
| Comparative device 7 | 2 (fac:mer = 100:0) | mCBP | 60.0 | 60° C., 24 h | 9.4 | 15.7 |
| Comparative device 8 | 3 (fac:mer = 100:0) | mCBP | 424.1 | 60° C., 24 h | 240.5 | 56.7 |
| Comparative device 9 | 4 (fac:mer = 100:0) | mCBP | 351.6 | 60° C., 24 h | 213.8 | 60.8 |
| Comparative device 10 | 5 (fac:mer = 100:0) | mCBP | 299.9 | 60° C., 24 h | 139.2 | 46.4 |
| Comparative device 11 | 6 (fac:mer = 100:0) | mCBP | 211.1 | 60° C., 24 h | 72.6 | 34.4 |
| Comparative device 12 | 7 (fac:mer = 100:0) | mCBP | 98.4 | 60° C., 24 h | 21.7 | 22.1 |
| Comparative device 13 | 8 (fac:mer = 100:0) | mCBP | 101.4 | 60° C., 24 h | 33.9 | 33.4 |
| Comparative device 14 | 9 (fac:mer = 100:0) | mCBP | 249.8 | 60° C., 24 h | 88.4 | 35.4 |
| Comparative device 15 | 10 (fac:mer = 100:0) | mCBP | 68.9 | 60° C., 24 h | 20.7 | 30.1 |
| Comparative device 16 | 11 (fac:mer = 100:0) | mCBP | 90.1 | 60° C., 24 h | 30.3 | 33.6 |
| Comparative device 17 | 12 (fac:mer = 100:0) | mCBP | 104.7 | 60° C., 24 h | 33.4 | 31.9 |
| Comparative device 18 | 13 (fac:mer = 100:0) | mCBP | 103.5 | 60° C., 24 h | 15.9 | 15.4 |
| Comparative device 19 | 14 (fac:mer = 100:0) | mCBP | 101.9 | 60° C., 24 h | 20.0 | 19.6 |
| Comparative device 20 | 15 (fac:mer = 100:0) | mCBP | 92.5 | 60° C., 24 h | 32.0 | 34.6 |
| Comparative device 21 | 16 (fac:mer = 100:0) | mCBP | 101.2 | 60° C., 24 h | 40.5 | 40.0 |
| Comparative device 22 | 17 (fac:mer = 100:0) | mCBP | 88.7 | 60° C., 24 h | 23.5 | 26.5 |
| Comparative device 23 | 18 (fac:mer = 100:0) | mCBP | 96.1 | 60° C., 24 h | 24.1 | 25.1 |
| Comparative device 24 | 19 (fac:mer = 100:0) | mCBP | 122.9 | 60° C., 24 h | 24.0 | 19.5 |
| Comparative device 25 | 20 (fac:mer = 100:0) | mCBP | 105.6 | 60° C., 24 h | 22.8 | 21.6 |
| Comparative device 26 | 21 (fac:mer = 100:0) | mCBP | 99.7 | 60° C., 24 h | 22.4 | 22.5 |
| Comparative device 27 | 22 (fac:mer = 100:0) | mCBP | 98.5 | 60° C., 24 h | 26.4 | 26.8 |
| Comparative device 28 | 23 (fac:mer = 100:0) | mCBP | 100.6 | 60° C., 24 h | 34.8 | 34.6 |
| Comparative device 29 | 24 (fac:mer = 100:0) | mCBP | 99.8 | 60° C., 24 h | 25.0 | 25.0 |
| Comparative device 30 | 1 (fac:mer = 100:0.01) | mCBP | 100.0 | 60° C., 24 h | 30.1 | 30.1 |
| Comparative device 31 | 1 (fac:mer = 100:0.04) | mCBP | 99.8 | 60° C., 24 h | 64.4 | 64.5 |
| Invention device 25 | 1 (fac:mer = 100:0.05) | mCBP | 100.4 | 60° C., 24 h | 95.8 | 95.4 |
| Invention device 26 | 1 (fac:mer = 100:0.1) | mCBP | 101.4 | 60° C., 24 h | 99.1 | 97.7 |
| Invention device 27 | 1 (fac:mer = 100:0.5) | mCBP | 100.4 | 60° C., 24 h | 98.2 | 97.8 |
| Invention device 28 | 1 (fac:mer = 100:0.6) | mCBP | 95.8 | 60° C., 24 h | 94.5 | 98.6 |

TABLE 5-continued

| No. of device | Light emitting material (content ratio) | Host material | Brightness before exposure (relative value) | Storing conditions | Brightness after exposure (relative value) | Brightness keeping ratio (%) |
|---|---|---|---|---|---|---|
| Invention device 29 | 1 (fac:mer = 100:0.8) | mCBP | 94.2 | 60° C., 24 h | 93.4 | 99.1 |
| Invention device 30 | 1 (fac:mer = 100:1) | mCBP | 94.0 | 60° C., 24 h | 93.8 | 99.8 |
| Invention device 31 | 1 (fac:mer = 100:1.1) | mCBP | 93.8 | 60° C., 24 h | 93.2 | 99.4 |
| Invention device 32 | 1 (fac:mer = 100:2) | mCBP | 93.6 | 60° C., 24 h | 93.0 | 99.4 |
| Invention device 33 | 1 (fac:mer = 100:4.5) | mCBP | 93.7 | 60° C., 24 h | 92.7 | 98.9 |
| Comparative device 32 | 1 (fac:mer = 100:6) | mCBP | 71.5 | 60° C., 24 h | 71.4 | 99.9 |
| Comparative device 33 | 4 (fac:mer = 100:0.4) | mCBP | 355.8 | 60° C., 24 h | 198.5 | 55.8 |
| Invention device 34 | 4 (fac:mer = 100:0.05) | mCBP | 350.1 | 60° C., 24 h | 344.5 | 98.4 |
| Invention device 35 | 4 (fac:mer = 100:0.5) | mCBP | 356.8 | 60° C., 24 h | 346.5 | 97.1 |
| Invention device 36 | 4 (fac:mer = 100:0.7) | mCBP | 357.4 | 60° C., 24 h | 356.0 | 99.6 |
| Invention device 37 | 4 (fac:mer = 100:0.8) | mCBP | 347.6 | 60° C., 24 h | 347.9 | 100.1 |
| Comparative device 34 | 6 (fac:mer = 100:0.03) | mCBP | 211.1 | 60° C., 24 h | 143.1 | 67.8 |
| Invention device 38 | 6 (fac:mer = 100:0.05) | mCBP | 224.5 | 60° C., 24 h | 223.2 | 99.4 |
| Invention device 39 | 6 (fac:mer = 100:4) | mCBP | 201.3 | 60° C., 24 h | 198.1 | 98.4 |
| Invention device 40 | 6 (fac:mer = 100:5) | mCBP | 199.9 | 60° C., 24 h | 195.7 | 97.9 |
| Comparative device 35 | 6 (fac:mer = 100:5.5) | mCBP | 140.2 | 60° C., 24 h | 138.5 | 98.8 |
| Invention device 41 | 7 (fac:mer = 100:0.05) | H-2 | 98.6 | 60° C., 24 h | 98.2 | 99.6 |
| Invention device 42 | 7 (fac:mer = 100:0.1) | H-2 | 98.1 | 60° C., 24 h | 98.5 | 100.4 |
| Invention device 43 | 7 (fac:mer = 100:0.25) | H-2 | 97.9 | 60° C., 24 h | 97.7 | 99.8 |
| Invention device 44 | 7 (fac:mer = 100:0.7) | H-2 | 98.5 | 60° C., 24 h | 97.9 | 99.4 |
| Invention device 45 | 7 (fac:mer = 100:2.5) | H-2 | 96.4 | 60° C., 24 h | 95.9 | 99.5 |
| Invention device 46 | 14 (fac:mer = 100:0.1) | mCBP | 102.8 | 60° C., 48 h | 99.5 | 96.8 |
| Invention device 47 | 14 (fac:mer = 100:0.25) | mCBP | 102.6 | 60° C., 48 h | 99.6 | 97.1 |
| Invention device 48 | 14 (fac:mer = 100:0.75) | mCBP | 103.5 | 60° C., 48 h | 102.1 | 98.6 |
| Invention device 49 | 14 (fac:mer = 100:1) | mCBP | 95.6 | 60° C., 48 h | 94.7 | 99.1 |
| Invention device 50 | 14 (fac:mer = 100:2) | mCBP | 94.2 | 60° C., 48 h | 93.6 | 99.4 |
| Comparative device 36 | 15 (fac:mer = 100:0.01) | H-6 | 95.7 | 120° C., 24 h | 45.7 | 47.8 |
| Invention device 51 | 15 (fac:mer = 100:0.05) | H-6 | 97.8 | 120° C., 24 h | 90.8 | 92.8 |
| Invention device 52 | 15 (fac:mer = 100:0.1) | H-6 | 97.3 | 120° C., 24 h | 92.0 | 94.6 |
| Invention device 53 | 15 (fac:mer = 100:0.15) | H-6 | 96.8 | 120° C., 24 h | 92.0 | 95.0 |
| Invention device 54 | 15 (fac:mer = 100:0.55) | H-6 | 95.8 | 120° C., 24 h | 92.4 | 96.5 |
| Invention device 55 | 15 (fac:mer = 100:1.2) | H-6 | 95.1 | 120° C., 24 h | 93.6 | 98.4 |
| Invention device 56 | 16 (fac:mer = 100:0.05) | H-4 | 111.2 | 60° C., 24 h | 107.3 | 96.5 |
| Invention device 57 | 16 (fac:mer = 100:0.1) | H-4 | 110.0 | 60° C., 24 h | 108.2 | 98.4 |
| Invention device 58 | 16 (fac:mer = 100:0.7) | H-4 | 106.5 | 60° C., 24 h | 106.3 | 99.8 |
| Invention device 59 | 16 (fac:mer = 100:2.5) | H-4 | 101.2 | 60° C., 24 h | 100.7 | 99.5 |
| Invention device 60 | 18 (fac:mer = 100:0.1) | H-4 | 106.1 | 60° C., 48 h | 104.4 | 98.4 |
| Invention device 61 | 18 (fac:mer = 100:0.9) | H-4 | 107.5 | 60° C., 48 h | 105.5 | 98.1 |
| Invention device 62 | 18 (fac:mer = 100:1.5) | H-4 | 103.5 | 60° C., 48 h | 100.2 | 96.8 |
| Invention device 63 | 18 (fac:mer = 100:4) | H-4 | 99.6 | 60° C., 48 h | 97.7 | 98.1 |
| Comparative device 37 | 18 (fac:mer = 100:5.5) | H-4 | 91.6 | 60° C., 48 h | 91.1 | 99.5 |
| Invention device 64 | 19 (fac:mer = 100:0.05) | H-4 | 132.9 | 60° C., 24 h | 129.0 | 97.1 |
| Invention device 65 | 19 (fac:mer = 100:0.1) | H-4 | 136.5 | 60° C., 24 h | 133.6 | 97.9 |
| Invention device 66 | 19 (fac:mer = 100:1) | H-4 | 132.4 | 60° C., 24 h | 131.9 | 99.6 |
| Invention device 67 | 19 (fac:mer = 100:2) | H-4 | 124.5 | 60° C., 24 h | 123.9 | 99.5 |
| Invention device 68 | 19 (fac:mer = 100:5) | H-4 | 123.2 | 60° C., 24 h | 122.8 | 99.7 |
| Invention device 69 | 22 (fac:mer = 100:0.2) | mCBP | 98.5 | 60° C., 24 h | 94.0 | 95.4 |
| Invention device 70 | 22 (fac:mer = 100:0.25) | mCBP | 99.4 | 60° C., 24 h | 95.5 | 96.1 |
| Invention device 71 | 22 (fac:mer = 100:0.75) | mCBP | 99.1 | 60° C., 24 h | 96.0 | 96.9 |
| Invention device 72 | 22 (fac:mer = 100:3) | mCBP | 94.6 | 60° C., 24 h | 92.6 | 97.9 |
| Invention device 73 | 22 (fac:mer = 100:4) | mCBP | 90.2 | 60° C., 24 h | 89.2 | 98.9 |
| Invention device 74 | 1 (fac:mer = 100:0.5) | mCBP | 99.9 | 60° C., 48 h | 99.7 | 99.8 |
| Invention device 75 | 1 (fac:mer = 100:0.5) | mCBP | 102.1 | 60° C., 100 h | 99.5 | 97.5 |
| Invention device 76 | 1 (fac:mer = 100:0.5) | mCBP | 103.0 | 120° C., 24 h | 100.0 | 97.1 |
| Comparative device 38 | 1 (fac:mer = 100:0) | mCBP | 100.7 | 60° C., 48 h | 15.6 | 15.5 |
| Comparative device 39 | 1 (fac:mer = 100:0) | mCBP | 98.7 | 60° C., 100 h | 9.8 | 9.9 |
| Comparative device 40 | 1 (fac:mer = 100:0) | mCBP | 97.9 | 120° C., 24 h | 8.4 | 8.6 |
| Invention device 77 | 1 (fac:mer = 100:0.5) | H-2 | 101.4 | 60° C., 48 h | 100.1 | 98.7 |
| Invention device 78 | 1 (fac:mer = 100:0.1) | H-2 | 105.1 | 60° C., 48 h | 99.7 | 94.9 |
| Invention device 79 | 1 (fac:mer = 100:0.5) | H-3 | 122.4 | 60° C., 48 h | 121.5 | 99.3 |
| Invention device 80 | 1 (fac:mer = 100:2) | H-3 | 113.6 | 60° C., 48 h | 112.0 | 98.6 |
| Invention device 81 | 1 (fac:mer = 100:0.5) | H-4 | 114.6 | 60° C., 48 h | 113.6 | 99.1 |
| Invention device 82 | 1 (fac:mer = 100:0.5) | H-5 | 100.4 | 60° C., 48 h | 99.9 | 99.5 |
| Invention device 83 | 6 (fac:mer = 100:0.5) | H-6 | 99.7 | 60° C., 48 h | 98.8 | 99.1 |
| Invention device 84 | 6 (fac:mer = 100:0.5) | H-6 | 101.4 | 120° C., 24 h | 101.4 | 100.0 |

In the column of the light emitting material in Table 5, for example in the case of Device 1, the term "1 (fac:mer=100: 0.5)" means that the phosphorescent metal complex 1 having a facial isomer (fac) and a meridional isomer (mer) at a mass ratio of 100:0.5 is used as a light emitting material.

It has been understood from the results of Table 5 that Invention devices 1 to 84 which are Examples of the invention, are superior in brightness keeping ratio to Comparative devices 1 to 40, which are Comparative Examples. The meridional-isomer-free Comparative Example corresponds to Patent Document 1 cited as a prior art.

Device 32 of Comparative Example has good exposure stability, but due to an excessively large content of the meridional isomer relative to the facial isomer, it is inferior to Device 1 in brightness, meaning inferior emission efficiency.

Invention devices 41 to 45, 51 to 68, and 77 to 84 show that the advantage of the invention is available even if the host material used is different in structure. In particular, Invention devices 56 to 68 and 79 to 81 using H-3 or H-4 as the host material have improved brightness before heating. In addition, it has been found that the devices using Compounds 1 to 9 show higher emission efficiency and higher brightness keeping ratio than the devices using Compounds 10 to 13.

Light emission apparatuses, display apparatuses, and illumination apparatuses are thought to need driving at temperatures higher than room temperature due to heat generated at the time of driving. In addition, instantaneous emission at high brightness is required at each pixel portion by applying a high current density. The light emitting devices of the invention are designed to have high emission efficiency in such cases so that they can be used advantageously.

Example 2

Devices were prepared in a manner similar to that employed in Example 1 by using the light emitting materials shown in Table 6. Upon preparation, as soon as the materials were put in a crucible, vapor deposition was started (Vapor deposition condition 1).

Next, after the crucible containing the materials was heated for 48 hours without changing the temperature, vapor deposition was started (Vapor deposition condition 2) and a device was prepared similarly. Deposition condition 2 was performed on the assumption that a large amount of a material be vapor deposited successively upon production of devices. Brightness of the two devices thus prepared was measured by applying a voltage to give a current density of 10 mA/cm². The brightness is expressed as a relative value supposing that the brightness of Device 2-1 is 100.

TABLE 6

|  | Light emitting material (content ratio) | Brightness under Deposition condition 1 (relative value) | Brightness under vapor deposition condition 2 (relative value) |
| --- | --- | --- | --- |
| Invention device 2-1 | 1 (fac:mer = 100:0.5) | 100.0 | 98.6 |
| Invention device 2-2 | 3 (fac:mer = 100:0.5) | 420.0 | 420.0 |
| Invention device 2-3 | 4 (fac:mer = 100:0.5) | 355.6 | 352.4 |
| Invention device 2-4 | 6 (fac:mer = 100:0.5) | 211.1 | 204.5 |
| Invention device 2-5 | 11 (fac:mer = 100:0.5) | 88.9 | 86.9 |
| Comparative device 2-1 | ref-1 (fac:mer = 100:0.5) | 266.7 | 76.5 |
| Comparative device 2-2 | 1 (fac:mer = 100:0) | 100.0 | 69.7 |
| Comparative device 2-3 | 3 (fac:mer = 100:0) | 424.5 | 240.7 |
| Comparative device 2-4 | 4 (fac:mer = 100:0) | 350.4 | 213.0 |
| Comparative device 2-5 | 6 (fac:mer = 100:0) | 208.9 | 71.9 |
| Comparative device 2-6 | 11 (fac:mer = 100:0) | 90.5 | 30.4 |

It has been found from the results of Table 6 that Invention devices 2-1 to 2-5 using the invention materials for organic electroluminescence device which have been heated for 48 hours prior to vapor deposition show almost no reduction in brightness compared with the devices using the materials prepared in the conventional manner, suggesting that the materials for organic electroluminescence device according to the invention are suited for mass production of devices.

Comparative devices 2-1 to 2-6 using materials for organic electroluminescence device which are outside the scope of the invention and have been heated for 48 hours prior to vapor deposition show marked reduction in brightness compared with the devices using the materials prepared in the conventional manner, suggesting that they are not suited for mass production of devices.

The entire disclosure of Japanese Patent Application No. 2009-201147 filed on Aug. 31, 2009, and Japanese Patent Application No. 2010-029537 filed on Feb. 12, 2010, from which the benefit of foreign priority has been claimed in the present application, is incorporated herein by reference, as if fully set forth.

What is claimed is:

1. A material for an organic electroluminescence device, which comprises:
(a) a phosphorescent metal complex represented by the following formula (A10-1):

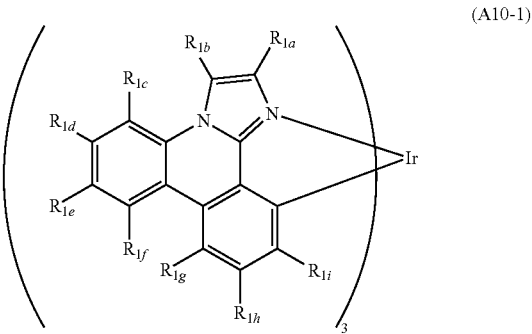

(A10-1)

wherein, each of $R_{1a}$ to $R_{1i}$ independently represents a hydrogen atom or a substituent, (b) a structural isomer represented by the same chemical formula as that of the phosphorescent metal complex (a) but different sterically in a coordination method of the ligand, wherein the structural isomer (b) is contained in an amount of 0.05 mass % or greater but not greater than 1 mass % relative to the phosphorescent metal complex (a), wherein the structural isomer of phosphorescent metal complex (a) is a facial isomer, while the structural isomer (b) is a meridional isomer.

2. The material for organic electroluminescence device according to claim 1, wherein the phosphorescent metal complex represented by the formula (A10-1) is a phosphorescent metal complex represented by formula (A11-1)

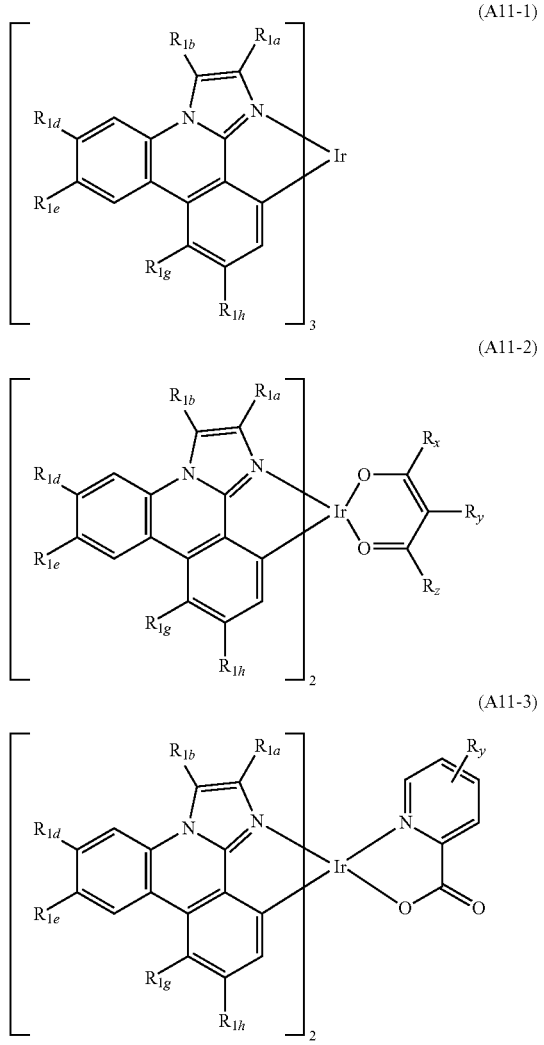

wherein, each of $R_{1a}$, $R_{1b}$, $R_{1d}$, $R_{1e}$, $R_{1g}$, $R_{1h}$ independently represents a hydrogen atom, an alkyl group, a cycloalkyl group, an aryl group, a cyano group, a fluoro group, —$OR_{2a}$, —$SR_{2a}$, —$NR_{2a}R_{2b}$, —$BR_{2a}R_{2b}$, or —$SiR_{2a}R_{2b}R_{2c}$, and each of $R_{2a}$ to $R_{2c}$ independently represents a hydrocarbon substituent or a heteroatom-substituted-substituent.

3. An organic electroluminescence device which comprises:
a substrate,
a pair of electrodes on the substrate,
and one or more organic layers including a light emitting layer between the electrodes,
wherein the material for organic electroluminescence device according to claim 1 is contained in at least one of the organic layers.

4. The organic electroluminescence device according to claim 3, which comprises said material in the light emitting layer.

5. A light emission apparatus which comprises the organic electroluminescence device according to claim 3.

6. A display apparatus which comprises the organic electroluminescence device according to claim 3.

7. An illumination apparatus which comprises the organic electroluminescence device according to claim 3.

8. The material for organic electroluminescence device according to claim 1, wherein each of $R_{1a}$ to $R_{1i}$ independently represents a hydrogen atom, an alkyl group, a cycloalkyl group, an aryl group, a cyano group, a fluoro group, —$OR_{2a}$, —$SR_{2a}$, —$NR_{2a}R_{2b}$, —$BR_{2a}R_{2b}$, or —$SiR_{2a}R_{2b}R_{2c}$,
wherein each of $R_{2a}$ to $R_{2c}$ independently represents an alkyl group, a cycloalkyl group, or an aryl group.

9. An organic electroluminescence device having a light emitting layer between a pair of electrodes, wherein the light emitting layer comprises:
(a) a phosphorescent metal complex represented by the following formula (A10-1):

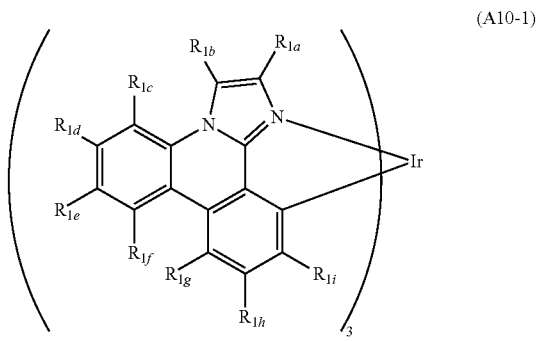

wherein, each of $R_{1a}$ to $R_{1i}$ independently represents a hydrogen atom or a substituent, (b) a structural isomer represented by the same chemical formula as that of the phosphorescent metal complex (a) but different sterically in a coordination method of the ligand, wherein the structural isomer (b) is contained in an amount of 0.05 mass % or greater but not greater than 5 mass % relative to the phosphorescent metal complex (a), wherein the structural isomer of phosphorescent metal complex (a) is a facial isomer, while the structural isomer (b) is a meridional isomer;
wherein said device exhibits an improved brightness keeping ratio compared to a device comprising a phosphorescent metal complex represented by the same chemical formula as that of (A10-1) and having an amount of structural isomer (b) less than 0.05 mass % relative to the phosphorescent metal complex (a); and
the brightness keeping ratio is measured with respect to a storage condition of about 60° C. over about 24 hours.

* * * * *